US005325315A

United States Patent [19]

Engel et al.

[11] Patent Number: 5,325,315

[45] Date of Patent: Jun. 28, 1994

[54] PROCESS FOR AUTO CALIBRATION OF A MICROPROCESSOR BASED OVERCURRENT PROTECTIVE DEVICE AND APPARATUS

[75] Inventors: Joseph C. Engel, Monroeville Boro; Gary F. Saletta, Penn Township, Westmoreland County, both of Pa.; Marlan L. Winter; Edward C. Prather, both of Hendersonville, N.C.

[73] Assignee: Westinghouse Electric Corp., Pittsburgh, Pa.

[21] Appl. No.: 73,636

[22] Filed: Jun. 8, 1993

Related U.S. Application Data

[63] Continuation of Ser. No. 636,000, Dec. 28, 1990, abandoned.

[51] Int. Cl.[5] ............................................ G01R 35/00

[52] U.S. Cl. ............................... 364/571.05; 364/483; 364/571.01

[58] Field of Search ....................... 364/571.01, 571.02, 364/571.04, 571.05, 571.06, 571.07, 571.08, 483, 424.03

[56] References Cited

U.S. PATENT DOCUMENTS

| | | | |
|---|---|---|---|
| 3,320,034 | 5/1967 | Greenberg et al. . | |
| 3,754,182 | 8/1973 | Morris et al. . | |
| 3,925,709 | 12/1975 | Mitchell et al. . | |
| 4,114,048 | 9/1978 | Hull et al. . | |
| 4,131,935 | 12/1978 | Clement . | |
| 4,166,205 | 8/1979 | Maier et al. | 200/153 |
| 4,245,184 | 1/1981 | Billings et al. . | |
| 4,251,743 | 2/1981 | Hareyama . | |
| 4,316,136 | 2/1982 | Saxarra et al. . | |
| 4,321,583 | 3/1982 | Baron et al. . | |
| 4,331,997 | 5/1982 | Engel et al. | 361/93 |
| 4,337,517 | 6/1982 | Nickel et al. | 364/571.04 |
| 4,366,469 | 12/1982 | Michaels et al. . | |
| 4,384,321 | 5/1983 | Rippel . | |
| 4,399,416 | 8/1983 | Gillespie . | |
| 4,419,619 | 12/1983 | Jindrick et al. | 364/483 |
| 4,467,260 | 8/1984 | Mallick, Jr. et al. | 318/800 |

(List continued on next page.)

OTHER PUBLICATIONS

Westinghouse Descriptive Bulletin 8171 "IQ Data" Mar. 1990.

"Interrupt-Drive Microprocessor-Based Overcurrent Relay" by M. A. Manzoul, IEEE Transactions on Industrial Electronics, vol. 38, No. 1, pp. 8-9, Feb. 1991.

"Rule-Based Coordination Program Evaluates Distribution Overcurrent Protection Alternatives" by S. R.

(List continued on next page.)

*Primary Examiner*—Jack B. Harvey

*Assistant Examiner*—Jae H. Choi

*Attorney, Agent, or Firm*—M. J. Moran

[57] ABSTRACT

Process and apparatus for calibrating an electrical device such as a circuit breaker, motor controller or monitor is taught. A precision power supply device is interconnected by way of appropriate input channels to the device to be calibrated for supplying a precise accurate calibration variable as an input. A personal computer PC is interlinked by way of a communications network with the apparatus to be calibrated and is also interlinked with the precision supply device so that the personal computer PC has available the exact value of input variable utilized. Gain adjustment calibration is made by supplying the predetermined value of circuit variables, for instance 10 amperes or 120V to the input terminals of the device being calibrated. Upon command, the personal computer PC instructs the device being calibrated to deliver to the personal computer PC those values of input variable which the device being calibrated interprets as the input variable value. The personal computer PC compares this value with the actual value and generates a correction factor which the personal computer PC sends back to the device being calibrated for storage in an EEPROM. Consequently, during subsequent use after the calibration procedure has been completed and the calibration features have been safely "locked" away in the EEPROM, all readings will be adjusted by the aforementioned calibration factor to compensate for errors which may exist in other portions of the device being calibrated.

40 Claims, 49 Drawing Sheets

U.S. PATENT DOCUMENTS 4,471,418 9/1984 Tuma .
4,503,408 3/1985 Mrenna et al. .................. 335/135
4,550,360 10/1985 Dougherty .................. 361/93
4,554,501 12/1985 Baker .
4,556,838 12/1985 Brasseur .
4,618,848 10/1986 Parfitt .
4,626,831 12/1986 Engel .
4,644,566 2/1987 Vercellotti et al. .
4,677,366 6/1987 Wilkinson et al. .
4,683,415 7/1987 Zimmerman .
4,698,740 10/1987 Rodgers et al. .
4,712,169 12/1987 Albach .
4,712,179 12/1987 Heimer .
4,731,722 3/1988 Conroy .
4,746,899 5/1988 Swanson et al. .
4,812,736 3/1989 Albach et al. .
4,814,998 3/1989 Aramaki .................. 364/474.35
4,823,280 4/1989 Mailandt et al. .................. 364/483
4,831,378 5/1989 Baars et al. .
4,837,504 6/1989 Baer et al. .................. 364/483
4,839,819 6/1989 Begin et al. .................. 364/483
4,851,843 7/1989 Neal .
4,864,213 9/1989 Kido .
4,870,418 9/1989 Kal et al. .
4,876,502 10/1989 Verbanets et al. .
4,893,102 1/1990 Bauer .................. 335/132
4,907,165 3/1990 Toda .................. 364/483
4,910,631 3/1990 Murphy .
4,940,929 7/1990 Williams .
4,940,981 7/1990 Naylor et al. .
4,942,509 7/1990 Shires et al. .
4,947,355 8/1990 Koeman .................. 364/571.01
4,949,029 8/1990 Cooper et al. .................. 364/571.04
4,964,029 10/1990 Severinsky et al. .
5,003,454 3/1991 Bruning .
5,006,975 4/1991 Neufeld .
5,079,704 1/1992 Bird et al. .................. 304/571.01
5,089,979 2/1992 McEachern et al. .................. 364/571.04
5,095,453 3/1992 Pierson et al. .................. 364/571.01
5,220,517 6/1993 Sierk et al. .................. 364/571.04

OTHER PUBLICATIONS

Mendis, M. T. Bishop and D. A. Gonzalez, IEEE Computer Applications in Power, pp. 31-36, Apr. 1991.

"Monolithic Sensor Interfaces with On-Board Digital Signal Processing", Sharbel E. Novjaim, Proceedings of the American Control.

"How to Select a Microcontroller", John J. Vaglica and Peter S. Gilmour, IEEE Spectrum Magazine, Nov. 1990.

"Using the Motorola MC68HC11", Steve Garcia and Burton Brown, Circuit Cellar Ink Magazine, Dec. 1990, Jan. 1991.

Westinghouse Descriptive Bulletin 8171, "IQ Data", Mar. 1990.

Great Britain App. Serial No. GB-A-2155266 (U.S. Counterpart 4,546,403).

PCT Appln. Serial No. WO-A-8701765 (U.S. Counterpart 4,680,667).

FIG. 4
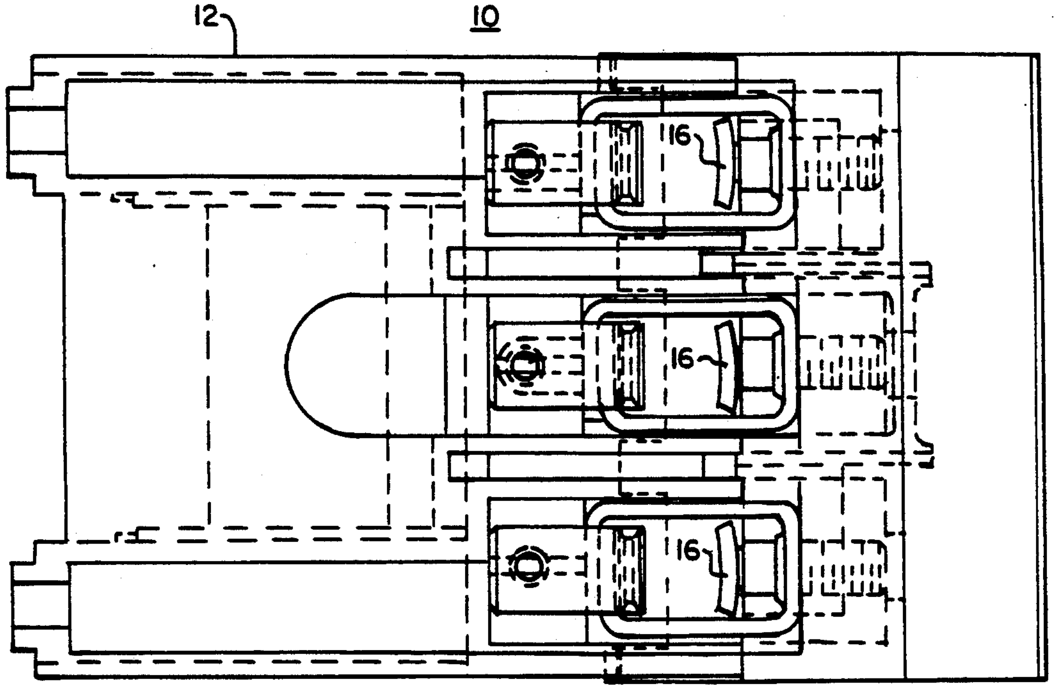
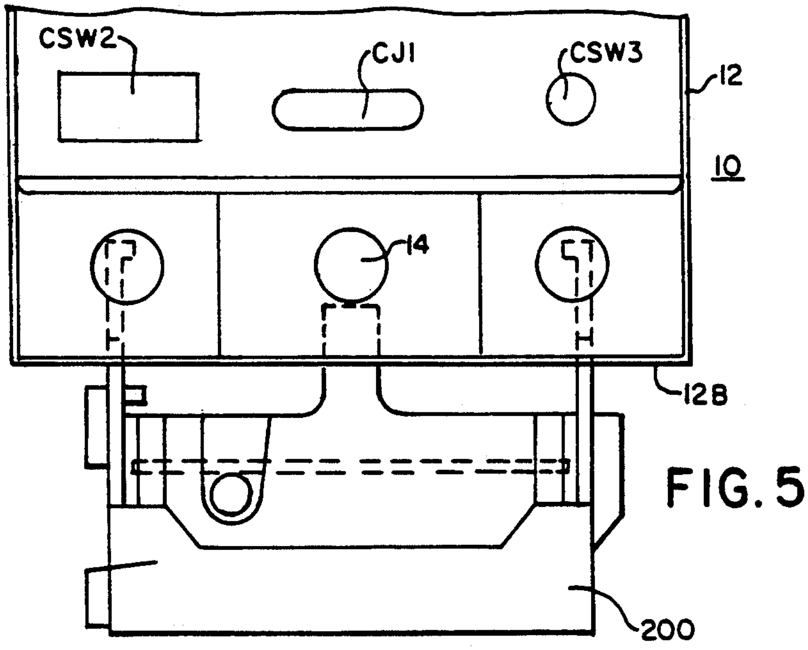
FIG. 5

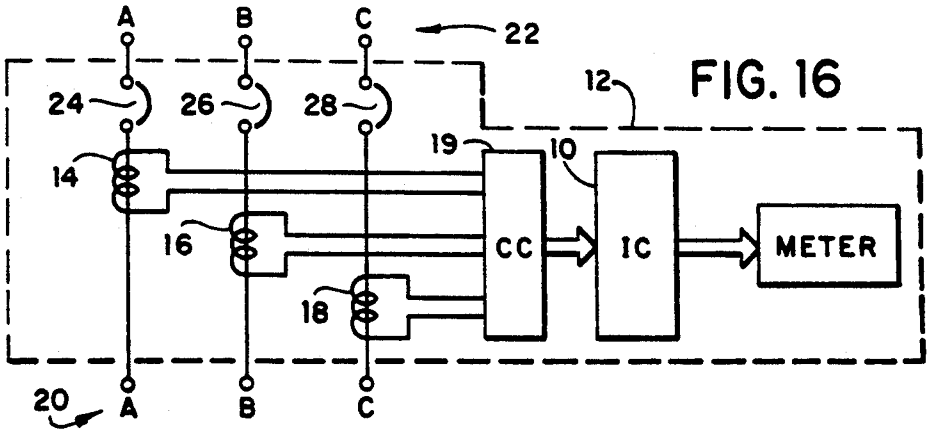
FIG. 16
FIG. 18
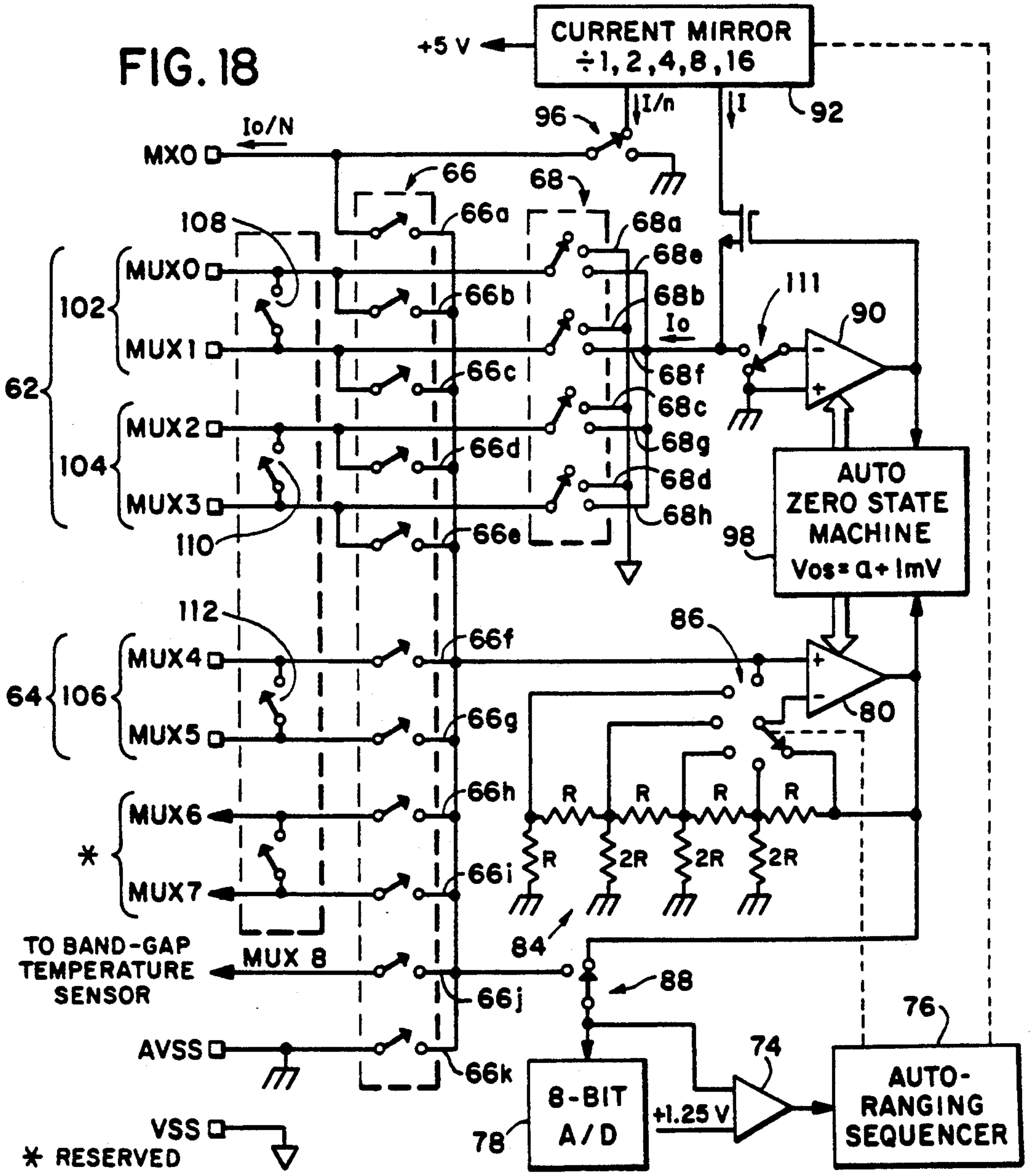

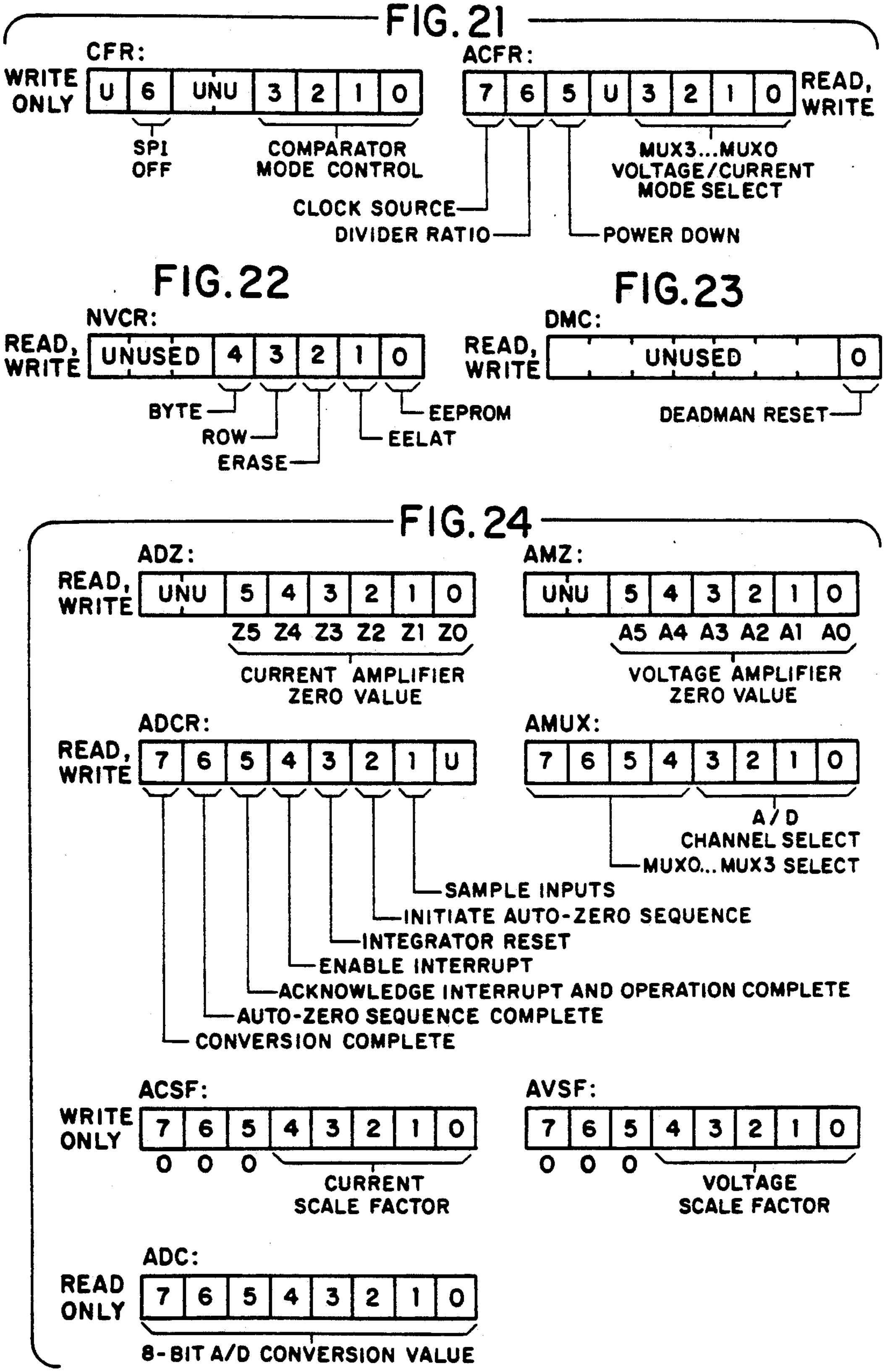
FIG. 21
CFR:
WRITE ONLY
U 6 UNU 3 2 1 0
SPI OFF
COMPARATOR MODE CONTROL
ACFR:
7 6 5 U 3 2 1 0
READ, WRITE
MUX3...MUXO VOLTAGE/CURRENT MODE SELECT
CLOCK SOURCE
DIVIDER RATIO
POWER DOWN
FIG. 22
NVCR:
READ, WRITE
UNUSED 4 3 2 1 0
BYTE
ROW
ERASE
EELAT
EEPROM
FIG. 23
DMC:
READ, WRITE
UNUSED 0
DEADMAN RESET
FIG. 24
ADZ:
READ, WRITE
UNU 5 4 3 2 1 0
Z5 Z4 Z3 Z2 Z1 Z0
CURRENT AMPLIFIER ZERO VALUE
AMZ:
UNU 5 4 3 2 1 0
A5 A4 A3 A2 A1 A0
VOLTAGE AMPLIFIER ZERO VALUE
ADCR:
READ, WRITE
7 6 5 4 3 2 1 U
SAMPLE INPUTS
INITIATE AUTO-ZERO SEQUENCE
INTEGRATOR RESET
ENABLE INTERRUPT
ACKNOWLEDGE INTERRUPT AND OPERATION COMPLETE
AUTO-ZERO SEQUENCE COMPLETE
CONVERSION COMPLETE
AMUX:
7 6 5 4 3 2 1 0
A/D CHANNEL SELECT
MUX0...MUX3 SELECT
ACSF:
WRITE ONLY
7 6 5 4 3 2 1 0
0 0 0
CURRENT SCALE FACTOR
AVSF:
7 6 5 4 3 2 1 0
0 0 0
VOLTAGE SCALE FACTOR
ADC:
READ ONLY
7 6 5 4 3 2 1 0
8-BIT A/D CONVERSION VALUE FIG. 58
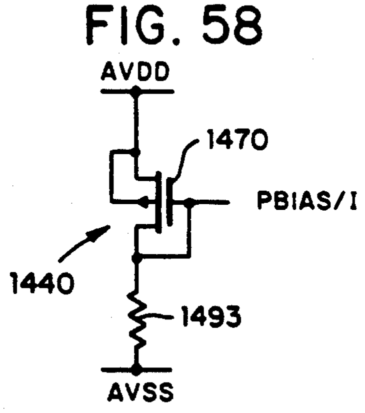
FIG. 53
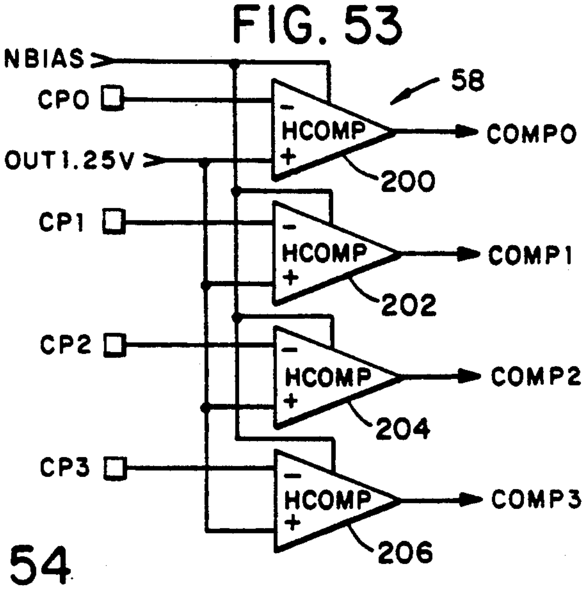
FIG. 54
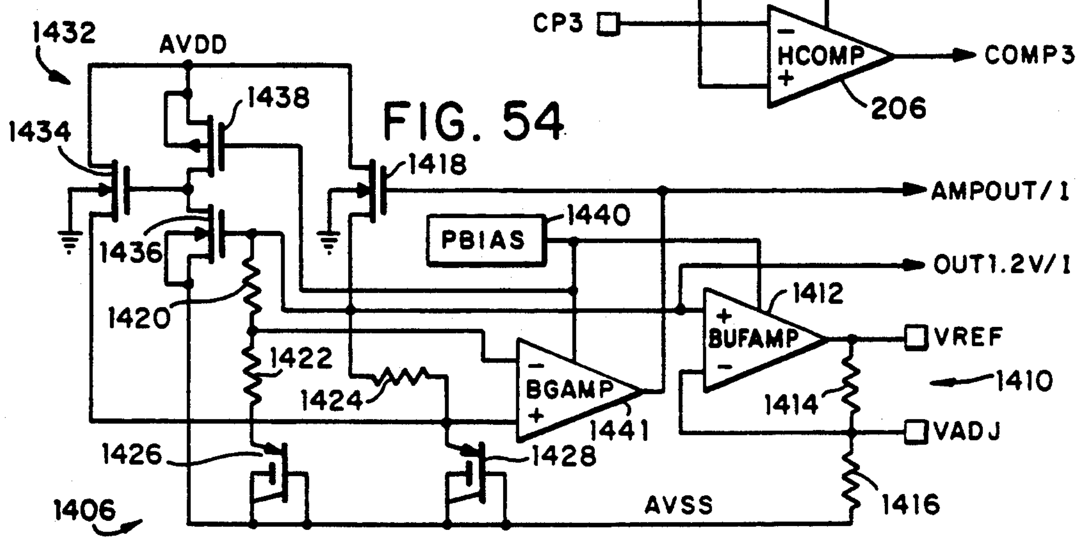
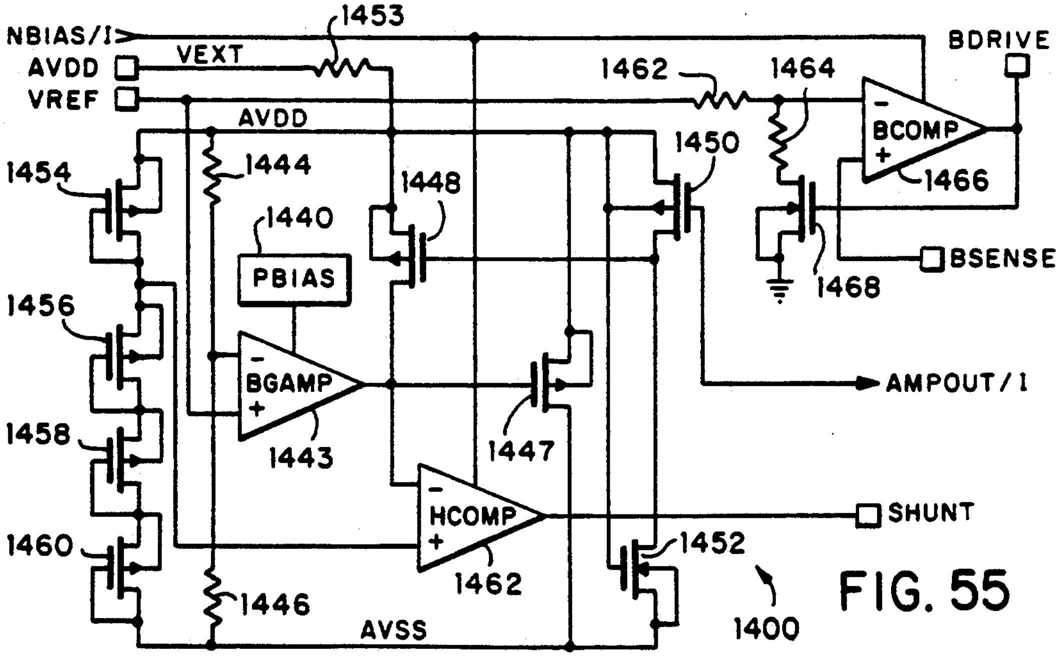
FIG. 55

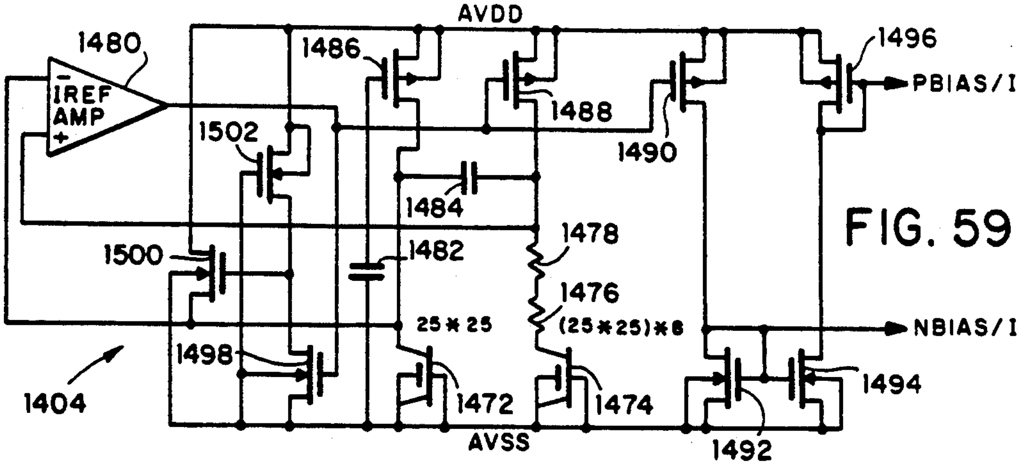
FIG. 59
FIG. 62
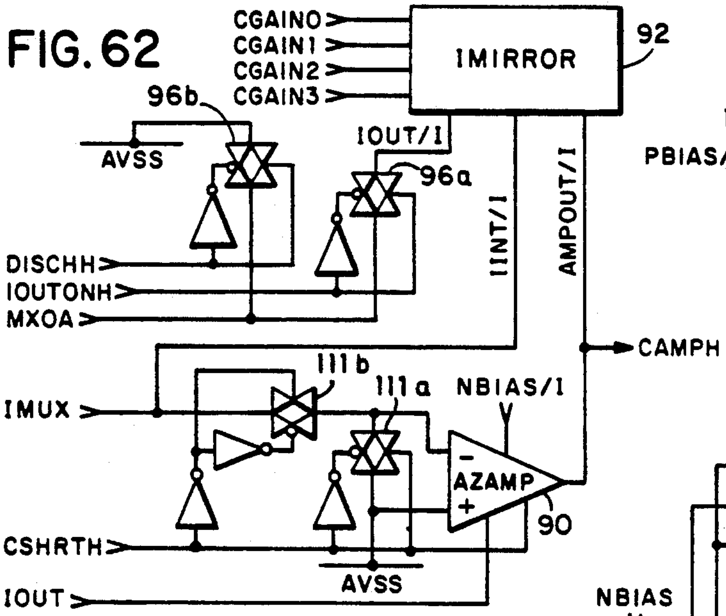
FIG. 60
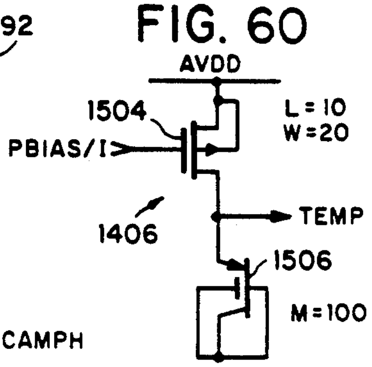
FIG. 61
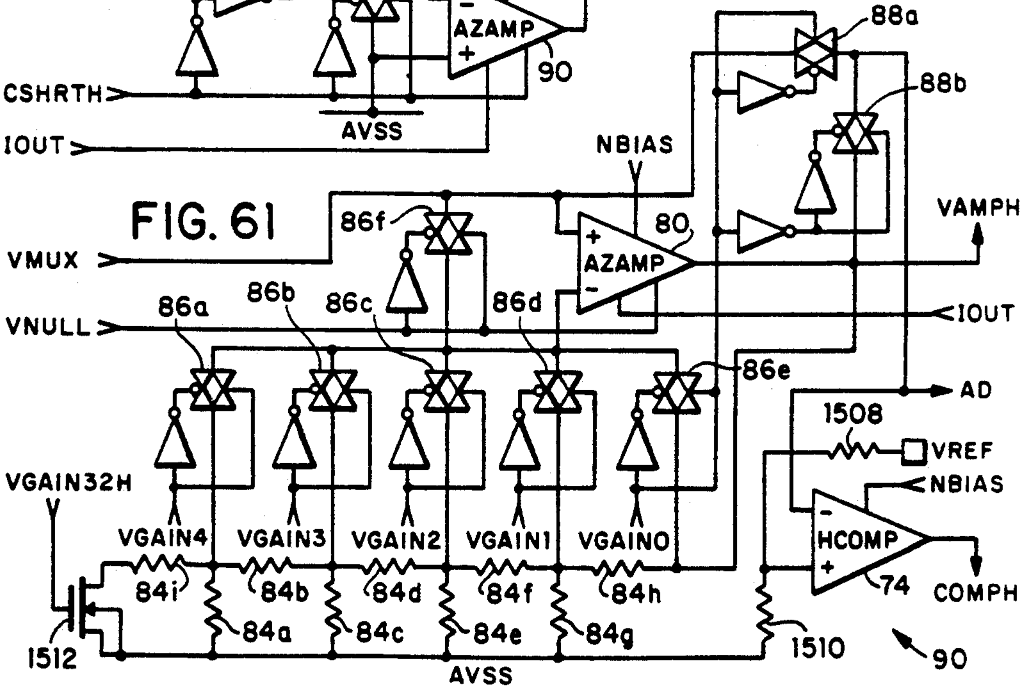

PROCESS FOR AUTO CALIBRATION OF A MICROPROCESSOR BASED OVERCURRENT PROTECTIVE DEVICE AND APPARATUS

This application is a continuation of application Ser. No. 07/636,000 filed Dec. 28, 1990, now abandoned.

CROSS REFERENCE TO RELATED APPLICATIONS

The subject matter of this invention is related to subject matter disclosed and claimed in the following concurrently filed copending applications:

U.S. application Ser. No. 636,643, entitled "SURE-CHIP", by J. C. Schlotterer, still pending.

U.S. application Ser. No. 636,870, entitled "A Process for Offset Adjustment of a Microprocessor Based Overcurrent Protective Device and Apparatus", by Edward C. Prather, now U.S. Pat. No. 5,251,157.

U.S. application Ser. No. 635,720, entitled "Voltage Controlled Power Supply", by Marlan L. Winter and Mark E. Innes, now abandoned.

BACKGROUND OF THE INVENTION

Various electrical apparatus such as circuit breakers, motor controllers, monitors, motor starters have many common features. Microprocessor-based overcurrent protection devices such as circuit breakers and motor overload relays must measure electrical current and then produce a time-to-trip versus current characteristic curve should the current be above a preset value. Basically, these apparatus rely upon sensing electrical variables such as line to neutral voltage, line-to-line voltage, phase current, frequency and the like as inputs, either alone or in combination, for ultimately causing a desirable electrical function to occur. For instance, circuit breakers sense electrical current and open upon the occurrence of a predetermined amount. Motor controllers are utilized to start motors to relay information about the status of the motor from one station to another, etc. Monitors provide readout information about the status of line currents, voltages, power, frequency, etc. The state of the art has advanced to a position where the aforementioned may provide current, voltage, power, and frequency information, etc. to a printed circuit card which may have surface mounted components, discrete components, transformers, inductors, capacitors, operational comparators and all of the appropriate interconnecting paths as well as personal computer printed circuit (PC) devices such as communication networks, analog-to-digital (A-to-D) converters, counters, etc. disposed thereupon. In many applications, microprocessors having random access memories (RAM) and electrically erasable programmable read only memories (EEPROM) are also included. Part or all of these may be contained in large scale integrated circuits or combinations of large scale integrated circuits and discrete components. Many of the aforementioned contained potentiometer devices such as three-point or two-point variable resistors, variable capacitors, adjustable operational comparators, etc.

It has long been recognized that in order for any of the devices or apparatus described previously to operate reliably and accurately, it is necessary for the sensing transformers, internal circuit board components, large scale integrated circuits, etc. to accurately depict and react to the basic circuitry and at output devices such as readout devices, circuit breaker tripping devices, relaying devices, those variables which are monitored or read. For example, the measurement of current usually requires a calibration procedure as the "as built" accuracy of circuitry used to convert the analog current values to digital values usually is not precise enough. For instance, if a circuit breaker is programmed to trip at a specific period of time at 10 amperes, for example, and if in fact 10 amperes of current are flowing in the line to be protected but gain adjustment and offset factors within the circuitry make it appear that only 9.9 amperes of current are flowing, then an error exists which could lead to catastrophic consequences. In the past, provision has been made for eliminating the error by placing the device in question in a calibration mode whereby a precision value of a desired variable is provided as a sensed input to the system and various potentiometers, offset adjustment devices and the like are manipulated or "tweaked" at the end of the production process so that desirable occurrences happen at the exact value of input variable at which they are supposed to happen. Generally, after this has been completed, a protective coating of material, a "conformal coating", is placed over the adjustment devices so that they may not be tampered with by subsequent purchasers, users, etc. This leads to a number of disadvantages or problems. One disadvantage lies in the fact that the process is highly labor intensive and furthermore requires a great deal of judgement, experience and perhaps even dexterity on the part of the calibrator or adjustor. Furthermore, in some instances where a microprocessor is employed, a resistive-capacitive network rather than a crystal oscillator may be utilized for determining the microprocessor's time base. In sensitive applications, this time base accuracy may not be sufficient. In addition, problems can arise if the board to be calibrated is small.

Two areas in which calibration problems are likely to arise are associated with analog sampling systems that require "gain" and exhibit "offset". Conventional calibration procedures with the use of trim pots and component selection are not only expensive but can be difficult to implement, especially if the board is very small and/or has been conformal coated. Ideally the trip unit should be calibrated without physically modifying the printed circuit board. Gain adjustments are required for precision circuits requiring operational comparators to magnify or attenuate a signal before being processed by an analog-to-digital converter. Offset adjustments are made to remove errors caused by DC biasing currents existing in a circuit. Those offsets could be present on the input signals or generated by operational comparators in the circuit. Gain adjustment is usually made by imposing a multiplying factor on a signal whereas offset adjustment is made by adding or subtracting a constant to or from the signal being processed. U.S. Pat. No. 4,550,360 issued on Oct. 29, 1985 to J. J. Dougherty, entitled "Circuit Breaker Static Trip Unit Having Automatic Circuit Trimming", teaches one way to overcome problems associated with the prior art. The Dougherty patent describes the use of a microprocessor and selected input values to correct for gain and offset. However, emphasis is directed to correction for individual components or a class thereof within the system. It requires testing individual components or classes of individual components using different inputs such as, for example, full scale current for current transformers and five milliamperes for a diode and then deriving a microprocessor memory correction value related thereto. However, it would be advantageous to be able to calibrate the entire system using only a single input where the calibration is related to the ultimate output value rather than to the individual values of components. It would be further advantageous to be able to achieve the foregoing without adding extra component elements to the system being calibrated and to do the calibration in a non-obtrusive manner. It can be seen, therefore, that the prior art mode for calibration has many disadvantages as described previously. It would be desirous therefore if an advantageous calibration procedure for apparatus could be found which was relatively inexpensive, required a minimum of human intervention, was highly accurate, highly reliable and as close to being automated as possible.

SUMMARY OF THE INVENTION

In accordance with the invention, a process for calculating a digital calibration factor for an electrical device of the type that acts in the presence of a predetermined value of an input electrical variable at the input of the electrical device to ultimately perform a function is claimed. An interactive calibration procedure is to be used which uses both a microprocessor in a product and an external computer PC to calculate and store calibration constants into nonvolatile memory within the product. Both an amplitude and time base calibration procedure are described. The common elements of the calibration procedure are as follows: 1) product microprocessor with analog signal processing circuitry, oscillator circuit and nonvolatile memory; 2) external computer PC with communication means to the product microprocessor as well as to an accurate current measuring reference; and 3) software for both computers which handles the communications protocol. The calibration factor is digitally stored in a calibration factor memory region of the electrical device. Any input electrical value within a range of input electrical values will provide a corresponding derived electrical value in the device. The process comprises the steps of supplying a first value of the input electrical variable to the input, sensing that input electrical variable, and producing a corresponding first derived value related thereto, communicating that first derived value to a computing means which also has the aforementioned first value of input electrical variable available thereto, calculating the calibration factor within the computing means according to the relationship: the calibration factor equals the first value of input electrical variable divided by the first derived value; and finally the step of communicating that calibration factor to the calibration factor memory region for digital placement therein and subsequent use by the electrical device for performing the function. The function may be performed when a derived value as affected by the calibration factor equals the predetermined variable.

An electrical device of the type that acts in the presence of a predetermined value of an input electrical variable having construction features which are capable of performing the process features described previously is also claimed.

BRIEF DESCRIPTION OF THE DRAWINGS

For a better understanding of the invention, reference is made to the preferred embodiment thereof, shown in the accompanying drawings in which:

FIG. 4 shows a top view of the apparatus of FIG. 1;

FIG. 5 shows a partially broken away front elevation of the apparatus of FIG. 1, with the communications module in an alternative arrangement on the bottom of the assembly;

Figure 17:
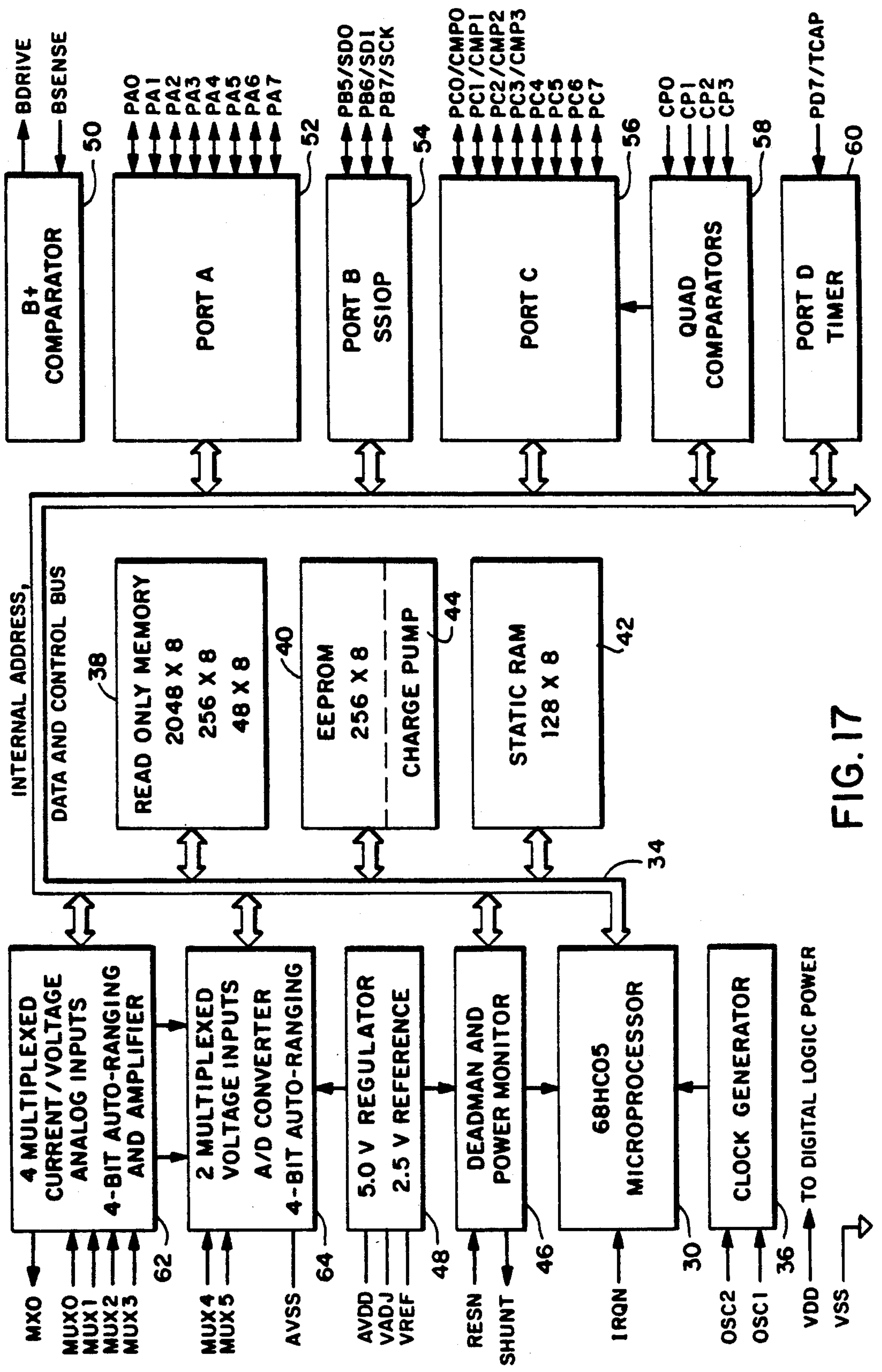
Figure 19A:
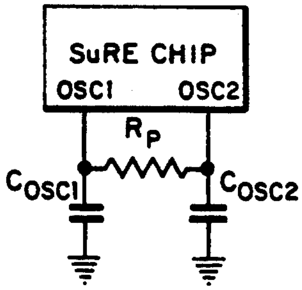
Figure 19B:
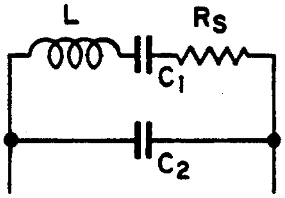
Figure 19C:
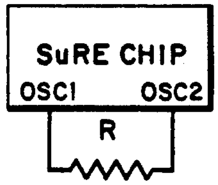
Figure 19D:
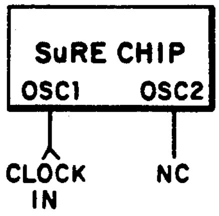
Figure 20:
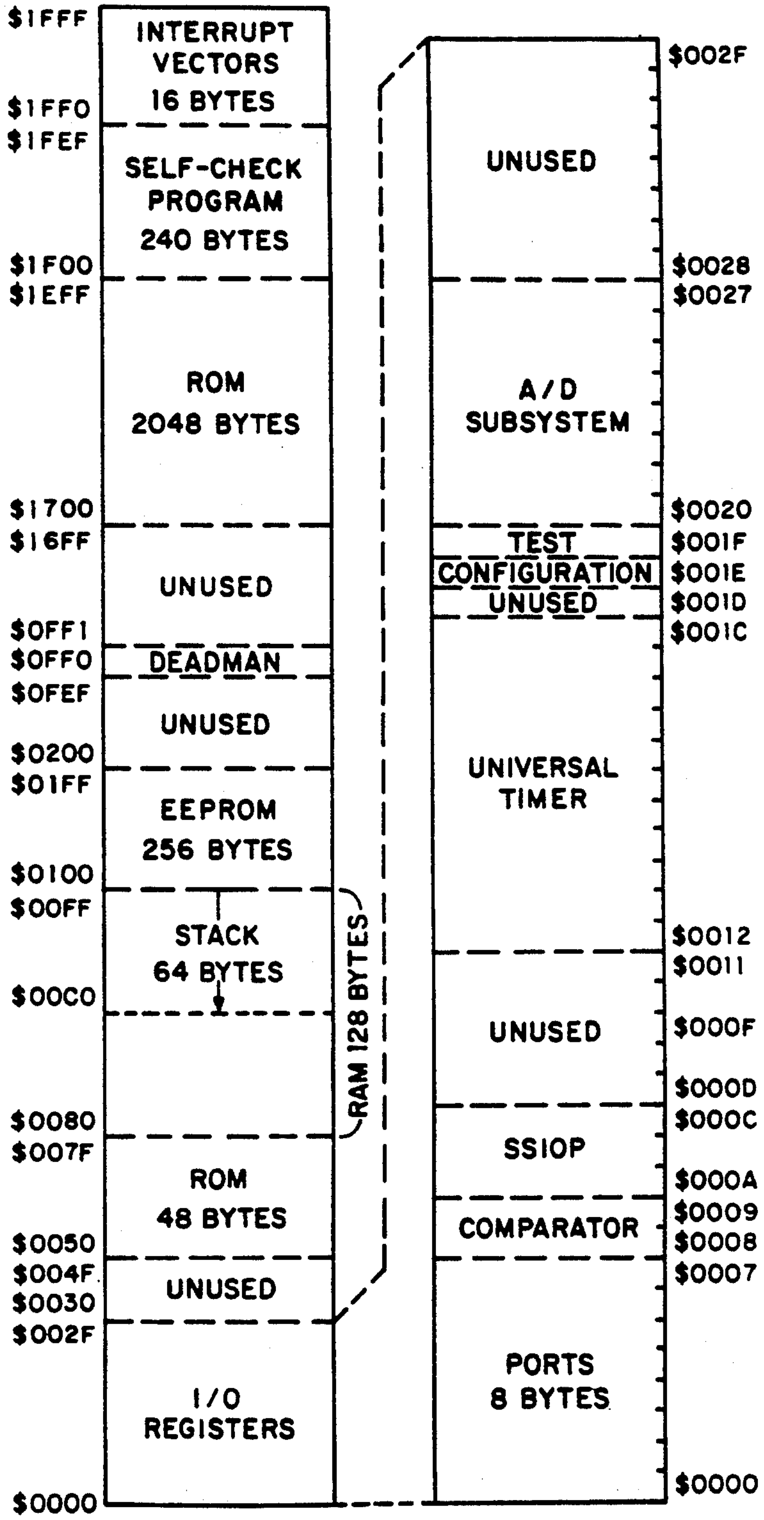
Figure 25:
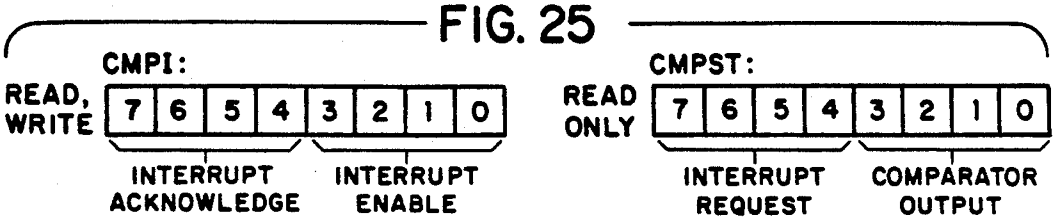
Figure 26:
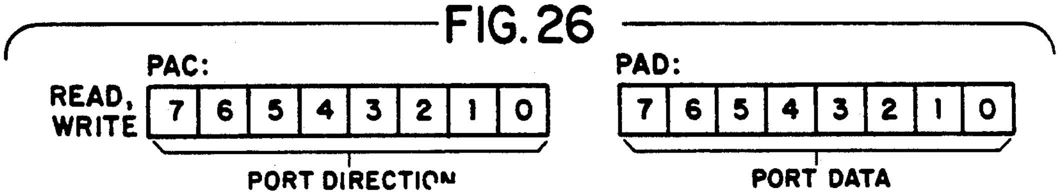
Figure 27:
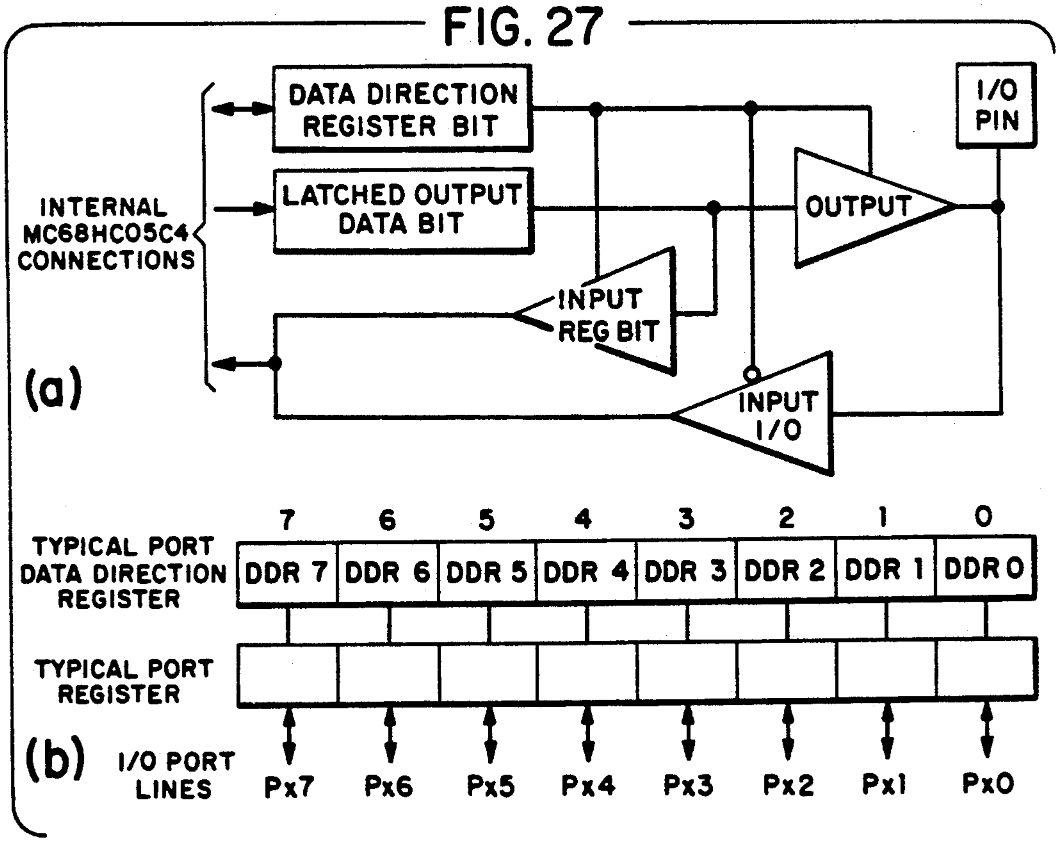
Figure 28:
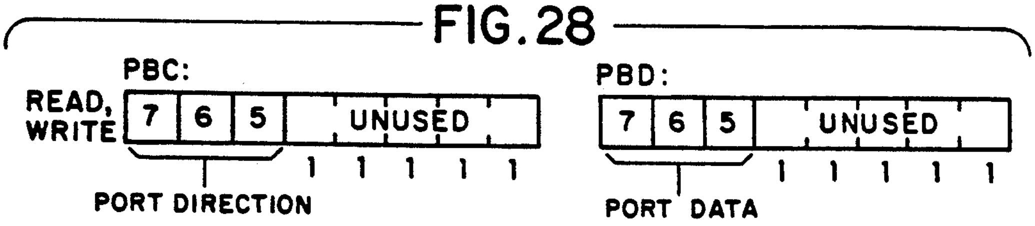
Figure 29:
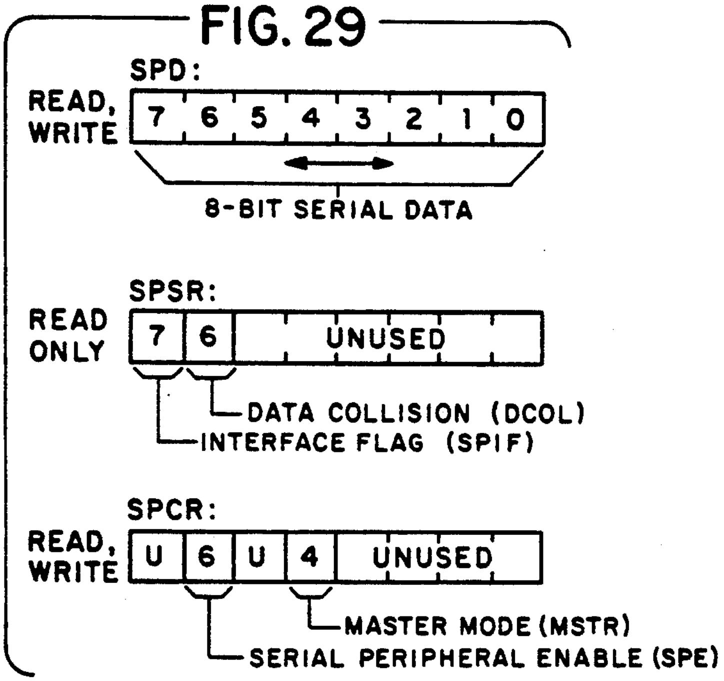
Figure 30:
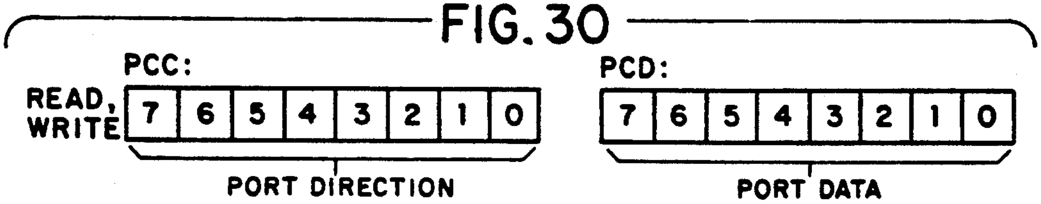
Figure 31:
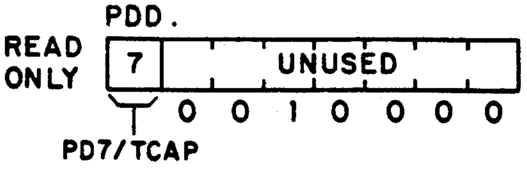
Figure 32:
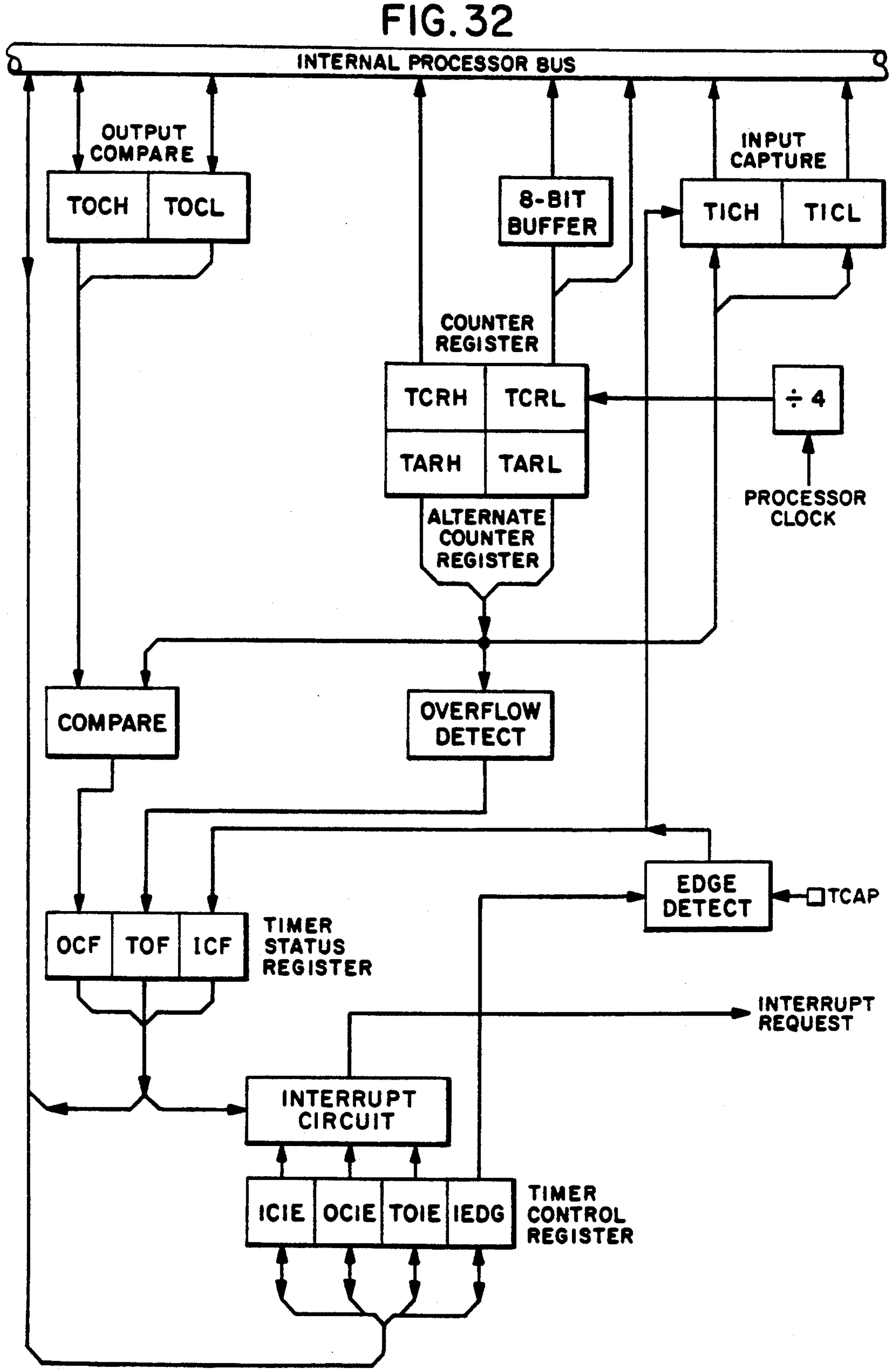
Figure 33A:
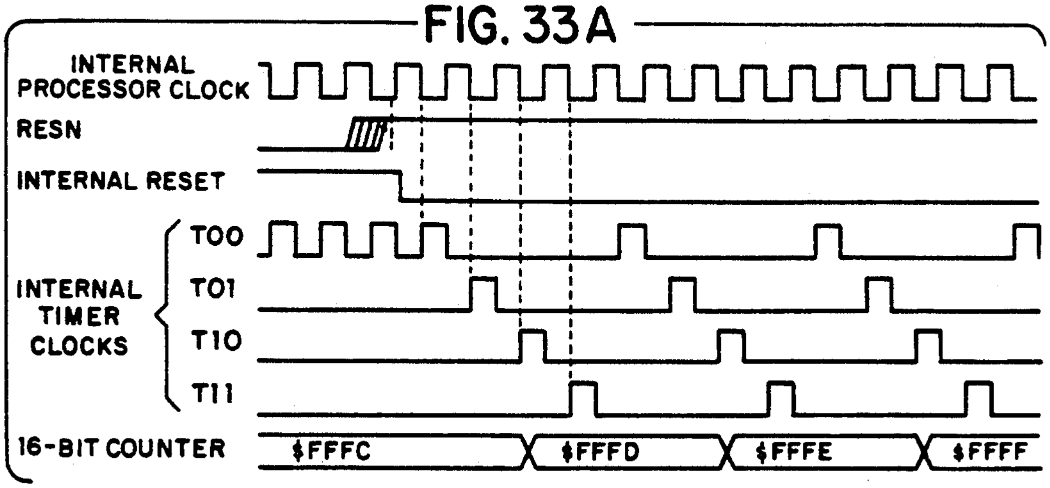
Figure 33B:
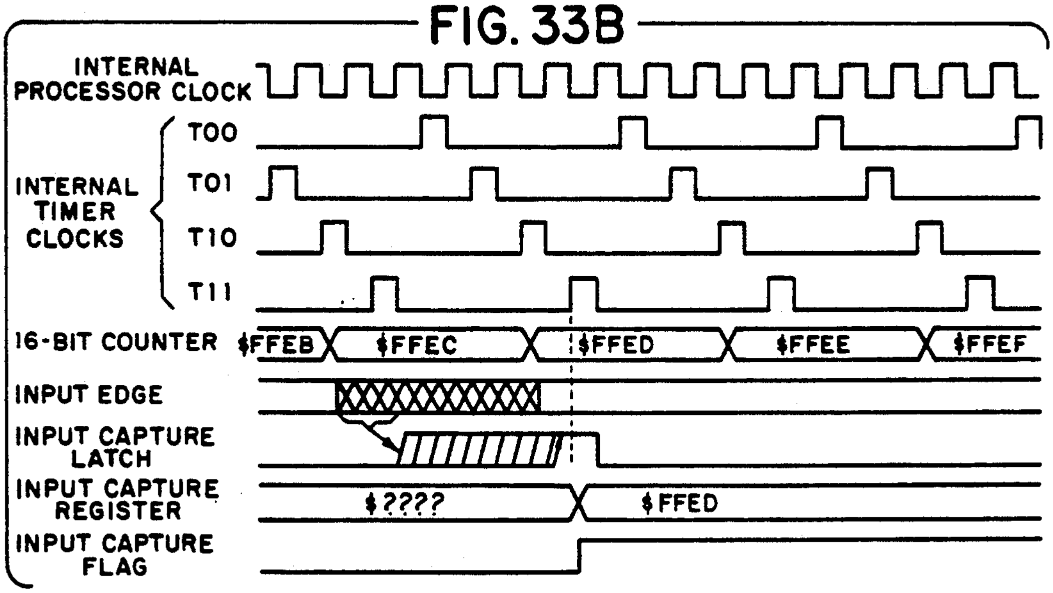
Figure 33C:
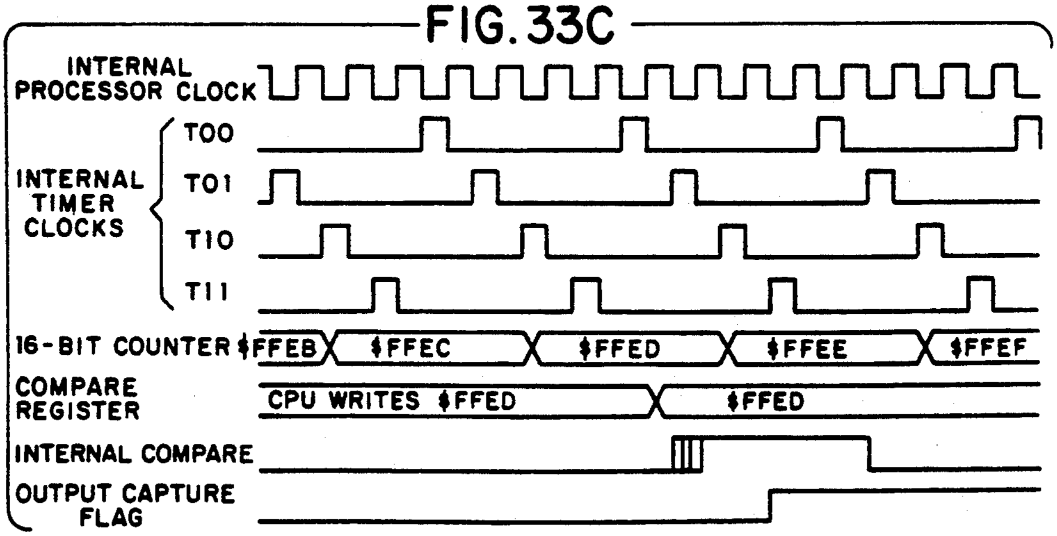
Figure 33D:
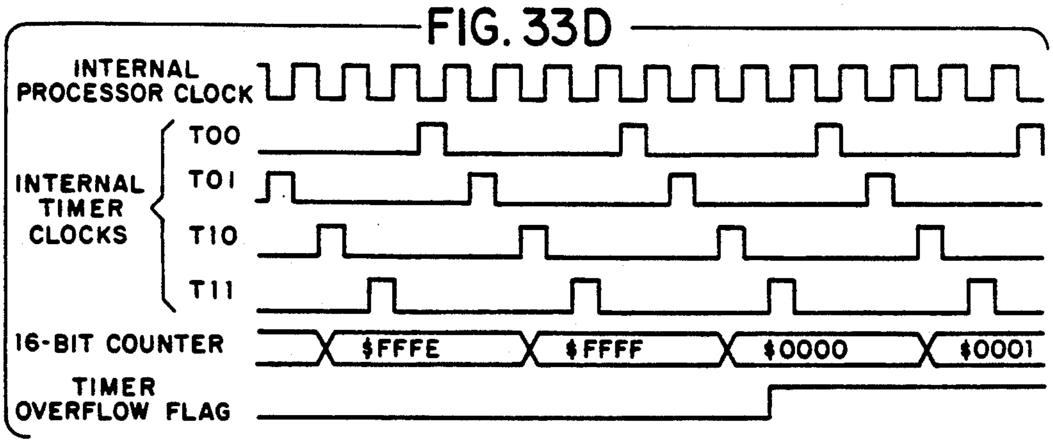
Figure 34:
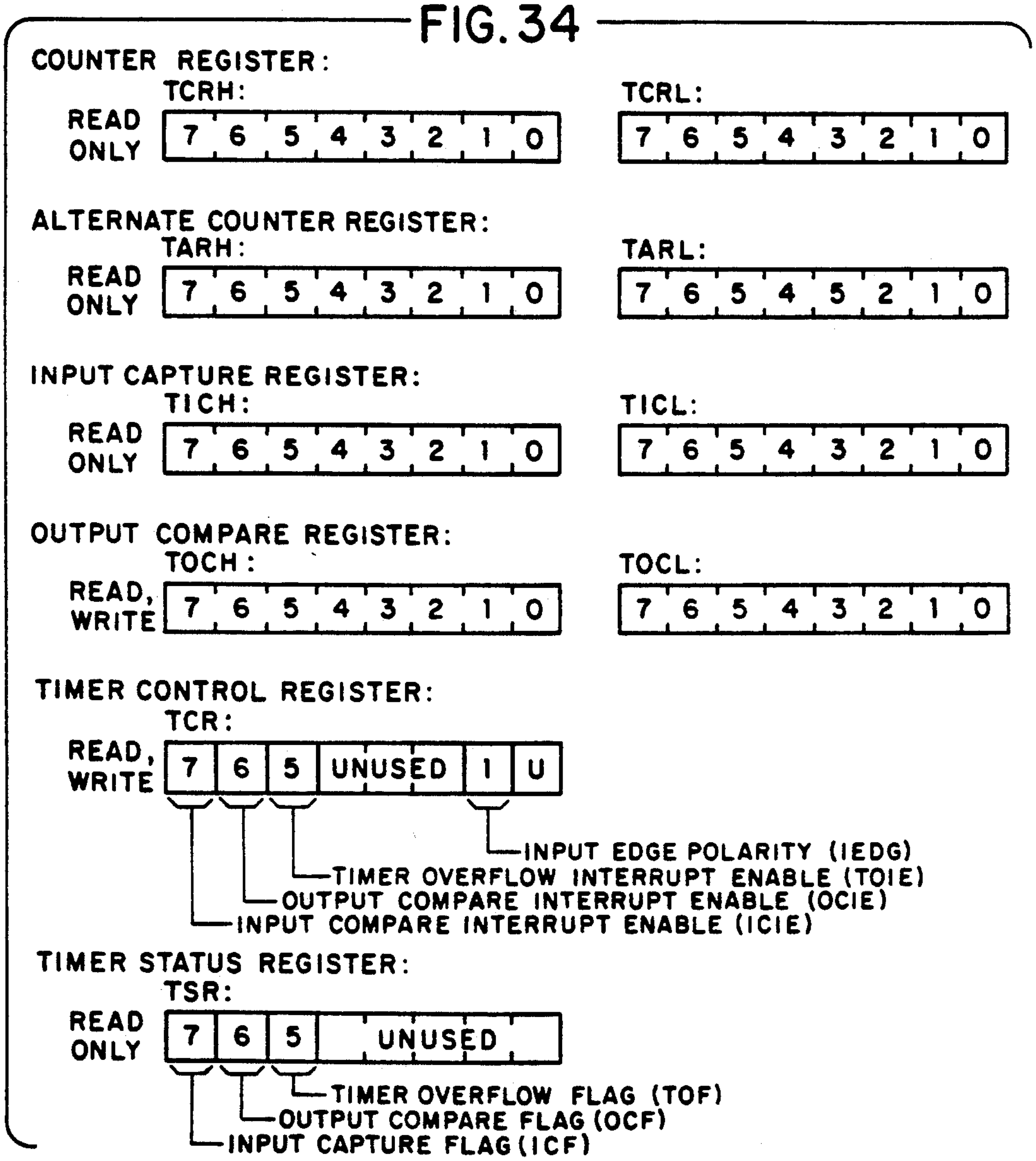
Figures 35, 37:
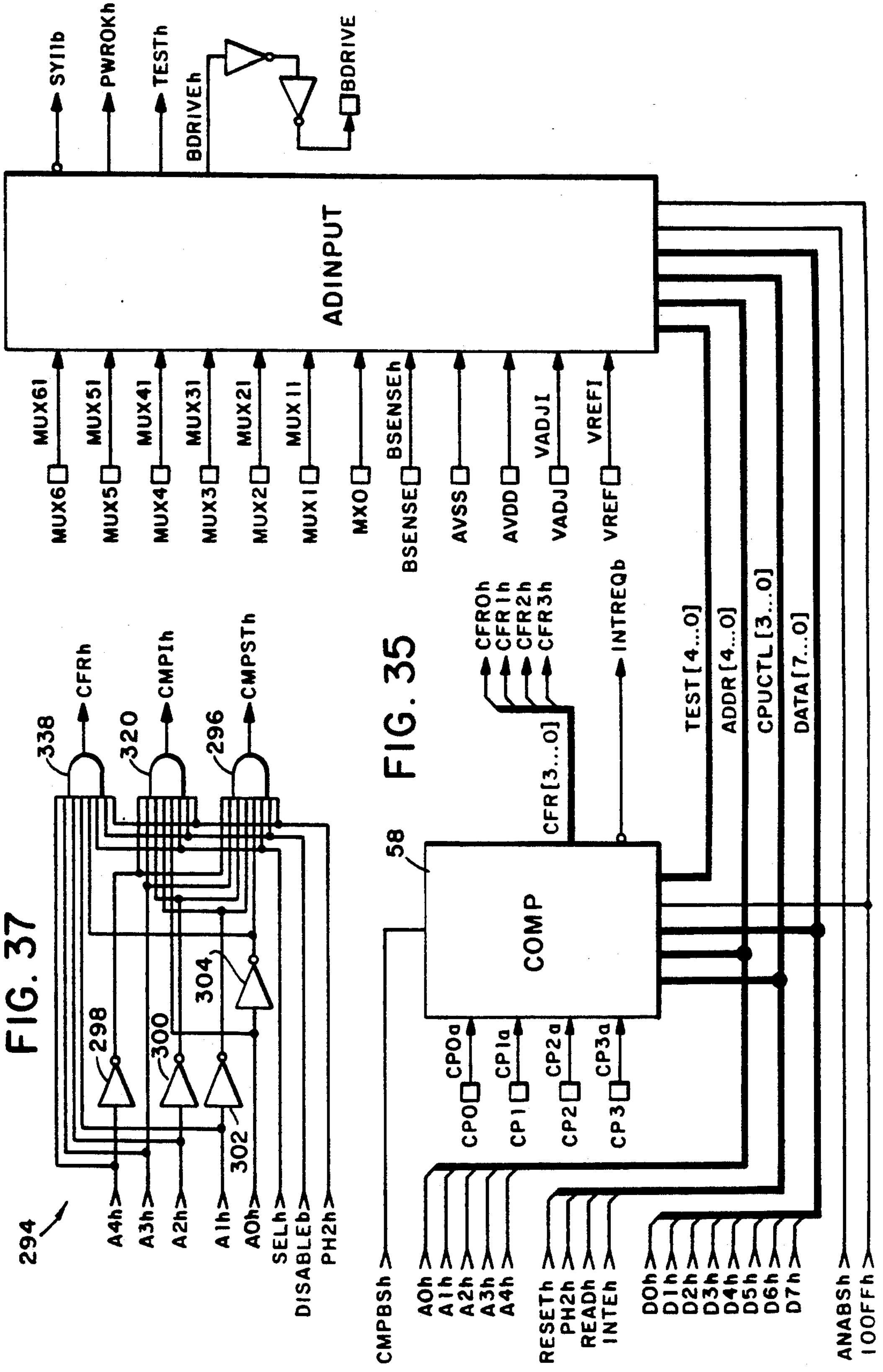
Figure 36:
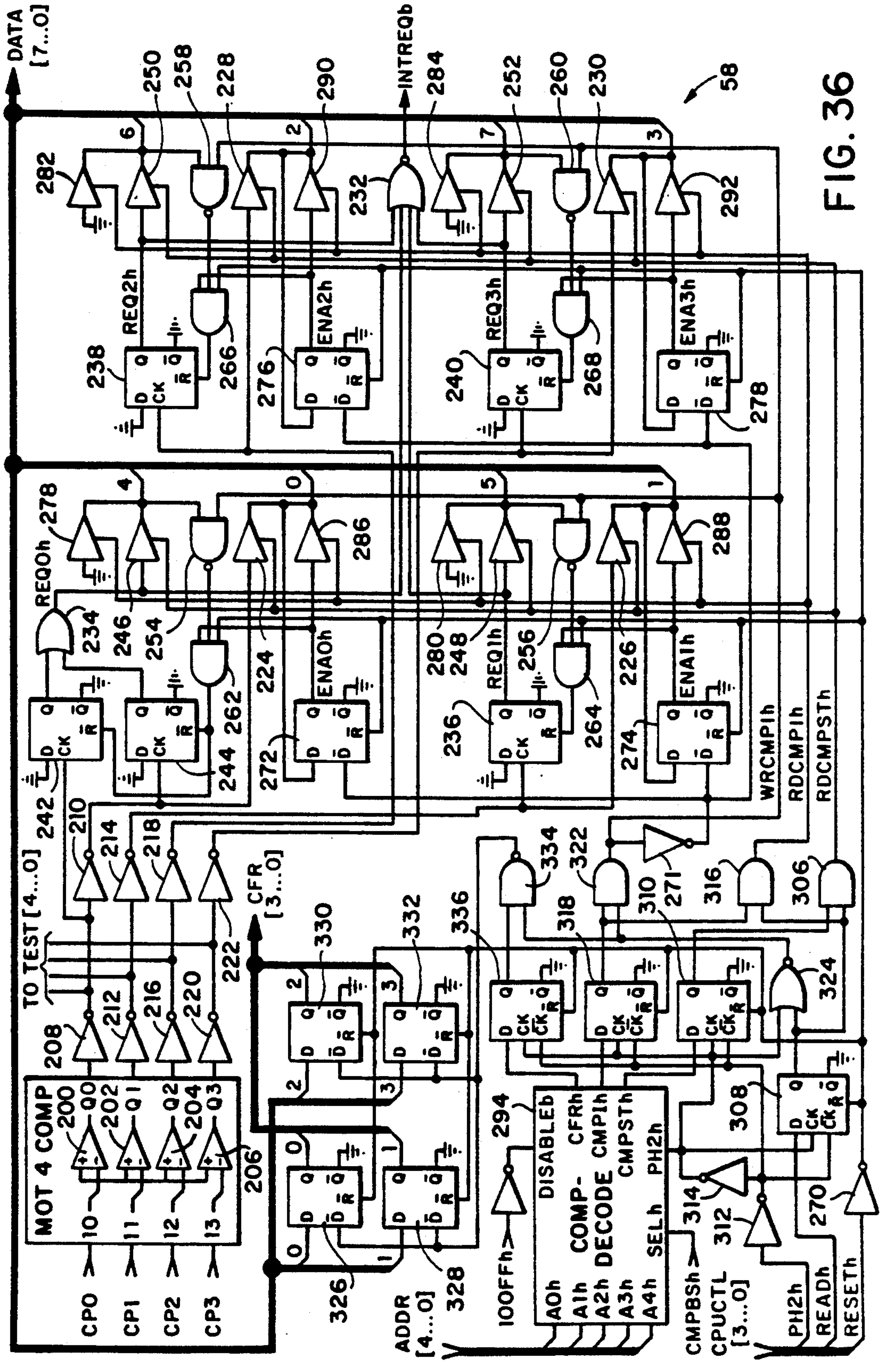
Figure 38:
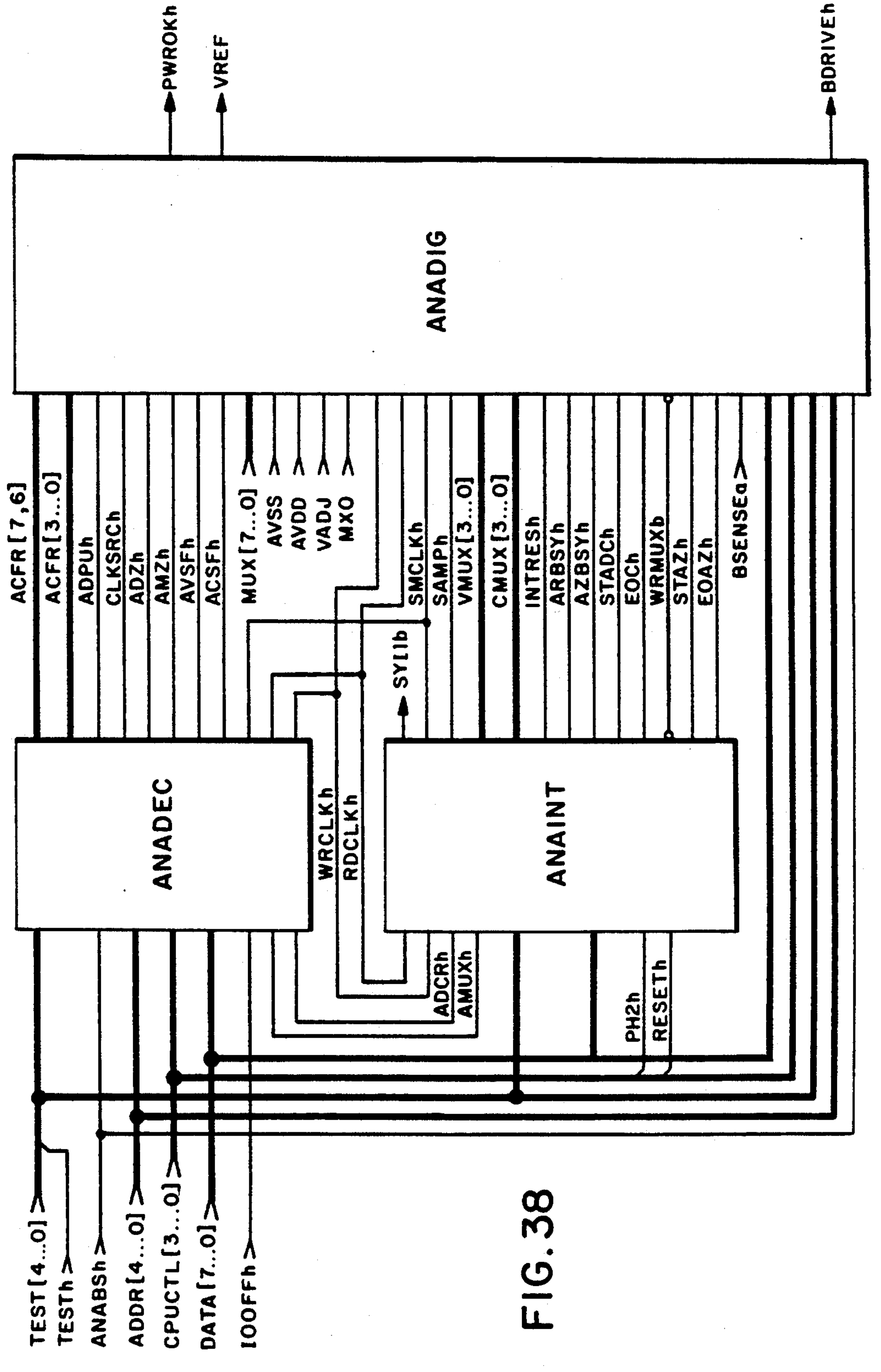
Figure 39:
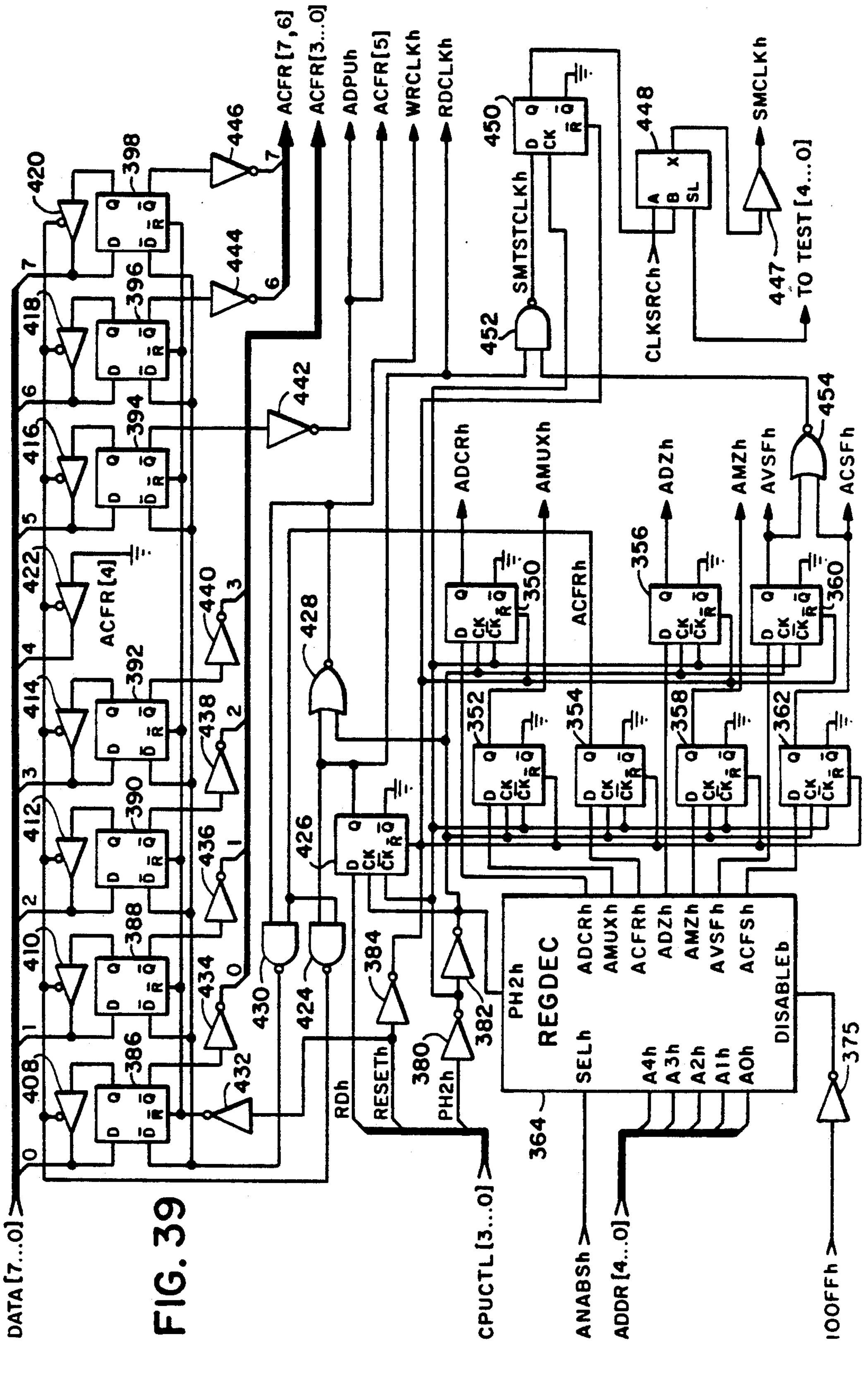
Figure 43:
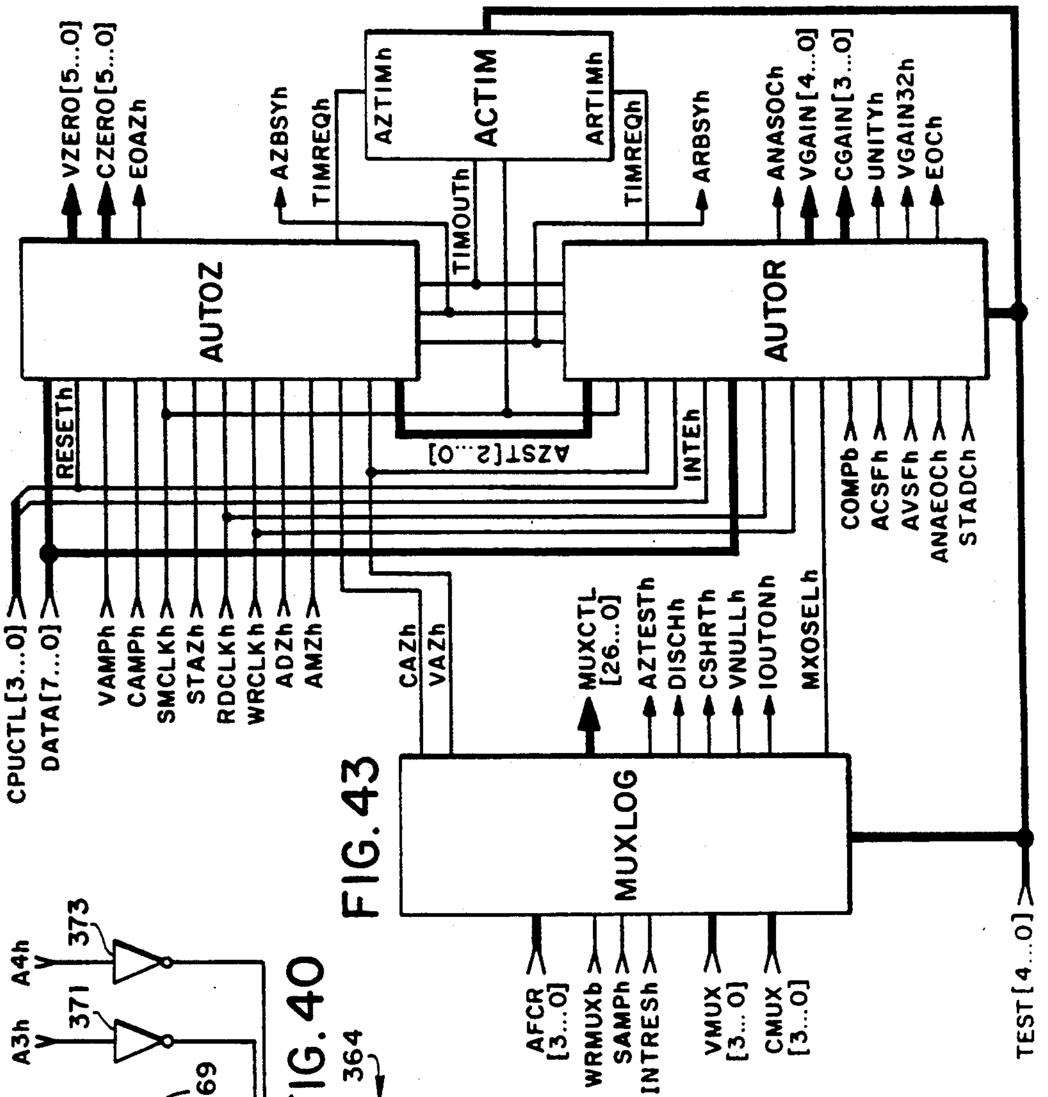
Figure 40:
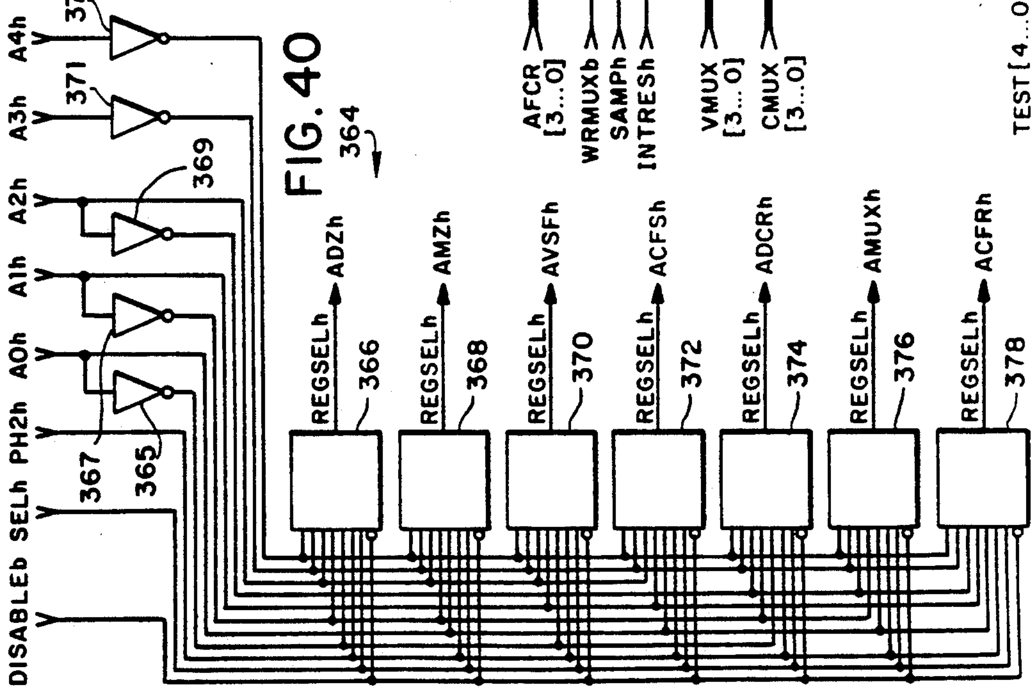
Figure 41:
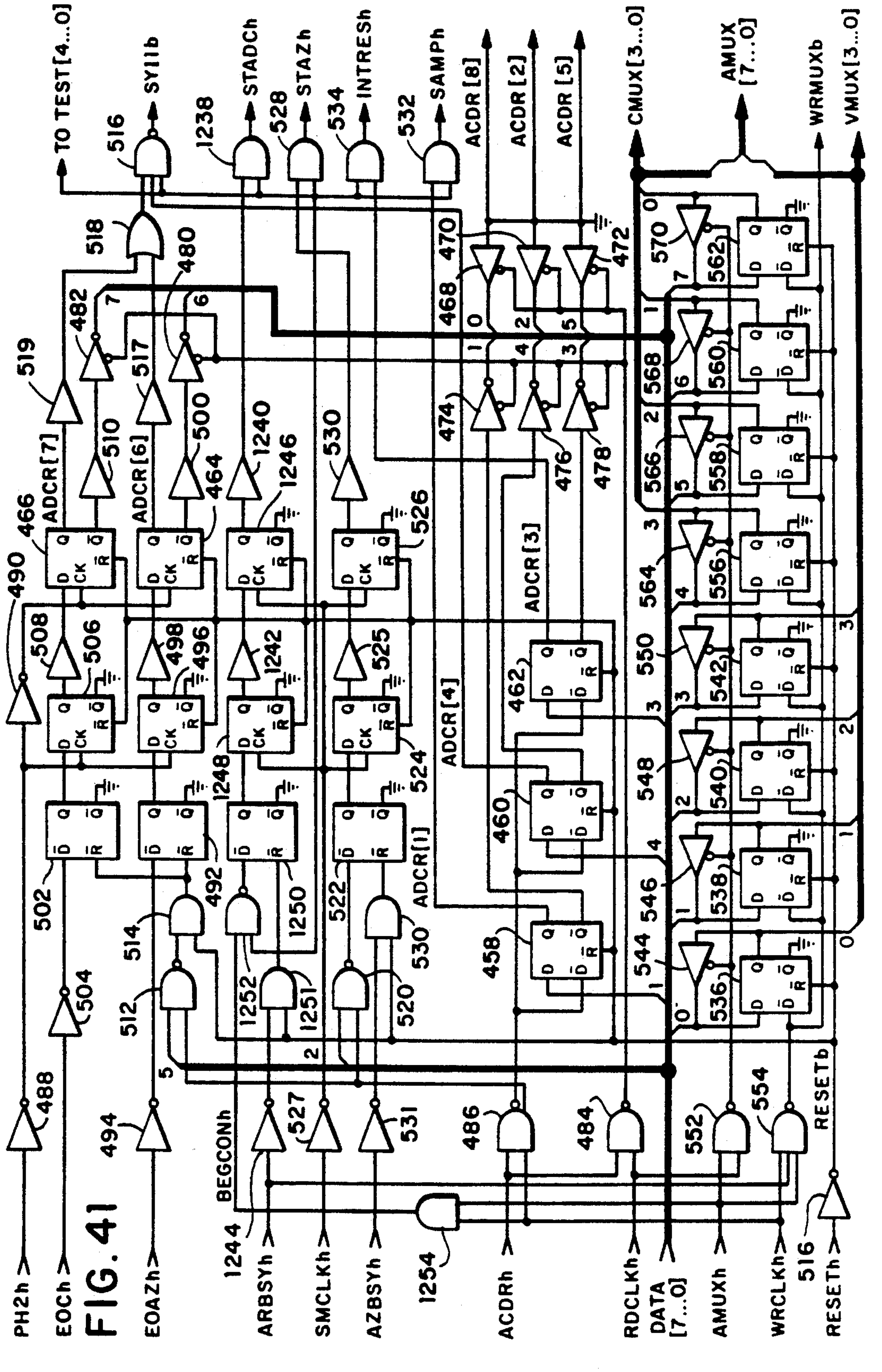
Figure 42:
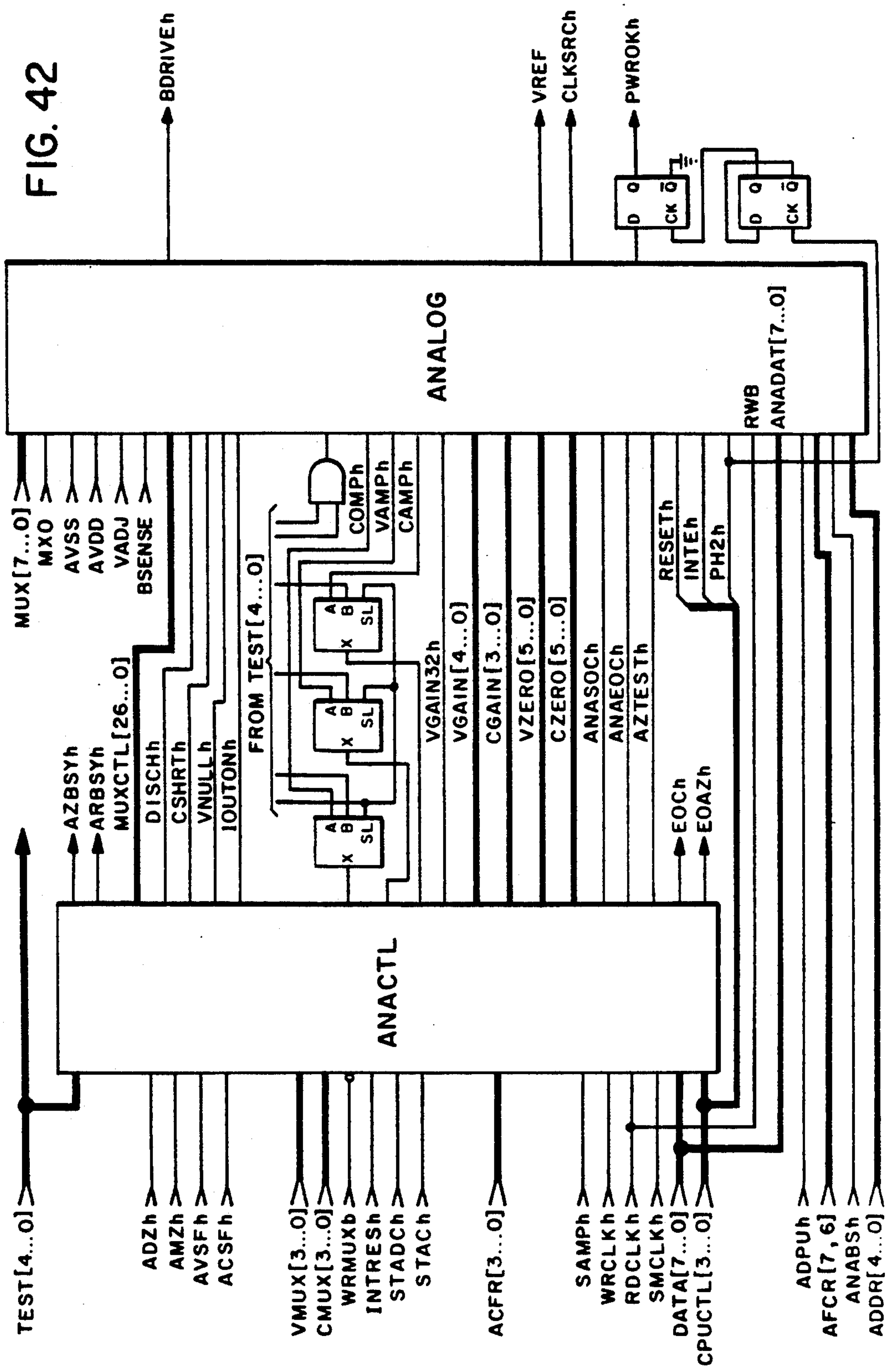
Figure 44:
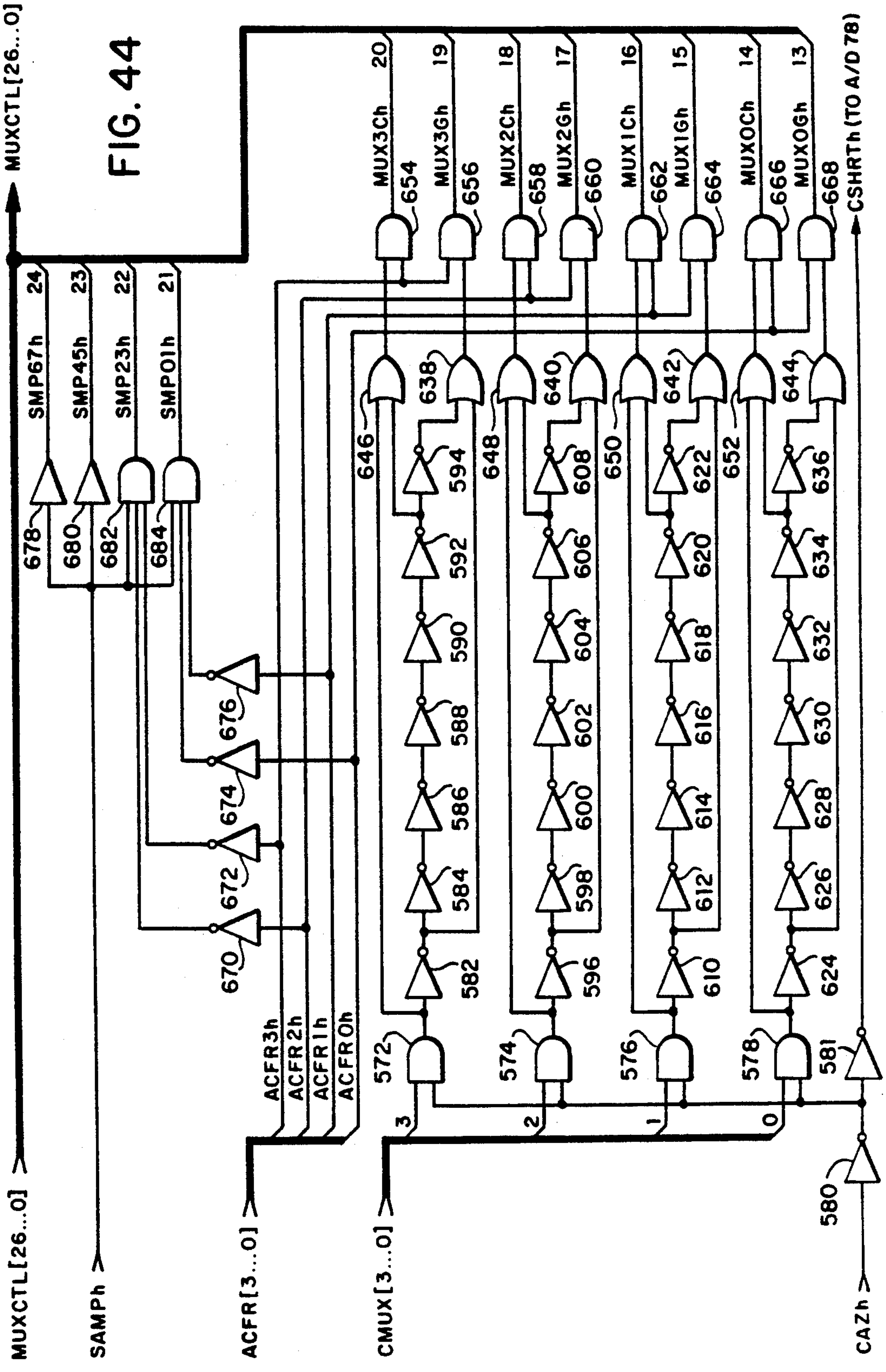
Figure 45:
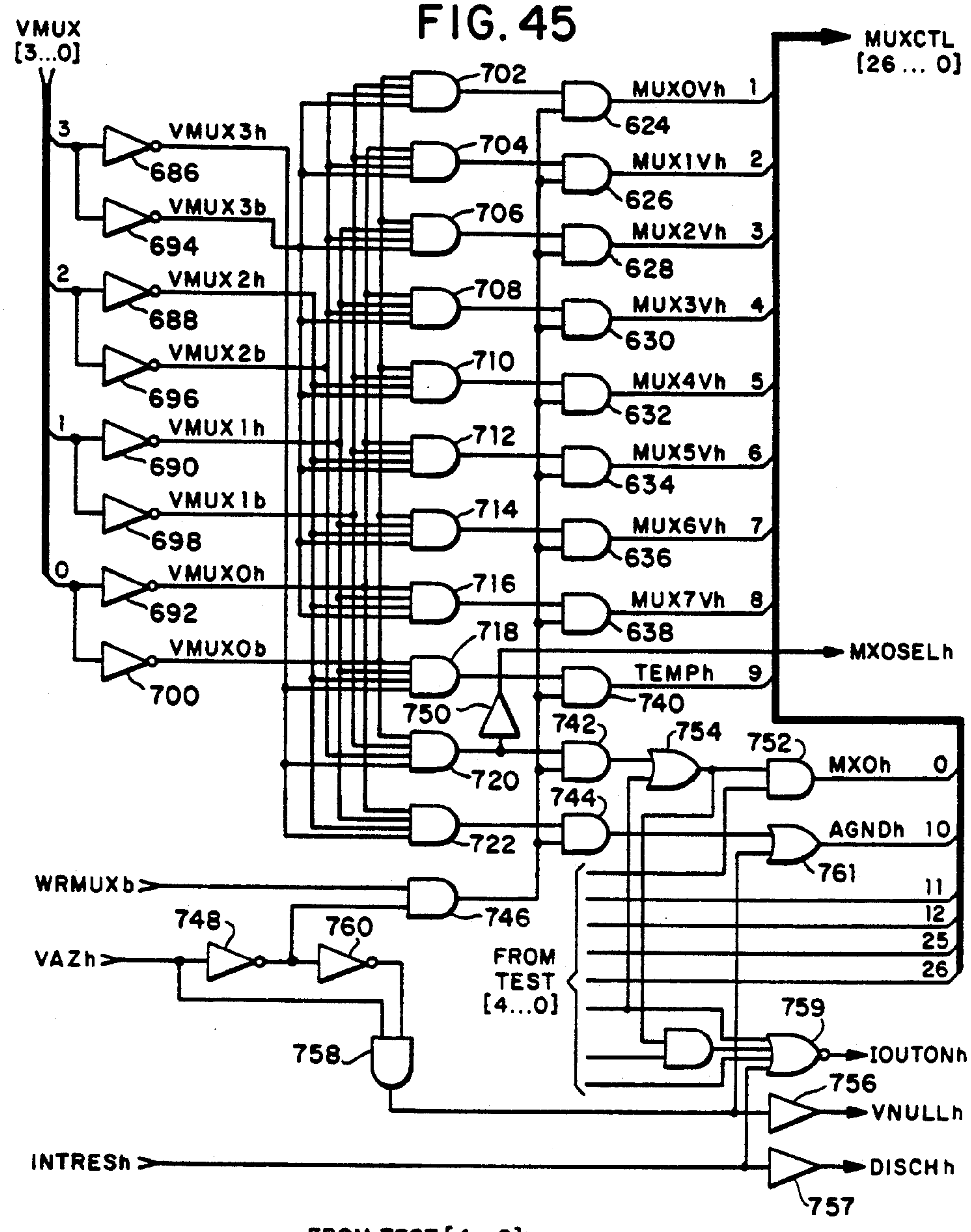
Figure 47:
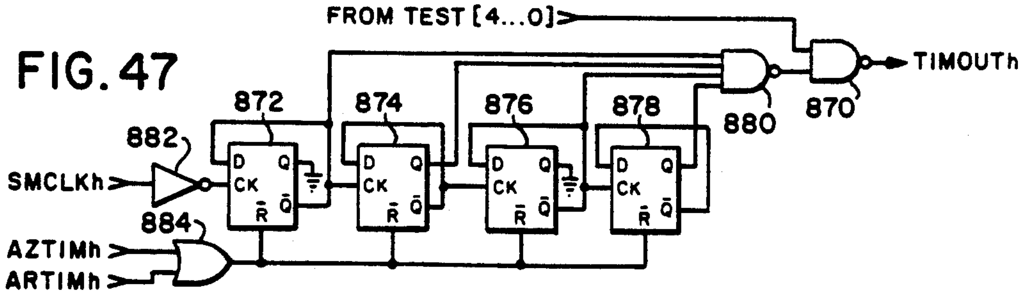
Figure 46:
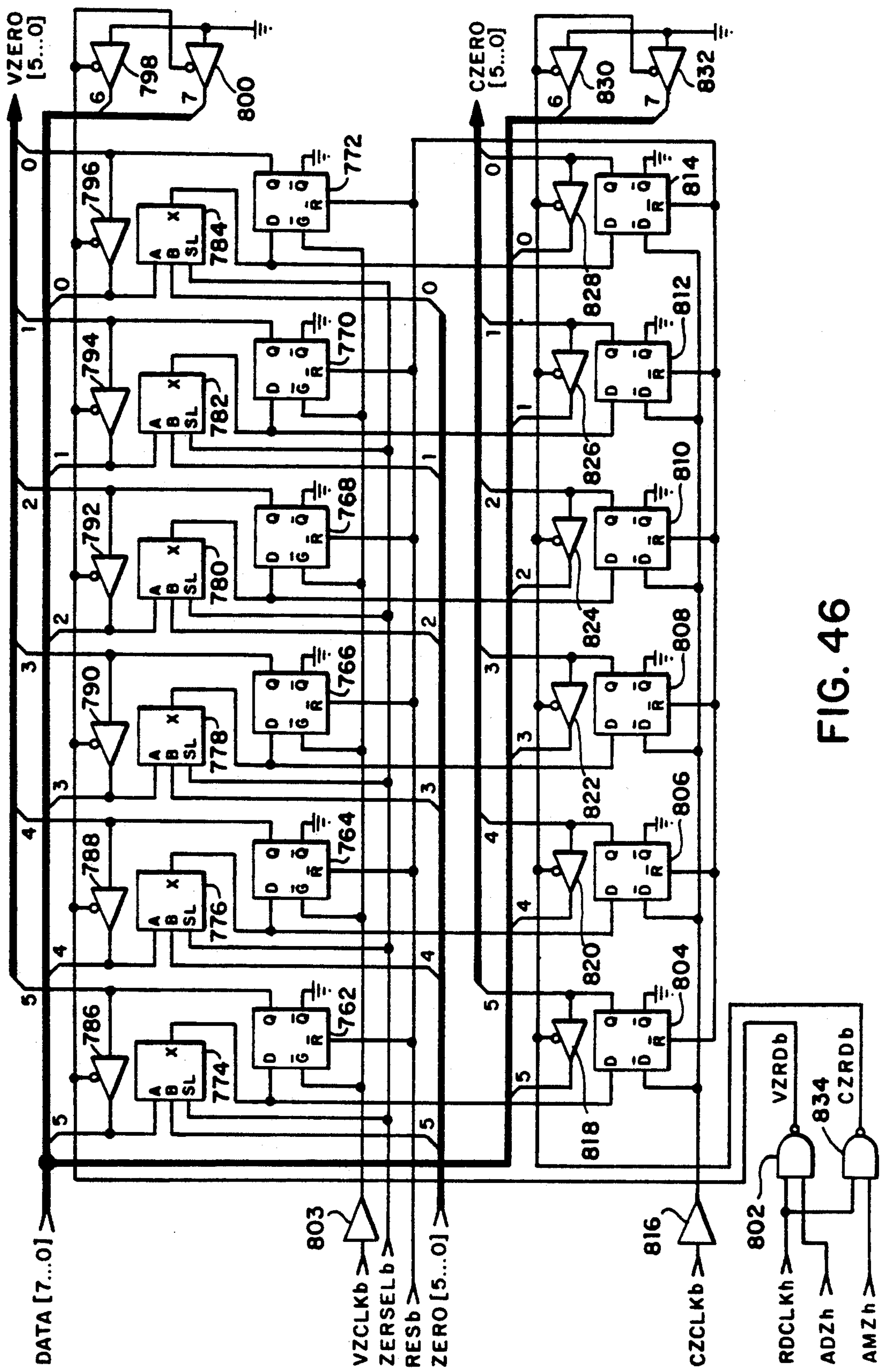
Figure 48:
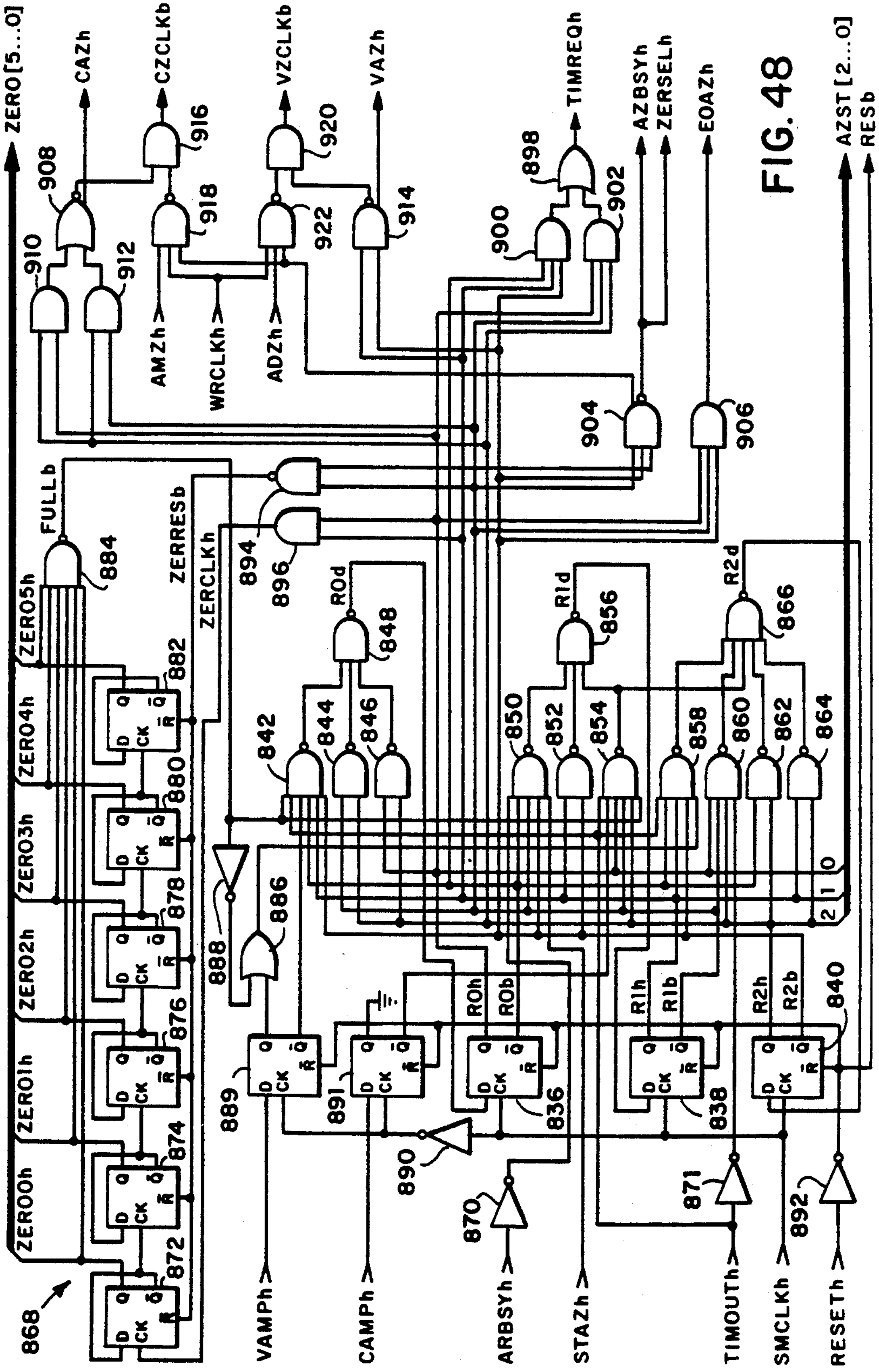
Figure 49:
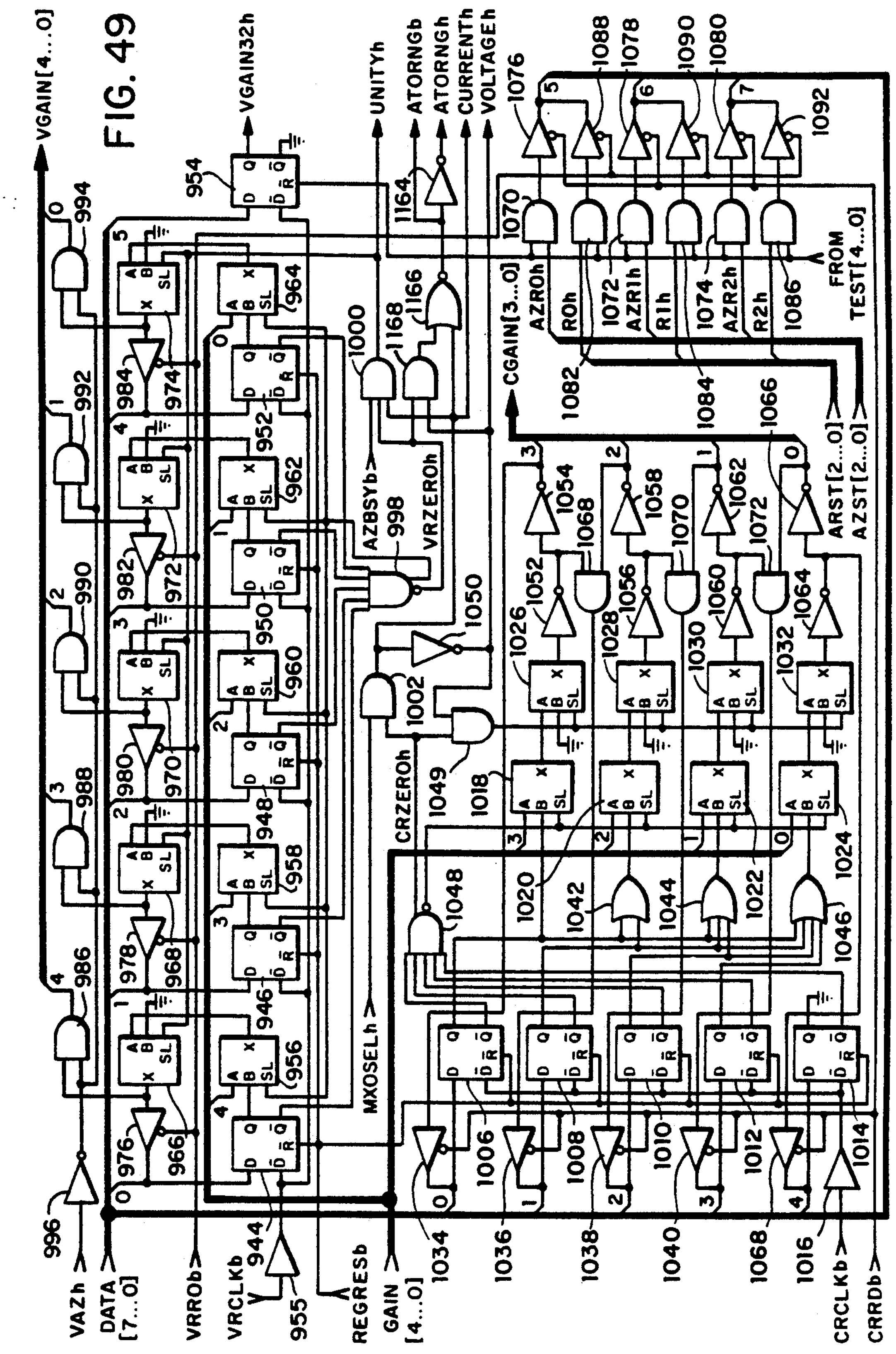
Figure 50:
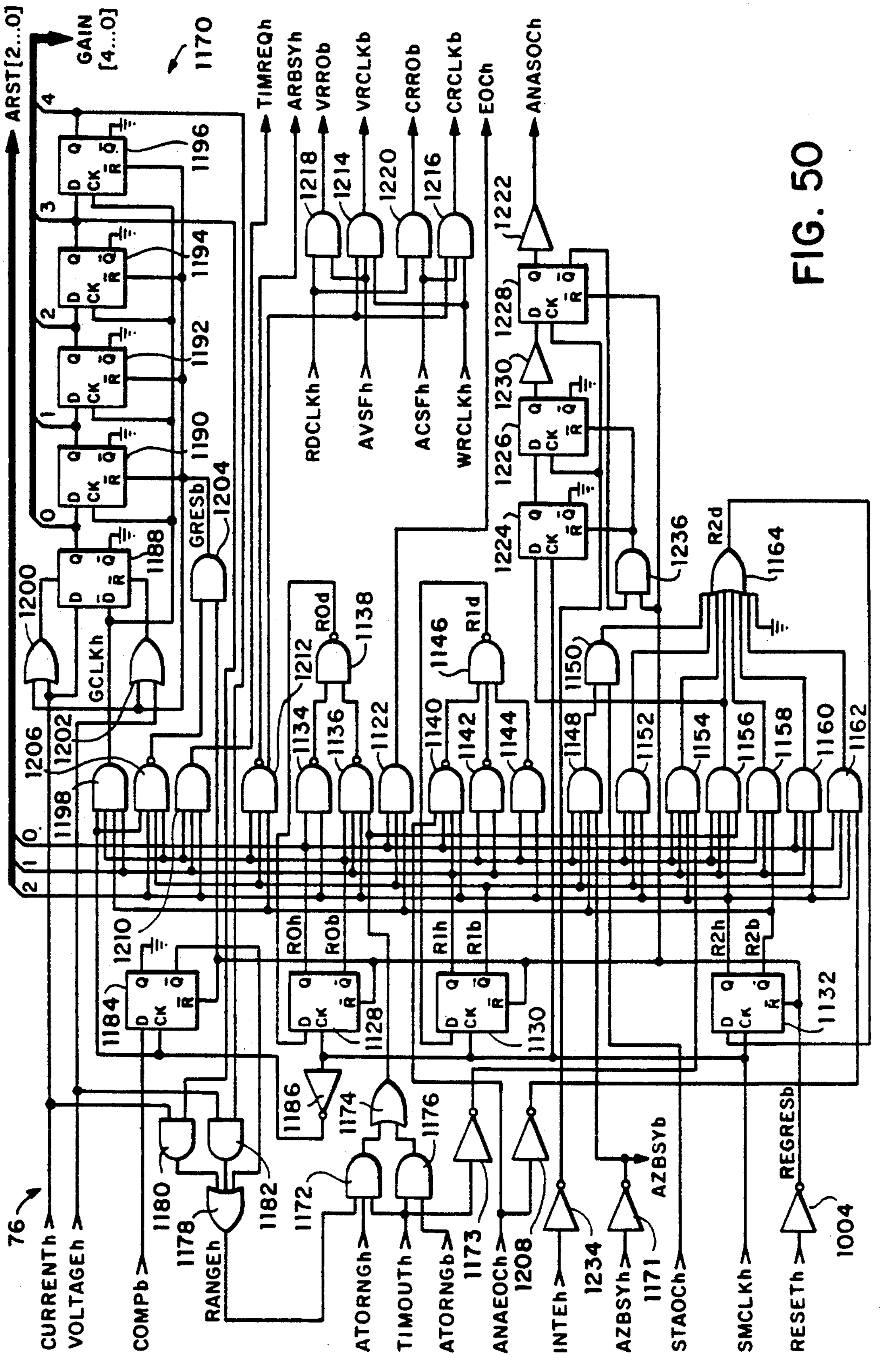
Figure 51:
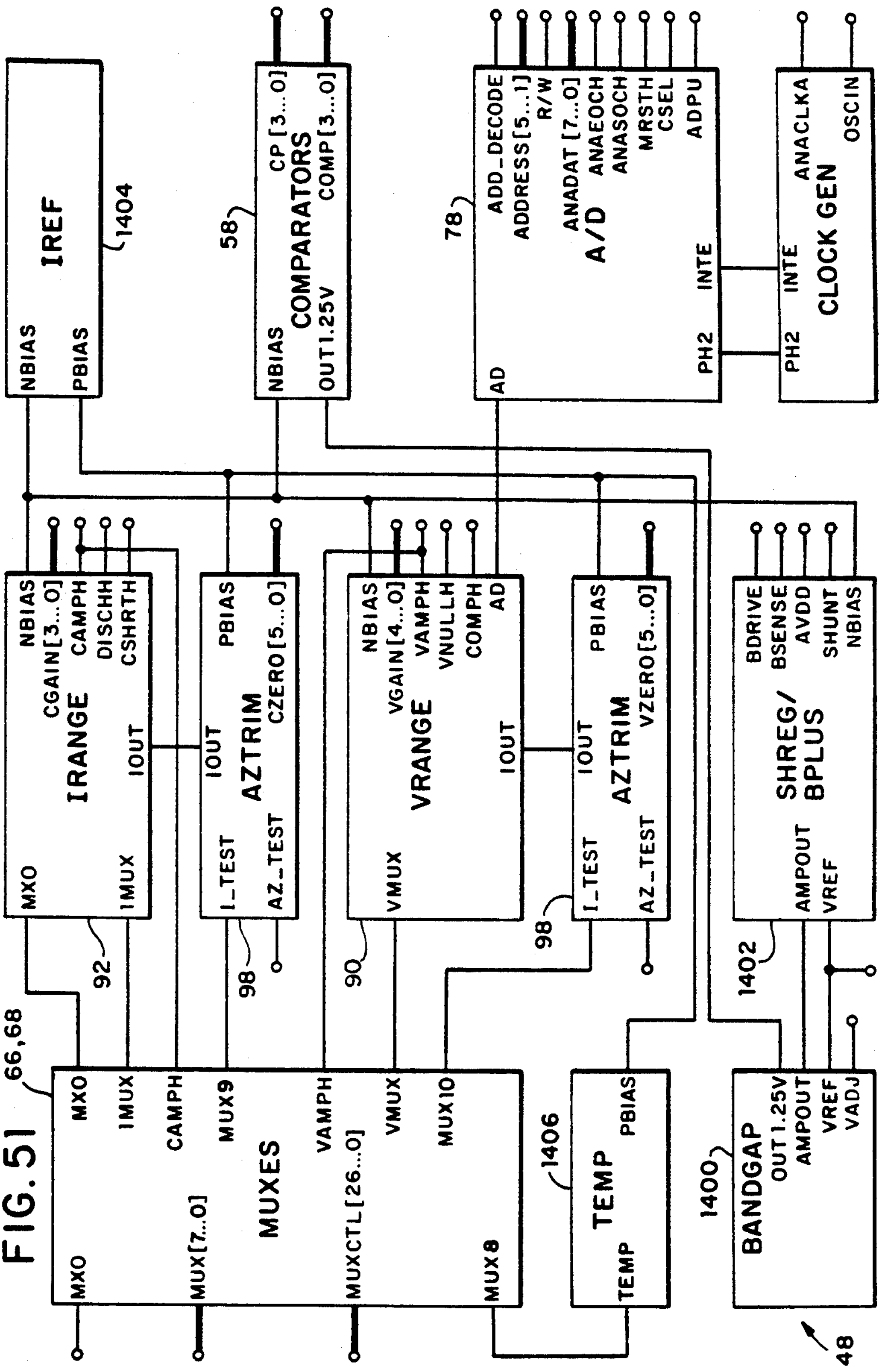
Figure 52:
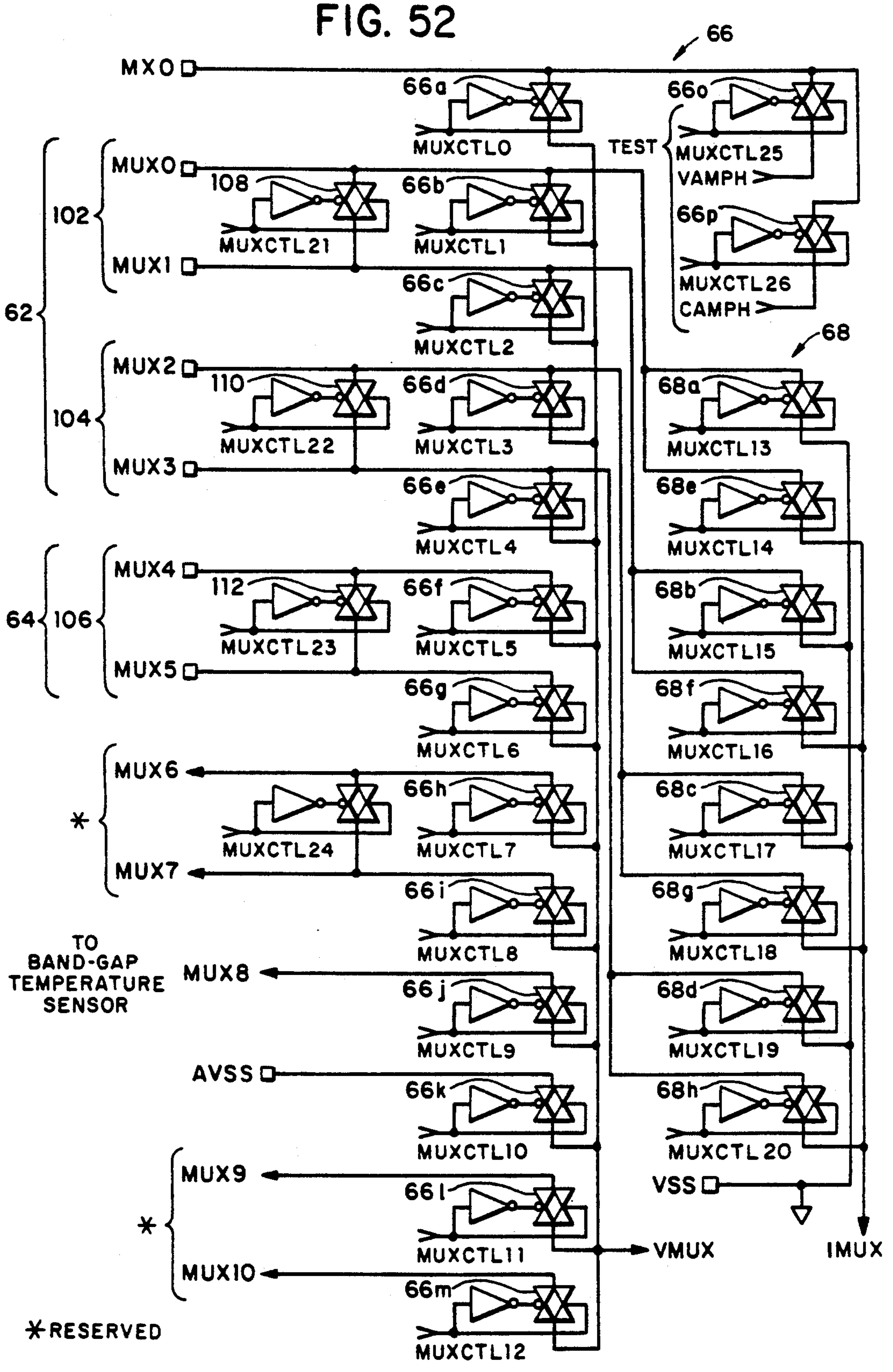
Figure 56:
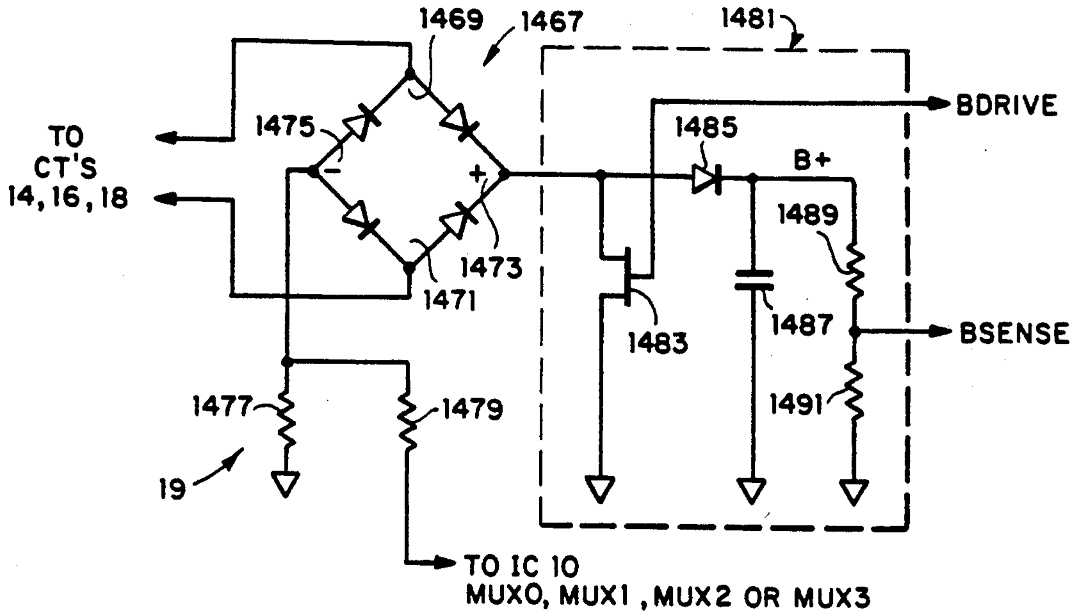
Figure 57:
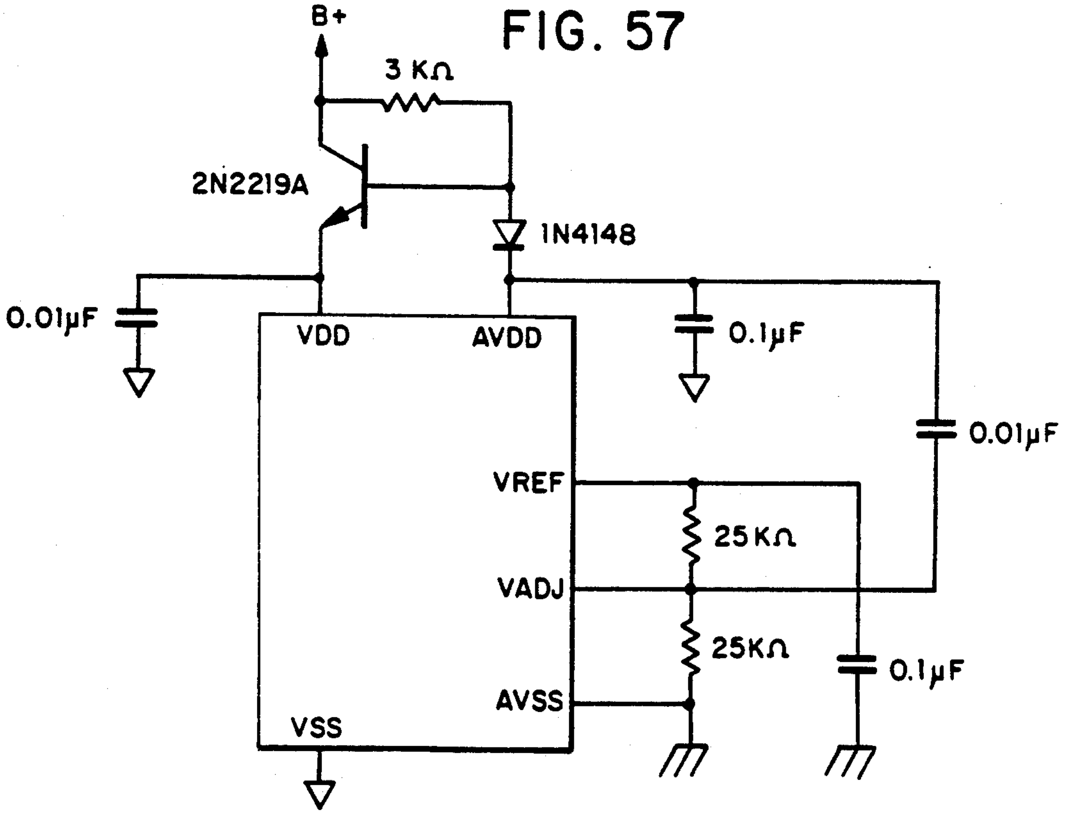
Figure 63:
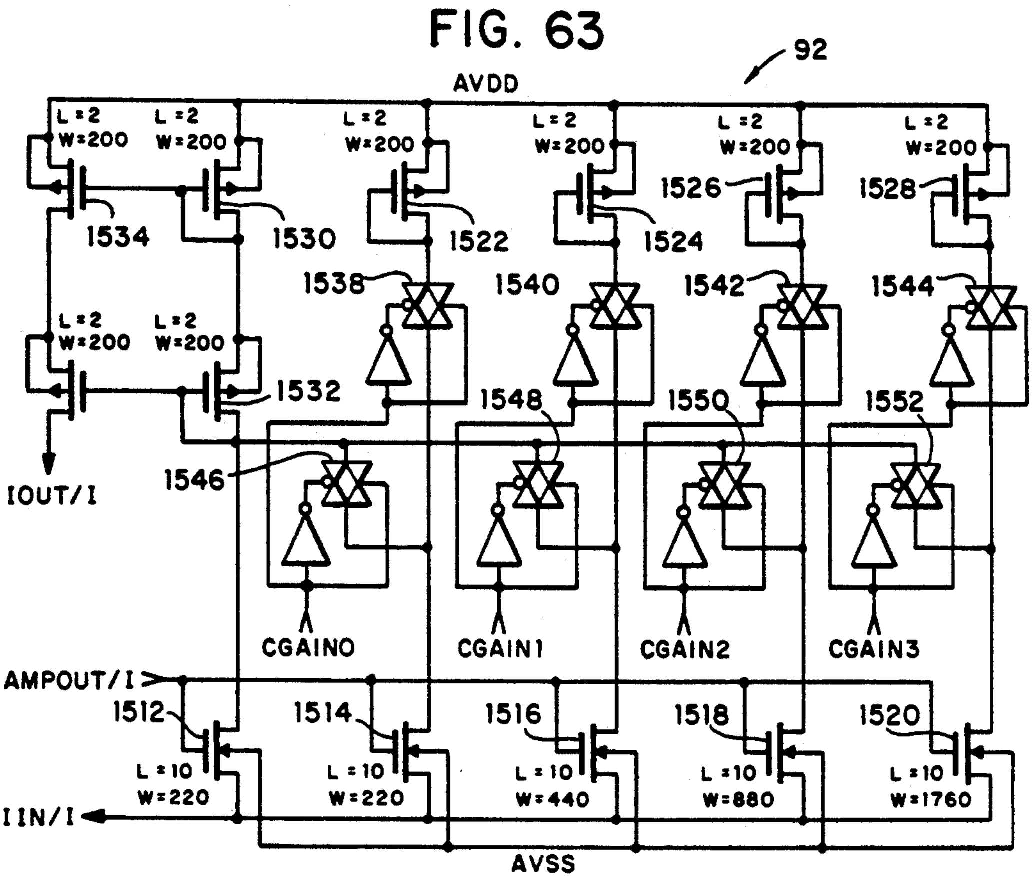
Figure 64:
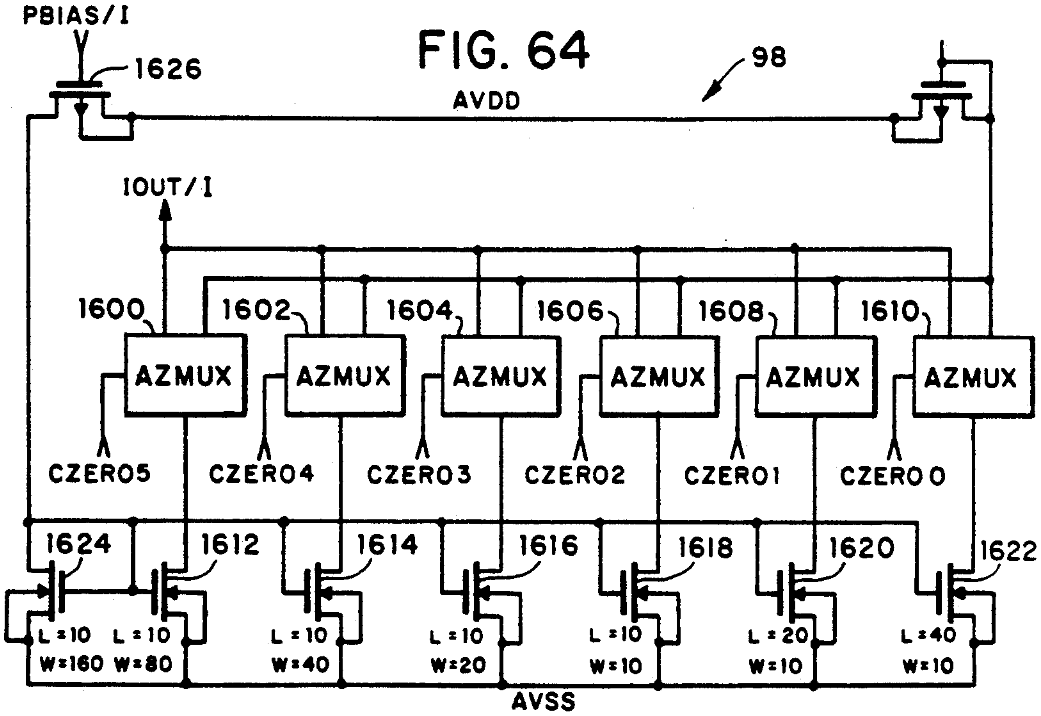
Figure 65:
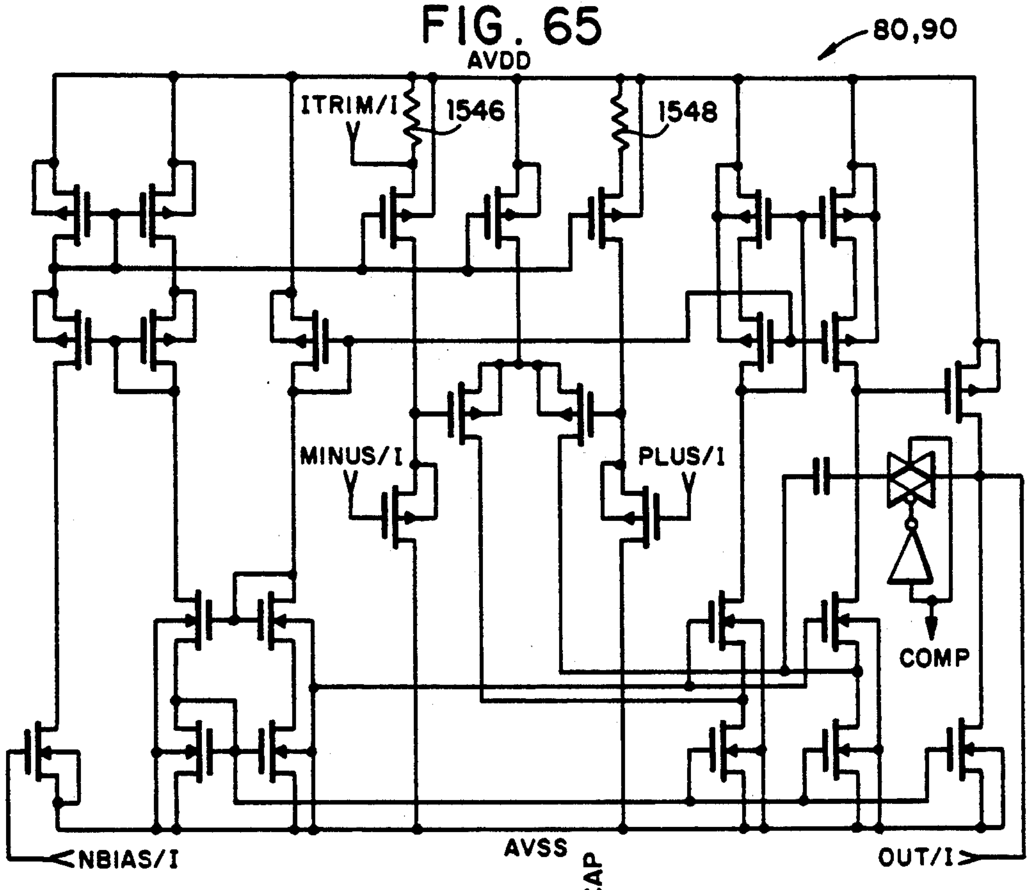
Figure 66:
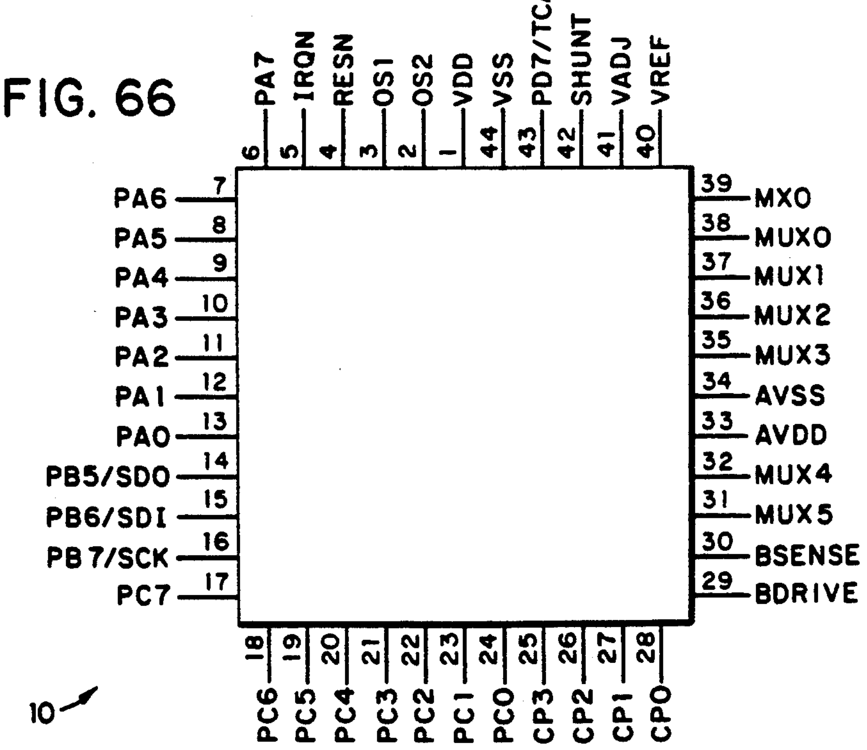

The following drawings relate to the SURECHIP CUI integrated circuit (IC);

FIG. 16 is a functional representation of an application of the IC in accordance with the present invention;

FIG. 17 is a functional block diagram of the IC in accordance with the present invention;

FIG. 18 is a functional block diagram of a portion of the IC in accordance with the present invention;

FIGS. 19A–19D are diagrams of alternate clock generator connections for the IC in accordance with the present invention;

FIG. 20 is a memory address map for the IC in accordance with the present invention;

FIG. 21 is a format diagram for configuration registers CFR and ACFR which form a portion of the IC in accordance with the present invention;

FIG. 22 is a format diagram for an EEPROM control register NVCR which forms a portion of the IC in accordance with the present invention;

FIG. 23 is a format diagram for a dead-man control register DMC which forms a portion of the IC in accordance with the present invention;

FIG. 24 is a format diagram for A/D conversion interface registers ADZ, AMZ, ADCR, AMUX, ACSF, AVSF and ADC which form a portion of the IC in accordance with the present invention;

FIG. 25 is a format diagram for comparator mode control registers CMPI and CMPST which form a portion of the IC in accordance with the present invention;

FIG. 26 is a format diagram for PORT A registers PAC and PAD which form a portion of the IC in accordance with the present invention;

FIG. 27 is a block diagram of a parallel port which forms a portion of the IC in accordance with the present invention;

FIG. 28 is a format diagram for PORT B registers PBC and PBD which form a portion of the IC in accordance with the present invention;

FIG. 29 is a format diagram for PORT B serial peripheral interface registers SPD, SPSR and SPCR which form a portion of the IC in accordance with the present invention;

FIG. 30 is a format diagram for PORT C registers PCC and PCD which form a portion of the IC in accordance with the present invention;

FIG. 31 is a format diagram for a PORT D register PDD which forms a portion of the IC in accordance with the present invention;

FIG. 32 is a block diagram of a programmable timer which forms a portion of the IC in accordance with the present invention;

FIGS. 33A–33D are timing diagrams for the timer of FIG. 32;

FIG. 34 is a format diagram for programmable timer registers TCRH, TCRL, TARH, TARL, TICH, TICL, TOCH, TOCL, TCR and TSR which form a portion of the IC in accordance with the present invention;

FIG. 35 is an overall block diagram of the comparator subsystem and A/D input subsystems of the IC in accordance with the present invention;

FIG. 36 is a schematic diagram of the quadcomparator subsystem in accordance with the present invention;

FIG. 37 is a schematic diagram of the address decode logic for the comparator control registers CMPST and CMPI and the configuration register CFR in accordance with the present invention;

FIG. 38 is a block diagram of the analog subsystem in accordance with the present invention;

FIG. 39 is a schematic diagram of the microprocessor bus interface logic in accordance with the present invention;

FIG. 40 is a schematic diagram of the address decode logic for the interface registers in accordance with the present invention;

FIG. 41 is a schematic diagram of the control and status register in accordance with the present invention;

FIG. 42 is a block diagram of the analog digital control logic portions of the IC in accordance with the present invention;

FIG. 43 is a block diagram of the analog subsystem digital control logic in accordance with the present invention;

FIG. 44 is a schematic diagram of the current multiplexer (MUX) control logic in accordance with the present invention;

FIG. 45 is a schematic diagram of the voltage MUX control logic in accordance with the present invention;

FIG. 46 is a schematic diagram of the auto-zero control registers in accordance with the present invention;

FIG. 47 is a schematic diagram of the five microsecond timer in accordance with the present invention;

FIG. 48 is a schematic diagram of the auto-zero control logic in accordance with the present invention;

FIG. 49 is a schematic diagram of the auto-range control logic in accordance with the present invention;

FIG. 50 is a schematic diagram of the auto-range state machine in accordance with the present invention;

FIG. 51 is an overall block diagram of the analog circuitry in accordance with the present invention;

FIG. 52 is a schematic diagram of the input analog NUX system in accordance with the present invention;

FIG. 53 is a block diagram of the analog quad comparator system in accordance with the present invention;

FIG. 54 is a schematic diagram of the band gap regulator in accordance with the present invention;

FIG. 55 is a schematic diagram of the shunt regulator, B+ comparator and the power monitor in accordance with the present invention;

FIG. 56 is a schematic diagram of an exemplary external conditioning circuit for use with the IC in accordance with the present invention;

FIG. 57 is a schematic diagram of an exemplary regulator circuit for use with the IC in accordance with the present invention;

FIG. 58 is a schematic diagram of a biasing circuit in accordance with the present invention;

FIG. 59 is a schematic diagram of another biasing circuit in accordance with the present invention;

FIG. 60 is a schematic diagram of the temperature sensing circuit in accordance with the present invention;

FIG. 61 is a schematic diagram of the ranging circuitry for the voltage comparator in accordance with the present invention;

FIG. 62 is a schematic diagram of the current mirror and comparator in accordance with the present invention;

FIG. 63 is a schematic diagram of the current mirror in accordance with the present invention;

FIG. 64 is a schematic diagram of the offset correction circuitry in accordance with the present invention;

FIG. 65 is a schematic diagram of the auto-zeroable voltage and current comparators in accordance with the present invention; and FIG. 66 is a pin out diagram of the IC in accordance with the present invention.

Figure 67:
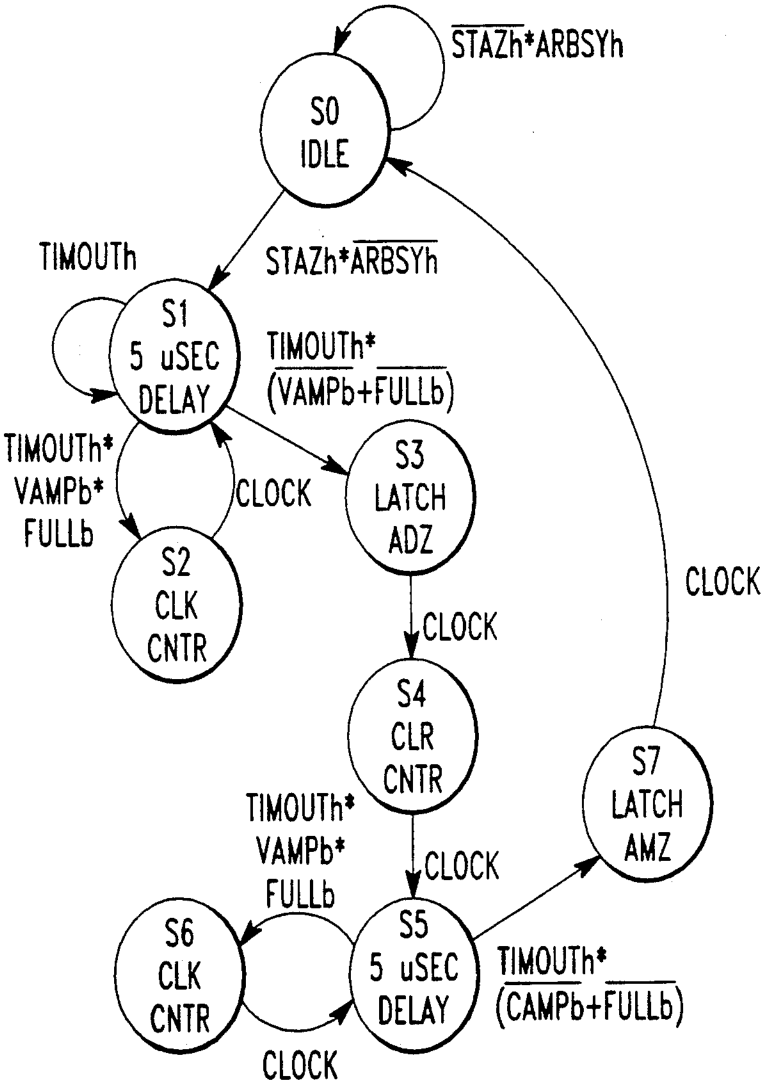

FIG. 67 is an auto-zero state diagram in accordance with the present invention.

Figure 68:
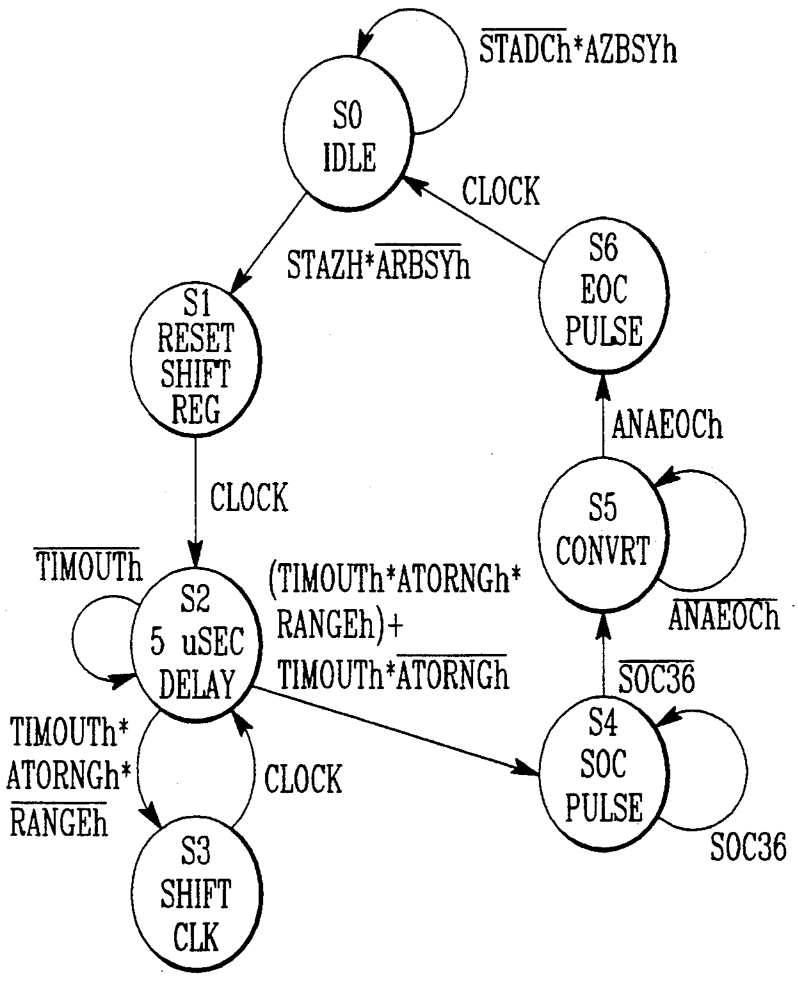

FIG. 68 is an auto-range state diagram in accordance with the present invention.

DETAILED DESCRIPTION

Figure 8:
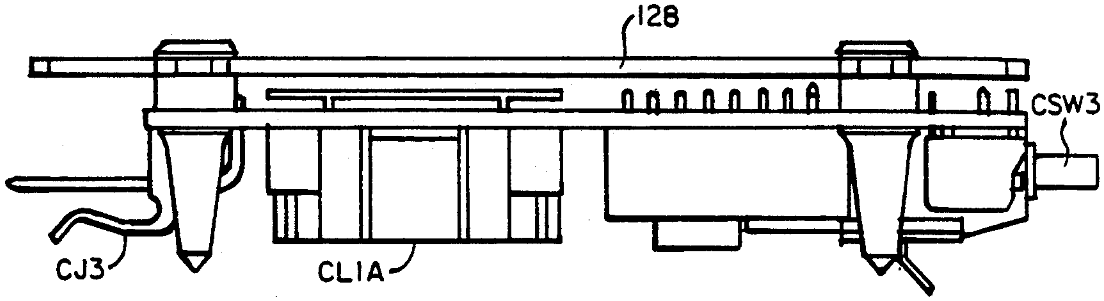
FIG. 8 shows a side view of the circuit board assembly of FIGS. 6 and 7.
Figure 9:
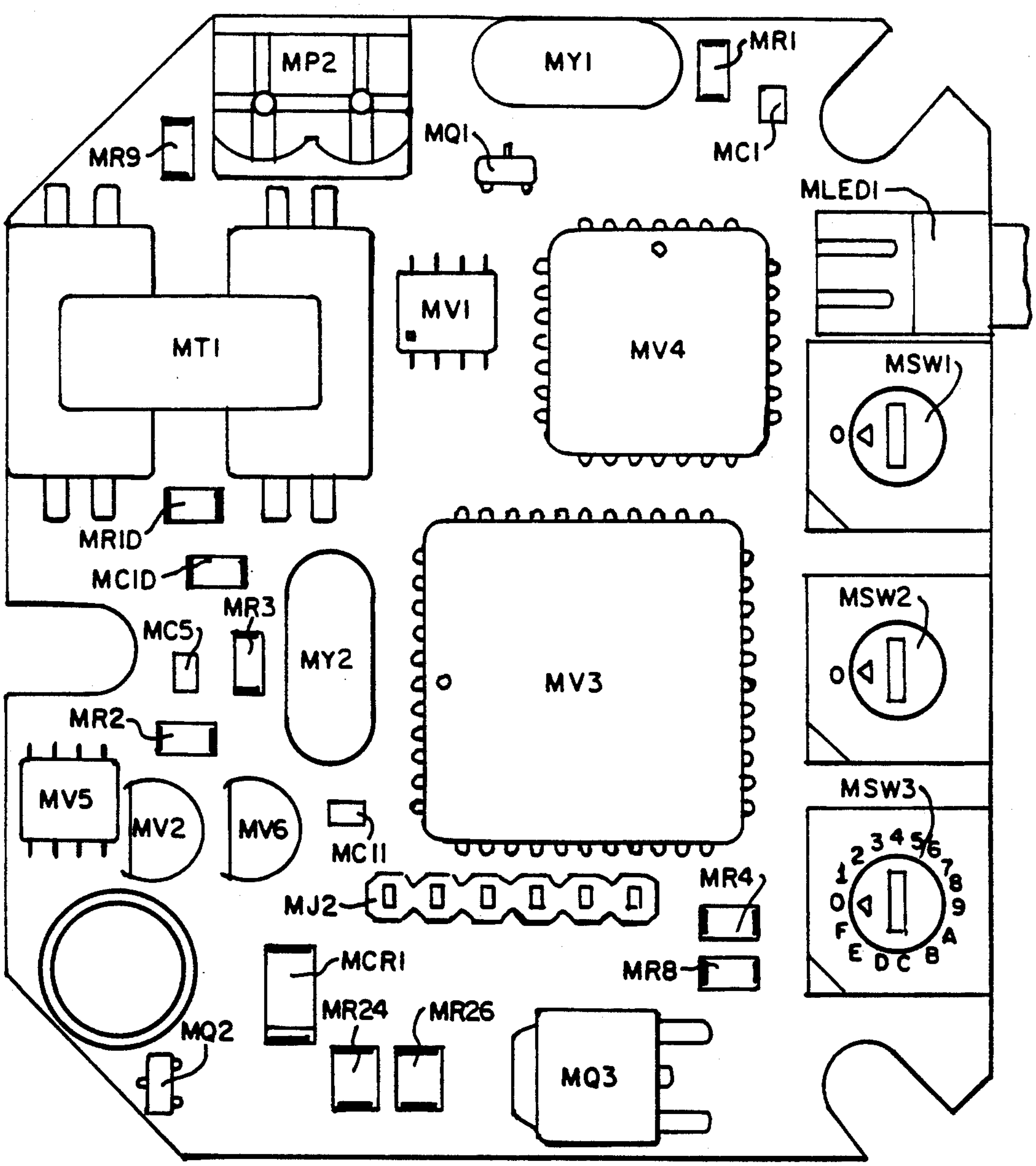
FIG. 9 shows a layout view of the circuit board of the communication module in FIGS. 1 and 5.

Referring now to the drawings and FIGS. 1–5, in particular, an electromagnetic contactor or motor controller 10 is depicted. The contactor or motor controller may be of the type depicted in U.S. Pat. No. 4,893,102 issued Jan. 9, 1990, to J. A. Bauer, and entitled: ELECTROMAGNETIC CONTACTOR WITH ENERGY BALANCED CLOSING SYSTEM. U.S. Pat. No. 4,893,102 is incorporated by reference herein. It should be understood with respect to the embodiments incorporated by reference from U.S. Pat. No. 4,893,102 that the physical arrangement of the control circuit board as shown best in FIGS. 8, 9 and 10 thereof may be different than the circuit board arrangements depicted herein. Although the description of the operation of the contactor or motor control system is extensively explained in U.S. Pat. No. 4,893,102, it will be briefly outlined herein in a less detailed form. Contactor 10 is a type of device that acts in the presence of a predetermined value of an input electrical variable such as line or phase current to perform a function such as closing contacts to start a motor or stop a motor.

Figure 2:
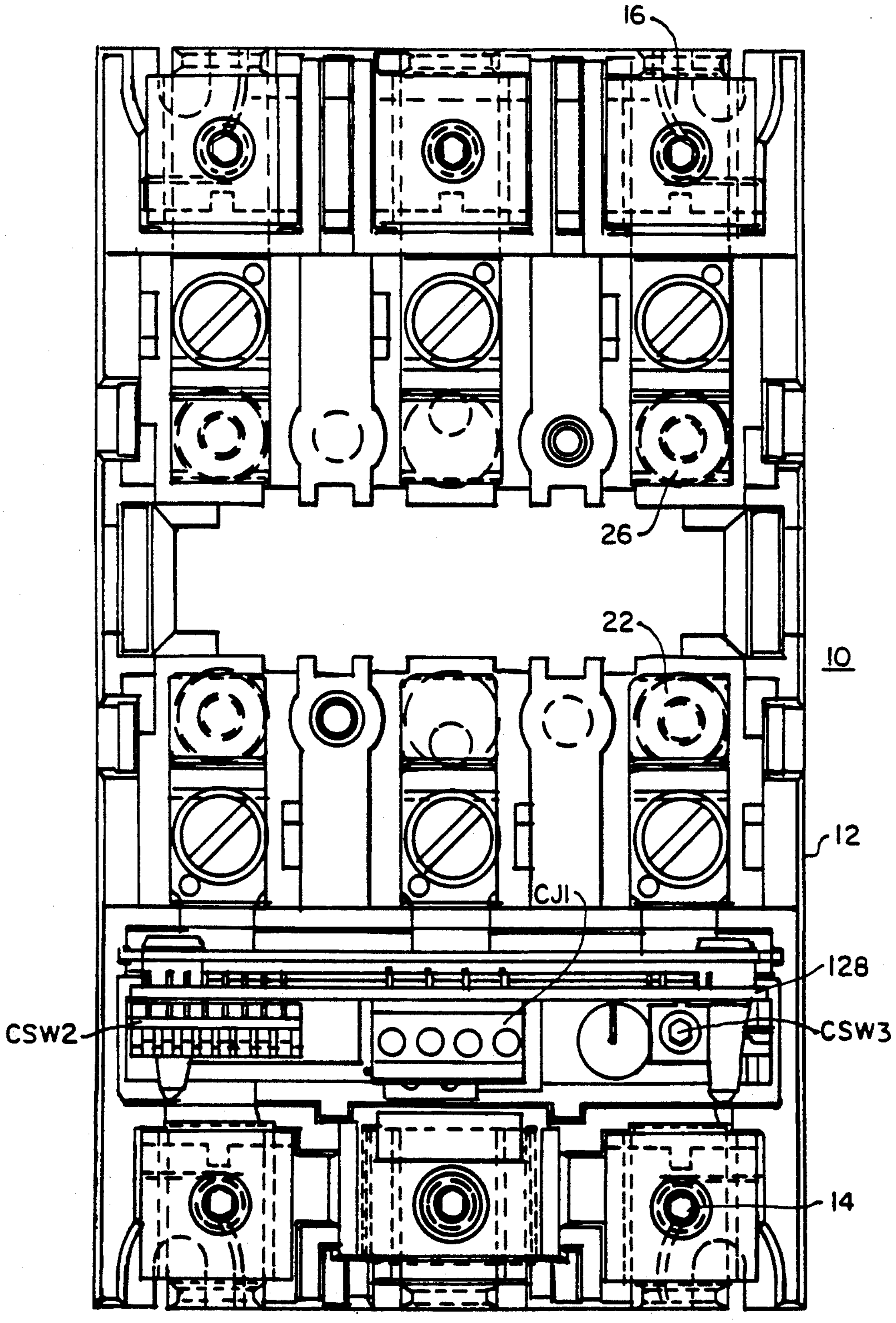
FIG. 2 shows a front elevation in the same orientation as FIG. 1 of the motor control apparatus or contactor with arc box, magnetic subassembly, and crossbar subassembly omitted.
Figure 3:
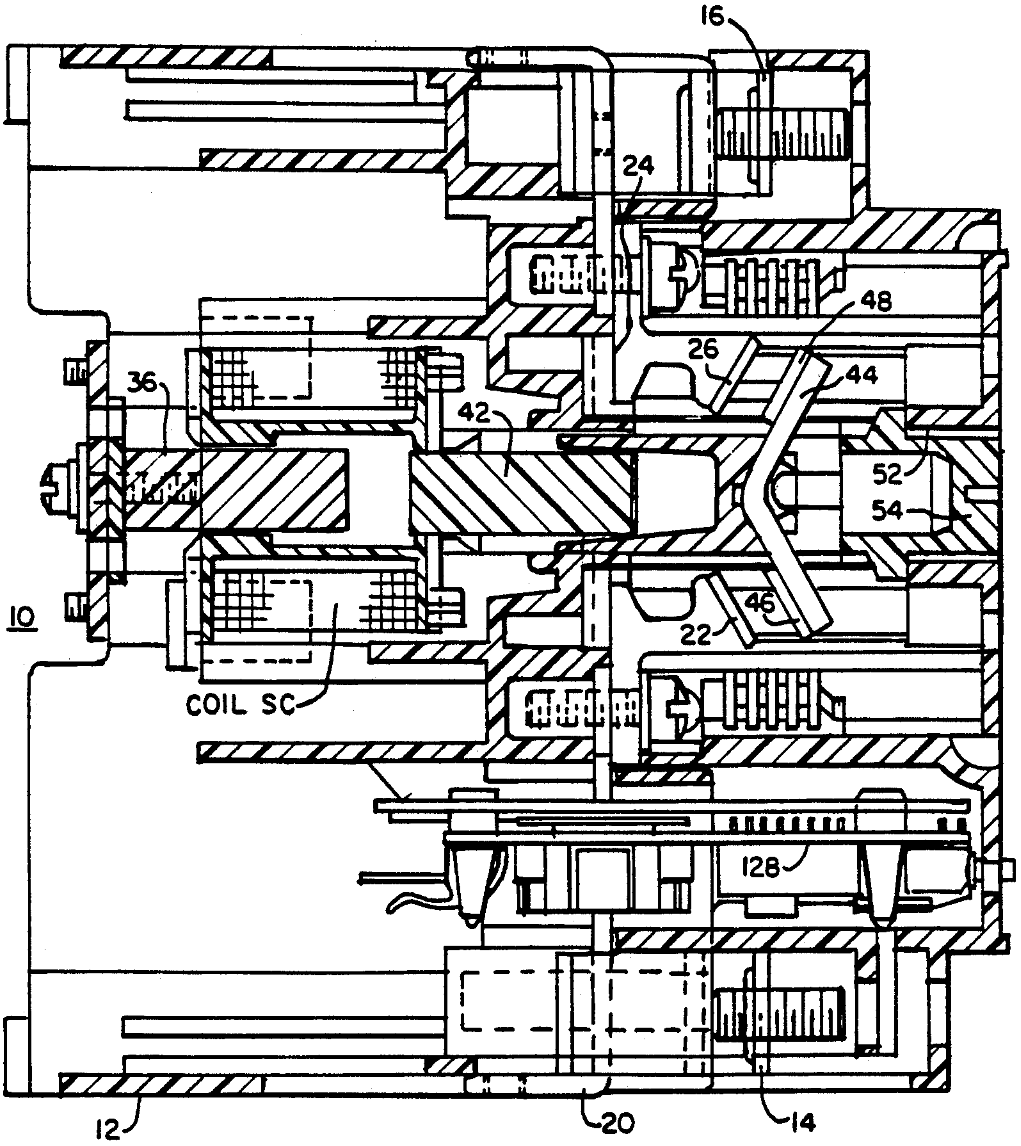
FIG. 3 shows a side elevation cut away along plane III—III of FIG. 1, of the microprocessor controlled circuit board assembly.
Figure 7:
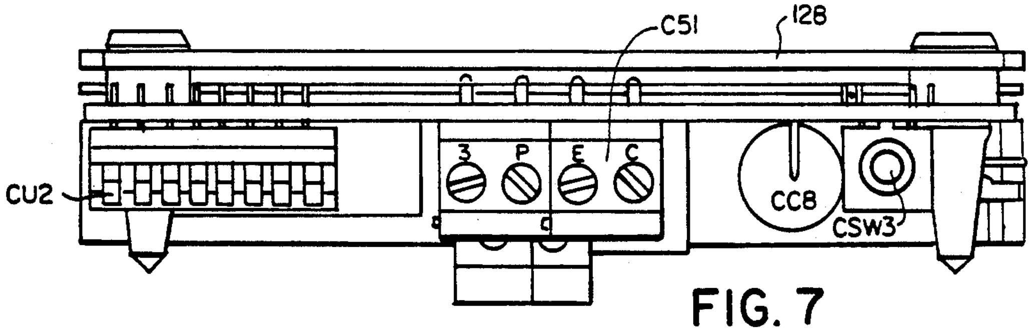
FIG. 7 shows a front view of the circuit board assembly of FIG. 6.
Figure 6:
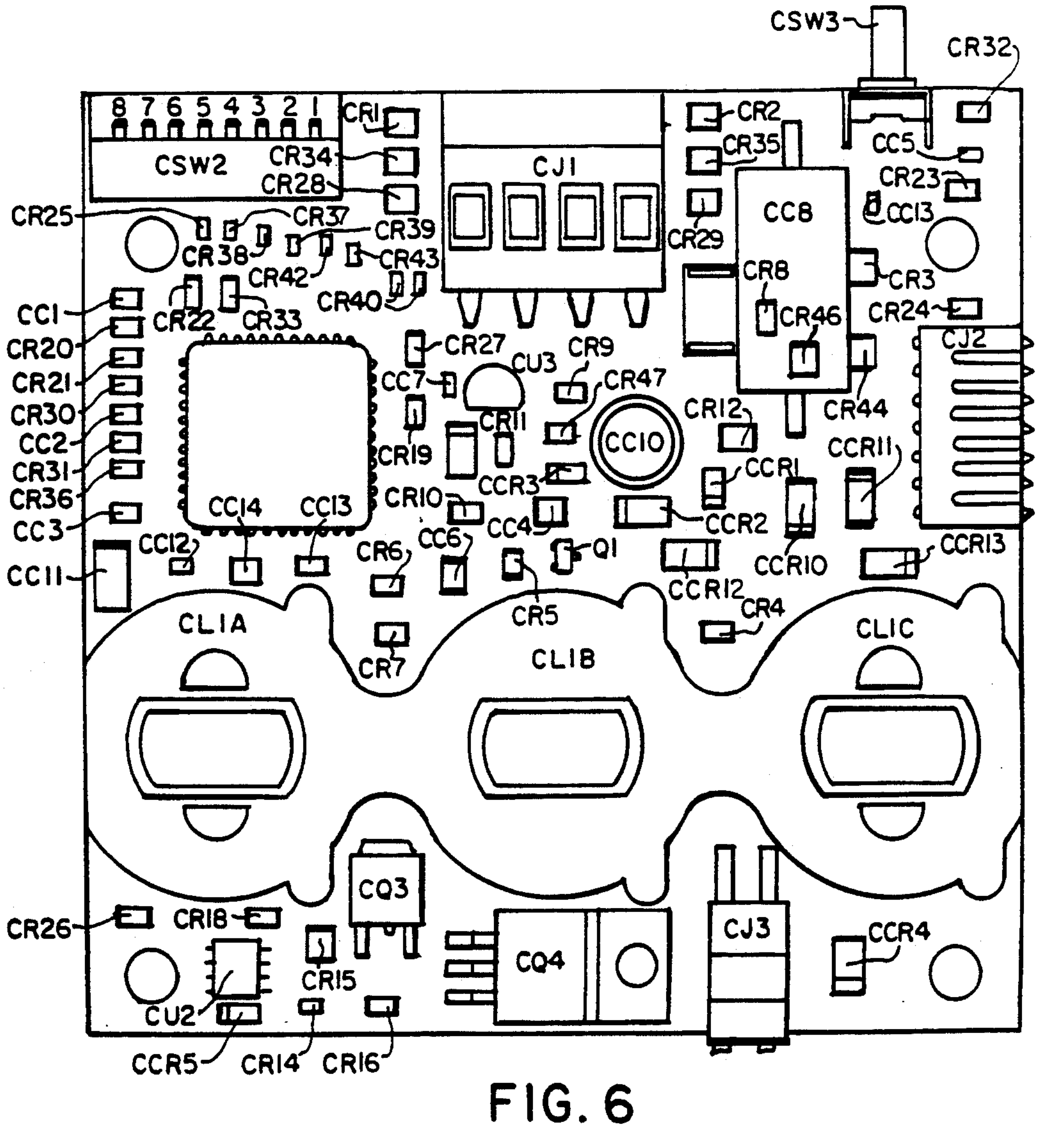
FIG. 6 shows a top view of the component layout of the microprocessor controlled circuit board assembly utilized in the apparatus of the preceding figures.

Referring specifically to FIG. 3, the contactor arrangement of the present invention is depicted with reference symbols referring to like or similar elements in the contactor of FIG. 2 of the incorporated-by-reference U.S. Pat. No. 4,893,102. In particular, there is provided a contactor or motor control apparatus 10 having an insulating housing 12. There are a pair of spaced-apart load terminals 14, 16 suitable for interconnection with an electrical load such as a motor winding which is to be controlled by the contactor or motor control device 10. Load terminal 14 is interconnected with internal conductor 20 and load terminal 16 is interconnected with internal conductor 24. Internal conductor 20 is interconnected with a fixed contact 22 and internal conductor 24 is interconnected with a fixed contact 26. There is provided a contact carrier 42 upon which is disposed an electrically conducting contact bridge 44 having movable contacts 48, 46 at either end thereof which are complementary with fixed contacts 26, 22, respectively. The contact carrier 42 is movable in controlled relationship such that the contact bridge 44 which is affixed thereto and movable therewith causes the contacts 48, 46 to abut against contacts 26, 22, respectively, when there is a need or desire to close the circuit between terminals 14, 16. In a like manner, internal operations of the contactor or motor controller 10 is such that the contacts 48, 46 may separate from contacts 26, 22, respectively, and remain in a disposition of separation as a function of carrier 42 moving in a different direction and causing the rigidly affixed bridge member 44 to move correspondingly. Generally, as is described in incorporated-by-reference U.S. Pat. No. 4,893,102, the movement of carrier 42 and concurrent movement of the bridging member 44 is controlled by a control card or control board 128 which may include a microprocessor as a control element. Generally, when the magnitude of electrical current flowing between terminals 14, 16, when the contactor 10 is in a closed disposition, is appropriate, the control board 128, upon sensing that current will cause appropriate action to take place with regard to component magnetic structures, electromagnetic solenoid structures (such as COIL SC), and various aligned springs, to cause the contacts 48, 46 to separate from contacts 26, 22, respectively. Furthermore, the contacts may be opened or closed manually or they may be closed in response to electromagnetic interaction in a manner described, for example, in the incorporated-by-reference U.S. Pat. No. 4,893,102. The general operation of the circuit board 128 of the present invention is such that it may operate similarly to the circuit board arrangement 128 shown and described in the incorporated-by-reference U.S. Pat. No. 4,893,102. In the present invention, apparatus and process for calibrating the circuit board 128 is described hereinafter.

Figure 1:
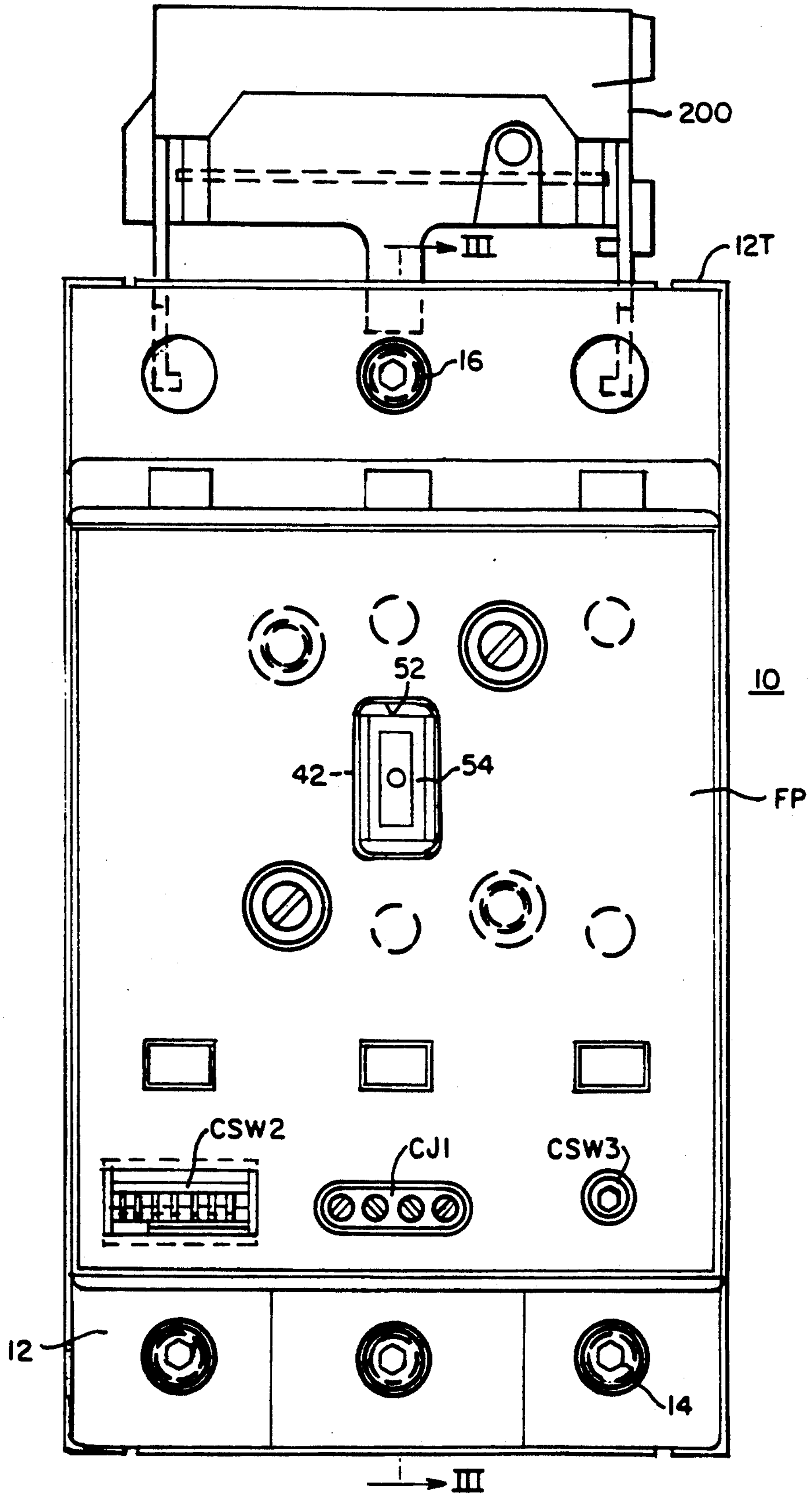
FIG. 1 shows a front elevation of an electromagnetic contactor or motor control apparatus with a communications module affixed to the top thereof.

Referring specifically to FIG. 1, the front elevation of the apparatus shown in section and described previously with respect to FIG. 3, is depicted. In particular, there is provided an opening or orifice 52 in which a guiding or bridging member 54 is affixed in order to longitudinally and radially align the movable carrier 42. The front panel FP of the contactor 10 contains three orifices or openings through which important construction features portions or parts of the circuit board arrangement 128 are accessible. These portions or parts are a switch CSW2, connector CJ1, and switch CSW3. The construction, operation and function, of the accessible elements will be described hereinafter. At the top portion 12T of the contactor 10 is disposed in detachably attached a communication module 200, the construction, operation and purpose of which will be described hereinafter.

Referring now to FIG. 2, the contactor arrangement shown in FIG. 1 is depicted in similar orientation except that the front panel FP, including that which is called the "arc box", as well as the magnetic subassembly and the crossbar assembly have been omitted or removed. In particular, the arrangement of the circuit control card 128 within the contactor internal portion is once again depicted. The arrangement of elements CSW2, CJ1 and CSW3 is clearly shown.

Referring to FIG. 4, a top view of the contactor 10 is shown. In particular, the arrangement of the three-phase load terminals 16 is clearly set forth.

In FIG. 5 another embodiment of the invention is shown in which the communication module 200 is detachably attached to the contactor 10 at the bottom 12B thereof.

CONSTRUCTION FEATURES OF THE CONTROL CIRCUIT BOARD 128

Referring now to FIGS. 6–8 and 10A–10C, the construction features of the control circuit board 128 are described. As shown best in FIG. 10A, there is provided an input connector CJ1 having terminals 1, 2, 3, 4. Terminal 4 is connected to system common or ground (hereinafter "ground"). One side each of resistive elements CR28, CR29, CR34, CR35 are also connected to ground. Terminal 4 is designated "C". Terminal 1 is connected to one side of a resistive element CR1 to one side each of resistive elements CR28, CR34 and to an output designated "3". Terminal 2 is connected to one side of a resistive element CR2, to a terminal "P", and to one side each of resistive elements CR29, CR35. Terminal 3 is connected to one side of a resistive element CR3, to a terminal "E" and to one side of a varistor element CMV1. Terminal "E" may have impressed thereupon a control voltage to ground. In one embodiment of the invention that value may be 120 V AC. The other side of resistive element CR1 is connected to one side of capacitive element CC1, and to terminal CP2 and terminal PC1 of an integrated circuit chip CU1. The construction and operation of chip CU1 will be described hereinafter. The other side of resistive element CR2 is connected to one side of a capacitive element CC2 and to terminal CP1 and terminal PC0 of chip CU1. The other side of resistive element CR3 is connected to one side of a capacitive element CC3 and to terminal CPO of chip CU1. The other side of the varistor CMV1 and capacitive elements CC1, CC2, CC3 are connected to ground. The three-phase sensors designated CL1A, CL1B and CL1C are connected at one side each thereof to ground and to one side each of resistive elements CR6, CR5 and CR4, respectively. The other side of resistive elements CR4, CR5, CR6 are connected to input terminals MUX2, MUX1, MUX0 respectively of chip CU1. The latter inputs are designated "PHASE3", "PHASE 2" and "PHASE 1", respectively. The foregoing represents the current sensing arrangement for the system.

Figure 10A:
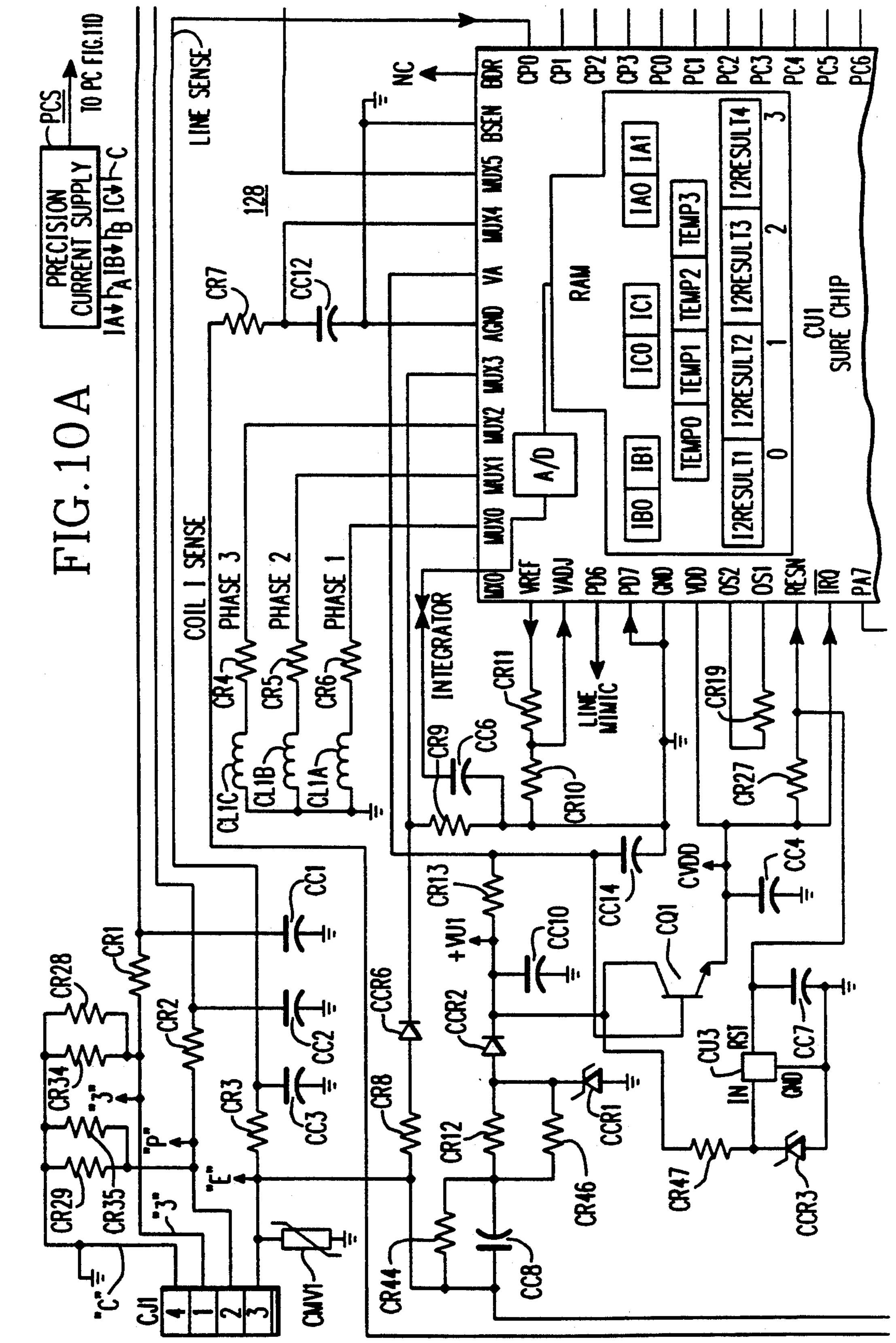
FIGS. 10A–10C show a circuit schematic diagram of the circuit board assembly shown in FIGS. 3, 6, 7 and 8.
Figure 10B:
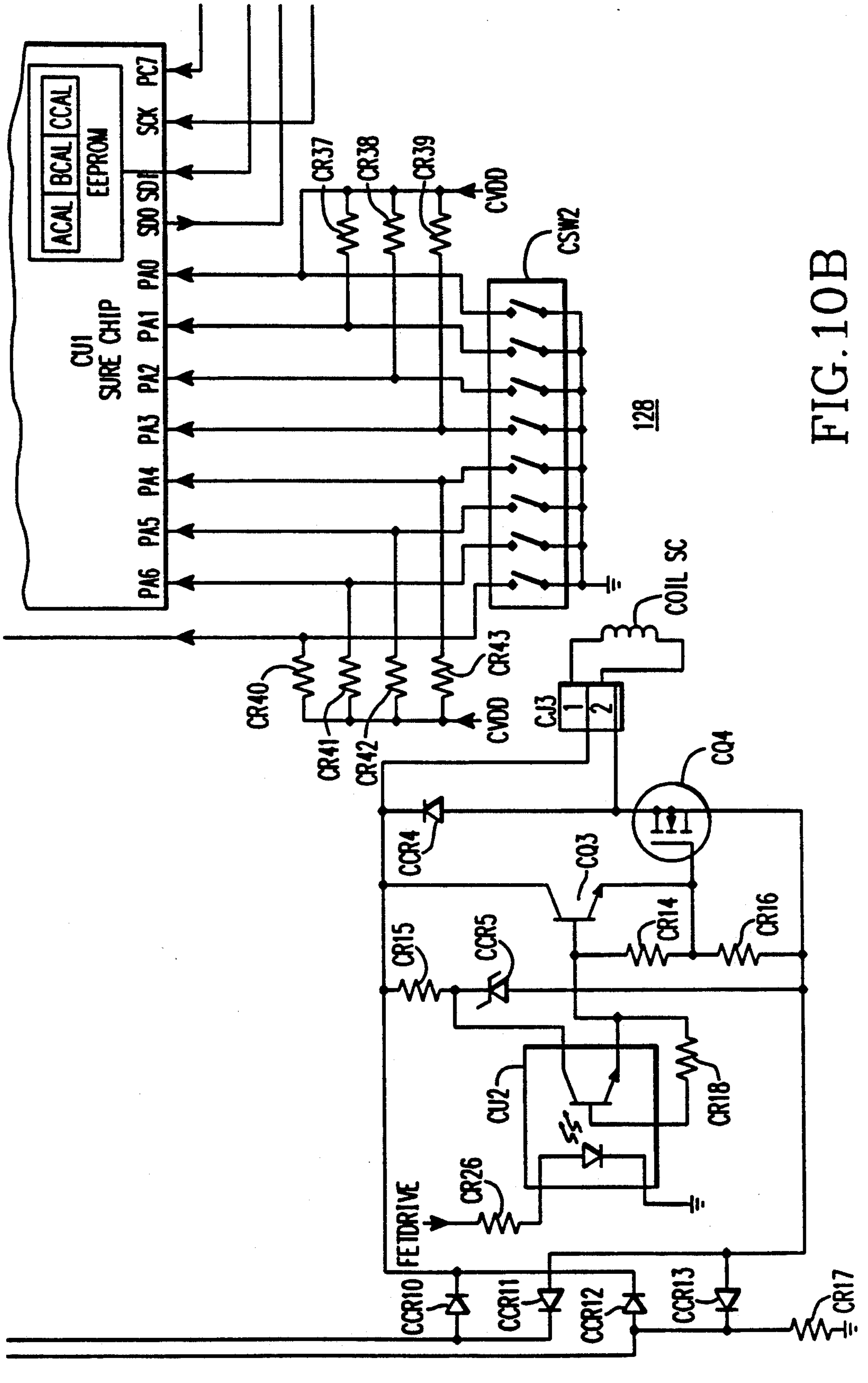
Figure 10C:
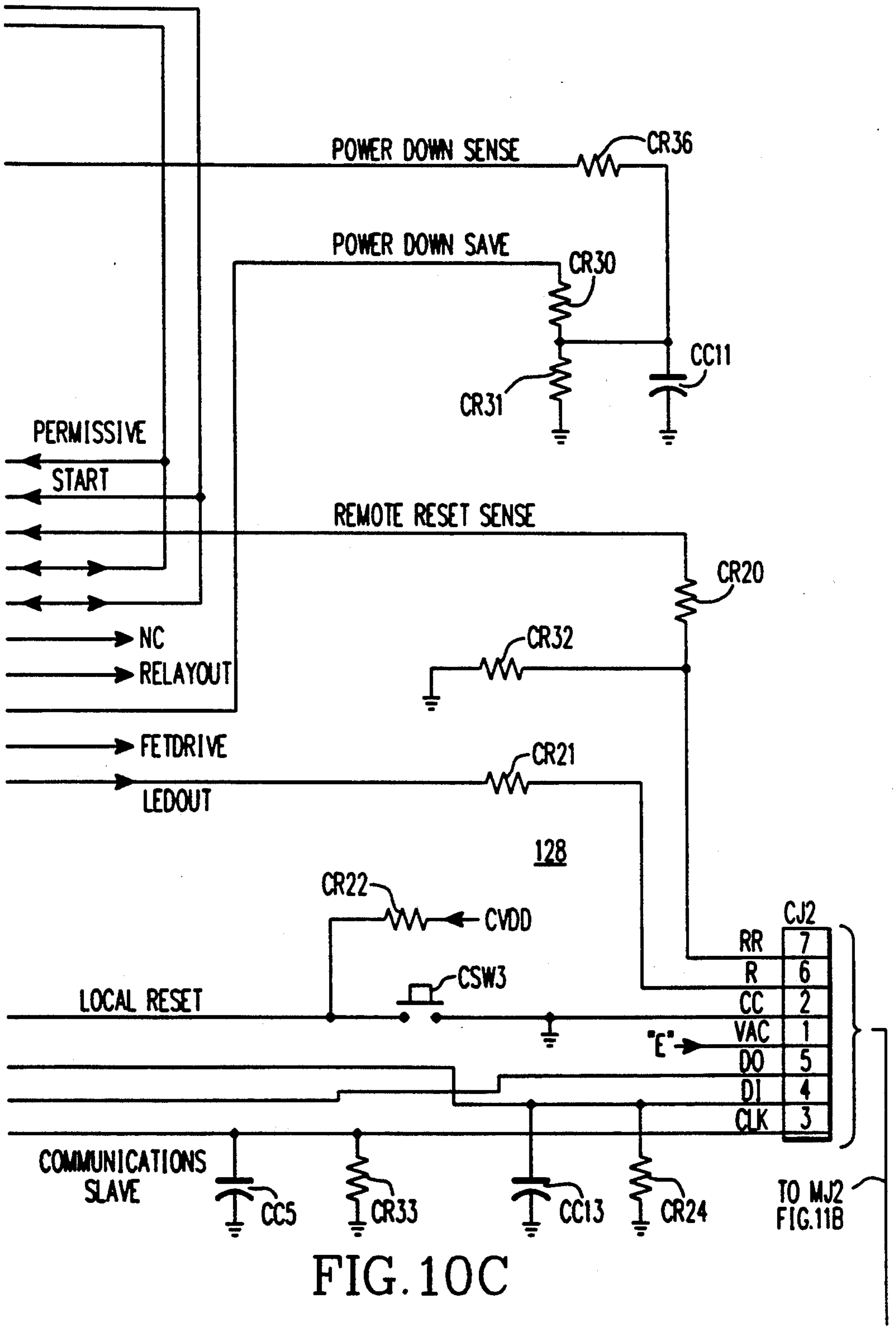

Referring now to FIGS. 10B and 10C, there is shown an input connector CJ2 which is externally interconnectable with the communication module 200, in a manner to be described hereinafter. Terminal 7 of connector CJ2, designated "RR", is connected to one side of a resistive element CR20 and one side of a resistive element CR32. The other side of resistive element CR32 is connected to ground. The other side of resistive element CR20 is designated "REMOTE RESET SENSE" and is connected to the CP3 terminal of the chip CU1. Terminal 6 of connector CJ2 is designated "R" and is connected to one side of a resistive CR21, the other side of which is connected to terminal PC6 of chip CU1. This is designated the "LEDOUT" terminal. Chip CU1 may be of the type known as a SURECHIP which is a proprietary device of the Westinghouse Electric Corporation. The SURECHIP will be described in detail hereinafter. Terminal 2 of connector CJ2 is designated "CC" and is connected to ground. Terminal 1 of connector CJ2 is designated "VAC" and is connected to the "E" control voltage as described previously. Terminal 5 of connector CJ2 is designated "DO" for data out and is connected to the output terminal SDO of the chip CU1. Terminal 4 of connector CJ2 is designated "DI" for data in and is connected to one side of a resistive element CR24, one side of capacitive elements CC13, and to the input terminal SD1 of the chip CU1. The other side of resistive element CR24 and the other side of capacitive element CC13 are connected to ground. Terminal 3 of the connector CJ2 is designated "CLK" for clock is connected to one side of resistive element CR33, one side of a capacitive element CC5, and to the SCK terminal of the chip CU1. This terminal is designated "COMMUNICATIONS SLAVE". The other side of resistive element CR33 and the other side of capacitor element CC5 are connected to ground.

The terminal PC7 of the chip CU1 is connected to one side of a resistive element CR22 and one side of the switch CSW3. The other side of the switch CSW3 is connected to ground. The other side of resistive element CR22 is interconnected to have impressed thereupon voltage CVDD, the supply of which will be described hereinafter. Switch CSW3 is a normally open push-button switch. Terminals PA0 through PA7 of chip CU1 are connected to separate terminals of the programming switch CSW2. Each of the terminals PA1 through PA7 is connected to one side of an appropriate resistive elements CR37 through CR43. The other side of resistive elements CR37 through CR43, respectively, is connected to voltage source CVDD. Terminal AGND and terminal BSEN of chip CU1 is connected to ground.

Capacitive element CC12 is connected at one side thereof to ground. The other side capacitive element CC12 is connected to terminal MUX4 of the chip CU1, and to one side of a resistive element CR7. The other side of resistive element CR7 is connected to the anode of a diode CCR12 and the cathode of a diode CCR13, as well as one side of a resistive element CR17, the other side of which is connected to ground. The anode of diode CCR13 is connected to the anode of a diode CCR11, to the anode of a zener diode CCR5, to one side of a resistive element CR16, and to the drain terminal of a field effects transistor CQ4. The cathode of the diode CCR12 is connected to the cathode of a diode CCR10, to one side of a resistive element CR15, to the cathode of a diode CCR4 to the collector of a transistor CQ3, and to terminal 1 of a connector CJ3. Connector J3 is interconnected to one side of a solenoid coil COIL SC in the contactor 10 for control of the armature member or carrier 42 in a manner described previously with respect to the incorporated-by-reference U.S. Pat. No. 4,893,102. The other side of the coil COIL SC is connected to terminal 2 of the connector CJ3. Terminal 7 of connector CJ3 is connected to the source terminal of the field effects transistor CQ4, and to the anode of diode CCR4. The other side of the resistive element CR15 is connected to the anode of zener diode element CCR5. The junction point between the resistive element CR15 and the anode of zener diode CCR5 is connected to the collector terminal of an output transistor of a chip CU2. The emitter terminal of the transistor of chip CU2 is connected to one side of a resistive element CR18, one side of a resistive element CR14, the base of transistor CQ3. The emitter of transistor CQ3 is connected to the gate terminal of the field effect transistor CQ4, to the other side of the resistive element CR14, and to the other side of the resistive element CR16. The other side of resistive element CR18 is connected to the base of the transistor element of the chip CU2. The input circuit for the chip CU2 comprises a light-emitting diode, the anode of which is connected to one side of a resistive element CR26 and the cathode of which is connected to the system common or ground. The other side of the resistive element CR26 is connected to receive the signal "FET DRIVE" from the chip CU1. The chip CU2 represents a diode-driven transistor output isolating device comprising a light-emitting diode as the input and a light-receptive transistor as the output. It essentially acts as an isolation device.

The anode of the diode CCR10 and the cathode of the diode CCR11 are connected together and to one side of a resistive element CR44, one side of a capacitive element CC8, one side of a resistive element CR8, and to the control voltage "E". The other side of the resistive element CR44 and the other side of the capacitive element CC8 are connected to one side of a resistive element CR12 and one side of a resistive element CR46. The other side of resistive element CR12 and the other side of resistive element CR46 are interconnected together, and the anode of a diode element CCR2 and regulating terminal of a zener diode CCR1 the cathode of which is connected to ground. The other side of resistive element CR8 is connected to the anode of a diode element CCR6, the cathode of which is connected to one of a resistive element CR9 and to the MUX3 terminal of the chip CU1. The cathode of the diode CCR2 is connected to the collector of a transistor CQ1, one side of a resistive element CR47, one side of a capacitive element CC10, and one side of a resistive element CR13. The other side of resistive element CR13 is connected to one side of a capacitive element CC14, the VA terminal of the chip CU1, and to the base of transistor CQ1. The other side of resistive element CR9 is connected to one side of a capacitive element CC6, one side of a resistive element CR10, the other side of capacitive element CC14, and ground. The other side of capacitive element CC6 is connected to the MX0 terminal of the chip CU1 which internally is connected to an A-to-D converter designated "A/D". The other side of resistive element CR10 is connected to one side of a resistive element CR11 and to the VADJ terminal of the chip CU1. The other side of resistive element CR11 is connected to the VREF terminal of the chip CU1. The terminal PD6 of the chip CU1 is designated "LINE MIMIC". The terminal PD7 of the chip CU1 is interconnected with ground and the GND terminal of the chip CU1. The VDD terminal of the chip CU1 is connected to provide the power supply voltage VDD as described previously and is connected to the emitter of previously described transistor CQ1, one side of capacitor CC4, one side of resistive element CR27, and to the $\overline{\text{IRQ}}$ terminal of chip CU1. The other side of capacitive element CC4 is connected to ground. The other side of resistive element CR27 is connected to one side of a capacitive element CC7, to the RESN terminal of the chip CU1, and to one input terminal of an integrated circuit CU3. The other side of resistive element CR47 is connected to the anode of a zener diode CCR3 and to another terminal for the chip CU3. The ground terminal of chip CU3, the anode of the zener diode CCR3, and the other side of the capacitive element CC7 are connected to ground. Connected between the OS2 and OS1 terminals of the chip CU1 is a resistive element CR19.

The terminal MUX5 of the chip CU1 is connected to one side of a resistive element R36 and is designated "POWER DOWN SENSE". Terminal PC4 of the chip CU1 is connected to one side of a resistive element CR30 and is designated "POWER DOWN SAVE". The other side of resistive element CR30 is connected to the other side of resistive element CR36, to one side of a resistive element CR31, and one side of a capacitive element CC11. The other side of capacitive element CC11 and the other side of resistive element CR31 are connected to ground. Terminal PC2 of chip CU1 is designated "NC". Terminal PC3 of chip CU1 is designated "RELAY OUT". Terminal PC5 of chip CU1 is designated "FET DRIVE", and as was described previously, is interconnected as an input to one side of a resistive element CR26.

CONSTRUCTION FEATURES OF THE COMMUNICATION MODULE 200

Referring now to FIG. 9 and FIGS. 11A-11D, there is shown a circuit board layout and circuit schematic diagram, respectively, for the communication module 200, otherwise depicted in FIG. 1. The communication module 200 which may be otherwise known as a smart minicomputer or PONI "PRODUCT OPERATED NETWORK INTERFACE" may act as an interface device between a remote personal computer PC and the electrical contactor 10, relay, etc., as the case may be. In this embodiment of the invention there are provided three rotary switches MSW1, MSW2, MSW3 representing the least significant address, the middle address, and the most significant address, respectively, for external access to the device 10 from a data highway, for example. Inputs MC2, MC5 of each of the aforementioned switches are grounded. The hexadecimal outputs "1", "2", "4", "8" for each switch, respectively, are provided to INCOM communication chip MU4 the INCOM chip is proprietary to the Westinghouse Electric Corporation and is further described in U.S. Pat. No. 4,644,547, issued Feb. 17, 1987 to L. C. Vercellotti et al. and entitled, "Digital Message Format for Two-Way Communication and Control Network". U.S. Pat. No. 4,644,547 is incorporated by reference herein. In this embodiment of the invention, INCOM chip MU4 operates in the expanded mode slave configuration. For the output of switch MSW1, the "1" output is provided to the A0 input of the chip MU4. The "2" output is provided to the A1 input, the "4" is provided to the A2 input, and the "8" is provided to the A3 input. In a like manner, for switch MSW2 the "1", "2", "4", "8" outputs are provided to the A4, A5, A6, A7 inputs of the chip MU4. Finally, for the switch MSW3 the "1", "2", "4", "8" outputs are provided to the A8, A9, A10, A11 inputs, respectively, of the chip MU4. The RX input and TX output of the communication chip MU4 are connected with complementary inputs and outputs of other portions of the communication module 200 in a manner which will be described hereinafter. Signal MRX is provided to the RX input and signal MTX comes from the TX output. There is provided a capacitor element MC1 one side of which is grounded and the other side of which is connected to the OSC1 input of the chip MU4, one side of a crystal MY1, and one side of a resistive element MR1. The other side of the crystal MY1 and the other side of the resistive element MR1 are connected to the OSC2 input of the communication chip MU4 and one side of a capacitive element MC4, the other side of which is grounded. The crystal MY1 may, in one embodiment of the invention, be a 3.6864 MHz crystal. The BUSY output of the communication chip MU4 is connected to the PA4 input of a microprocessor MU3. Microprocessor MU3 may be a Motorola chip of the type designated MC6805. The INT output of the communication chip MU4 is connected to the PA3 input of a microprocessor MU3. The SERDAT terminal of the communication chip MU4 is connected to the terminal PA2 of the microprocessor MU3. The SCRCLK terminal of the communication chip MU4 is connected to the PA1 terminal of the microprocessor MU3 and the R/W terminal of the communication chip MU4 is connected to the PA0 terminal of the microprocessor MU3. The VDD terminal of the communications chip MU4 is connected to the MVDD power supply voltage from power supply module 202 for power and to one side of capacitive element MC3. The other side of the capacitive element MC3 is connected to ground. The terminal PB0 of the microprocessor MU3 is connected to one side of a resistive element MR19 and one side of a resistive element MR20. The other side of the resistive element MR19 is connected to ground and the other side of the resistive element MR20 is connected to the MVDD voltage. All of the following terminals in the microprocessor MU3 are connected to ground PA7, PA6, PA5, PB3, PB4, PB5, PB6, PB7, VSS, PC7, PC6, PC5, PC4, PC3, PC2, PC1, PC0. The following terminals of the microprocessor MU3 are connected together, to one side of a capacitive element MC12, and to the MVDD power supply voltage: VPP, $\overline{\text{IRQ}}$, VDD, TCAP, PD7, SS, RD1. The $\overline{\text{RESET}}$ terminal of the microprocessor MU3 is connected to receive a RESET signal from power supply module 202 in a manner to be described hereinafter. There is provided a capacitive element MC11, one side of which is connected to or ground, and the other side of which is connected to one side of a crystal MY3, one side of a resistive element MR3, and to the OSC1 terminal of the microprocessor MU3. The other side of the crystal MY3, the other side of the resistive element MR3, and one side of a capacitive element MC5 are connected to the OSC2 input terminal of the microprocessor MU3. The other side of the capacitive element MC5 is connected to system common or ground. Terminals TCMP and TD0 of microprocessor MU3 are not externally connected. The SCK terminal of the microprocessor MU3 is connected to one side of a resistive element MR7. The MOSI terminal of the microprocessor MU3 is connected to one side of a resistive element MR5. The MIS0 terminal of the microprocessor MU3 is connected to one side of a resistive element MR8 and one side of a resistive element MR4, the other side of which is grounded. The other side of the resistive elements MR5, MR7, MR8 are connected to the DO, CLK, DI terminals of a connector MJ2.

INPUT NETWORK 201

Figure 11A:
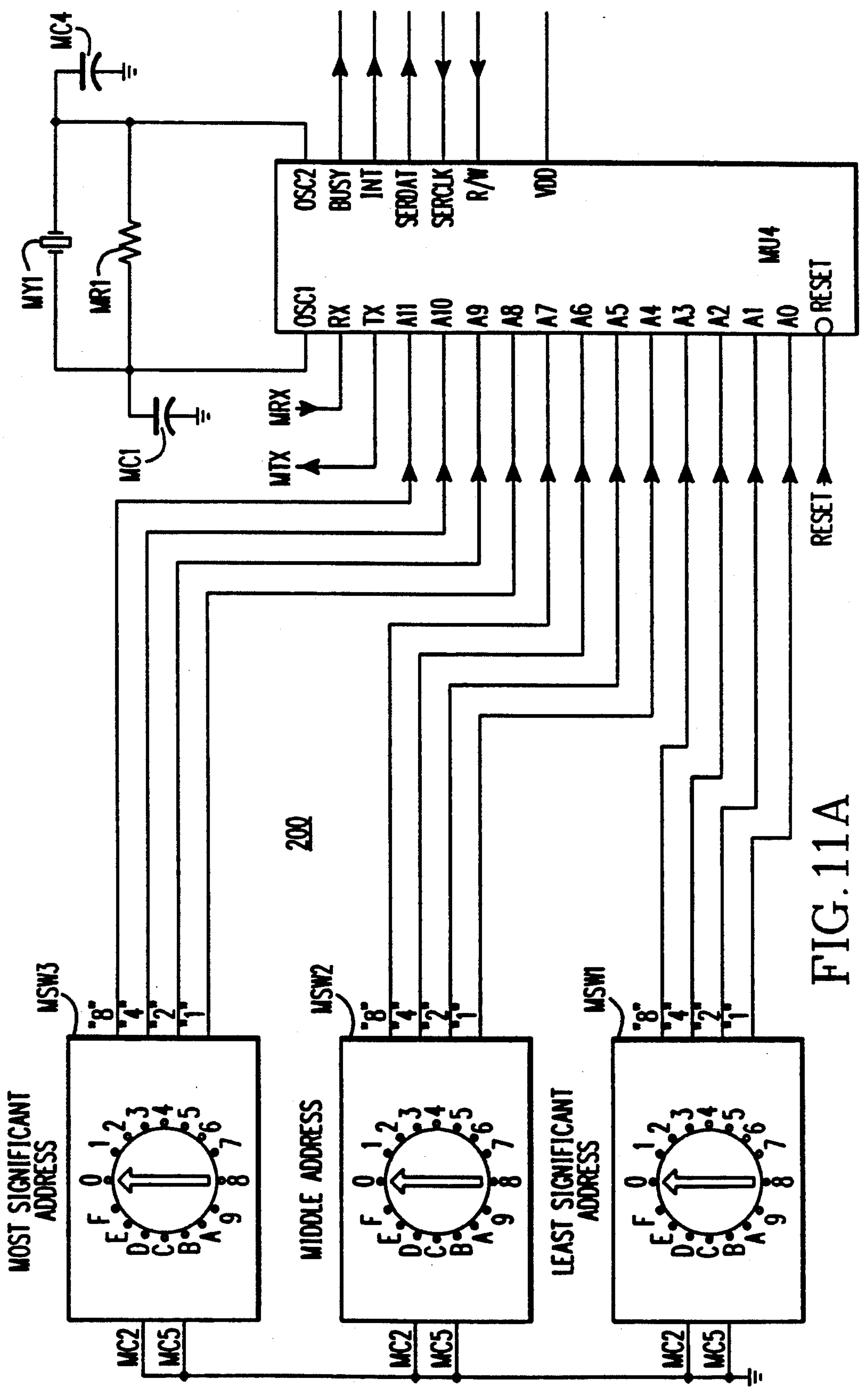
FIGS. 11A–11D show a circuit schematic diagram of the communication modules shown in FIGS. 1, 5 and 9.
Figure 11B:
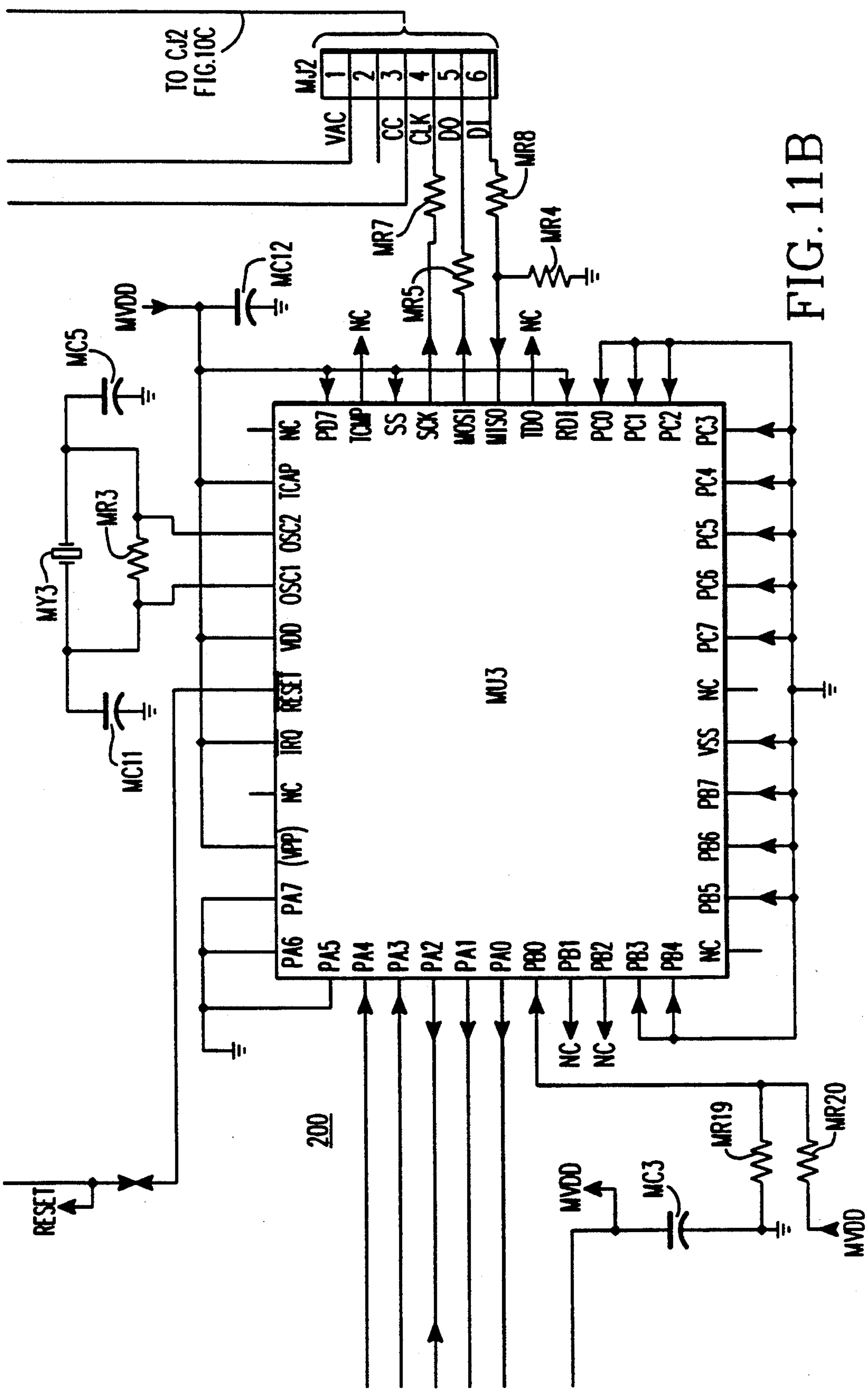
Figure 11C:
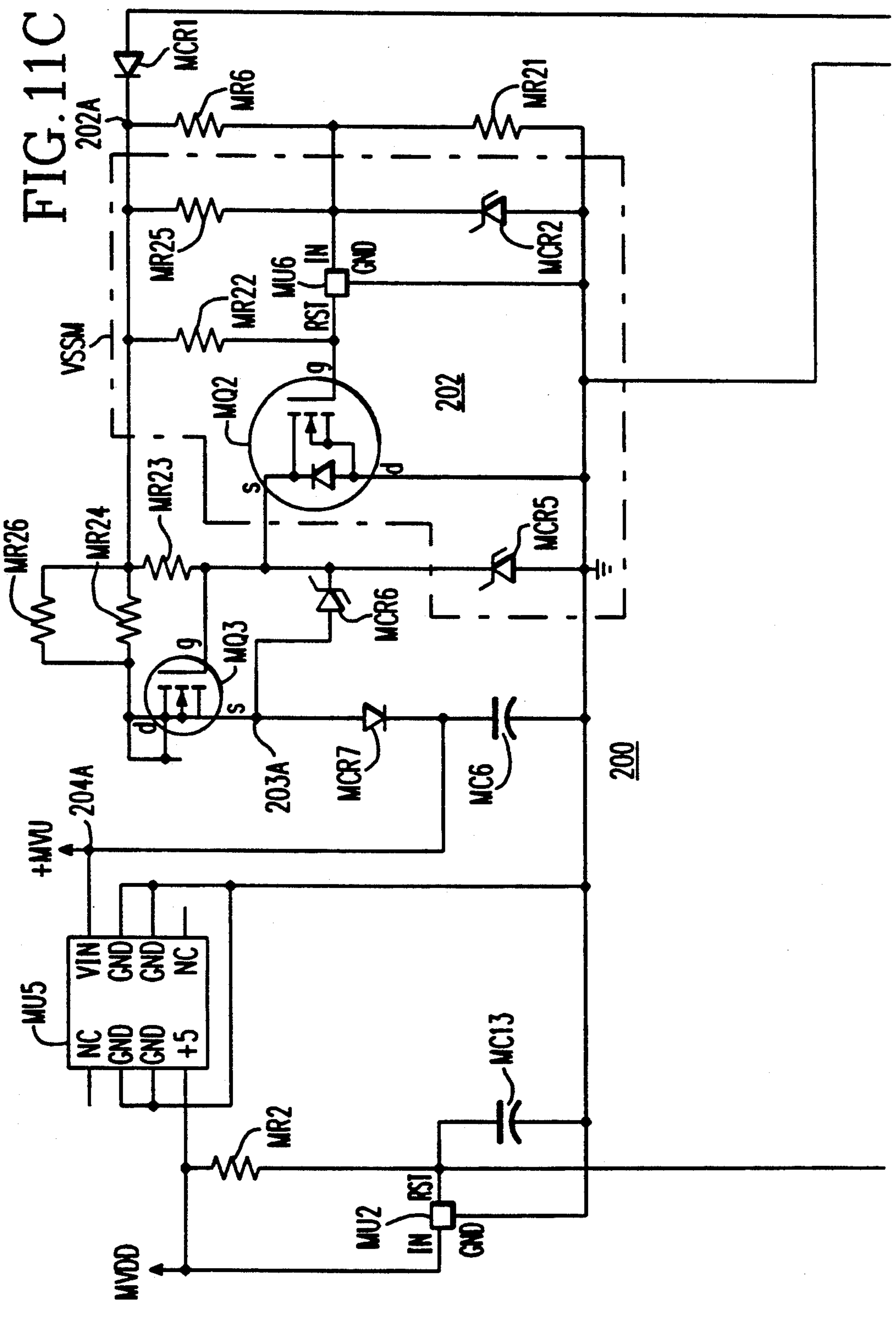
Figure 11D:
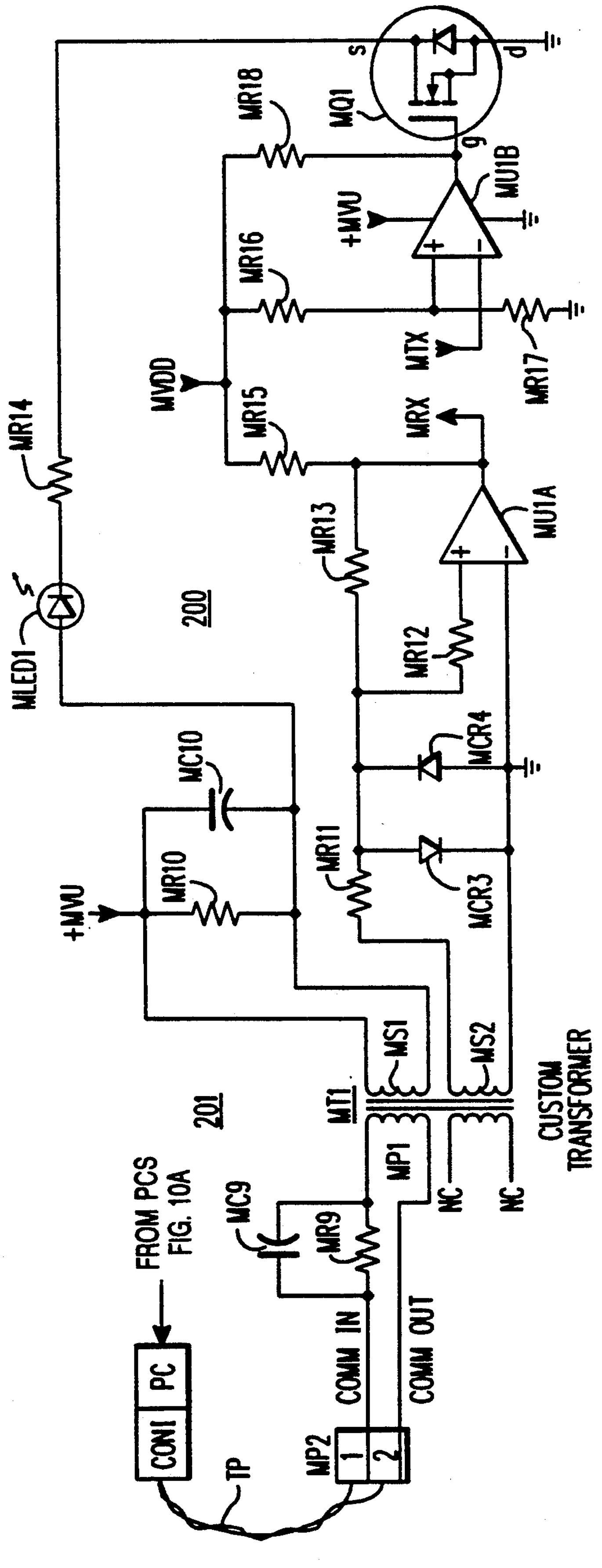

Referring specifically to FIG. 11D, there is provided an input network for module 200 which includes an input port or connector MP2. Terminal 1 of input connector MP2 is connected to one side of a resistive element MR9 and one side of a capacitive element MC9. The input terminal 1 of the connector MP2 is designated "COMM IN". The other side of capacitive element MC9, and the other side of resistive element MR9 are connected to one side of a first primary winding MP1 of a transformer MT1. Terminal 2 of connector MP2 is connected to the other terminal of the transformer winding MP1 of the transformer MT1. Terminal 2 of connector MP2 is designated "COMM OUT". The secondary windings of the transformer MT1 are designated MS1 and MS2. Connected in parallel across the secondary winding MS1 are resistive element MR10 and a capacitive element MC10. Connected to the high side of the capacitive element MC10 is a voltage MVU which is provided from a power supply which will be described hereinafter. Connected to one side of the secondary winding MS2 is one side of a resistive element MR11, the other side of which is connected to the anode of a diode MCR3. The cathode of the diode MCR3 is connected to the other side of the transformer secondary winding MS2. Connected in parallel with a diode MCR3 is a second diode MCR4 connected in an anode-to-cathode, cathode-to-anode relationship. Connected to the anode of the diode MCR3 is one side of a resistive element MR12 and one side of a resistive element MR13. The other side of a resistive element MR12 is connected to the positive input terminal of a isolating comparator MU1A. The negative input terminal of the comparator MU1A, the anode of the diode MCR4, and the cathode of the diode MCR3 are connected to ground. The other side of the resistive element MR13 is connected to the output of the comparator MU1A and to one side of a resistive element MR15. The output of the comparator MU1A provides the MRX signal for the chip MU4 as described previously. The other side of the resistive element MR15 is connected to one side of a resistive element MR16, one side of a resistive element MR18, and to voltage MVDD. The other side of the resistive element MR16 is connected to the positive input terminal of a comparator MU1B and to one side of a resistive element MR17. The negative terminal of the comparator MU1B receives the MTX output signal from the chip MU4 as described previously. The comparator MU1B is interconnected with the voltage source MVU from power supply 202 and with ground in an appropriate manner. The output of the comparator MU1B is connected to the other side of the resistive element MR18 and to the gate of a Field Effect Transistor (FET) device MQ1. The drain of the transistor device MQ1 is connected to ground as is the other side of the resistive element MR17. The source of the transistor device MQ1 is connected to one side of a resistive element MR14, the other side of which is connected to the cathode of a light-emitting diode MLED1, the anode of which is connected to common terminal between the previously described resistive element MR10, and capacitive element MC10.

POWER SUPPLY CIRCUIT 202

Referring specifically to FIGS. 11B and 11C, there is shown connected to the MJ2 connector a conductor designated VAC which is provided to the anode of a diode MCR1. The cathode of the diode MCR1 is connected to one side of a resistive element MR6, one side of a resistive element MR25, one side of a resistive element MR22, one side of a resistive element MR23, one side of a resistive element MR24, and one side of a resistive element MR26. The other side of resistive element MR6 is connected to one side of a resistive element MR21, the cathode of a zener diode MCR2, the other side of resistive element MR25, and the terminal IN of a RESET MU6. RESET device MU6 and RESET device MU2 to be described hereinafter may be Motorola devices designated MC34064. Terminal RST of RESET device MU6 is connected to the other side of resistive element MR22 and to the gate terminal of a transistor MQ2. Elements MR22, MR25, MCR2, MCR5, MQ2 and MU6 form a voltage sensing and switching means as described hereinafter. The drain terminal of the transistor MQ2 is connected to the other side of the resistive element MR23, the gate terminal or control of a FET MQ3, the cathode or regulating terminal of the zener diode MCR6, and the cathode or regulating terminal of a zener diode MCR5. The other side of resistive elements MR24, MR26 are connected together and to the drain or input terminal of the FET MQ3. The source or output terminal of the transistor MQ3 is connected to the anode of the zener diode MCR6 and the anode of a diode MCR7. The cathode of the diode MCR7 is connected to one side of a capacitive element MC6 and to provide the output voltage MVU. There is provided a voltage regulator MU5, the VIN input terminal of which is also connected the voltage MVU. There is a "+5" terminal for the device MU5 which is connected to one side of a resistive element MR2 and the IN terminal of a RESET device MU2. This later terminal provides the voltage MVDD. The RST terminal of the device MU2 is connected to the other side of the resistive element MR2, to one side of a capacitive element MC13, and to the previously described $\overline{\text{RESET}}$ terminal of the microprocessor MU3 for providing a RESET signal thereto connected. Four terminals designated GND on the device MU5 are connected to ground. In a like manner, the other side of resistive element MR21, the anode of the zener diode MCR2, the GND terminal of the device MU6, the drain of the transistor element MQ2, the anode of the zener diode MCR5, the other side of the capacitive element MC6, the other side of the capacitive element MC13, and the GND terminal of the device MU2 are connected to ground.

OPERATION

Referring to FIGS. 10A and 10B, explanation of the operation of the preferred embodiment of the invention is begun. Terminal 4 otherwise designated "C" of connector CJ1 is internally connected to ground. This terminal is interconnected externally with the user's ground. Connected to terminal 1 externally of connector CJ1 is a customer's pushbutton or similar initiating device which provides the output signal "3" which is indicative of a start operation. This is supplied to terminal CP2 of chip CU1 in order to begin operation. Connected externally to terminal 2 of terminal CJ1 is a "P" signal which is indicative that it is "permissible" to utilize the contactor circuit. This may be referred to as an ENABLE signal which is supplied by the user. Finally, connected to terminal 3 is the user's control voltage which, in a preferred embodiment of the invention, may be 120 V AC. This latter voltage is designated "E".

Varistor CMV1 operates in conjunction with filter network CR3, CC3 to provide the control signal "E". Resistors CR29, CR35 operating in parallel cooperate with resistor CR2 and capacitor CC2 provide the filtered signal "P". Resistive elements CR34, CR28 operating in conjunction with resistive element CR1 and capacitive element CC1 provide a filtered input for the "START" signal. The "START" signal is supplied to the chip CU1 by way of voltage divider CR1, CC1, to the CP2, PC1 inputs of the microprocessor CU1, to indicate a start operation is to begin. Enable or permission signal "P" is supplied to the microprocessor CU1 by way of the voltage divider created by the resistive elements CR2, CC2 and provides an input signal to terminals CP1 and PC0 of the chip CU1 to indicate that it is permissive to utilize the chip.

With attention to FIG. 10B, a method for closing and opening the contacts of the contactor 10 is taught. In particular there is provided, as is shown in FIG. 3 for example, the coil COIL SC for moving the member 42 for thus causing the bridging member 44 to move in such a direction as to cause the contacts 22, 26, 46, 48 to close in the manner described previously, or to open in the manner described previously, depending upon where energy is supplied to the coil COIL CS or not. Energy may be supplied to the coil COIL CS in any convenient controllable fashion, but in a preferred embodiment of the invention it is provided by way of interconnection with the control voltage "E" as actuated by a signal designated FETDRIVE going positive as a function of action within the chip CU1. The diodes CCR10, CCR11, CCR12, CCR13 provide a full-wave bridge rectifier for the AC voltage "E" as interconnected between terminal 3 and terminal 4 of connector CJ1. This voltage is impressed across the combination of the resistive element CR15 and the zener diode CCR5 to provide a controlled voltage for the collector of the output of the transistor of the optocouple transistor network CU2. Normally, if the FETDRIVE signal is zero, the diode portion of the optocoupler or input circuit thereof remains unenergized, and the transistor output allows the base of the transistor CQ3 to assume a sufficient value of current and voltage to allow the base of the transistor CQ4 to place transistor CQ4 in an open circuit disposition between the collector and emitter thereof. However, if the FETDRIVE output signal is present, the diode of the optocoupler CU2 is energized, thus providing energizing light to the base of the transistor output thereof, thus causing the transistor CQ3 to conduct in such a manner as to cause the transistor CQ4 to assume a short circuit disposition between the emitter and collector thereof, thus providing the full voltage "E" between the terminals 1 and 2 of the connector CJ3 and across the diode CCR4. This causes the coil COIL CS to conduct electrical current, thus causing the contacts of the aforementioned contactor to close, thus providing a path for current through the aforementioned contactor.

Referring to FIGS. 10B, 10A, it will be noted that the presence of the voltage "E" will cause the voltage divider-filter represented by the resistive element CR3, and capacitive element CC3 to provide an input signal to the CPO input of the chip CU1 by way of conductor LINE SENSE, thus indicating that line voltage is present and that any operation within the chip CU1 or outside thereof which depends upon the presence of that voltage is allowable. In a like manner, resistive element CR17 will conduct some of the current which flows through the coil COIL SC when the coil is energized, thus providing an input indication back by way of the COIL I SENSE line to the filter represented by resistive element CR7 and capacitive element CC12. The midpoint of this filter element is interconnected with the MUX4 input terminal of the chip CU1, thus indicating that current is flowing in the coil, thus providing an implied input that the contactor contacts are closed.

Coils CL1A, CL1B, CL1C are interconnected at one end thereof to ground. These coils sense phase current flowing in phases A, B, C, or 1, 2, 3, as the case may be, of a three-phase electrical power system which is interconnected with the contacts of the aforementioned contactor. These coils provide analog current information to the chip CU1 by way of input terminals MUX0, MUX1, MUX2 for PHASES 1, 2, 3, respectively.

In order to generate the voltage +VU1, it is necessary to take the 120 V control voltage "E" and capacitively couple it to generate the appropriate voltage. Capacitor CC8 performs this function. The resistive element CR44 is a discharge resistor which will discharge the capacitor CC8 in the event of a loss of power. Resistive element CR12 and resistive element CR46 together act as a parallel current-limiting resistive network. Zener diode CCR1 clips the voltage to a usable value which in the preferred embodiment of the invention is approximately 15 V. Diode CCR2 is a half-wave rectifier and resistive element CR13 and capacitive element CC10 act as a filter. Capacitive element CC10 is a charge filter. The voltage +VU1 is therefore generated at the junction point between the resistive element CR13 and capacitive element CC10. Voltage +VU1 then cooperates with resistive element CR13 in combination with capacitive element CC14 and transistor CQ1 to create a 5 V power supply. This value is designated CVDD and it exists at the emitter of transistor Q1 and is supplied to the CVDD terminal of the chip CU1. Voltage CVDD cooperates with capacitive element CC4 and resistive element CR27 to create a RESET network. This RESET network cooperates with the RESN input terminal of the chip CU1. If the voltage VDD becomes noisy, thus creating a possibility that the chip CU1 will operate in an erratic manner, the RESET network will reset the chip CU1 at terminal RESN. Element CU3 is part of an undervoltage reset. If the voltage CVDD is above 4.5 V, it will operate to pull the voltage up toward 5 V at the top of capacitive element CC7. If voltage VDD is below 4.5 V, the chip CU1 will be reset by way of the reset network RESN. Zener diode CCR3 protects the input to the regulator circuit CU3 so that the voltage impressed thereacross does not get larger than a predetermined value which, in a one embodiment of the invention, is about 5.6 V. Resistive element CR19 which is interconnected with terminals OS1, OS2 of the chip CU1 sets the frequency at which chip CU1 oscillates. Resistive elements CR10, CR11 form a trim circuit which is utilized to set the VADJ (V adjust) and VREF (V reference) capabilities of the chip CU1. In one embodiment of the invention, resistive elements CR10, CR11 are not adjustable.

Referring now to FIG. 10C, the power-down circuit will be described. An amount of electrical charge is stored in capacitive element CC1 that is in proportion to the amount of heat in the motor controlled by the contactor or motor control device 10. There is stored internally in the chip CU1 a model for what the heat of the motor will be as a function of input variables such as motor current. The electrical charge is supplied by way of terminal PC4. There is also provided a POWER DOWN SENSE line which is connected to terminal MUX5 of chip CU1. It utilizes the voltage on capacitor C11 to decide how hot the motor was when power was lost. There is also provided a REMOTE RESET SENSE line in which resistive element CR20 and resistive element CR32 cooperate with the RR signal on terminal 7 of connector CJ2. These, in conjunction with resistive element R21, can provide a remote electrical reset and indication. Switch element CSW3 is a reset switch. When the contactor 10 has been tripped and switch CSW3 is actuated, the entire unit will be reset and be prepared to run again. Capacitive element CC13 and resistive element CR24 act as a noise filter for the communications channel or terminal designated DI. Likewise, resistive elements CR23, CR33 and capacitive element CC5 act as a noise filter for the clock channel CLK. Switch CSW2 in conjunction with its various terminals and the associated pulldown resistive resistors CR37 through CR43 is an option setting switch, whereby the user can throw certain parts of the switch to indicate heater settings, motor size, etc for programming chip CU1.

Referring now to FIGS. 11A-11D, the operation of the communications module 200 will be described. In particular, there is provided a connector MP2 which represents the first stage of the input network 201 for the communications device 200. Connector MP2 is interconnectable with a communications interface CONI "computer operated network interface" in a remote personal computer PC in a manner which will described hereinafter. Terminal 1 of connector MP2 interconnects with the line designated COMM IN which feeds through the capacitive element MC9 and a resistive element MR9, which operate as a filter. There is provided transformer MT1 having the one side of the primary winding MP1 thereof connected to COMM IN line and the other side thereof connected to the COMM OUT line which, in turn, is connected to terminal 1 of connector MP2. The pair of secondaries MS1, S2 for transformer CT1 interact with the remaining part of the communications module 200. Resistive element MR11 is a current-limiting element and diodes MCR3, MCR4 are clipping diodes. The result of the action of the clipping diodes MCR3, MCR4 is to take the AC signal which is provided by the secondary winding MS2 of the transformer MT1 and clip the voltage to near zero in both the positive and negative direction. Resistive element MR12 feeds the positive terminal of the comparator MU1A, the negative terminal of which is grounded. The output terminal of the comparator MU1A provides the output signal MRX. Comparator MU1A basically operates as a squaring device, which ensures that the signal MRX has an acceptable square wave shape. Resistive element MR13 provides hysteresis for the comparator MU1A so that it does not oscillate about a single value. Resistive element MR15 is a pull-up resistor; that is because the output of the comparator MU1A is of the open collector variety. There is also provided a similar comparator MU1B which has available to the negative terminal thereof the signal MTX, which will be described more fully hereinafter. Signal MTX is either a 5 V or a 0 V signal. Resistive elements MR16, MR17 are bias resistors which place a bias of approximately 2.5 V on the positive terminal of the comparator MU1B. Resistive element MR18 is a pull-up resistor similar to resistive element MR15. When the output of the comparator MU1B is high or at a digital 1, the field effects transistor MQ1 is energized or turned on, thus drawing electrical current through current-limiting resistive element MR14, and through the light-emitting diode element MLED1. Energization of the light-emitting diode element MLED1 is an indication to the user that the entire unit is, in fact, in a transmitting mode. Resistive element MR10 and capacitive element MC10 merely act in combination as a noise filter. Field effects transistor MQ1 is an oscillating device, and when it is turned on it provides an oscillating AC signal which generates a signal across the transistor secondary MS1 for application to the communications network represented by the lines COMM IN and COMM OUT. This is true even though the signal MTX is an ON/OFF type DC signal. Consequently, element MQ1, which may be a metal oxide FET transformer is a modulator. On the other hand, the operation of the input circuit represented by resistive element MR11, diodes MCR3, MCR4 and resistive elements MR12, MR13, MR15 and comparator MU1A act as a demodulator network.

Attention is now called to the rotary switches MSW1, MSW2, MSW3 of FIG. 11A. Basically, these switches provide address information for the entire network. It does this by providing a digital code to the INCOM chip MU4. Once the INCOM chip MU4 has its address, when a signal MRX is delivered to the INCOM chip MU4 by way of the input network 201 previously described, the INCOM chip MU4 scans the address information provided in part of the transmission from terminal MRX and decides whether the INCOM chip has been properly addressed or not. If the INCOM chip has been properly addressed in compliance with the address information provided by the switches MSW1 through MSW3, the INCOM chip MU4 will operate to receive further information from the communication network and provide useful functions such as motor starting. Obviously, address information is provided from the switches MSW1 through MSW3 by way of the twelve lines interconnected with the input terminals A0 through A11 of the INCOM chip MU4. The RX and TX terminals which interconnect with the MRX and MTX signals, respectively, of the input circuit 201 as described previously are shown on the INCOM chip MU4. INCOM chip terminals OSC1 and OSC2 are interconnected with a well-known oscillator circuit arrangement comprising capacitive elements MC1, MC4, resistive element MR1, and crystal MY1. Capacitive element MC3 which is interconnected between ground and the combination of the input terminal VDD and the power supply voltage CVDD is merely a bypass capacitor. Resistive elements CR19, CR20 provide a voltage divider between ground and voltage VDD. The voltage divider point of the latter network is connected to the PBO input of the microprocessor MU3 for the purpose of preventing a user from effectuating commands into the microprocessor CU3, which are undesirable. It is therefore a disabler of certain microprocessor commands.

Referring additionally to FIG. 11B, terminals PA0 through PA4 of the microprocessor MU3 are interconnected with the R/W, SCRCLK, SERDAT, INT, and BUSY terminals of the INCOM chip MU4, respectively. Terminals BUSY and INT provide information to the microprocessor MU3, the BUSY terminal telling the microprocessor when not to communicate with the INCOM chip and the remainder of the communications network under certain circumstances and the INT terminal telling the microprocessor when to communicate.

Terminal R/W is a READ/WRITE terminal whereby the INCOM chip MU4 is alerted whether it is to write information to the microprocessor MU3 by way of the serial data line SERDAT or to read information from the microprocessor MU3 by way of the serial data line SCRDAT. The serial clock line SCRCLK is a pulsing or clocking network for the INCOM chip MU4 under the command of the microprocessor MU3. Basically, data provided to the INCOM chip MU4 by way of the input terminal RX or taken from the input chip MU4 by way of the output terminal TX is transmitted back and forth by way of this serial data line SCRDAT to and from the microprocessor MU3. Consequently, INCOM data from the external personal computer PC which comes into the input network 201 by way of connector MP2 is properly demodulated and sent to the INCOM chip MU4 by way of terminal RX, and fed from the INCOM chip MU4 to the microprocessor MU3 by way of the serial data line SERDAT. Outgoing digital information from the microprocessor MU3 traverses the serial data line SCRDAT in the opposite direction, is routed by way of the INCOM chip CU4 to the terminal TX, and thence to the input network 201 where it is modulated and provided to the personal computer PC as an output by way of the connector MP2. The terminals SCK, MOSI, MISO of microprocessor MU3 are interconnected to the connector MJ2 and from there to complementary terminals on the connector CJ2 of the electronic circuit board 128 as described previously with respect to FIG. 10C, the complementary terminals being shown to the extreme right on FIG. 10C. The aforementioned connectors MJ2 and CJ2, and the lines or cables connected therebetween, represents the main communication path between the microprocessor MU3 and the chip CU1. The clock signal which is provided by way of terminal SCK to line CLK for terminal MJ2 is always generated in the microprocessor MU3. Consequently, the microprocessor MU3 represents a master and the chip CU1 represents a slave as far as the clock signal CLK is concerned. Data is transferred back and forth between microprocessor MU3 (master) and chip CU1 (slave) by the MOSI (master out/slave in) line, and the MISO (master in/slave out) line, or terminals of the microprocessor MU3.

POWER SUPPLY 202

Figures 13A, 13B, 13C:
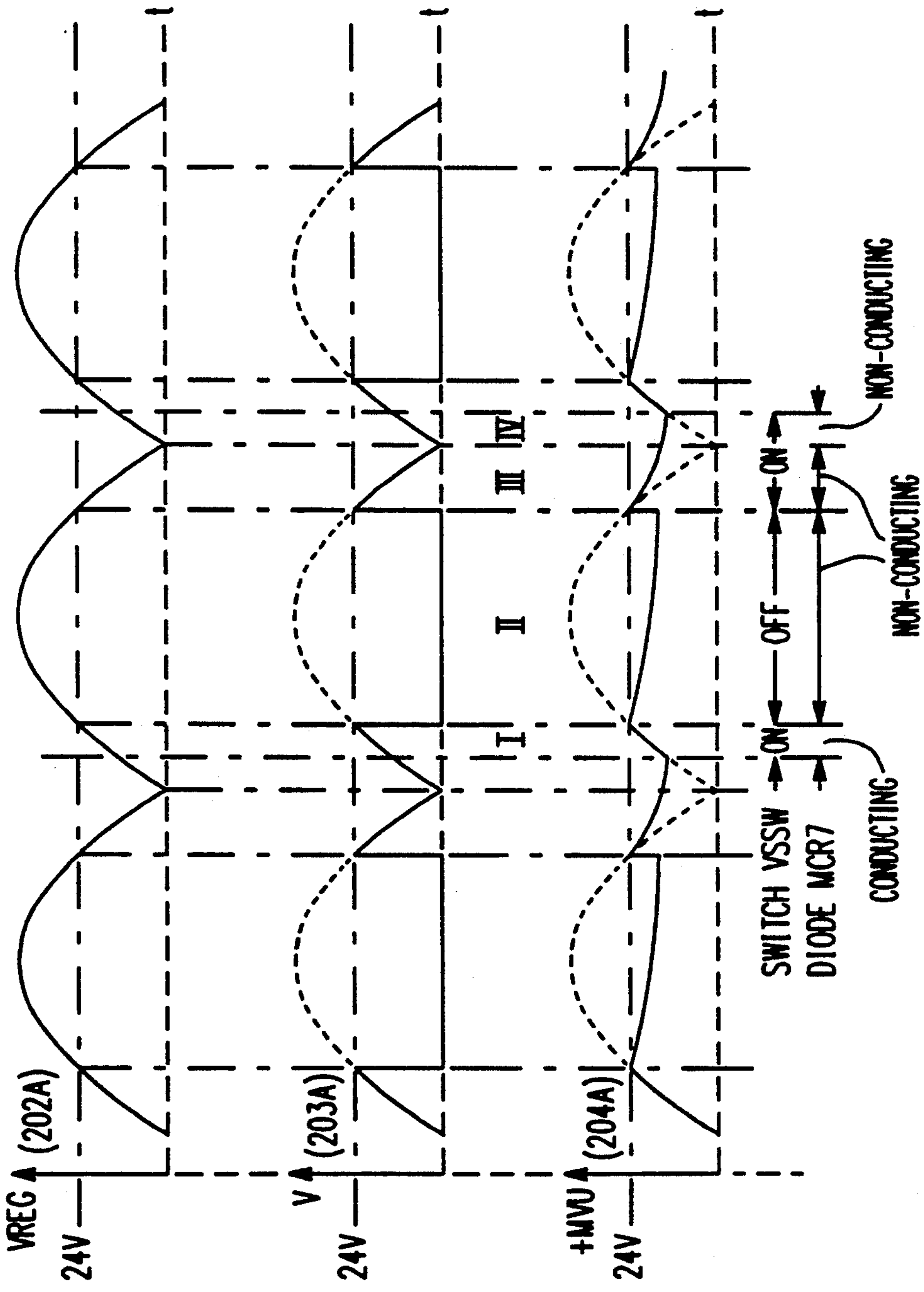
FIGS. 13A–13C shows plots of power supply voltage at various locations for the power supply 202 of the communications module 200.

Referring specifically to FIGS. 11C and 13A-13C, a pseudo switching power supply 202 is taught. In particular, AC power is delivered to the power supply 202 by way of the connector MJ2 at terminals 1, 2 thereof (see FIG. 11B). The AC power is delivered between the lines VAC and CC from complementary lines on terminal 1 and 3 of connector CJ2. One of the advantages of the present invention lies in the fact that the AC voltage applied as described may range from a very low value to as high as 200 V. The AC voltage is voltage "E" as shown in FIGS. 10A and 10C. Diode element MCR1 half-wave rectifies the input voltage as shown at Point 202A and in waveform 202A in FIG. 13A. In one embodiment of the invention it is desirable to produce 24 V as an output voltage MVU, and therefore the 24 V line is shown in FIG. 13A although that is not limiting. In the present embodiment of the invention, resistive elements MR6, MR21 are chosen to produce the ultimate voltage wave shape at MVU as depicted in FIG. 13C. Zener diode element MCR2 clips the voltage between resistive elements MR25 and MR21 at 5.6 V to protect the low voltage reset device MU6 to thus limit the input voltage on terminal IN thereof to no more than 5.6 V. Resistive element MR25 is a current-limiting resistor. Device MU6 is a "low voltage" reset device which may be of the kind designated as Motorola MC34064. The low voltage reset device MU6 is such that if the voltage on the input terminal IN thereof, relative to ground, is below 4.5 V, the reset output terminal RST produces a zero output voltage to ground; whereas, on the other hand, if the voltage on the input terminal is above 4.5 V, the reset output terminal RST produces approximately 4.5 V to ground. Resistive element MR22 is a pull-down resistor element because device MU6 operates in the open collector mode. Field effects transistor device MQ2 acts as an inverter producing a signal opposite to the one at the RST output terminal of the device MU6. The voltage between the Drain and Source of transistor MQ2 oscillates or changes between zero and 15 V DC. The 15 V output is determined by the zener diode device MCR6. Field effects transistor device MQ3 acts as a series switch relative to the voltage produced at the cathode of the diode MCR1, i.e., the voltage at point 202A. The output voltage will be allowed to be imposed upon the source of field effects transistor MQ3 until a value of 24 V is attained. At that point the action of the transistor MU6, MQ2 will cause the conduction path between the drain and the source of the field effects transistor MQ3 to open. The voltage at the drain will drop instantaneously to zero. This is shown as the voltage at point 203A in FIGS. 11C and 13. Diode MCR7 and capacitive element MC6 act as a filter so that the output voltage MVU at point 204A in FIGS. 11C and 13 is shown as a rather poorly regulated voltage MVU, which is approximately 24 V. It is necessary to regulate this latter voltage to produce the value MVDD, which is a highly regulated 5 V DC value in this embodiment of the invention. In order to accomplish that, a 5 V regulator device MU5 is utilized. With the voltage wave shape MVU imposed on the "VIN" terminal of Device MU5, the output voltage at the "+5" terminal thereof is the highly regulated 5 V DC value MVDD as shown.

The operation of the power supply circuit 202 is as follows. At the beginning of the Region I, switch VSSM is on and diode MCR7 is conducting. The half wave rectified voltage is above zero but less than 24 V and is increasing towards 24 V. Output voltage +MVU at 0.204 A follows the rectified voltage VREC shown in FIG. 13A which exists at 0.202 A. At the end of Region I, the half wave rectified voltage VREC reaches 24 V and turns switch VSSM off. This immediately drops the voltage on the anode of the diode MCR7 to zero which causes that diode to cease conducting. During the period II, the switch VSSM is off and the diode MCR7 is nonconducting. The voltage +MVU is determined by the discharge characteristic of the capacitor MC6 discharging through the remainder of the circuit connected to the power supply terminal +MVU. This continues until the end of Region II, when the half wave rectifier voltage VREC shown in FIG. 13 drops below 24 V. When this happens, switch VSSM immediately turns on, however, the diode MCR7 remains in a nonconducting state as the voltage on the anode thereof is less than the voltage on the cathode thereof which is represented by the decay characteristic of the capacitor MC6 as was described previously. It will be noted that the voltage on the anode of the diode decreases rapidly towards zero during Region III as it follows the wave shape VREC. The voltage on the cathode of the diode MCR7 is also decreasing but not as fast as the voltage on the anode. At the beginning of Region IV the capacitive element continues its discharge because the switch VSSM though still in a conducting or on state allows voltage to be impressed on the anode of the diode MCR7 which is increasing but nevertheless still less than the discharge voltage of the capacitor MC6. The end of Region IV is defined as that point where the increasing voltage VREC equals the decreasing voltage of the capacitive element MC6 in which case the cycle begins once again. Note that once the output voltage approaches the switch control voltage, the switch is automatically turned off, even if the voltage sense circuit has not been activated. This has the advantage of blocking the higher input voltages when charging and allowing the circuit to continue to conduct if not fully charged. It also acts as an internal phase angle controller.

Low voltage reset MU2, resistive element MR2, and capacitive element MC13 produce the signal RESET for microprocessor MU3. In particular, as long as the voltage across the resistive element MR2, which is connected across the IN-to-RST terminals of the device MU2, is above 4.5 V, the RESET wave shape will be at 0 V. However, if the latter-mentioned voltage across the resistive element R2 drops below 4.5 V, the RESET value will step to a high value, which be sufficient to reset the microprocessor MU3. This will occur as a result of a voltage loss on the power supply 202 which would cause the activity of the microprocessor MU3 to no longer be considered reliable.

CALIBRATION TECHNIQUE

Referring now to FIGS. 10A-10C, 11A, 11B, 11D, 12, 14 and 15, the process for calculating a digital calibration factor for the electrical device 10 is described. In particular, the chip CU1 operating in conjunction with the remainder of the circuits of FIGS. 10, 11, senses an electrical variable such as but not limited to an electrical current IAIN by way of current sensors CL1A, CL1B, or CL1C, and provides that current to the chip CU1 by way of input terminals MUX0, MUX1, and MUX2, respectively. Sequentially, those input terminals are supplied by terminal MUX3 to an integrating capacitor or integrator CC6 for producing a voltage representative of the currents in each case. That voltage is then sequentially provided to an A/D converter through terminal MXO and thence to memory locations IA0, IA1, IB0, IB1, IC0, IC1, in the chip CU1 for phase currents A, B, C, respectively.

Key elements of the process include an adjustable current source PCS and product hardware including analog signal processing circuitry and a synchronous bidirectional serial communication link to an external computer PC (product serves as "master" for link).

The procedure assumes that the product microprocessor CU1 utilizes a gain correction factor for each analog input which is used to adjust the digitally processed values derived from the A/D converter output. Also it is assumed that for a time based calibration that the processor CU1 utilizes a timer "tick" derived from a programmable timer. The timer consists of a free running counter and an output compare register. Whenever a timer interrupt occurs, corresponding to the counter value equalling the compare register contents, the register is reloaded with the value required to produce the next equally spaced timer interrupt. The computation of this reload value involves a timer correction factor which can be used to adjust the time between timer interrupts. This can be used to correct for oscillator variations due to the use of an RC oscillator rather than a crystal.

Figure 12:
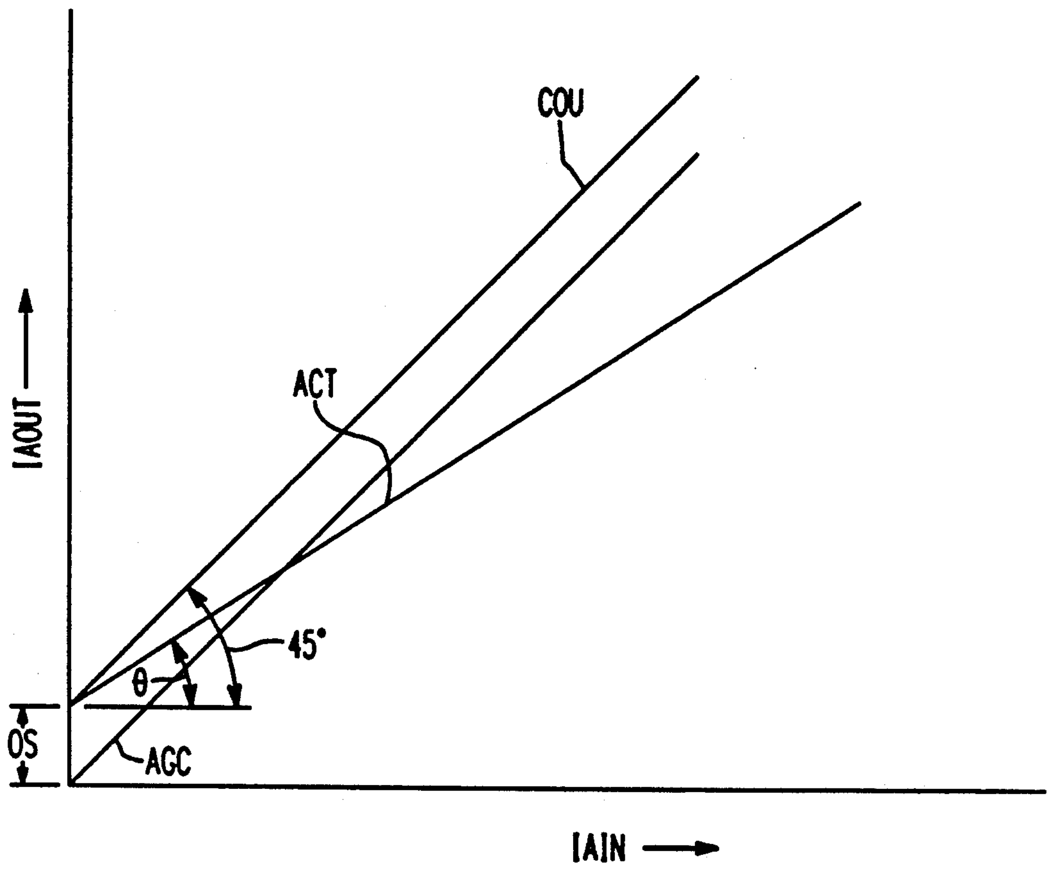
FIG. 12 shows a plot of input vs. output (or derived) current.

Referring to FIG. 12 specifically, it is recognized that for an ideal system, the actual current sensed IAIN in this case should equal the current as derived or interpreted by the chip CU1; IOUT in this case. In an ideal situation a graph representing the relationship between IAIN and IAOUT for equal scales on both ordinates should be a straight line at a 45° angular offset from the horizontal axis; that merely says that for any particular value of input current IAIN chosen, the output current IAOUT or derived current utilized in the microprocessor CU1 should be exactly the same. On the curve depicted in FIG. 12, that means that the angle j should be 45° and the offset OS should be zero. Therefore, the line designated AGC (assumed gain correction) should represent a slope of "1", which means that, as was stated previously, the input current will equal the output current. However, it is well recognized that the gain correction may not be ideal and, furthermore, offsets may exist. In this embodiment of the invention no correction is made for the offset OS. However, correction is made for gain error. This means that if, in actuality, the output current IAOUT does not equal the input current IAIN but rather is related to the input current IAIN by the straight line designated ACT (for actual current measurement), for example, that a gain correction can be made, which ignores offset OS but which nevertheless places the corrected line COU at a relationship of $j=45°$ with respect to the horizontal axis of the graph of FIG. 12. This corrected output utilizes the generation or calculation of digital gain correction factors in this embodiment of the invention.

In order to calculate gain correction factors for electrical current, a remote personal computer PC designated PC may be interconnected with terminal MP2 by way or a twisted pair of conductors TP. The remote personal computer PC may be interconnected by way of a CONI card or module. A precision current source PCS is utilized to provide precision known currents in the lines A, B, C, which are measured or monitored by the current sensors CL1A, CL1B, CL1C, respectively. The precision currents generated by the precision current source PCS are also made available to the personal computer PC and is stored as a value in a memory portion thereof.

Figure 14:
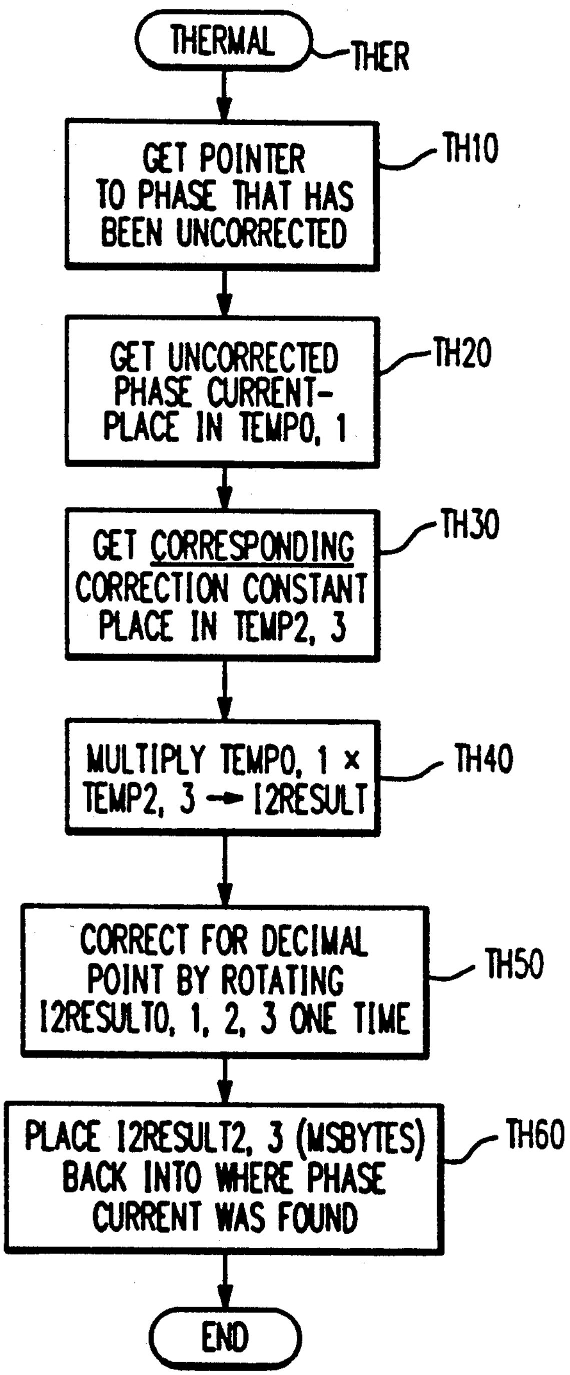
FIG. 14 shows a flow chart for reading circuit variables.
Figure 15:
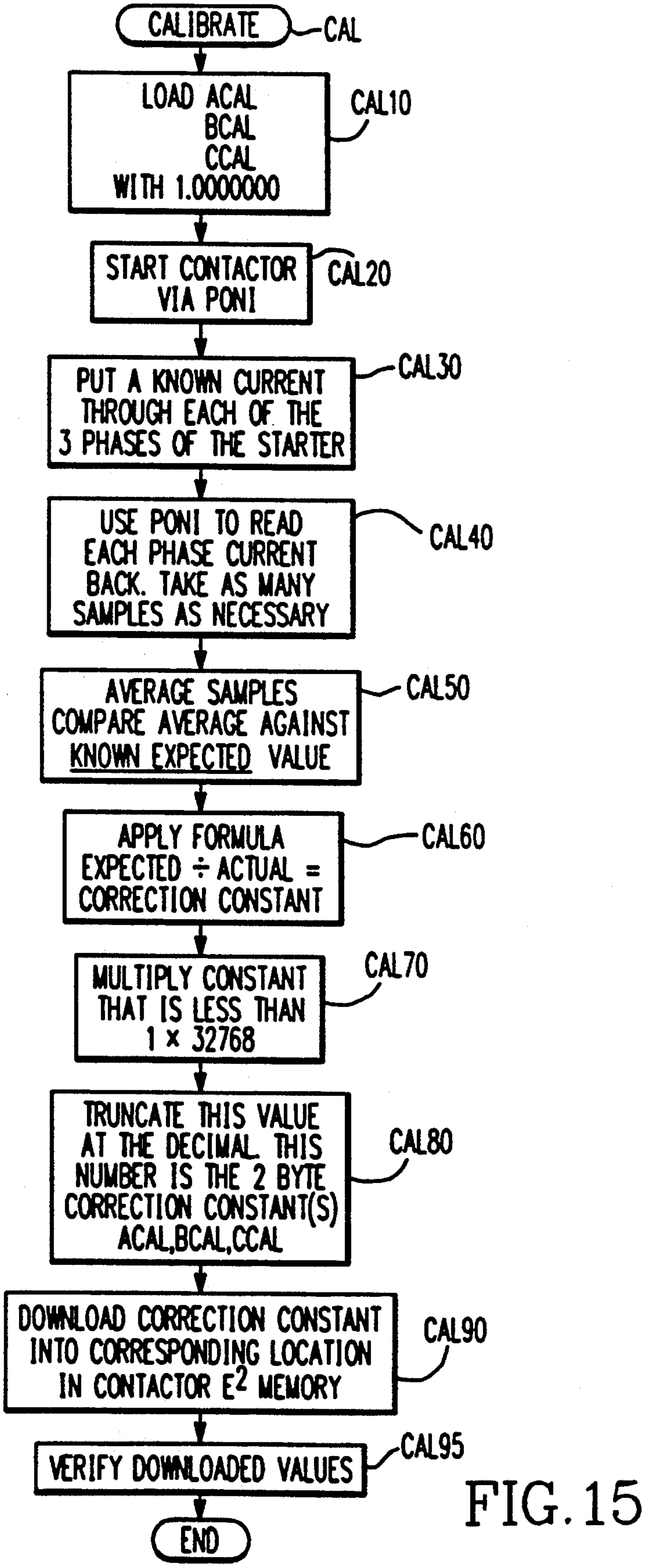
FIG. 15 shows a flow chart for calibrating the contactor.

Referring now to FIG. 14, the flow chart designated thermal (THER) is provided as part of the microprocessor control for the contactor of FIGS. 10. For purposes of simplicity of illustration, the phase correction and calibration will be described only with respect to one current which, in this embodiment of the invention, is arbitrarily chosen to be current IAIN. It is to be understood that correction and calculation with respect to gain correction factors for other circuit variables follow the same process. As indicated by block TH10, the first operation is to place the "pointer" of the microprocessor or the chip CU1 to a phase that has been uncorrected, which in this embodiment of the invention will be identified as the current contained in the 2-byte location IA0, IA1 for phase A. Each byte has eight bits of information stored therein. This information represents a derived electrical value. According to block TH20, these two bytes of data are then placed by the microprocessor portion of the chip CU1 into the TEMP0, TEMP1 random access memory locations. According to block TH30, the microprocessor then acquires corresponding correction constants such as ACAL from the calibration factor memory region or EEPROM and places those correction constants or factors into memory locations TEMP2 and TEMP3. It is understood that how the correction constants are derived has not yet been fully explained, but will be explained in detail with respect to FIG. 14. In the equation Y=MX+B for the lines of FIG. 12, M represents the slope or angle j for the various curves AGC, ACT, and COU. The offset OS as represented by the symbol B in the above equation is ignored in this embodiment of the invention. The correction constant adjusts the slope M. According to block TH40, the information stored in bytes TEMP0, TEMP1 is multiplied by the information stored in the bytes TEMP2, TEMP3 to produce the results I2-RESULT. This is done by a subroutine designated "MUL2". The product of the multiplication is stored in the random access memory in locations I2RESULT0, I2RESULT1, I2RESULT2, and I2RESULT3, as indicated by block TH40. The product is a 4-byte number. As is indicated in block TH50, it is necessary to correct for the decimal point by rotating to the left the bytes I2RESULT 0, 1, 2, 3 one time. This effectively places the decimal point in the correct place. In essence it means to move the decimal point one binary place to the left. And then, as indicated by block TH60, the I2-RESULT 2, 3 bytes are placed back to where the phase current was found in the first place, which are locations IA0, IA1. This is equivalent of placing the most significant digits of the I2RESULT information into memory. The new information in the locations IA0, IA1 now represents corrected or derived out current or the current designated IAOUT in FIG. 12. The correction which has taken place has been one of slope correction rather than offset correction.

Referring now to FIG. 14 as well as FIGS. 10C, 11D, 12, the flow chart CALIBRATE for loading 2-byte gain correction information into locations ACAL, BCAL, and CCAL of the EEPROM of the chip CU1 is described. In this embodiment of the invention and for purposes of simplicity, only the calculation of the ACAL set of bytes is described. ACAL is a 2-byte, 8-bit per byte, word. In order to arrive at the word, the personal computer PC downloads by way of the apparatus of FIGS. 10, 11 into the contactor 10. The personal computer PC instructs the chip CU1 to place the binary number 1.000000 into the ACAL location. This is a starting point, and this is depicted in calibrate flow chart CAL. The loading is specifically depicted in block CAL10. The personal computer PC is then utilized, as indicated at block CAL20, to start the contactor 10 in such a manner that the contacts 22, 26, 44 and 46 thereof are closed, or at least it appears to the chip CU1 that the contacts are closed. At this point, as indicated at block CAL30, a known precise current or a first value of an input electrical variable is placed by way of the precision current source PCS through each of the three phases A, B, C of the contactor 10, as the case may be, so that the sensing devices CL1A, CL1B, CL1C, operate in the manner previously described to sense the input electrical variable (current) to thus place derived input current information in the random access memory in locations IA0, IA1, IB0, IB1, IC0, IC1, respectively. According to block CAL40, the stored phase or derived currents are then read back or communicated to the personal computer PC in the manner described previously. According to block CAL40, this may be done by a sampling technique in which phase currents are sensed, stored, and read back to the personal computer PC a multiple number of times, which, in a preferred embodiment of the invention, may be ten times, to provide an accumulated value of phase current in the personal computer, which is then divided by the number of entries, which in this case is ten, to provide an average value of phase current. This is done according to block CAL50. At this point it is important to recognize that the calibration factor is "1", so that the data that has been read back to personal computer PC is uncorrected data indicative of what the entire system represented by FIGS. 10C, 10D interpret the precision currents IA, IB, IC, to be. For instance, in a preferred embodiment of the invention, current IA, IB, IC may be 5-ampere RMS current, and yet when read back to the programmable controller PC one may appear to be 4.997 amperes, indicating an error of 0.003 ampere caused by error in the various elements shown in FIGS. 10C, 10D. It is interesting to note at this point that the actual current, though being 5 amps, is derived by the system or interpreted thereby as being only 4.997 amps by the apparatus of FIGS. 10C, 10D. It is also important to recognize, and it is an important part of the present invention, that regardless of the value sensed by the personal computer, i.e., 4.997 amperes, the actual value being measured is 5 amperes, and therefore the interpreted or derived value of 4.997 amperes really represent 5 amperes. The personal computer PC then takes these average samples and compares them against the known expected value, which is 5 amperes. The personal computer PC then calculates the calibration factor according to the relationship: the calibration factor equals the first value of input electrical current divided by the first derived value. For example, in the personal computer PC the expected or first value of 5 amperes is divided by the actual or derived value of 4.997 to produce a correction constant 1.006; this is done according to block CAL60. Blocks CAL70, CAL80 digitally manipulate the data to place it in a proper form for being resubmitted or communicated to the calibration factor memory of the chip CU1 for digital placement therein. Block CAL90 indicates that the correction constant should be downloaded into the corresponding locations in the contactor EEPROM memory. This is a memory which is non-volatile, and once values are stored or "locked" therein they cannot be easily removed. Consequently, once the device in question has been calibrated at the factory and the proper calibration values have been loaded into the EEPROM memory, the customer-/user cannot inadvertently erase the valuable calibration data. This information is stored in the ACAL, BCAL, CCAL locations in the EEPROM memory. As is shown in lock CAL95, the personal computer PC interrogates the EEPROM to verify that the values which were downloaded are correct. At this point the calibration procedure has been completed. It will be noted by referring again to FIG. 14, block TH30, that when the chip CU1 is instructed to acquire the corresponding correction constants and place them in RAM locations TEMP2,3, for example, it is the corrected calibration values ACAL, BCAL and CCAL which are placed into the TEMP2,3 locations. Consequently, when device 10 performs its useful function, the appropriate derived value will be effected by the calibration factor.

Referring once again to FIGS. 10, 11, the path of communication between the personal computer PC and the memories of the chip CU1 is described. In particular, information travels from the personal computer PC to the memories of the sure chip CU1 in the following manner: Information travels down the twisted pair TP to the connector MP2 in the form of zeroes and ones represented by modulated high frequency AC signals from whence the information is provided by way of the transformer MT1 to the demodulator represented by the circuitry associated with the comparator MU1A, to then be provided as a series of digital ones and zeroes at the output terminal MRX. The output terminal MRX is interconnected with the basic INCOM chip MU4 from whence it is supplied by way of the serial data channel SERDAT to terminal PA2 of the microprocessor MU3, and from thence to the data OUT line DO to the connector MJ2 at terminal 5. There the data goes to the connector CJ2 at terminal 4 and the DI line. From thence the data moves to the SDI terminal of the chip CU1 where it may be routed to an EEPROM location therein.

Data such as ACAL resident in the EEPROM of the chip CU1 may be transferred out by way of the SDO terminal of the surechip CU1 and the DO output line to the connector CJ2 at terminal 5. From there the data is routed to the connector MJ2 at terminal 6 and to the DI input line and thence to the MISO input terminal of the microprocessor MU3. From there it is provided from terminal PA2 to the SERDAT terminal of the INCOM chip MU4, and from there to the TX output terminal as signal MTX. The TX output terminal feeds the modulator circuit represented, for example, by the comparator MU1B and the field effect transistor MQ1, as shown in FIG. 11D. From there the data is fed by way of the resistor MR14 to the secondary winding MS1 of the transformer MT1, and then back through connector MP2 and the twisted pair TP and to the personal computer.

Amplitude Calibration Method 1

This procedure utilizes the product microprocessor MU3 to calculate the gain correction factor based on a digital message received from the external computer PC that the test currents are at the desired calibration values. In this case the external computer PC could even be replaced by a jumper to other parts of the chip CU1 or the microprocessor MU3 which will cause the product to execute the calibration code, calculate the gain constants, and store the values in nonvolatile memory.

This technique has the advantage that it is simple, reliable and does not require an external computer.

Amplitude Calibration Method 2

In this procedure the gain factor calculation is done by the external computer PC as described previously. The product through the communications channel passes to the external computer PC both the value of currents and the associated gain factors which the product used to calculate the current values. The external computer PC compares the current values received from the product to those received from the current transducers. New gain factors are then calculated and sent to the chip CU1 for storage in nonvolatile memory as shown below:

GAIN FACTOR new=GAIN FACTOR old *
(CURRENT from the reference/CURRENT
from the product)

Time Calibration Method 1

The oscillator frequency can be measured directly by means of a frequency meter. The external computer PC can calculate the timer compare register load value increment by LOAD VALUE new=LOAD VALUE ideal *
(OSC.FREQ. actual/OSC.FREQ. ideal)

This value can be sent to product for storage in nonvolatile memory.

Time Calibration Method 2

A more automatic method for time calibration uses circuitry associated with the external computer PC to measure the frequency of the serial clock or some other product microprocessor output which is related to the product's execution time and then automatically sends a request to the product to either increase or decrease compare the register load increment.

Referring now to Table I, the pin reconciliation for the input pins of the INCOM chip MU4 of the present specification and the INCOM chip of the incorporated-by-reference U.S. Pat. No. 4,644,547 is set forth.

TABLE I

PIN RECONCILIATION

| Pin Numbers This INCOM Chip (MU4) | Pin Numbers INCOM Chip of U.S. Pat. No. 4,644,547 |
|---|---|
| 1 | 28 |
| 4 | 4 |
| 5 | 3 |
| 6 | 5 |
| 7 | 6 |
| 9 | 8 |
| 10 | 9 |
| 11 | 10 |
| 12 | 11 |
| 13 | 12 |
| 14 | 13 |
| 15 | 14 |
| 16 | 15 |
| 17 | 16 |
| 18 | 17 |
| 19 | 18 |
| 20 | 19 |
| 21 | 20 |
| 22 | 21 |
| 23 | 22 |
| 24 | 23 |
| 25 | 24 |
| 26 | 25 |
| 27 | 26 |

As was described previously, chip CU1 may be a SURE chip, the construction and operation of which will be described hereinafter.

The following definitions apply to the following description:

DEFINITIONS

Bit designations: Bits within a register will be designated by placing the bit number within square brackets. For example, bit 5 of register ABC is designated as: ABC[5]. Bits 5 through 0 of register ABC are designated: ABC[5 . . . 0]. Bits 4 and 5 of register ABC are designated as ABC[5,4], etc.

Hexadecimal. Base 16 numbers written with a dollar sign prefix. For example, $0100=256 decimal.

High-true: These signals are designated with the suffix "h" and are defined to be asserted (true or logical 1) when their electrical level is at or near the +VDD supply and are defined to be negated false or a logical zero) when their electrical level is at or near zero volts direct current (Vdc).

Low-true: These signals are designated by the suffix "b" and are defined to be asserted (true, or a logical 1) when their electrical level and are defined to be negated (false or a logical zero) when their electrical level is at or near +VDD supply.

Input: An input signal is received by the IC 10

Output: An output signal is driven by the IC 10.

Referring to the drawings, the IC in accordance with the present invention is generally identified with the reference numeral 10. The circuitry of the IC 10 has been standardized to enable it to be utilized with various types of electrical equipment including circuit breakers, motor controllers, and the like. For illustration and discussion purposes only, the IC 10 is shown utilized in a circuit breaker 12 in FIG. 16. The circuit breaker 12 is shown as a three phase circuit breaker having phases identified as "A", "B" and "C". It is to be understood by those of ordinary skill in the art that the IC 10 is capable of being utilized with various other types of electrical equipment, such as motor controllers, and the like.

The circuit breaker 12 does not form a portion of the present invention. As shown, the circuit breaker 12 is provided with three current transformers 14, 16 and 18. These current transformers 14, 16 and 18 are disposed on a load side 20 of the circuit breaker 12 to allow the circuit breaker 12 to be monitored and controlled. The line side 22 of the circuit breaker 12 is generally connected to a three phase source of electrical energy (not shown). A load side 20 is generally connected to a three phase load (not shown), such as an electrical motor.

An important aspect of the invention relates to the fact that the IC 10 is current driven as will be discussed below. As illustrated in FIGS. 16 and 56, the output of the current transformers 14, 16 and 18 is applied to the IC 10 by way of conditioning circuitry 19. The conditioning circuitry is used to provide electrical current of about 20 microamperes to the IC 10.

A block diagram of the digital portion of an exemplary embodiment of the IC 10 is shown in FIG. 17. Various configuration options are selectable by software programming and mask options for specific applications as will be discussed below. In order to provide an IC 10 with universal application for controlling and monitoring various types of electrical equipment, such as circuit breakers, motor controllers and the like, various peripherals may be provided. These peripheral devices may include a microprocessor 30 with a multiply instruction, for example, a Motorola type MC68H05. The microprocessor 30 communicates with the various other peripherals and external pins on the chip 10 by way of an internal address, data and control bus 34. A clock generator 36 provides timing for the microprocessor 30. An on-board memory subsystem is provided which may include read only memory (ROM) 38, electrically erasable read only memory (EEPROM) 40 and random access memory (RAM) 42. The EEPROM may be provided with an internal charge pump 44 for obviating the need to provide an external high voltage source for erasure in programming of the EEPROM 40.

Exemplary memory sizes are provided for illustration and discussion purposes only. For example, 256 bytes of EEPROM 40 and 128 bytes of RAM 42 may be provided. The ROM 38 may include 2,048 bytes of mask programmable user instruction memory, 240 bytes of self-test memory, 48 bytes of zero page memory and 16 bytes for vectors.

The IC 10 has separate digital and analog power supply systems. These power supply systems are segregated to prevent digital noise from affecting the analog circuitry. The digital power supply is directed to a VDD pin on the IC 10 formed from an external voltage regulator (FIG. 57). The analog power supply is directed to a AVDD pin. In many applications, an external transistor, diode and resistor are adequate.

Dead-man and power monitor circuitry 46 is provided. The power monitor circuitry includes an internal voltage level detector for monitoring the gate drive to the shunt regulator associated with the pin AVDD. The power monitor circuitry deactivates a SHUNT output pin which, when connected to a RESN pin, provides a reset when the analog supply voltage AVDD begins to fall below a preset threshold. The dead-man circuitry monitors operation of the microprocessor 30 and activates a reset upon detection of spurious operation.

An analog power supply subsystem 48 is provided for the analog circuitry. This subsystem 48 includes a +1.25 Vdc band gap regulator and a buffer amplifier to generate a +2.5 Vdc reference. An external current source is used to power the analog power supply subsystem 48. The current source is directed to an external pin AVDD. An adjustment pin VADJ is provided to allow the voltage reference to be trimmed to exactly +2.5 Vdc. Trimming may be provided by a voltage divider circuit, for example, two series connected resistors connected between the VREF pin and an analog ground pin AVSS. The interface between the series connected resistors is connected to the VADJ pin. A shunt regulator provides a nominal +5.0 Vdc source at the AVDD pin based on the reference voltage at the VREF pin. The buffer amplifier is provided with an open drain output such that it can only source current. This will permit multiple devices to be paralleled. The regulator can also be slaved to another IC. This is accomplished by connecting the VADJ pin to the VREF pin on the slave IC and connecting the VREF pin on the slave IC to the VREF pin on the master IC.

A comparator subsystem is provided which includes a B+ comparator 50 and a quad comparator system 58. The B+ comparator 50 is provided for external power supply generation as discussed below and illustrated in FIG. 56. The inverting input of the B+ comparator 50 is referenced to the VREF pin (nominally, +2.5 Vdc). The input signal is applied to a non-inverting input pin, BSENSE, of the comparator 50. The B+ comparator 50 output is connected to an external pin BDRIVE. The quadcomparators include four comparators referenced, for example, to +1.25 Vdc.

Various other peripheral devices may also be provided on the IC 10 to allow it to be adapted for various applications, such as circuit breakers, motor controllers, contactors and the like. For example, these peripheral devices, may include an 8-bit bidirectional port A, identified with the reference numeral 52, a special purpose 3-bit bidirectional port B, identified with the reference numeral 54. The port B may be used as an input/output port or in conjunction with a synchronous serial input/output port (SSIOP). A dual function 8-bit bidirectional port C, identified with the reference numeral 56, may also be provided. This port may be used as an input/output port or as a special function port. For example, the least significant bits of this port may be ORed with the output channels from the quadcomparator subsystem 58. A port D timer 60 may also be provided. This timer 60 may be used for time base or waveform generation, periodic measurement or other periodic functions.

An important aspect of the invention relates to an analog subsystem, identified by the function blocks 62 and 64 in FIG. 17. A block diagram for this subsystem is illustrated in FIG. 18. The analog subsystem includes, for example, six analog input channels for receiving analog voltage and current signals and converting these signals to an 8-bit digital signal with 12-bit resolution. Four of the input channels 62 can be selected by the software to operate as either voltage inputs or current inputs. The other input channels 64 can only be operated as voltage inputs. Current and voltage input operation of the input channels 62 and 64 is controlled by multiplexers (MUXes) 66 and 68, which are selected by the software.

The voltage input channels can accept positive voltages in the range of 0–2.5 Vdc and are applied to an auto-zeroable adjustable gain voltage amplifier 80. These signals can be processed in either an auto-ranging mode or a fixed gain mode, selectable by the software. If the auto-ranging mode is selected, the selected voltage input channel 62 or 64 is ranged by values stored in an internal auto-ranging register to allow the gain to be automatically adjusted until the signal is at least one-half of full scale but not in overflow. The ranged signal is then converted directly to an 8-bit digital value by an A/D 78 and stored in an internal register. If fixed ranging is selected, the voltage mode inputs 62 or 64 can be operated at preselected gain settings, for example, 1, 2, 4, 8 or 16. The preselected gain settings are provided by gain circuitry which includes a resistor network 84, connected to an inverting terminal of the voltage amplifier 80 by way of a MUX 86. The MUX 86 is controlled by the software. The output of the voltage amplifier 80 is connected to the A/D circuitry 78 by way of another MUX 88. The MUX 88 is in the position shown in FIG. 18 when voltage gains other than one have been selected. However, when a gain of one is selected, the voltage amplifier 80 is disconnected from the ranging circuitry and the input voltage channel 62 or 64 is applied directly to the A/D 78.

Current mode inputs 62 accept negative currents (e.g., currents flowing out of a MXO pin) with a $-1.6$ mA, for example, representing full scale. Unselected current input channels are tied to a digital ground pin (VSS) by the MUXes 68 which provide for make-before-break switching. The selected input current channel is connected to an inverting input of an auto-zeroable current amplifier 90, referenced to analog ground (AVSS). The source follower output is configured to maintain the inverting input at a virtual ground by providing current to the selected channels through an adjustable current mirror 92. The current mirror 92 can be set by auto-ranging circuitry, which can be overwritten by the software, to one of the following exemplary ratios: 1/1, $\frac{1}{2}$, $\frac{1}{4}$, $\frac{1}{8}$ or 1/16. The ratioed mirror output current is directed to the MXO pin. Thus, the current flowing out of the MXO pin will be a programmable fraction of the sum of the currents flowing out of the selected current input channel pin. Two modes of operation are possible:

Non-integrating mode. An external resistor (not shown) may be connected between the analog ground pin (AVSS) and the MXO pin to convert the ratioed current to a voltage. This voltage may then be converted to a digital value in a similar manner as discussed above. In this mode of operation, the default amplifier gain is set at times one unless overwritten by the software.

Integrating mode. An external capacitor (not shown) may be connected between the analog ground pin (AVSS) and the MXO pin to integrate the ratioed current. A shorting switch 96 is provided to discharge this capacitor under program control. Integrated voltages are then converted by the A/D 78 as discussed above.

The voltage and current amplifiers 80 and 90 have offset voltage compensation circuitry 98 to compensate for offsets inherent in CMOS amplifiers. These uncorrected offsets can be on the order of, for example, $\pm 20$ millivolt (mV) which can affect the accuracy of the least significant bits of the converted digital value. This circuitry 98 assures that the offset is always a negative voltage between 0 and 0.5 mV and forces the amplifier 80, 90 to have a positive output when the differential input voltage is zero. This offset correction can be done either automatically by the hardware or controlled by the software.

Sample and hold capability is provided for the input channels 62 and 64. More specifically, the six analog input channels 62 and 64 are grouped into three pairs of channels 102, 104 and 106. Each pair of channels 102, 104 and 106 can be used as a single channel with sample and hold capability. A capacitor (not shown) may be connected between one channel input and the analog ground pin AVSS while the other channel of the air is connected to a voltage input. A sample command permits the software to connect the two channels of each pair together by way of sample and hold MUXes 108, 110 and 112, thus storing the input voltage on the capacitor of the adjacent channel. Only channel pairs in which both channels are configured for voltage mode operate in this fashion. All three channel pairs 102, 104 and 106 may be sampled simultaneously.

There are other important aspects of the invention. For example, the IC 10 is adapted to respond to either analog signals or digital signals and provide a digital output signal. Another important aspect relates to the fact that the IC 10 is provided with circuitry which enables it to sense the ambient temperature in which it is disposed and generate a corresponding electrical signal.

CONFIGURATION METHODS

Since the IC 10 is intended for universal application of various types of electrical equipment, certain configuration information is required to tailor the IC 10 for a specific application. The configuration information is defined by either mask options, software, constants or run time configuration.

Regarding mask options, the contents of the ROM 38 may be specified at the time the IC 10 is manufactured. Certain other mask configuration options may be determined by modification of a single mask. These other configuration options include the dead-man subsystem 46, IRQN triggering, an oscillator option, comparator hysteresis option and an SSIOP option. A predetermined hysteresis, for example, 20 millivolts (mV) or no hysteresis at all can be selected on an individual comparator basis.

A mask programmable option also permits selection of the type of interrupt generated associated with an IRQN pin. One of two triggering methods may be selected as follows: 1) negative edge sensitive triggering only, or 2) both negative edge-sensitive and low level-sensitive triggering. If option 2) is selected, either type of input to the IRQN pin will produce an interrupt. The IC 10 can be configured to accept either a crystal/ceramic resonator input or an RC network to control the internal oscillator. More specifically, the IC 10 can be configured by mask option to accept either a crystal/ceramic resonator input or an RC network to control the internal oscillator. The internal clocks are derived by a divide-by-two of an internal oscillator, which operates with an AT-cut parallel resonant quartz crystal resonator in the frequency range of 1 MHz to 8 MHz. Use of an external oscillator is recommended when crystals outside the specified range are to be used. The crystal and components are mounted as close as possible to the input pins to minimize start-up and stability problems. Table 1 shows recommended parameters for crystal resonators.

TABLE 1

CRYSTAL/CERAMIC RESONATOR PARAMETERS

| PARAMETER | CRYSTAL 2 MHz | CRYSTAL 4 MHz | CERAMIC 2–4 MHz | UNITS |
|---|---|---|---|---|
| $R_S$ | 400 | 75 | 10 | ohms |
| $C_0$ | 5 | 7 | 40 | pF |
| $C_1$ | 8000 | 12000 | 4.3 | pF |
| $C_{OSC1}$ | 15–40 | 15–30 | 30 | pF |
| $C_{OSC2}$ | 15-30 | 15-25 | 30 | pF |
| $R_P$ | 10 | 10 | 1-10 | Megohms |
| Q | 30 | 40 | 1.25 | $10^3$ |

A ceramic resonator may be used in place of the crystal in cost-sensitive applications. The circuit shown in FIG. 19(*a*) is recommended when using a ceramic resonator. Its equivalent circuit is shown in FIG. 19(*b*). Table 1 shows the recommended parameters for various resonators.

A mask programmable oscillator option may be selected to permit the use of a single external resistor R between external oscillator pins OSC1 and OSC2 as illustrated in FIG. 19(*c*). With this option, frequencies between 5 MHz and 70 KHz are practical. An external clock input should be used with either mask oscillator option. This external clock is connected to the OSC1 pin with the OSC2 pin unconnected as shown in FIG. 19(*d*).

Two mask options are available for the SSIOP. These mask options relate to serial data transmission format and the clock rate. The first mentioned option allows data to be shifted out of an SSIOP register SPO either most significant bit first or least significant bit first. The clock rate option is provided to select the master clock rate. This option permits microprocessor's phase 2 clock to be divided either by 4 or 32 to provide the master clock rate. This will produce a data transmission bit of 1 MHz or 125 KHz for a device operating with an 8 MHz crystal.

In addition to the mask options, software constants are also used for configuration of the IC 10. More specifically, internal configuration registers are loaded by the microprocessor software from application dependent software constants stored in the program ROM 38 or the EEPROM 40. A pair of internal configuration registers (CFR, ACFR) are used to control these options in the IC 10. The CFR and ACFR registers are loaded on program initialization and are not intended to be altered during normal program operation and will be discussed in detail below.

Lastly, the IC 10 can be configured by run time configuration. With this option, configuration data is read from external devices through the microprocessor's I/O subsystem. This can be done by utilizing the input/output ports A, B or C in either a parallel or serial fashion.

CONFIGURATION REGISTERS

The configuration registers CFR and ACFR are used to specify various software configuration options available in the IC 10 architecture. These registers CFR, ACFR are programmed during software initialization to configure input/output pins to their appropriate function as well as setting other major configuration parameters. In order to avoid improper operation of the IC 10, the CFR and ACFR registers are not intended to be altered during normal operation.

The CFR register is a write only register. The ACFR register is a read-write register. The bit format for the CFR and ACFR registers is illustrated in FIG. 21. Both the CFR and ACFR configuration registers are initialized to zeros on power-up or reset. This defines the state of the IC 10 after power has been applied and before the microprocessor 30 alters it for the application.

CFR REGISTER

The CFR register is a write-only register used to configure the comparator output options. Bits 4–7 are unimplemented. The remainder of the bits in the CFR register are defined below.

CFR[3 . . . 0]: Comparator Mode Control. These four configuration bits enable the comparator outputs to be "ORed" with the least significant four bits of Port C. A zero in these configuration bits enables the OR operation for the associated port pin. In this mode each output pin will be low during device reset if the respective comparator is above the threshold voltage (+1.25 V). Reset will clear the microprocessor's Port C output register, making the output pin a function of the comparator input. When the microprocessor writes a "1" into the port output register, the output pin will be forced high independent of the state of the comparator.

A one in these configuration bits disables the OR operation. In this mode, the low port pins are in a high impedance state after reset. The configuration bits are assigned in sequential order with CFR[0] controlling PC0/CMP0 and CFR[3] controlling PC3/CMP3.

ACFR REGISTER

The ACFR register is a 7-bit read-write register and is used to configure the analog subsystem. This register is set to zero on device reset or power-up. Bit 4 is unimplemented. Bit definitions of the ACFR register are as follows:

ACFR[7]: Clock Source. This bit selects the clock source for the analog subsystem and the EEPROM charge pump 44. They can be configured to use either an internally generated clock or a clock derived from an external crystal oscillator of the IC 10. If the crystal oscillator is selected (ACFR[7]=1), the oscillator frequency must be in the range of 2–8 MHz. Other crystal values must use the internal clock source option (ACFR[7]=0). This bit is set to 0 (internal clock source) by reset. A delay of 10 milliseconds (ms) is required after selecting the internal clock to permit the oscillator to stabilize. During the stabilization time, A/D subsystem and EEPROM 40 operations are not intended to be performed. Table 2 defines the meaning of this bit.

TABLE 2

| ACFR[7] DECODE | |
|---|---|
| 0 | INTERNAL OSCILLATOR |
| 1 | CRYSTAL OSCILLATOR |

ACFR[6]: Divider ratio. This bit selects the clock divider ratio for the A/D 78. This bit selects a divider ratio of ½ or ¼, permitting crystals in the range of 2-8 MHz to be used. The selection of the external crystal and the state of ACFR[7] will determine the A/D conversion, autoranging and auto-zero times. Table 3 defines the configuration bit and demonstrates the effect on conversion times.

TABLE 3

A/D CONVERTER CLOCK SOURCE

| ACFR [7,6] | Divider | Crystal (MHz) | A/D Conv. (μs) | Auto-zero* (μs) | Auto-range** (μs) |
|---|---|---|---|---|---|
| O X | Internal | NA | 16-32 | 28-3,080 | 35-166 |
| 1 0 | 1/2 | 2 | 32 | 56-3,080 | 70-166 |
| 1 0 | 1/2 | 4 | 16 | 28-1,540 | 35-83 |
| 1 1 | 1/4 | 4 | 32 | 56-3,080 | 70-166 |
| 1 1 | 1/4 | 8 | 16 | 28-1,540 | 35-83 |

*The auto-range time depends on the number of gain steps required to range.
**The auto-zero time depends on the amount of offset correction required.

ACFR[5]: A/D power-down. This bit controls power down operation of the A/D 78. When set, it will power up the A/D 78. When the bit is reset, the A/D 78 will power down. This bit is set to zero by reset on power-on. At least 100 μs should be allowed for the A/D 78 to stabilize after power-up.

ACFR[3 . . . 0]: MUX3 . . . MUX0 mode select. These configuration bits control the input mode of the analog input channels 62 and 64. The input channels 62 (MUX0 . . . MUX3) can be placed in either a voltage input mode or a current input mode. A zero in these configuration bits selects the voltage mode, while a one selects the current mode. These bits are assigned sequentially with ACFR[0] controlling MUX0 and ACFR[3] controlling MUX3 as shown in Table 4.

TABLE 4

| ANALOG INPUT MODE DEFINITIONS |
|---|
| ACFR[0] = 0 = voltage mode, 1 = current mode |
| ACFR[1] = 0 = voltage mode, 1 = current mode |
| ACFR[2] = 0 = voltage mode, 1 = current mode |
| ACFR[3] = 0 = voltage mode, 1 = current mode |

MICROPROCESSOR 30

The microprocessor 30 is based on a Motorola type MC68HC05 architecture, a Von Neumann type machine, which places all data, program and I/O interfaces into a single address map. This reduces the number of special purpose instructions that must be supported and therefore results in a relatively small and easy to remember instruction set.

The microprocessor 30 is described in detail in *M6805 HMOS/M146805 CMOS FAMILY USERS MANUAL* by Motorola, Inc., copyrighted 1983, hereby incorporated by reference. The microprocessor 30 architecture is based on five registers: an accumulator (A), an index register (X), a program counter (PC), a stack pointer (SP) and a condition code register (CC).

The accumulator is a general purpose 8-bit register used by the program for arithmetic calculation and data manipulations. A full set of read/modify/write instructions operate on this register. The accumulator is used in the register/memory instructions for data manipulation and arithmetic calculation. The index register is used in the index mode of addressing or as an auxiliary accumulator. It is an 8-bit register that can be loaded either directly or from memory, having its contents stored in memory, or its contents compared to memory. In index instructions, the index register provides an 8-bit value that is added to an instruction provided value to create an effective address. The index register is also used for limited calculations and data manipulation.

The program counter is a 16-bit register and contains the memory address of the next instruction that is to be fetched and executed. Normally, the program counter points to the next sequential instruction, however, it may be altered by interrupts or certain instructions. During an interrupt, the program counter is loaded with the appropriate interrupt vector. Jump and branch instructions may modify the program counter so that the next instruction to be executed is not necessarily the next instruction in memory.

The stack array or stack is an area in memory used for the temporary storage of important information. It is essentially a sequence of RAM locations used in a last-in-first-out (LIFO) fashion. The stack pointer always points to the next free location on the stack. Interrupts and subroutines make use of the stack to temporarily save important information. The stack pointer is used to automatically store the return address (2 byte program counter) on subroutine calls and to automatically store all registers (5 bytes: A, X, PC and CC) during interrupts. The stack starts at location $00FF and extends downward 64 locations.

The condition code register is a 5-bit register that indicates the results of the instruction just executed, as well as the state of the processor. These bits can be individually tested by a program instruction and specified action taken as a result of their state. The following condition code bits are defined: half-carry (H), interrupt mask (I), negative (N), zero (Z) and carry/borrow (C).

MEMORY MAPPING

The microprocessor 30 is capable of addressing 65,536 bytes of memory. However, the address decoding circuitry only decodes 13 bits of address information, therefore, the memory space is limited to 8192 bytes in the range of $0000 to $1FFF. FIG. 20 is a diagram of memory allocation for the IC 10.

1. ROM 38

The IC 10 memory map has three sections of mask programmable ROM 38. This memory 38 is programmed at device manufacture. The three sections of the ROM 38 are located as defined in Table 5.

TABLE 5

ROM ASSIGNMENTS

| ADDRESS RANGE | SIZE | FUNCTION |
|---|---|---|
| $0050-$007F | 48 bytes | Zero page |
| $1700-$1EFF | 2048 bytes | User instruction memory |
| $1F00-$1FEF | 240 bytes | Self-check program |

TABLE 5-continued

| ROM ASSIGNMENTS | | |
|---|---|---|
| ADDRESS RANGE | SIZE | FUNCTION |
| $1FF0-$1FFF | 16 bytes | Vectors |

2. RAM 42

The IC 10 is configured with 128 bytes of RAM starting at location $0080 extending to $00FF. The top of this area is reserved for the stack. The stack starts at location $00FF and extends downward a maximum of 64 locations to $00C0. Unused stack locations may be used by the program for general storage. However, care must be exercised to avoid data being stored in these locations being overwritten by stack operations.

3. EPROM 40

The IC 10 has 256 bytes of EEPROM 40 located at addresses $0100 through $01FF.

4. INTERRUPT AND RESET VECTORS

The upper 16-bytes of the memory map are reserved for interrupt vectors. The address assignments for each are described below:

$1FFE-1FFF: Reset Vector. This vector is used on processor reset.

$1FFC-1FFD: Software Interrupt. This vector is used during execution of an SWI instruction.

$1FFA-1FFB: External Asynchronous Interrupt. This interrupt is assigned the highest priority of the four interrupts. The external interrupt (IRQN pin) uses this vector.

$1FF8-1FF9: Timer Interrupt. This interrupt is assigned the second-highest priority of the four interrupts. It is used by the timer.

$1FF6-1FF7: Comparator Subsystem Interrupt. This interrupt is assigned the third-highest priority of the four interrupts. It is used by the comparator subsystem.

$1FF4-1FF5: A/D Subsystem Interrupt. This interrupt is assigned the lowest priority of the four interrupts. It is used by the A/D subsystem.

$1FF2-1FF3 and $1FF0-1FF1: Reserved.

5. Data Transfer and Control

Data transfer and control functions are implemented using byte-wide register interfaces accessed by the microprocessor 30 in its memory address space as defined in Table 6.

TABLE 6

| REGISTER ADDRESS MAP | | | | | |
|---|---|---|---|---|---|
| ADDR | REGISTER | ADDR | REGISTER | ADDR | REGISTER |
| $0000 | PAD | $0010 | * | $0020 | ADCR |
| $0001 | PBD | $0011 | * | $0021 | AMUX |
| $0002 | PCD | $0012 | TCR | $0022 | ADC |
| $0003 | PDD | $0013 | TSR | $0023 | ACFR |
| $0004 | PAC | $0014 | TICH | $0024 | ADZ |
| $0005 | PBC | $0015 | TICL | $0025 | AMZ |
| $0006 | PCC | $0016 | TOCH | $0026 | AVSF |
| $0007 | * | $0017 | TOCL | $0027 | ACSF |
| $0008 | CMPST | $0018 | TCRH | $0028 | * |
| $0009 | CMPI | $0019 | TCRL | $0029 | * |
| $000A | SPCR | $001A | TARH | $002A | * |
| $000B | SPSR | $001B | TARL | $002B | * |
| $000C | SPD | $001C | NVCR | $002C | * |
| $000D | * | $001D | * | $002D | * |
| $000E | * | $001E | CFR | $002E | * |
| $000F | * | $001F | TEST | $002F | * |

TABLE 6-continued

| REGISTER ADDRESS MAP | | | | | |
|---|---|---|---|---|---|
| ADDR | REGISTER | ADDR | REGISTER | ADDR | REGISTER |
| $0FF0 | DMC | | | | |

*Reserved

EEPROM CONTROL

The microprocessor 30 controls the operation of the EPROM 40 by a single read-write register NVCR, located in memory address space. FIG. 22 shows the format of this register. Reset clears this register to zero. This will configure the EEPROM 40 for normal read operation. A description of the bit assignments for the NVCR register is provided below:

NVCR[7 . . . 5]: Unused. These bits are reserved for device testing.

NVCR[4]: Byte Erase Select (BYTE). This bit selects byte erase operations. When set, it overrides the row bit. If BYTE is set to a 1, erase operations effect the selected byte. If BYTE is set to zero, erase operations are either row or bulk.

NVCR[3]: Row Erase Select (ROW). This bit selects row or bulk erase operations. If BYTE is set, this bit is ignored. If ROW is set to a 1, erase operations effect the selected row. If ROW is set to a 0, bulk erase is selected.

NVCR[2]: EEPROM Erase (ERASE). This bit controls erase operations in the following manner: If ERASE is set to a 1, erase mode is selected. If ERASE is set to a 0, normal read or program mode is selected.

NVCR[1]: EEPROM Latch Control (EELAT). This bit controls EEPROM address and data latch operations as follows: If EELAT is set to a 1, address and data can be latched into the EEPROM 40 for programming or an erase operation. If EELAT is set to a 0, data can be read from the EEPROM 40. If an attempt is made to set both the EELAT and EEPGM bits in the same write cycle, neither will be set.

NVCR[0]: EEPROM Program Voltage Enable (EEPGN). This bit determines the operating mode of the EEPROM 40 as follows: If the EEPGM is set to a 1, the charge pump 44 is on and the resulting high voltage is applied to the EEPROM array. If EEPGM is set to 0, the charge pump generator is off. If an attempt is made to set both the EELAT and the EEPGM in the same write cycle, neither will be set. If a write to a EEPROM address is performed while the EEPGM bit is set, the write is ignored and the programming operation currently in progress is not disturbed. These two safeguards prevent accidental EEPROM 40 changes.

EEPROM OPERATION

An internal charge pump 44 avoids the necessity of supplying a high voltage for erase and programming. To reduce programming time, bulk, row and byte erase operations are supported.

The erase state of an EPROM byte is $FF. Programming changes ones to zeros. If any bit in a location needs to be changed from a zero to a one, the byte must be erased in a separate operation before it is reprogrammed. If a new byte has no ones in bit positions which were already programmed to zero, it is acceptable to program the new data without erasing the EEPROM byte first.

Programming and erasure of the EEPROM 40 relies on an internal high voltage charge pump 44. The clock source for the charge pump 44 is the same as the A/D subsystem and is selected by ACFR[7,6] as discussed above. Clock frequencies below 2 MHz reduce the efficiency of the charge pump 44 which increases the time required to program or erase a location. The recommended program and erase time is 10 ms when the selected clock is 2 MHz and should be increased to as much as 20 ms when the clock is between 1 MHz and 2 MHz. At least 10 ms should be allowed after changing the clock source for the charge pump 44 to stabilize.

The EEPROM 40 operation is controlled by the NVCR register. Various operations are performed by the EEPROM 40 as described below. Other processor operations can continue to be performed during EEPROM programming and erasure provided these operations do not require a read of the data from the EEPROM 40. The EEPROM 40 is disconnected from the internal read/data bus 34 during program and erase operations.

To read data from the EEPROM 40, the EELAT bit must be zero. When this bit is cleared, the remaining bits in the NVCR register have no meaning or effect and the EEPROM 40 may be read as if it were a normal ROM.

During EEPROM 40 programming, the ROW and BYTE bits are not used. The zero bits in a byte must be erased by a separate erase operation prior to programming. The following sequence of operations is required to initiate a programming cycle as follows:

1. Set the EELAT bit with EEPGM=0
2. Store data to the EEPROM memory location
3. Set the EEPGM bit to turn on the high voltage
4. Wait 10 ms
5. Reset both EEPGM and EELAT bits to return to normal operation (clear NVCR)

The following sequence of operations is required to initiate a bulk erase of the EEPROM memory as follows:

1. Set the ERASE and EELAT bits with EEPGM=0
2. Write any data to any EEPROM address
3. Set the EEPGM bit to turn on the high voltage
4. Wait 10 ms
5. Reset ERASE, EELAT and EEPGM bit to return to normal operation (clear NVCR).

A row in the EEPROM 40 is a group of 16 bytes whose starting address is $xxN0 and whose ending address is $xxNF. The x's indicate don't care address bits. The N is the row number. This type of erase operation saves time compared to byte erase operations when large sections of EEPROM are to be erased. The sequence of operations required to initiate a row erase in the EEPROM 40 is as follows:

1. Set the ROW, ERASE and EELAT bits with EEPGM=0
2. Write any data to any EEPROM address in the selected row
3. Set the EEPGM bit to turn on the high voltage
4. Wait 10 ms
5. Reset ROW, ERASE, EELAT and EEPGM bit to return to normal operation (clear NVCR)

DEAD-MAN AND POWER MONITOR SUBSYSTEM 46

The power monitor circuitry is discussed below in connection with the analog power supply. The dead-man circuitry monitors the microprocessor 30 for proper operation. This function is a mask-enabled option that interacts with the microprocessor 30 through a single register (DMC) located at address $0FF0. The dead-man circuitry may implemented as a 17-bit ripple counter that provides a timeout period of 32.8 milliseconds at a bus rate of 4 MHz (262,144 oscillator cycles). If the counter overflows, a processor reset will occur and the device will be reinitialized.

The dead-man timer is reset by writing a zero to DMC[0]. This will reset the counter and begin the timeout period again. The location of the DMC register was chosen such that a normal bit manipulation instruction cannot reset the timer. Only extended or indexed, 16-bit offset addressing modes can access this location.

DEAD-MAN INTERFACE REGISTER

The dead-man subsystem is controlled by a 1-bit register (DMC) located in memory address space. FIG. 23 defines the register's format.

DMC[0]: Dead-man Reset. This write-only bit is used to reset the dead-man timer. Writing a zero to it will reset the dead-man counter and restart the dead-man timeout time.

ANALOG SUBSYSTEM INTERFACE REGISTERS

The microprocessor 30 interface consists of seven registers (ADZ, AMZ, AMUX, ACSF, AVSF, ADC, and ADCR) located in the memory address space. The format of these registers is shown in FIG. 24.

ADZ: A/D Auto-zero Value. This 6-bit read-write register contains the offset correction value for the voltage input amplifier 80. The ADZ register is loaded with the correction value at the completion of an auto-zero sequence. A value of zero represents the intrinsic positive offset built into the amplifier 80. As the ADZ value increases, the offset decreases. A least-significant-bit represents approximately 0.5 mV offset. The correction value may be changed by writing to this register. Write operations to the ADZ register are intended for diagnostic and verification purposes and are not intended in normal operation. The auto-zero sequence should provide the proper offset value for nominal device operation. At the completion of the auto-zero, the offset of the amplifier 80 should be in the range of 0 to −0.5 mV.

AMZ: Amplifier Auto-zero Value. This 6-bit read-write register contains the offset correction value for the current amplifier 90. The AMZ register will be loaded with the correction value at the completion of an auto-zero sequence. As the AMZ value increases, the off-set decreases. A least-significant-bit represents approximately 0.5 mV offset. The correction value may be changed by writing into this register. Write operations to this register are intended for diagnostic and verification purposes and should not be done in normal operation. The auto-zero sequence should provide the proper offset value for nominal device operation. At the completion of the auto-zero, the offset of the amplifier should be in the range of 0 to −0.5 mV.

ACSF: Current Scale Factor. This read-write register is used to control operation of the current input auto-ranging. The value written into this register determines the current subsystem auto-ranging operating mode. If a zero is written, the current subsystem is placed in auto-ranging mode. A nonzero value inhibits auto-ranging and sets the current mirror 92 into a fixed scale value. Table 7 defines possible values for ACSF write operations. Values other than these will cause unpredictable operation.

This register is not a true 'read-write' register. The value read from it is not necessarily the value that was written into it. Writing a zero into ACSF enables auto-ranging, however, a zero will never be read from ACSF. There are only five possible values that will be read: $10, $08, $04, $02, and $01.

The value read from this register is one of the scale factors required to properly scale the 8-bit A/D output. Five values are possible: x1, x2, x4, x8 and x16. Scale factors are shown in Table 7.

TABLE 7

CURRENT SCALE FACTOR CONTROL VALUES

| ACSF[7 . . . 0] | HARDWARE MODE | SOFTWARE SCALE FACTOR |
|---|---|---|
| $00 | Auto-ranging enable | |
| $10 | Divide by 16 | x 16 |
| $08 | Divide by 8 | x 8 |
| $04 | Divide by 4 | x 4 |
| $02 | Divide by 2 | x 2 |
| $01 | Divide by 1 | x 1 |

AVSF: Voltage Scale Factor. This read-write register is used to control operation of the voltage input auto-ranging. The value written into this register determines the voltage amplifier 80 auto-ranging operating mode. If a zero is written, the voltage amplifier 80 is placed in auto-ranging mode. A nonzero value inhibits auto-ranging and sets the voltage amplifier 80 in a fixed-gain mode of operation. Table 8 defines legal values for AVSF write operations. Values other than these will cause unpredictable operation.

This register is not a true read-write register. The value read from it is not necessarily the value that was written into it. Writing a zero into AVSF enables auto-ranging, however, a zero will never be read from AVSF. There are only five possible values that will be read: $10, $08, $04, $02 and $01.

TABLE 8

A/D VOLTAGE AMPLIFIER CONTROL VALUES

| ACSF[7 . . . 0] | HARDWARE MODE | SOFTWARE SCALE FACTOR |
|---|---|---|
| $00 | Auto-ranging enable | |
| $01 | x 16 gain | x 1 |
| $02 | x 8 gain | x 2 |
| $04 | x 4 gain | x 4 |
| $08 | x 2 gain | x 8 |
| $10 | x 1 gain | x 16 |

The value read from this register is one of the scale factors required to properly scale the A/D output. Five values are possible: x1, x2, x4, x8 and x16. Scale factors are shown in Table 8. This register should not be read or written to while a conversion is in progress.

AMUX: Input Multiplexer Controls. This 8-bit read-write register is used to select the MUXes 66 and 68 connected to the voltage and current input channels 62 and 64. The register is divided into two 4-bit fields; one for controlling the voltage input channels and the other for controlling the current input channels. It is also used to initiate the A/D conversion process. Writing to this register will initiate an A/D conversion.

AMUX[3 . . . 0]: A/D Channel Select. These four bits control operation of the voltage input channels 62 and 64. These bits are decoded as shown in Table 9. Values indicated as "reserved" are dedicated to test and verification and should not be selected during normal operation. When the current channels 62 are selected (AMUX[3 . . . 0]=1000), auto-ranging of the voltage amplifier 80 will be inhibited and the gain set to x1. If a nonzero value has previously been written into the AVSF register, the selected gain will be used instead of an x1 gain factor.

TABLE 9

A/D CHANNEL SELECT DECODE

| AMUX [3 . . . 0] | SOURCE | AMUX [3 . . . 0] | SOURCE |
|---|---|---|---|
| 0000 | MUX0 | 1000 | MXO (Current Channel) |
| 0001 | MUX1 | 1001 | Reserved |
| 0010 | MUX2 | 1010 | Reserved |
| 0011 | MUX3 | 1011 | Reserved |
| 0100 | MUX4 | 1100 | Reserved |
| 0101 | MUX5 | 1101 | Reserved |
| 0110 | Reserved | 1110 | Temp. Sensor |
| 0111 | Reserved | 1111 | AVSS (0 volts) |

AMUX[7 . . . 4]: Current MUX Select. These four bits control operation of the current input channels 62. Each bit controls a channel independent of the other three bits. Bits are assigned sequentially with AMUX[4] assigned to input pin MUX0 and AMUX[7] assigned to input pin MUX3. These bits have no effect if the associated channel is configured for voltage mode by the CFR register. A zero in AMUX[7 . . . 4] connects the appropriate input pin(s) to digital ground (VSS), while a one connects the pin(s) to the current mirror 92 output. The currents can be summed by selecting multiple current inputs. If all four bits of this field are zero, no input channels are connected to the current mirror 92 output. Since the inverting input of the current amplifier 90 remains connected to the current mirror 92 output, the current amplifier 90 output will be low, and the current mirror 92 will have no current flowing out of it.

ADC: A/D Converter Output: This read-only register is used to return the 8-bit output value. The least-significant bit is in ADC[0]. This value must be multiplied by the voltage and current scale factors found in ACSF and AVSF. Depending on the mode of operation, both scale factors may not be needed:

Voltage Inputs: The ADC register should be multiplied by AVSF for all voltage inputs. The contents of ACSF register should not be used to scale a voltage reading.

Current Inputs: The ADC register should be multiplied by the value in the ACSF register and then the AVSF register for scaling of the current subsystem output (MSO). If the voltage amplifier 80 is set to auto-ranging, the AVSF software scale factor will always be x16, since the voltage gain will be forced to x1 by the selection of MXO.

If an input voltage is converted that is not in the range of AVSS to VREF, the A/D converter will return either $00 (voltages less than AVSS) or $FF (voltages greater than VREF). No additional indication is provided.

ADCR: A/D Subsystem Control: This byte-wide register is used to control operation of the A/D 78. It is implemented as a read-write register to permit read-modify-write instructions to properly manipulate bits. All command bits will read as zero. Control bits will read the current value of the control bit.

ADCR[0]: Unused. This bit is not used. The ADCR[0] bit will always read zero.

ADCR[1]: Sample Inputs. This control bit is used to close the three MUXes 108, 110 and 112 that connect the pairs of channels 102, 104 and 106 together to form the sample and hold function. The channels are closed when ADCR[1]=1 and open when ADCR[1]=0. ADCR[1] is set to zero by device reset. Each of the sample and hold switches 108, 110 and 112 will close only if both channels it is associated with are configured in the voltage mode.

ADCR[2]: Initiate Auto-Zero Sequence. When this command bit is written with a one, the voltage and current amplifiers 80 and 90 will initiate an autozero sequence. When the sequence is completed, the ADCR[6] bit will be set to a one. An interrupt will be generated, if enabled, at the completion of the autozero sequence. The ADCR[2] bit will always read zero.

ADCR[3]: Integrator Reset. When this control bit is written with a one, the MUX 96 disconnects the MXO pin from the current mirror 92 and shorts MXO to analog ground. The MUX 96 will remain shorted as long as this bit remains set. To open the MUX 96 a zero must be written to ADCR[3]. This bit will read the present state of the MUX 96.

ADCR[4]: Enable Interrupt. This control bit enables interrupts from the A/D subsystem 78. When the ADCR[4] bit is set to one, interrupts are enabled. The ADCR[4] bit will read the present state of the interrupt enable.

ADCR[5]: Acknowledge Interrupt And Operation Complete. This command bit resets the operation complete flags when written with a one. It will reset ADCR[6 . . . 7], removing the interrupt request from the processor. ADCR[5] should be written with a one prior to initiation of another conversion. This bit will always read as a zero.

ADCR[6]: Auto-Zero Sequence Complete. This read-only status bit indicates the completion of an auto-zero sequence. It will be set to a one after completion of the auto-zero cycle. Registers ADZ and AMZ will be updated with the new value of offset correction calculated by the auto-zero sequence. This bit is reset by writing to the ADCR[5] bit with a one. The ADCR[6] bit cannot be written.

ADCR[7]: Conversion Complete. This read-only status bit indicates the completion of an A/D conversion cycle. It will be set to a one after completion of the A/D conversion and indicates that data is available in the ADC, ACSF, and AVSF registers. It is reset by writing the ADCR[5] bit with a one. This bit cannot be written.

A/D SUBSYSTEM OPERATION

The A/D subsystem should be initialized during the power-up routine. The following initialization operations are required.

The ACFR register should be written with the appropriate value to select the proper operating mode of the MUX4 . . . MUX1 inputs. Care should be used when placing an input channel in the current mode, since this will produce a low-impedance on the input pin.

The clock source and divider ratio should be selected with the ACFR[7,6] bits based on the application's crystal value. If the RC oscillator mask option is selected, the clock source should be set to internal (ACFR[7]=0). The ACFR[5] bit should be written with a one to enable A/D subsystem operation.

The control register (ADCR) should be written with an appropriate value. Bits 1, 3 and 4 should be set to establish initial operation conditions. An auto-zero sequence should be initiated by setting the bit ADCR[2]=1. This will cause the offset voltages in the voltage and current amplifiers 80 and 90 to be canceled and the ADZ and AMZ registers to be set to the correct values.

The two scale factor registers (ACSF and AVSF) should be initialized. If auto-ranging is desired, a zero should be written into both registers, otherwise the required scale factors should be selected.

OPERATION WITH VOLTAGE INPUTS

To initiate a conversion of a voltage input, the AMUX register should be written with a value that contains the desired input channel in the low-order four bits and the present current switch selection in the high-order four bits. This will start the conversion of the selected voltage input. When the conversion is complete, an interrupt will be generated (if enabled) and the ADCR[7] bit will be set. The ADCR[5] bit should be written with a one to clear the interrupt and acknowledge the operation complete flag. This will reset the ADCR[7] bit. The conversion value is read from ADC register and then multiplied by the value in the AVSF register to produce a 12-bit value. It should be noted that a voltage gain factor of x1 produces a scale factor of x16.

Moreover, it is not intended to write to the AVSF register prior to each conversion. The ADCR[7] bit must be cleared after every conversion operation by writing to the ADCR[5] bit with a one.

OPERATION WITH CURRENT INPUTS

To initiate a conversion of a current input, the AMUX register should be written with a value that contains $8 in the low-order four bits and the present current switch selection in the high-order four bits. This will start the conversion of the MXO input. When the conversion is complete, an interrupt will be generated (if enabled) and ADCR[7] will be set. ADCR[5] should be written with a one to clear the interrupt and acknowledge the operation complete flag. This will reset ADCR[7]. The conversion value is read from the ADC register and then multiplied by AVSF and ACSF to produce a 16-bit value. If voltage auto-ranging has been enabled by writing AVSF with a zero, it is not necessary to multiply the result by AVSF as long as a 12-bit result is desired. It should be noted that a voltage gain factor of X1 produces a scale factor of X16. As long as AVSF is not written with an overriding gain factor, the X16 scale factor can be ignored for current conversions.

The A/D subsystem generates a synchronous interrupt at vector address $1FF4–$1FF5. The interrupt must be acknowledged prior to resetting the 1 bit in order to not reprocess the interrupt.

SUBSYSTEM OPERATION

1. Quadcomparators Subsystem 58

Four individual inverting comparators are available. The non-inverting input of each is referenced to +1.25 volts. The comparators are discussed in detail below. The comparator output states can be read from a register (CMPST) and can also be directly connected to the least significant four output pins of port C. One comparator interrupts on both rising and falling output signals while the other three comparators interrupt only on rising outputs.

The quadcomparator subsystem 58 is controlled by 4 bits of the Configuration Register as defined in FIG. 21.

CFR[3 . . . 0]: Comparator Mode Control. These four configuration bits enable the comparator outputs to be ORed with the least-significant four bits of port C. A zero in a configuration bit enables the OR operation for the associated port pin. In this mode, each output pin will be low during device reset if the respective comparator input is above the threshold voltage (+1.25 V). A reset will clear the port C output register making the output pin only a function of the comparator input. When the microprocessor 30 writes a 1 into this port output register bit, the corresponding output pin will be forced high independent of the state of the comparator input.

A one in these configuration bits disables the OR operation. In this mode, the port pins behave as a normal output pin. The configuration bits are assigned sequentially, with CFR[0] controlling PC0/CMP0 and CFR[3]controlling PC3/CMP3. See Table 10 for assignments.

TABLE 10

| COMPARATOR MODE CONTROL |
|---|
| CFR[3]: PC3/CMP3 |
| CFR[2]: PC2/CMP2 |
| CFR[1]: PC1/CMP1 |
| CFR[0] PC0/CMP0 |

The comparator subsystem 58 communicates with the microprocessor 30 through a set of two control and status registers (CMPI and CMPST) located in memory address space. The state of each comparator output can be read through the CMPST register. An external interrupt facility is provided to generate interrupts on selected edges of the comparator outputs. These comparators have approximately 20 mV of optional hysteresis. FIG. 25 shows the format of these registers.

CMPI REGISTER

CMPI[7 . . . 4]: Interrupt Acknowledge. These four command bits are used to reset the interrupt request generated by the quadcomparator subsystem 58. They always read as zero. When a one is written into a command bit, the corresponding interrupt request is cleared. These four bits are not read-write registers. The interrupt request must be reset prior to clearing the 1-bit to prevent reprocessing the interrupt. Bit assignments are defined in Table 11.

TABLE 11

| CMPI[7 . . . 4] BIT ASSIGNMENTS |
|---|
| CMPI[4]: CP0 |
| CMPI[5]: CP1 |
| CMPI[6]: CP2 |
| CMPI[7]: CP3 |

CMPI[3 . . . 0]: Interrupt Enable. These four control bits are used to enable the comparator interrupts. A one enables a comparator interrupt, while a zero disables it. They are true enables in that transitions prior to the enable will be ignored. Clearing the enable with an interrupt pending will remove the interrupt request. These four bits are implemented as true read-write registers. Bit assignments are defined in Table 12.

TABLE 12

| CMP[3 . . . 0] BIT ASSIGNMENTS |
|---|
| CMP[0]: CP0 |
| CMP[1]: CP1 |
| CMP[2]: CP2 |
| CMP[3]: CP3 |

CMPST REGISTER

CMPST[7 . . . 4]: Interrupt Request. These four read-only status bits indicate which comparator interrupt(s) are active. They are read to determine the cause of the microprocessor interrupt. A one indicates an interrupt request for its respective comparator output. Bit assignments are defined in Table 13.

TABLE 13

| |
|---|
| CMPST[4]: CP0 |
| CMPST[5]: CP1 |
| CMPST[6]: CP2 |
| CMPST[7]: CP3 |

CMPST[3 . . . 0]: Comparator Output. These four read-only status bits indicate the state of the four comparator outputs. A one indicates the comparator output is high and that the comparator input is below the threshold. Bit assignments are defined in Table 14.

TABLE 14

| |
|---|
| CMPST[0]: CP0 |
| CMPST[1]: CP1 |
| CMPST[2]: CP2 |
| CMPST[3]: CP3 |

The comparator subsystem 30 generates a synchronous interrupt at vector address $1FF6–$1FF7.

2. B+ Comparator 50

The B+ comparator 50 is discussed in detail below. This comparator is provide for power supply generation (see FIG. 56). The negative input of this comparator is connected to the VREF pin (+2.5 V nominal). The positive pin is BSENSE. The comparator output is located at BDRIVE.

3. Port A Subsystem 52

Port A is an 8-bit bidirectional input/output port. FIG. 27 illustrates the operation of typical parallel port I/O circuitry discussed in detail below. The eight port A pins can be individually programmed as input or output. The port A subsystem 52 communicates with the microprocessor 30 through a set of two registers (PAD, PAC) located in memory address space. The direction of each port bit is determined by PAC, while the state of the port pins is controlled by PAD. The format of these registers is provided in FIG. 26.

PAC REGISTER

PAC[7 . . . 0]: Port Direction. These eight bits are used to control the direction of the corresponding port pin. The port pin is an input if the port direction bit is zero. At reset, the port direction bits are cleared to zero, defining the port pins as inputs.

PAD REGISTER

PAD[7 . . . 0]: Port Data. These eight bits are used to read the state of the port pin if an input, and to control the state of a port pin if it is an output. A zero corresponds to an electrical low on the port pin. Bits are assigned sequentially, with PAD[0] controlling pin PA0. Device reset does not affect the data register.

PORT OPERATION

Each of the eight bits of the port operates independently of the others. The following paragraphs describe the operation of a single port bit.

Each port pin can be programmed to be either an input or output as determined by the port direction register bits. A pin is configured as an input if its port direction register bit is set to zero. At power-on or reset, all port direction register bits are cleared, which configures port pins as inputs. When the port direction register bit is set, the port pin becomes an output, driving the state of the port data register bit onto the port pin. A one in the port data register causes a high on the port pin. When the port data register is written, the eight data bits are latched in the port data register.

When the port data register is read, the source of the data is determined by the port direction register. If the port pin is configured as an output, the read operation data source is the port data register, not the port pin. If the port pin is configured as an input, the read operation data source is the port pin itself. This prevents read-modify-write operations from altering the state of output pins that may be loaded by external circuitry.

Whenever a port pin's direction is changed to output, its data register should be loaded with the desired output state prior to direction change.

4. Port B Subsystem 54

Port B is a 3-bit bidirectional input/output port. The three port B pins can be individually programmed as input or output. They are shared with the synchronous serial I/O port (SSIOP) and their functionality may be changed when that system is in use.

The port B subsystem 54 communicates with the microprocessor 30 through a set of two registers (PBD, PBC) located in memory address space illustrated in FIG. 28. The direction of each port bit is determined by PBC. while the state of the port pins is controlled by PBD.

PBC REGISTER

PBC[7 . . . 5]: Port Direction. These three bits are used to control the direction of the corresponding port pin. The port pin is an input if the port direction bit is zero. At reset, the port direction bits are cleared to zero, defining the port pins as inputs. Bit assignments are in ascending order with PBC[5] assigned to pin PB5/SDO and PBC[7] assigned to pin PB7/SCK. Bits 0 through 4 of this register are unused and read as ones.

PBD REGISTER

PBD[7 . . . 5]: Port Data. These three bits are used to read the state of the port pin if an input, and to control the state of a port pin if it is an output. A zero corresponds to an electrical low on the port pin. Bits are assigned sequentially, with PBD[5] controlling pin PB5/SDO. Device reset does not affect the data register. Bits 0 through 4 of this register are unused and read as ones.

5. Synchronous Serial I/O Port

The synchronous serial input/output port (SSIOP) subsystem is designed to provide a simple interface to peripheral devices that communicate over a serial bus. It may also be used for inter-processor communication in a multi-processor system. The SSIOP is essentially an 8-bit shift register with separate pins for incoming (PB6/SD1) and outgoing (PB5/SDO) data and a third pin for serial clock (PB7/SCK).

The SSIOP communicates with the microprocessor 30 through three registers located in memory address space: SPD, SPSR and SPCR. FIG. 29 defines the registers formats.

SPD: SSIOP DATA REGISTER

This 8-bit read-write register is used to transmit and receive data on the synchronous serial bus. This system is not double buffered and thus any write to this register will destroy the previous contents. The SPD register can be read at any time, but if a transmission is in progress, the results may be ambiguous. Writes to the SPD register while a transmission is in progress can cause invalid data to be transmitted and/or received.

SPSR: SSIOP STATUS REGISTER

This 2-bit, read-only register is used to indicate operational status of the SSIOP. The two bits are cleared by device reset.

SPSR[7]: SSIOP Interface Flag (SPIF). This operation flag is set upon occurrence of the last rising clock edge and indicates that a data transfer has taken place. It has no effect on any further transmissions and can be ignored without problem. SPIF is cleared by reading the SPSR with SPIF set (SPSR[7]) followed by a read or write of the serial data register SPD. If SPIF is cleared before the last edge of the next byte, it will be set again. Reset clears this bit.

SPSR[6]: Data Collision (DCOL). This read-only status bit indicates an invalid access to the data register has been made. This can occur any time after the first falling edge of PB7/SCK until SPIF is set. A read or write of the data register during this time will result in invalid data being transmitted or received. DCOL is cleared by reading the SPSR with SPIF set followed by a read or write of the data register. If the last part of the clearing sequence is done after another transmission has been started, DCOL will be set again. Reset also clears this bit.

SPCR: SSIOP CONTROL REGISTER

This 2-bit register is used to control operation of the SSIOP subsystem. It is implemented as a read-write register to permit read-modify-write instructions to properly manipulate bits. These control bits will read the current value of the bit.

SPCR[6]: SIOP Enable (SPE). This control bit enables the synchronous serial I/O port and initializes the port B control register such that PB5 (SDO) is output. PB6 (SD1) is input and PB7 (SCK) is input (slave mode only). The port B control register can be subsequently altered as the application requires and the port B data register (except for PB5) can be manipulated as usual, however, these actions could affect the transmitted or received data. When the SPE register is cleared, port B reverts to a standard parallel I/O port without affecting the port B data or control register. The SPE register is readable and writable any time, but clearing the SPE register while a transmission is in progress will abort the transmission, reset the bit counter, and return port B to its normal I/O function. Reset clears this bit.

SPCR[4]: Master Mode (MSTR). This control bit is used to configure the SSIOP for master mode. In this mode the transmission is initiated by writing to the data register (SPD). The PB7/SCK pin is configured as an output providing a synchronous data clock at a fixed rate of either a processor phase 2 divided by 4 or 32 as determined by a mask option. While the device is in master mode, the PB5/SDO and PB6/SD1 pins do not change function. These pins behave exactly the same as in slave mode. Device reset clears SPCR[4] and returns the SSIOP to slave mode. This control bit may be set at any time regardless of the state of SPE. Clearing MSTR will abort any transmission in progress.

SSIOP OPERATION

The SSIOP operates as a synchronous serial communication interface. Data is transmitted by the master device in parallel to all slave devices over a single wire connected to the PB5/SDO pin. The selected slave device transmits data over a separate wire connected to the PB6/SD1 pin in a full duplex fashion. A common clock PB7/SCK, serves both input and output data streams. Thus, the byte transmitted by the master is replaced by the byte received from the slave. Slave selection in multiple-slave configurations will require the use of additional port pins or external decoding logic if more than one slave is employed.

This bidirectional I/O pin PB7/SCK is used as the data clock for the SSIOP. The state of PB7/SCK between transmissions must be a logic one. The first falling edge of PB7/SCK signals the beginning of a transmission. At this time, the first bit of transmitted data is presented at the PB5/SDO pin. Data is captured at the PB6/SD1 pin on the rising edge of PB7/SCK. Subsequent falling edges shift the data and present the next bit. The transmission is ended upon the eighth rising edge of PB7/SCK. The maximum frequency of PB7/SCK in slave mode is equal to the processor's phase 2 clock divided by 4. For an 8 MHz oscillator, the maximum PB7/SCK frequency is 1 MHz. There is no minimum clock rate.

In master mode, the format is identical, except that the PB7/SCK pin is an output and the shift clock now originates internally. The master mode transmission frequency is selected by mask option at either crystal frequency divided by 8 or 64.

The PB6/SK1 pin becomes an input as soon as the SSIOP is enabled. New data may be presented to the PB5/SD1 pin on the falling edge of PB7/SCK. Valid data must be present at least 100 ns prior to the rising edge of the serial clock.

The PB5/SDO pin becomes an output as soon as the SSIOP is enabled. A mask programming option configures data transmission to be either MSB or LSB first. In either case, the state of the PB5/SDO pin will always reflect the value of the first bit received on the previous transmission if there was one. Prior to enabling the SSIOP, PB5/SDO can be initialized to determine the beginning state if necessary by normal port operations. While the SSIOP is enabled, PB5/SDO cannot be used as a standard port since the pin is coupled to the last stage of the serial shift register. On the first falling edge of PB7/SCK, the first data bit to be shifted out is presented to the output pin.

6. Port C Subsystem 45

Port C is an 8-bit bidirectional input/output port. The eight port C pins can be individually programmed as input or output. Four pins can be assigned specialized output functions by the configuration register CFR.

CFR[3 . . . 0]: Comparator Mode Control. These four configuration bits enable the comparator outputs to be ORed with the least-significant four bits of port C. A zero in these configuration bits enables the OR operation. In this mode, device reset places the four port pins in input mode and causes the port pins to be low unless the respective comparator outputs are above the threshold of +1.25 V.

A one in these configuration bits disables the OR operation. In this mode, the port pins behave as normal I/O pins. The configuration bits are assigned in sequential order with CFR[0] controlling PCD/CMPO and CFR[3] controlling PC3/CMP3.

INTERFACE REGISTERS

The port C subsystem 56 communicates with the microprocessor 30 through a set of two registers (PCD, PCC) located in memory address space, illustrated in FIG. 30. The direction of each port bit is determined by PCC, while the state of the port pins is controlled by PCD.

PCC REGISTER

PCC[7 . . . 0]: Port Direction. These eight bits are used to control the direction of the corresponding port pin. The port pin is an input if the port direction bit is a zero. At reset, the port direction bits are cleared to zero, defining the port pins as inputs. Note that the low-order four bits can be set to be outputs by the CFR. Bit assignments are in ascending order with PCC[0] assigned to pin PC0 and PCC[7] assigned to pin PC7.

PCC[7 . . . 4]: The high-order nibble of the port control register operates as a normal set of bidirectional port control bits. The following conditions apply:

- Reset clears PCC[7 . . . 4].
- Writing a zero to a PCC[7 . . . 4] bit will cause the corresponding port pin to become an input, with its state readable by the respective bit in the PCD.
- Writing a one to a PCC[7 . . . 4] bit will cause the corresponding port pin to become an output, with its state driven by the last state written to the respective bit in the PCD.
- Reading PCC[7 . . . 4] will reflect the current state of those bits allowing for bit manipulation using read-modify-write instructions.
- PCC[3 . . . 0]: The low-order nibble of the port control register operates differently from the high-order depending on the state of the configuration control register bits CFR[3 . . . 0]. The following conditions apply:
- A zero in one of the lower four bits of the CFR (CFR[3 . . . 0]) will set the corresponding bit in the PCC.
- Since device reset clears CFR[3 . . . 0], the low-order nibble of the port control register (PCC[3 . . . 0]) will be set after reset.
- Writing a zero to one of the lower four bits of the PCC (with the corresponding CFR bit set), will cause the respective port pin to become an input, with the pin's state readable in the data register PCD.
- Writing a one to one of the lower four bits of the PCC (with the corresponding CFR bit set), will cause the respective port pin to become an output, with its state driven by the last state written to the appropriate PCD bit.
- Writing a one to one of the lower four bits of the PCC will be ignored if the respective bit in the CFR is clear.
- Reading the lower four bits of the PCC will reflect the current state of those bits as stored in the PCC allowing for bit manipulation using read-modify-write instructions.

PCD REGISTER

PCD[7 . . . 0]: Port Data. These eight bits are used to read the state of the port pins if configured as an input and to control the state of a port pin if it is configured as an output. A zero corresponds to an electrical low on the port pin. Bits are assigned sequentially, with PCD[0] controlling pin PC0. Device reset does not affect the data register PCD[3 . . . 0]. The high-order four bits are not changed by reset.

PCD[7 . . . 4]: The high-order nibble of PCD operates as a normal bidirectional port data register. The following conditions apply:

Reset does not affect the upper four bits of the PCD.

A read of the upper four bits of the PCD will reflect the state of the respective port pin if the corresponding PCC bit is clear (input mode).

A read of the upper four bits of the PCD will reflect the last state of the respective bit in the PCD if the corresponding PCC bit is set (output mode).

7. Port D Subsystem 60

Port D is a 1-bit special function port associated with the timer.

PDD REGISTER

The port D subsystem communicates with the microprocessor 30 through a single data register (PDD) located in memory address space (FIG. 31).

The port D data register is a special purpose 1-bit register associated with the timer.

PDD[7] is a read-only bit associated with the PD7/TCAP pin. This bit can be read at any time, even if the TCAP function is enabled. Write operations have no effect on this register bit.

All other PDD bits are unimplemented and read as zeros. Bits 0 through 6 of the port D data register are unimplemented. Bit 4 always reads as one, while the others read as zeros.

8. Programmable Timer

The IC 10 contains a single 16-bit programmable timer 60. The timer 60 is driven by the output of a fixed divide-by-four prescaler operating from the microprocessor 30 phase 2 clock. It can be used for many purposes, including input waveform measurements. The timer 60 is also capable of generating periodic interrupts or indicating passage of an arbitrary number of internal clock cycles. A block diagram of the timer is shown in FIG. 32. Timing diagrams are shown in FIGS. 33(*a*)–33(*d*).

Because the timer has a 16-bit architecture, each specific functional capability is represented by two registers. These registers contain the high and low byte of that function. Generally, accessing the low byte of a specific timer function allows full control of that function; however, an access of the high byte inhibits that specific timer function until the low byte is also accessed. The 1-bit in the condition code register should be set while manipulating both the high and low byte register of a specific timer function to ensure that an interrupt does not occur. This prevents interrupts from occurring between the time that the high and low bytes are accessed.

The key element in the programmable timer 60 is a 16-bit free running counter preceded by a prescaler which divides the microprocessor internal phase-2 clock by four. The prescaler gives the timer a resolution of 2.00 μs assuming a crystal frequency of 4 MHz. The counter is clocked to increasing values during the low portion of the internal phase 2 clock. Software can read the counter at any time without affecting its value.

The double-byte free running counter can be read from either of two locations: the counter register (TCRH, TCRL), or the alternate counter register (TARH, TARL). A read sequence containing only a read of the least significant byte of the counter register will receive the counter value at the time of the read. If a read of the counter at either location first addresses the most significant byte, it causes the least significant byte to be transferred to a buffer. This buffer value remains fixed after the first most significant byte read, even if the user reads the most significant byte several times. The buffer is accessed when reading the counter register (TCRL) or alternate counter register (TARL) least significant byte, and thus completes a read sequence of the total counter value. In reading either the counter register or alternate counter register, if the most significant byte is read, the least significant byte must also be read in order to complete the sequence.

The free running counter cannot be loaded or stopped by the program. During a power-on-reset or device reset, the counter is set to $FFFC and begins running after the oscillator start-up delay. Because the counter is 16 bits and is preceded by a fixed divide-by-four prescaler, the value in the counter repeats every 262,144 microprocessor 30 phase 2 clock cycles. When the counter rolls over from $FFFF to $0000, the timer overflow flag bit (TOF) is set. An interrupt can also be enabled when counter rollover occurs by setting its interrupt enable bit (TOIE).

The programmable timer capabilities are provided by using the following twelve addressable 8-bit registers. Note that the names high and low represent the significance of the byte. The format of these registers is shown in FIG. 34.

The timer has one 16-bit output compare register. It consists of two 8-bit registers. The output compare register consists of TOCH and TOCL, with TOCH the most significant byte. This output compare register can be used for indicating when a period of time has elapsed. These registers are unique in that all bits are readable and writable and are not altered by the timer hardware. Reset does not affect the contents of these registers, and if the compare function(s) are not utilized, the two bytes of these registers can be used as storage locations.

The contents of the output compare register is compared with the contents of the free running counter every fourth rising edge of the microprocessor phase 2 clock. If a match is found, the output compare flag (OCF) bit is set. The value in the output compare register should be changed after each successful comparison in order to establish a new elapsed timeout. An interrupt can also accompany a successful output compare, provided the corresponding interrupt enable bit, OCIE, is set.

After a processor write cycle to the output compare register containing the most significant byte (TOCH), the corresponding output compare function is inhibited until the least significant byte is also written. The user must write both bytes if the most significant byte is written. A write made only to the least significant byte will not inhibit the compare function. The free running counter is updated every four internal phase 2 clock cycles due to the internal prescaler. The minimum time required to update the output compare register is a function of the software program rather than the internal hardware.

A processor write may be made to either byte of the output compare register without affecting the other byte.

Because neither the output compare flag (OCF) or output compare register is affected by reset, care must be exercised when initializing the output compare function with software. The following procedure is recommended:

1. Write to the high byte of the output compare register to inhibit further compares until the low byte is written.
2. Read the timer status register to clear the output compare flag if it is already set.
3. Write to the low byte of the output compare register to enable the output compare function with the output compare flag clear.

The objective of this procedure is to prevent the output compare flag from being set between the time it is read and the write to the output compare register. A software example is shown below.

| | | | | |
|---|---|---|---|---|
| B7 | 16 | STA | OCMPHI | INHIBIT OUTPUT COMPARE |
| B6 | 13 | LDA | TSTAT | ARM OCF BIT IF SET |
| BF | 17 | STX | OCMPLD | READY FOR NEXT COMPARE |

The two 8-bit registers (TICH, TICL) which make up the 16-bit input capture register, are read-only and are used to latch the value of the free running counter after a defined transition is sensed by the input capture edge detector. The level transition which triggers the counter transfer is defined by the input edge bit (IEDG). Reset does not affect the contents of the input capture registers.

The result obtained by an input capture will be one more than the value of the free running counter on the rising edge of the phase 2 processor clock preceding the external transition (FIG. 33). This delay is required for internal synchronization. Resolution is affected by the prescaler allowing the timer to only increment every four phase 2 clock cycles.

The free running counter contents are transferred to the input capture register on the proper signal transition regardless of whether the input capture flag (ICF) is set or clear. The input capture register always contains the free running counter value which corresponds to the most recent input capture.

After a read of the most significant byte (TICH) of the input capture register, counter transfer is inhibited until the least significant byte of the register is also read. This characteristic forces the minimum pulse period attainable to be determined by the time used in the capture software routine and its interaction with the main program. For example, a polling routine using instructions such as BRSET, BRA, LDA, STA, INCX, CMPX, and BEQ might take 34 internal phase 2 cycles to complete. The free running counter increments every four processor clock cycles due to the prescaler.

A read of the least significant byte (TICL) of the input capture register does not inhibit the free running counter transfer. Minimum pulse periods are ones which allow software to read the least significant byte and perform needed operations. There is no conflict between the read of the input capture register and the free running counter transfer since they occur on opposite edges of the internal processor clock.

TIMER CONTROL REGISTER

The timer control register (TCR) is a read-write register which contains four control bits. Three of these bits control interrupts associated with each of the three flag bits found in the timer status register. The other bit controls which edge is significant to the capture edge detector. The timer control register and the free running counter are the only sections of the time affected by reset. The timer control register bit assignment is defined in FIG. 34.

TCR[0]: Unused.

TCR[1]: Input Edge Polarity (IEDG). The value of the input edge (IEDG) bit determines which level transition on the PD7/TCAP pin will trigger a free running counter transfer to the input capture register. Reset does not affect the IEDG bit. A zero selects the falling edge.

TCR[2]: Unused.

TCR[4]: Unused.

TCR[5]: Timer Overflow Interrupt Enable (TOIE). If the timer overflow interrupt enable (TOIE) bit is set, a timer interrupt is enabled whenever the TOF status flag (in the timer status register) is set. If the TOIE bit is clear, the interrupt is inhibited. The TOIE bit is cleared by reset.

TCR[6]: Output Compare Interrupt Enable (OCIE). If the output compare interrupt enable (OCIE) bit is set, a timer interrupt is enabled whenever the OCF status flag is set. If the OCIE bit is clear, the interrupt is inhibited. This bit is cleared by reset.

TCR[7]: Input Capture Interrupt Enable (ICIE). If the input capture interrupt enable (ICIE) bit is set, a timer interrupt is enabled when the ICF status flag (in the timer status register) is set. If the ICIE bit is clear, the interrupt is inhibited. The ICIE bit is cleared by reset.

TIMER STATUS REGISTER

The timer status register (TSR) is a 3-bit register containing read-only status information. These four bits indicate the following:

- A proper transition has taken place at the TCAP pin with an accompanying transfer of the free running counter contents to the input capture register.
- A match has been found between the free running counter and one of the output compare registers.
- The free running counter contains $FFFF (timer overflow).

The timer status register is illustrated in FIG. 34. The timing diagrams are shown in FIGS. 33(*a*)-33(*d*) illustrate the timing relationships to the timer status register bits.

TSR[4]: Unused.

TSR[5]: Timer Overflow Flag (TOF). The timer overflow flag (TOF) bit is set by a transition of the free running counter from $FFFF to $0000. It is cleared by accessing the timer status register (with TOF set) followed by an access of the free running counter least significant byte. Reset does not affect the TOF bit.

TSR[6]: Output Compare Flag (OCF). The output compare flag (OCF) is set when the output compare register matches the contents of the free running counter. The OCF is cleared by accessing the timer status register (with OCF set) and then writing the low byte of the output compare register. Reset does not affect the output compare flag.

TSR[7]: Input Capture Flag (ICF). The input capture flag (ICF) is set when the selected edge has been sensed by the input capture edge detector. It is cleared by a processor access of the timer status register (with ICF set) followed by accessing the low byte of the input capture register. Reset does not affect the input compare flag.

Accessing the timer status register satisfies the first condition required to clear any status bits which happen to be set during the access. The only remaining step is to provide an access of the register which is associated with the status bit. Typically, this presents no problem for the input capture and output compare function.

A problem can occur when using the timer overflow function and reading the free running counter at random times to measure an elapsed time. Without incorporating the proper precautions into software, the timer overflow flag could unintentionally be cleared if: 1) the timer status register is read or written when TOF is set; and 2) the least significant byte of the free running counter is read but not for the purpose of servicing the flag. The counter alternate register contains the same value as the free running counter; therefore, this alternate register can be read at any time without affecting the timer overflow flag in the timer status register.

During the WAIT instruction, the programmable timer continues to operate normally and may generate an interrupt to trigger the CPU out of the wait state. The STOP instruction has been disabled in the IC 10.

ANALOG SUBSYSTEM SCHEMATICS

The analog subsystem for the IC 10 is illustrated in FIGS. 35-65. FIGS. 35-50 illustrate the digital circuitry while FIGS. 51-65 illustrate the analog circuitry.

DIGITAL CONTROL LOGIC

1. Quadcomparator Subsystem Logic

The quadcomparator subsystem 58 includes four individual comparators 200, 202, 204 and 206 (FIGS. 36 and 53). Each of these comparators 200, 202, 204 and 206 is referenced to a predetermined voltage, for example, +1.25 Vdc connected to a non-inverting input (FIG. 53). Input signals are applied to external pins CP0, CP1, CP2 and CP3 illustrated in FIG. 36.

The comparator subsystem 58 communicates with the microprocessor 30 through two registers CMPI and CMPST located in memory address space. An internal interrupt facility is provided to generate interrupts on selected edges of the comparator outputs $Q_0$, $Q_1$, $Q_2$ and $Q_3$. The comparator outputs $Q_0$, $Q_1$, $Q_2$ and $Q_3$ are read at the data bus DATA[3 . . . 0]. More specifically, each of the comparator outputs $Q_0$, $Q_1$, $Q_2$ and $Q_3$ is connected to a pair of serially coupled inverters 208 and 210; 212 and 214; 216 and 218; and 220 and 222, respectively, for high gain. The outputs of the inverters 210, 214, 218 and 222 are applied to tristate devices 224, 226, 228 and 230. The outputs of these tristate devices are connected to the data bus DATA[3 . . . 0] as CMPST[3 . . . 0]. These comparator outputs comprise the CMPST[3 . . . 0] status bits. Reading of these status bits is controlled by a read signal RDCMPSTh, which is active any time the microprocessor 30 addresses the CMPST register and initiates a read as discussed below.

The CMPI register is used for interrupt control. More specifically, CMPI [3 . . . 0] is used to enable interrupts while CMPI[7 . . . 4] is used to reset the interrupt request generated by the comparator subsystem 58. The interrupt request must be reset prior to clearing the I bit to prevent reprocessing the interrupt.

An interrupt request signal INTREQ is generated on selected edges of the comparator outputs $Q_0$, $Q_1$, $Q_2$ and $Q_3$. More specifically, the INTREQ signal is generated on rising and falling output states of the comparator 200 and on rising output states of the comparators 202, 204 and 206. This INTREQ signal is available at the output of a quad NOR gate 232. Comparator interrupt request signals REQ0h, REQ1h, REQ2h and REQ3h are applied to the inputs of the NOR gate 232. These interrupt request signals are available as outputs at an OR gate 234 for the comparator 200 and flip-flops 236, 238 and 240 for the comparators 202, 204 and 206, respectively. More specifically, the interrupt request signal REQ0h for the comparator 200 is generated at the output of the dual input OR gate 234. The inputs to the OR gate 234 are from flip-flops 242 and 244. The output $Q_0$ of the comparator 200 is applied to the clock input CK of the flip-flop 244 by way of the high gain inverters 208 and 210. The complement of this signal, available at the output of the inverter 208 is applied to the clock input CK of the flip-flop 242. The Q outputs of the flip-flops 242 and 244 are applied to the OR gate 234 to generate the REQ0h signal on rising and falling output states of the comparator 200. The $Q_1$, $Q_2$ and $Q_3$ outputs of the comparators 202, 204 and 206 are applied to clock inputs CK of the flip-flops 236, 238 and 240 to generate the REQ1h, REQ2h and REQ3h signals. These REQ0h, REQ1h, REQ2h and REQ3h signals may be read as status bits CMPST[7 . . . 4] by the microprocessor 30 on the data bus DATA[7 . . . 4]. More specifically, the REQ0h, REQ1h, REQ2h and REQ3h signals are applied to tristate devices 246, 248, 250 and 252. The outputs of these tristate devices 246, 248, 250 and 252 are connected to the data bus DATA[7 . . . 4]. The tristate devices 246, 248, 250 and 252 are under the control of the RDCMPSTh signal.

Four command bits CMPI[7 . . . 4] are used to reset the interrupt request. These command bits CMPI[7 . . . 4] are used to reset the flip-flops 236, 238, 240, 242 and 244, which generate the REQ0h, REQ1h, REQ2h and REQ3h signals. These command bits CMPI[7 . . . 4] may be written by way of the data bus DATA[7 . . . 4] and are applied to dual input NAND gates 254, 256, 258 and 260 along with a WRCMPIh signal. These NAND gates will only be enabled when the microprocessor 30 addresses the CMPI register and initiates a write. The outputs of the NAND gates 254, 256, 258 and 260 are applied to tri-input AND gates 262, 264, 266 and 268. The outputs of these AND gates are applied to the reset inputs $\overline{R}$ of the flip-flops 236, 238, 240, 242 and 244. The other two inputs to the AND gates 262, 264, 266 and 268 are the reset signal RESETb from the microprocessor 30, available at the output of an inverter 270 and interrupt enable signals ENA0h, ENA1h, ENA2h and ENA3h, available at Q outputs of flip-flops 272, 274, 276 and 278. The ENA0h, ENA1h, ENA2h and ENA3h signals allow the interrupt request to be cleared once acknowledged. The RESETb signal allows the microprocessor 30 to reset these flip-flops. In order to prevent reprocessing of the interrupt, a WRCMPIb signal, available at an output of an inverter 271, is applied to the $\overline{D}$ inputs of the interrupt enable flip-flops 272, 274, 276 and 278. These flip-flops are thus reset after the write signal WRCMPIh becomes inactive.

The command bits CMPI[7 . . . 4] are always read as zero on the data bus DATA[7 . . . 4]. More specifically, these command bits are read at the output of the tristate devices 278, 280, 282 and 284. The input to these tristate devices is connected to digital ground. The tristate devices 278, 280, 282 and 284 are under the control of a RDCMPIh signal which indicates that the microprocessor 30 has addressed the CMPI register and initiated a read.

Four status bits CMPI[3 . . . 0] are used to read comparator interrupt enable signals ENA0h, ENA1h, ENA2h and ENA3h. These signals ENA0h, ENA1h, ENA2h and ENA3h are available at the Q outputs of the flip-flops 272, 274, 276 and 278. These outputs are connected to tristate devices 286, 288, 290 and 292. The outputs of these tristate devices are connected to the data bus DATA[3 . . . 0]. The tristate devices 286, 288, 290 and 292 are under the control of a RDCMPIh signal which indicates that the microprocessor 30 has addressed the CMPI register and has initiated a read.

The RDCMPSTh, RDCMPIh and WRCMPIh signals are generated by a comparator decode system 294. The comparator decode subsystem 294 decodes addresses applied to the internal address bus ADDR[4:0] to allow the registers CMPST and CMPI to be written to and read. More specifically, as illustrated in Table 6 the CMPST register is located at address location $0008. Thus, when the address $0008 is placed on the internal address bus ADDR[4 . . . 0] an AND gate 296 (FIG. 37) is enabled. More specifically, the AND gate 296 is an eight input AND gate. The address inputs ADDR[4,2,1,0], identified as A4h, A2h, A1h and A0h, are applied through inverters 298, 300, 302 and 304. The address bit ADDR[3], identified as A3h, is applied directly to an input of the AND gate 296. Also applied to the AND gate 296 are signals SELh, DISABLEb and PH2h from the microprocessor 30.

The hexadecimal address $0008 corresponds to binary bits 01000. When the address 01000 is applied to the address inputs of A4h, A3h, A2h, A1h and A0h, the output of the AND gate 296 will be a logical one indicating that the CMPST register is being addressed by the microprocessor 30. More specifically, the RDCMPSTh signal is available at an output of a dual input AND gate 306 (FIG. 36). The inputs to the AND gate 306 are Q outputs of flip-flops 308 and 310. The CMPSTh signal, available at the output of the AND gate 296, is applied to a D input of the flip-flop 310. Timing for this flip-flop is provided by the microprocessor's phase 2 clock signal PH2h. More specifically, a PH2h signal is applied to a clock input CK of the flip-flop 310 by way of a pair of serially connected inverters 312 and 314. An inverted phase 2 clock signal, available at the output of the inverter 312 is applied to the $\overline{CK}$ input of the flip-flop 310. A READh signal, available from the microprocessor internal control bus CPUCTL[3 . . . 0], is applied to a D input of a flip-flop 308. The READh signal indicates that the microprocessor 30 is requesting a read operation. Timing signals are applied to the clock CK and $\overline{CK}$ inputs of the flip-flop 308 in the same manner as the flip-flop 310. Thus, whenever the microprocessor 30 addresses $0008, the signal RDCMPST is generated at the output of the AND gate 306, which indicates that the microprocessor 30 is reading the CMPST register.

An RDCMPIh signal is available at the output of a dual input AND gate 316. The output of the flip-flop 308 is applied to one input of the AND gate 316 which indicates that the microprocessor 30 has initiated a read. The other input to the AND gate 316 is a Q output of a flip-flop 318. A CMPIh decode signal is applied to a D input of the flip-flop 318. Timing control for the flip-flop 318 is identical to the flip-flops 308 and 310. The CMPIh signal is available at an output of an AND gate 320 (FIG. 37). The circuitry including the AND gate 320 and the inverters 298, 300, 302 and 304 generates the CMPIh signal whenever the microprocessor 30 addresses $0009.

The WRCMPIh signal is available at an output of a dual input AND gate 322 (FIG. 36). One input to the AND gate 322 is the output of the flip-flop 318, which indicates that the CMPI register was addressed. The other input to the AND gate 322 is from a NOR gate 324. The NOR gate 324 is used to develop a microprocessor write signal. Specifically, the output of the flip-flop 308 is applied to one input of the NOR gate 324. The output signal from the NOR gate 324 will be low during write operations. The other input is from the phase 2 clock, available at the output of the inverter 278.

Four configuration bits CFR[3 . . . 0] from the configuration register CFR are used for comparator mode control. These configuration bits CFR[3 . . . 0] allow the outputs of the comparators 200, 202, 204, 206 to be ORed with port C. A zero enables the OR operation while a one disables it. More specifically, the CFR register is a write only register and includes the flip-flops 326, 328, 330 and 332. The D inputs of these flip-flops are connected to the data bus DATA[3 . . . 0]. The Q outputs of these flip-flops are tied to an internal bus CFR[3 . . . 0] which allows the OR operation. These flip-flops 326, 328, 330 and 332 are under the control of a dual input NAND gate 334, connected to the $\overline{D}$ input, which enables the write operation. One input to the NAND gate 334 is from the output of the NOR gate 324 which indicates a write operation. The other input is from a flip-flop 336. A CFRh signal, which indicates that the microprocessor 30 addressed the CFR register is applied to the D input of the flip-flop 336.

The CFRh signal is a decode signal and is available at the output of an AND gate 338 (FIG. 37). The AND gate 338 and the inverter 298 decode the address bus ADDR[4 . . . 0] to enable the AND gate 338 and generate the CFRh signal any time the microprocessor 30 addresses $001E.

The microprocessor 30 is adapted to reset the comparator subsystem 58. More specifically, a reset signal RESETb from the computer control bus CPUCTL[3 . . . 0] by way of the inverter 270 is applied to the AND gates 262, 264, 266 and 268 to reset the flip-flops 236, 238, 240, 242 and 244. The RESETb signal is also applied to the flip-flops 272, 274, 276, 278, 308, 310, 318, 326, 328, 330, 332 and 336 to allow the microprocessor 30 to reset the comparator subsystem 58.

2. Processor Bus Interface Logic

The microprocessor 30 communicates with the analog control system by way of, for example, seven registers ADCR, AMUX, ACFR, ADZ, AMZ, AVSF and ACFR located in memory address space as identified in Table 6. The format of the registers is illustrated in FIG. 24. These registers are selected by register select flip-flops 350, 352, 354, 356, 358, 360 and 362, illustrated in FIG. 39. These registers are all read-write registers and are decoded by a register decode subsystem 364 illustrated in FIG. 40. These registers may be decoded in various manners, for example, seven programmable logic arrays (PLA) 366, 368, 370, 372, 374, 376 and 378 may be provided. Each of these PLA's includes address inputs ADDR[4 . . . 0] applied either directly or by Way of inverters 365, 367, 369, 371 and 373 as shown in FIG. 40 and three control signals SELh, DISABLE and PH2h. The SELh signal corresponds to the microprocessor's ANABSh signal. The ANABSh signal is a register select signal from the microprocessor master chip address decoder which enables address decoding on a block basis. The DISABLEb signal corresponds to the microprocessor's IOOFF signal, used to disable all I/O devices during a test mode. The IOOFF signal is available at the output of a buffer 375 (FIG. 39). The PH2 signal is the microprocessor's phase 2 clock.

The outputs of the PLA's 366, 368, 370, 372, 374, 376 and 378 represent register select signals ADZh, AMZh, AVSFh, ACSFh, ADCRh, AMUXh and ACFRh indicating that a particular register has been addressed by the microprocessor 30. For example if the address $0020 is placed on the address bus ADDR[4 . . . 0], the register ADCR will be selected. Similarly, when the addresses of the other registers are placed on the address bus ADDR[4 . . . 0] in accordance with Table 9, those registers will be selected.

The output signals from the PLA's 366, 368, 370, 372, 374, 376 and 378 are applied to D inputs of the register select flip-flops 350, 352, 354, 356, 358, 360 and 362. Timing for these register select flip-flops is provided by the phase 2 clock signal PH2h, applied to the clock inputs CK of these flip-flops 350, 352, 354, 356, 358, 360 and 362 through a pair of inverters 380 and 382 and an inverted phase 2 clock signal, available at the output of the inverter 380, applied to the $\overline{CK}$ inputs of these flip-flops. A reset signal RESETh from the microprocessor control bus CPUCTL[3 . . . 0] is applied to the reset inputs $\overline{R}$ of the flip-flops 350, 352, 354, 356, 358, 360 and 362 by way of an inverter 384 to set these flip-flops to zero on reset. The output of the register select flip-flops 350, 352, 354, 356, 358, 360 and 362 are the register select signals ADCRh, AMUXh, ACFRh, ADZh, AMZh, AVSFh and ACSFh.

ACFR REGISTER

The ACFR register is a read-write register utilized by the A/D subsystem 78. This register includes the flip-flops identified by the reference numerals 386, 388, 390, 392, 394, 396 and 398 (FIG. 39).

The ACFR register can be read or written to by the microprocessor 30. More specifically, the D inputs of the flip-flops 386, 388, 390, 392, 394, 396 and 398 are tied respectively to the data bus DATA[7 . . . 0] to allow the microprocessor 30 to write to this register. The output Q of these flip-flops are also tied to the data bus DATA[7 . . . 0] by way of the tristate devices 408, 410, 412, 414, 416, 418, 420 and 422 to allow this register to be read.

During read operations the tristate devices 408, 410, 412, 414, 416, 418, 420 and 422 are under the control of a read control NAND gate 424 and a read-write control flip-flop 426 to allow the Q outputs of these flip-flops to be tied to the data bus DATA[7 . . . 0] and read by the microprocessor 30. The tristate device 422 for the ACFR[4] bit has its input tied to ground. Thus, this bit will always read zero.

A read signal is developed by the NAND gate 424. The NAND gate 424 is a two input NAND gate and is under the control of the read-write control flip-flop 426 and the ACFR select flip-flop 354. A read signal READh from internal control bus CPUCTL[3 . . . 0] is applied to a D input of the read-write control flip-flop 426. Timing for this flip-flop is a phase 2 clock signal PH2h, applied to a clock input CK and an inverted phase 2 clock signal from the output of the inverter 380, applied to the $\overline{CK}$ input of a flip-flop 426. The Q output of the flip-flop 426 is a read clock signal RDCLKh, which is applied to the NAND gate 424. Thus, any time the microprocessor 30 addresses the ACFR register (e.g., $0023) and places a read signal READh on the computer control bus CPUCTL[3 . . . 0], the flip-flops 386, 388, 390, 392, 394, 396 and 398 as well as the ACFR[4] bit will be read.

During write operations the tristate devices 408, 410, 412, 414, 416, 418 and 420 are normally in a high impedance state. A write control signal is applied to the $\overline{D}$ inputs of these flip-flops. The write control signal is under the control of a write control NOR gate 428 and a NAND gate 430. The NOR gate 428 is a two input NOR gate with a one input from the phase 2 clock PH2h and one input from the read-write control flip-flop 426. The output of the NOR gate 428 is a write signal WRCLKh. The write signal WRCLKh is applied to one input of the dual input NAND gate 430. The other input to the NAND gate 430 is the ACFR register select signal ACFRh. The output of the NAND gate 430 is then applied $\overline{D}$ inputs of the ACFR flip-flops 386, 388, 390, 392, 394, 396 and 398. The data bus DATA[7 . . . 5] and DATA[3 . . . 0] are applied to the D inputs of these flip-flops to allow the microprocessor 30 to write to them. The bit ACFR[4] is tied to digital ground.

The ACFR register may be reset by the microprocessor 30. More specifically, a reset signal RESETh from the control bus CPUCTL[3 . . . 0] is applied to the reset inputs R of the flip-flops 386, 388, 390, 392, 394, 396 and 398 through an inverter 432.

As heretofore discussed, the ACFR register is a configuration register used to configure the A/D subsystem 78. Thus the $\overline{Q}$ outputs of the flip-flops 386, 388, 390, 392, 394, 396 and 398 are connected to inverters 434, 436, 438, 440, 442, 444 and 446. The outputs of the inverters 434, 436, 438 and 440 are tied to an internal bus ACFR[3 . . . 0]. The outputs of the inverters 444 and 446 are tied to an internal bus ACFR[7,6]. The output of the inverter 442 is applied to an internal bus ACFR[5] and also is used as a signal ADPUh.

The RDCLKh signal, available at the output of the read write control flip-flop 426, is used to develop a state machine clock signal SMCLKh for use in auto-zero and auto-range state machines to be discussed below. The SMCLKh signal is available at the output of a buffer 447. The input to the buffer is a MUX 448. The MUX 448 allows for inputs from an external clock source signal CLKSRCh under the control of test circuitry applied to its select input SL. During normal operation, the SMCLK signal is developed by a flip-flop 450. Timing for the flip-flop 450 is an inverted phase.2 clock signal, available at the output of the inverter 380. This flip-flop 450 may be reset by the microprocessor 30. An output from a NAND gate 452 is applied to a D input of the flip-flop 450. The NAND gate 452 is a dual input NAND gate. One input to the NAND gate 452 is the RDCLKh signal. The other input to the NAND gate 452 is an output of an OR gate 454. The inputs to the OR gate 454 are the ACSFh and AVSFh signals which indicate that the AVSF or ACSF registers have been addressed by the microprocessor 30 to allow the SMCLK signal to be generated when autozero and autoranging operations are initiated.

ADCR REGISTER

The ADCR register is used to control the operation of the A/D subsystem 78. This register is a byte wide read-write register. This register includes the flip-flops 458, 460, 462, 464 and 466 (FIG. 41). Three bits ADCR[5], ADCR[2] and ADCR[0] are tied to ground and will always read zero. More specifically, the bit ADCR[0] is tied to ground and to the input of a tristate device 468. The output of the tristate device 468 is tied to the data bus DATA[0]. The bit ADCR[2] is also tied to ground and to a tristate device 470. The output of the tristate device 470 is tied to the data bus DATA[2]. Similarly, the bit ADCR[5] is also tied to ground and to a tristate device 472. The output of the tristate device 472 is connected to the data bus DATA[5].

The balance of the bits may also be read by the microprocessor 30. More specifically, the $\overline{Q}$ outputs of the flip-flops 458, 460, 462, 464 and 466 are coupled to tristate devices 474, 476, 478, 480 and 482. The outputs of these tristate devices are applied to the data bus DATA[1,3,4,6,7].

The tristate devices 468, 470, 472, 474, 476, 478, 480 and 482 for all the bits ADCR[7 . . . 0] are under the control of the read control NAND gate 484. Normally these tristate devices are in a high impedance state. However, during a read operation the NAND gate 484 enables these tristate devices to connect the ADCR[7 . . . 0] bits the data bus DATA[7 . . . 0]. The NAND gate 484 is a two input NAND gate. A ADCRh signal is applied to one input. This signal is a decode signal for the ADCR register. More specifically, the ADCR register is located at memory address $0020. Thus, any time this address is written by the microprocessor 30 the ADCRh signal will be active. The other input to the NAND gate 484 is the RDCLKh signal discussed above. Thus, any time the microprocessor 30 addresses the ADCR register and initiates a read, the NAND gate 484 will be enabled.

The bits ADCR[1], ADCR[3] and ADCR[4] are control bits which may be written by the microprocessor 30. More specifically, the D inputs of the flip-flops 458, 460 and 462 are connected to the data bus DATA[1, 3, 4]. The $\overline{D}$ inputs of these flip-flops are connected to an output of a dual input NAND gate 486. The ADCRh signal is applied to one input of the NAND gate 486 which indicates that the ADCR registers have been addressed by the microprocessor 30. A WRCLKh signal is applied to the other input. Thus, the NAND gate 486 will be enabled any time the microprocessor 30 addresses the ADCR register and initiates a write operation.

The bits ADCR[7] and ADCR[6] are read only status bits generated by the flip-flops 464 and 466. These bits indicate that the auto-zero sequence is complete and the A/D conversion is complete. These flip-flops 464 and 466 are clocked by the phase 2 clock signal PH2h by way of two inverters 488 and 490. Status signals EOCh and EOAZh, representative of the status of the A/D subsystem 78 and the auto-zero operation, are applied to the D inputs of these flip-flops 464 and 466 by way of control circuitry discussed below. More specifically, an end of auto-zero signal EOAZh, which indicates that the auto-zero process has finished is applied to an $\overline{S}$ input of a flip-flop 492 by way of an inverter 494. The Q output of the flip-flop 492 is applied to a D input of a flip-flop 496. The Q output of the flip-flop 496 is applied to the D input of the flip-flop 464 by way of a buffer amplifier 498. The $\overline{Q}$ output of the flip-flop 464 is applied to the data bus DATA[6] by way of the tristate device 480 and a buffer amplifier 500 to generate an end of auto-zero flag.

An EOCh signal is applied to the flip-flop 466, by way of an inverter 504 and control circuitry discussed below. The EOCh signal indicates the end of the A/D conversion process. The output of the inverter 504 is applied to an $\overline{S}$ input of a flip-flop 502. A Q output of the flip-flop 502 is applied to a D input of a flip-flop 506. The Q output of the delay flip-flop 506 is applied to the D input of the flip-flop 466 by way of a buffer amplifier 508. The output of the buffer 508 is applied to the D input of the flip-flop 466. The $\overline{Q}$ output of the flip-flop 466 is applied to the data bus DATA[7] by way of the tristate device 482 and a buffer amplifier 510 to generate an A/D conversion complete flag.

Timing for the flip-flops 496 and 506 is an inverted phase 2 clock signal available at the output of the inverter 488. The flip-flops 496 and 506 as well as the flip-flops 464 and 466 may be reset by the microprocessor 30 by way of a RESETb signal available at the output of an inverter 516.

ACFR[5] is a command bit which resets the autozero complete and A/D conversion complete flags and resets the bits ACFR[6] and ACFR[7] to remove an A/D interrupt request SYI1b signal from the microprocessor 30. The command bit ACFR[5] is available on the data bus DATA[5] and is applied to one input of a dual input NAND gate 512. The other input to the NAND gate 512 is a non-inverting output of the NAND gate 486 which enable write operations to the ADCR register. The output of the NAND gate 512 is applied to one input of a dual input AND gate 514. The other input to the AND gate 514 is the microprocessor reset signal RESETb available at the output of the inverter 516. The output of the AND gate 514 is applied to the reset inputs $\overline{R}$ of the flip-flops 492 and 502 to reset the complete flag and remove the A/D interrupt SY1B.

The A/D interrupt signal SYI1b is generated at an output of a three input NAND gate 516 at the completion of the autozero sequence and the A/D conversion when the A/D interrupt ADCR[4] is enabled. One input to the NAND gate 516 is an output of a two input OR gate 518. The inputs to the OR gate 518 are status bits ADCR[6] and ADCR[7], available at outputs of buffers 517 and 519, which are connected to the Q outputs of the flip-flops 464 and 466. These bits ADCR[7,6] indicate that the autozero operation is complete and the A/D conversion is complete, respectively. Another input to NAND gate 516 is the ADCR[4] bit, which indicates an interrupt enable. The third input is from the test circuitry, normally used only during testing.

The ADCR[2] is a command bit which may be written by the microprocessor 30 and is used to initiate an A/D sequence. This bit is available on the data bus DATA[2] and is applied to dual input NAND gate 520. The other input to the NAND gate 520 is from the ADCR register write control NAND gate 486. The output of the NAND gate 520 to an $\overline{S}$ input of a flip-flop 522. A Q output of the flip-flop 522 is applied to a D input of a flip-flop 524. The output of the flip-flop 524 is applied to a D input of another flip-flop 526 by way of a buffer 525. A Q output of the flip-flop 526 is used to generate the start auto-zero signal STAZh. More specifically, the Q output of the flip-flop 526 is applied to one input of a dual input AND gate 528 by way of a buffer 530. The other input to the AND gate 528 is from test circuitry. The output of the AND gate 528 is the STAZh signal.

The STAZh signal is cleared when the auto-zero state machine is busy (AZBSYh). More specifically, a AZBSYh signal is applied to one input of a two input AND gate 530 by way of an inverter 531. A RESETb signal from the microprocessor 30 is applied to the other input. The output of the AND gate 530 is applied to an $\overline{R}$ input of the flip-flop 522 to reset this flip-flop. Timing for the flip-flops 524 and 526 is provided by the SMCLKh signal available at an output of an inverter 527. The flip-flops 524 and 526 are reset by the microprocessor 30 by way of the RESETb signal applied to their reset inputs $\overline{R}$.

The ADCR[1] bit is used to control the three sample and hold switches 108, 110 and 112. Specifically the D output of the flip-flop 458 is applied to one input of a AND gate 532. The other input to the AND gate 532 is from the test circuit. The output of the AND gate 532 is a signal SAMPh which controls the sample and hold switches 108, 110 and 112.

The ADCR[3] bit available at the Q output of the flip-flop 462. This bit ACDR[3] is used to control the integrator reset. More specifically, the output of the flip-flop 462 is applied to a two input AND gate 534. The other input to the AND gate 534 is from the test circuit. The output of the AND gate 534 is an integrator reset signal INTRESh. This signal is applied to a buffer 757 (FIG. 45) to generate a DISCHh signal and applied to the switch 96 (FIG. 62). When the DISCHh signal is high, the switch 96 (FIG. 18) disconnects and MXO pin from the current mirror 92 and shorts the MXO pin to analog ground AVSS. The switch 96 remains shorted as long as this bit remains set. The shorting switch 96 may be open by writing a zero to ADCR[3]. This signal is also representative of the present state of the switch 96.

INPUT MULTIPLEXER CONTROLS

An 8 bit read-write register AMUX[7 . . . 0] is used to control the voltage and current input MUXes 62 and 64. This register is divided into 2 four bit fields, one field controls the voltage inputs and generates a signal VMUX[3 . . . 0] and the other controls the current inputs and generates a signal CMUX[3 . . . 0].

The VMUX[3 . . . 0] signal is developed by the flip-flops 536, 538, 540 and 542 (FIG. 41). The D inputs of these flip-flops are tied to the data bus DATA[3 . . . 0] to allow the microprocessor 30 to write to them. The output of these flip-flops are tied to the data bus DATA[3 . . . 0] by way of tristate devices 544, 546, 548 and 550 to allow the contents of these flip-flops to be read by the microprocessor 30. The tristate devices 544, 546, 548 and 550 are normally in a high impedance state and are under the control of a NAND gate 552. The NAND gate 522 is a two input NAND gate. A read clock signal RDCLKh is applied to one input. The RDCLKh signal indicates a read operation by the microprocessor 30 as previously discussed. An AMUXh signal is applied to the other input. The AMUXh signal represents that this register has been addressed by the microprocessor 30. More specifically the AMUX register is located in memory at $0021. Thus any time the microprocessor 30 addresses this location, the AMUXh signal will be active high. This allows the microprocessor 30 to read the contents of the flip-flops 536, 538, 540 and 542 by connecting the Q outputs of these flip-flops to the data bus DATA[3 . . . 0].

Write operations to the flip-flops 536, 538, 540 and 542 are controlled by a NAND gate 554. This NAND gate 554 generates a write WRMUXb that is applied to the $\overline{D}$ inputs of these flip-flops. The NAND gate 554 is a three input NAND gate. The write clock WRCLKh signal is applied to one input. An AMUXh signal is applied to another input. Lastly, a signal ARBSYh is applied to the NAND gate 554. The ARBSYh signal represents that the auto-ranging system is busy and will be discussed in detail below.

The flip-flops 536, 538, 540 and 542 are reset by a RESETb signal, applied to the reset inputs $\overline{R}$ of these flip-flops. The RESETb signal allows the microprocessor 30 to reset these flip-flops.

The CMUX[3 . . . 0] signal is developed by the flip-flops 556, 558, 560 and 562. The D inputs of these flip-flops are tied to the data bus DATA[7 . . . 4] to allow the microprocessor 30 to write to them. The Q outputs of these flip-flops are connected to the data bus DATA[7 . . . 4] by way of tristate devices 564, 566, 568 and 570 for read operations. The tristate devices 564, 566, 568 and 570 are normally in a high impedance state and are under the control of the NAND gate 552 which allows these flip-flops to be read when the microprocessor 30 initiates a read operation and places the address $0021 on the address bus ADDR [4 . . . 0]. Write operations to the flip-flops 556, 558, 560 and 562 are controlled by the NAND gate 554 in a similar manner as the flip-flops 536, 538, 540 and 542.

The outputs of the flip-flops 536, 538, 540, 542, 556, 558, 560 and 562 are used to generate a MUX control signal MUXCTL[26 . . . 0] to control the current and voltage MUXes 66 and 68 as shown in FIGS. 18 and 52. More specifically, the voltage channel MUXes 66 and 68 are controlled by the control signal VMUX[3 . . . 0] while current channel MUXes 66 are controlled by the CMUX[3 . . . 0] signal. These signals are decoded by a series of inverters, OR gates and AND gates (FIG. 44) to generate the MUX control signals MUXCTL to allow individual control of each of the voltage and current channel MUXes. More specifically, the CMUX[3 . . . 0] signal is applied to one input of dual input AND gates 572, 574, 576 and 578. The other inputs to these AND gates is a signal CAZh, which is applied to the AND gates 572,574,576 and 578 by way of an inverter 580. The signal CAZh is also used to develop a signal CSHRTh, used in the A/D subsystem 78. The signal CSHRTh is available at the output of an inverter 581, serially coupled to the inverter 580. The signal CAZh indicates that the current amplifier 90 is being auto-zeroed.

The output of the NAND gate 572 is coupled to a chain of serially connected inverters 582, 584, 586, 588, 590, 592 and 594. The output of the NAND gate 574 is coupled to a chain of serially connected inverters 596, 598, 600, 602, 604, 606 and 608. Similarly, the output of the NAND gate 576 is coupled to a chain of serially connected inverters 610, 612, 614, 616, 618, 620 and 622. Lastly, the NAND gate 578 is applied to a chain of serially connected inverters 624, 626, 628, 630, 632, 634 and 636. The outputs of the inverters 594,608, 622 and 636 are coupled to inputs of dual input OR gates 638, 640, 642 and 644. The other inputs to these OR gates are the outputs from the inverters 582, 596, 610 and 624. The outputs of the NAND gates 572, 574, 576 and 578 are applied to inputs of dual input OR gates 646, 648, 650 and 652, respectively. The other inputs to these OR gates are from the outputs of the inverters 592, 606, 620 and 632, respectively. The outputs of the OR gates 638, 640, 642, 644, 646, 648, 650 and 652 are applied to inputs of dual input AND gates 654, 656, 658, 660, 662, 664, 666 and 668, respectively. The ACFR[3 . . . 0] bits from the internal bus ACFR[3 . . . 0] are applied to the other inputs of these AND gates to control whether the input MUXes 66 (FIG. 18) are in a current mode or a voltage mode. A one in these bits selects the current mode. More specifically, the ACFR[3] bit is applied to the inputs of the AND gates 654 and 656. The ACFR[2] bit is applied to the inputs of the AND gates 658 and 660. The ACFR[1] bit is applied to the inputs of the AND gates 608 and 610. Lastly, the ACFR[0] bit is applied to the inputs of the AND gates 666 and 668. The outputs of the AND gates 654, 656, 658, 660, 662, 664, 666 and 668 are decode signals MUXCTL[20 . . . 13] which allow for individual control of the current channel MUXes 66.

The sample and hold switches 108, 110 and 112 may also be individually controlled by decode circuitry (FIG. 44) which includes inverters 670, 672, 674, 676, 678 and 680 and three input AND gates 682 and 684. More specifically, the inverters 670, 672, 674 and 676 are tied to the internal ACFR bus ACFR[3 . . . 0]. The outputs of the inverters 670 and 672 are applied to the AND gate 682 along with a SAMPh signal, available at its output of the NAND gate 532 (FIG. 41), which indicates that the command bit ACFR[1] has been set. The outputs of the inverters 674 and 676 are applied to the AND gate 684 along with the SAMPh signal. The SAMPh signal is also tied to the inverters 678 and 680 and the AND gate 684 represent the signal MUXCTL[24 . . . 21] which allows individual control of the sample and hold switches 108, 110 and 112.

The VMUX[3 . . . 0] bits of the AMUX register control the voltage channel MUXes 66 and 68 to generate the MUXCTL[10 . . . 0] signals and to generate the MUXCTL[10 . . . 0] signals (FIG. 45). The MUXCTL[26, 25, 12, 11] signals (also shown on FIG. 45) are used during a testing mode. More specifically, the voltage channel MUXes 66 and 68 are selected by the VMUX[3 . . . 0] bits. These four bits are decoded by circuitry (FIG. 45) consisting of buffer amplifiers 686, 688, 690 and 692; inverters 694, 696, 698 and 700; quad input AND gates 702; 704, 706, 708, 710, 712, 714, 716, 718, 720 and 722; and dual input AND gates 724, 726, 728, 730, 732, 734, 736, 738, 740, 742 and 744. More specifically, the VMUX[3 . . . 0] bits are applied to the inputs of the buffer amplifiers 686, 688, 690 and 692 and the inverters 694, 696, 698 and 700. The output of the buffer amplifier 686 is applied to the inputs of the AND gates 718, 720 and 722. The output of the inverter 694 is applied to the inputs of the AND gates 702, 704, 706, 708, 710, 712, 714 and 716. The output of the buffer amplifier 688 is applied to the inputs of the AND gates 710, 712, 714, 716, 718 and 722. The output of the inverter 696 is applied to the inputs of the AND gates 702, 704, 706, 708 and 720. The output of the buffer amplifier 690 is applied to the inputs of the AND gates 706, 708, 714, 716, 718 and 722. The output of the inverter 698 is applied to the inputs of the AND gates 702, 704, 710, 712 and 720. The output of the buffer amplifier 692 is applied to the inputs of the AND gates 704, 708, 712, 716 and 722. Lastly, the output of the inverter 700 is applied to the inputs of the AND gates 702, 706, 710, 714, 718 and 720. The output of the AND gates 702, 704, 706, 708, 710, 712, 714, 716, 718, 720 and 722 are a decode of the AMUX[3 . . . 0] bits. The outputs of these AND gates are applied to the inputs of dual input AND gates 724, 726, 728, 730, 732, 734, 736, 738, 740, 742 and 744. The other input to these AND gates is an AND gate 746 which controls write operation to the voltage channel MUXes. More specifically, the AND gate 746 is a two input AND gate. A WRMUXb signal is applied to one input. The other input to the AND gate 746 is a signal VAZh by way of an inverter 748. As will be discussed below, the signal VAZh is active high and indicates when the voltage amplifier 80 is being zeroed. This signal will be discussed in detail below. The outputs of the AND gates 724, 726, 728, 730, 732, 734, 736, 738 and 740 represent the signal MUXCTL[9 . . . 0].

As will be discussed in more detail below, autoranging is inhibited when the current channels are selected. Thus the output of the AND gate 720 is used to generate a signal MXOSELh by way of an inverter 750. More specifically, a signal MXOh, which indicates that a current channel has been selected, is generated at the output of an AND gate 752 and corresponds to an MUXCTL[9] signal. The AND gate 752 is a two input AND gate. One input is from the test circuit. The other input is from an OR gate 754. The OR gate 754 is a two input OR gate. One input is from a test circuit. The other input is from the AND gate 742 which indicates that the current channels have been selected.

A VNULLh signal is developed at the output of a buffer amplifier 756. This VNULLh signal controls the zero switch 86 (FIGS. 45 and 61) for auto-zeroing the voltage amplifier 80. The input to the buffer amplifier 756 is an output of a two input AND gate 758. One input to the AND gate 758 is the VAZh signal indicating that the amplifier 80 is being autozeroed. The other input to the AND gate 758 is the same signal VAZh applied by way of inverters 748 and 760.

An AGNDh signal is developed at the output of a two-input OR gate 761. One input to the OR gate 761 is the output from the AND gate 744. The VNULLh signal is applied to the other input. The AGNDh signal is used to connect the voltage channels to ground (FIG. 18). The AGNDh signal is available as MUXCTL[10].

Lastly, MUXCTL[26,25,12,11] are used in conjunction with the test circuit.

AUTO-ZERO REGISTERS ADZ AND AMZ

The ADZ and AMZ registers are used in connection with the auto-zero logic 98 for the current and voltage amplifiers 80 and 90. The auto-zero logic corrects for the offsets in the amplifiers 80 and 90 created by using a CMOS process to fabricate these amplifiers.

ADZ REGISTER

The ADZ register (FIG. 46) is a 6 bit read-write register which contains the offset correction value for the voltage amplifier 80. As previously discussed, write operations to this register are intended for diagnostic and verification purposes only. This register is loaded with the correction value for the amplifier 80 at the completion at the auto-zero sequence.

More specifically, the data bus DATA[7 . . . 0] is applied to this register, which includes the flip-flops 762, 764, 766, 768, 770 and 772. MUXes 774, 776, 778, 780, 782 and 784 allow the inputs of these flip-flops to be connected to either the data bus DATA[7 . . . 0] or to a zero bus ZERO[5 . . . 0]. The ZERO[5 . . . 0] bus contains the offset correction value for the amplifier being zeroed and allows the offset correction value to be written to the ADZ register. The data bus DATA[5 . . . 0] bits are applied to the A inputs of the MUXes 774, 776, 778, 780, 782 and 784. The ZERO[5 . . . 0] bus signal is applied to the B inputs of these MUXes. A ZERSEL signal is applied to the select inputs SEL of these MUXes. The ZERSEL signal controls whether the ADZ register is loaded from the data bus or the zero bus. The outputs of the MUXes 774, 776, 778, 780 and 782 are applied to the D inputs of the flip-flops 762, 764, 766, 768, 770 and 772. The ZERSELh signal (FIG. 48), generated by the autozero state machine, indicates that the state machine is in state S3. In state S3, the offset correction value is latched into the ADZ register by the VZCLKh signal discussed below. The VZCLKh signal is developed by the auto-zero state machine and is available at the output of a buffer 803. This signal VZCLKh is applied to the $\overline{G}$ inputs of the flip-flops 762, 764, 766, 768, 770 and 772.

The Q outputs of the flip-flops 762, 764, 766, 768, 770 and 772 are applied to an internal bus VZERO[5 . . . 0] for the voltage amplifier 80. The Q outputs of these flip-flops are also connected to the data bus DATA[5 . . . 0] by way of tristate devices 786, 788, 790, 792, 794 and 796 to allow these flip-flops to be read by the microprocessor 30. The bits ADZ[7,6] will always read zero since these bits are tied to the data bus DATA[7,6] by way of tristate devices 798 and 800 which have grounded inputs.

The tristate devices 786, 788, 790, 792, 794, 796, 798 and 800 are normally in a high impedance state except during a read operation when these tristate devices allow the outputs of the flip-flops 762, 764, 766, 768, 770 and 772 to be tied to the data bus DATA[7 . . . 0]. These tristate devices are under the control of a NAND gate 802. The output of the NAND gate 802 is a signal VZRDb signal, which represents a ADZ register read. The inputs to the NAND gate 802 are the signals RDCLKh and ADZh. The read signal RDCLKh is the read clock signal. The ADZh signal represents a microprocessor 30 has placed the address $0024 on the address bus ADDR[4 . . . 0]. The ADZ register is loaded by a VZCLKh signal.

The ADZ register can also be reset by the microprocessor 30. More specifically, a RESb signal is applied to the reset inputs of the flip-flops 762, 764, 766, 768, 770 and 772.

AMZ REGISTER

The AMZ register is a 6 bit read-write register that contains the offset correction value for the current mirror amplifier 92. This register is loaded with the correction value at the completion of the auto-zero sequence. Write operations to this register are diagnostic and verification purposes only.

The AMZ register includes the flip-flops 804, 806, 808, 810, 812 and 814. The Q outputs of the flip-flops 804, 806, 808, 810, 812 and 814 are tied to an internal bus CZERO[5 . . . 0]. The data bus DATA[7 . . . 0] is applied to the inputs of these flip-flops by way of the MUXes 774, 776, 778, 780, 782 and 784. These flip-flops are clocked by a CZCLKb signal, developed by the autozero state machine to latch the offset correction value for the current amplifier 90 (FIG. 62) into the AMZ register in state S7 (Appendix C) as discussed below. The CZCLKb signal is applied to $\overline{D}$ inputs of these flip-flops by way of a buffer 816. A RESb signal is applied to the reset inputs R of these flip-flops for reset.

The Q outputs of the flip-flops 804, 806, 808, 810, 812 and 814 are applied to the data bus DATA[5 . . . 0] by way of tristate devices 818, 820, 822, 824, 826 and 828. The bits AMZ[7,6] are not used and will always read zero. More specifically, the data bus DATA[7, 6] are connected to the outputs of tristate devices 830 and 832, respectively. The input to the tristate devices 830 and 832 are connected to ground. Thus the AMZ[7, 6] bits will always read zero.

All of the tristate devices 818, 820, 822, 824, 826, 828, 830 and 832 are under the control of a NAND gate 834. The output of the NAND gate 834 is a signal CZRDb, which indicates an AMZ register read. The RDCLKh is applied to one input of the NAND gate 834. An AMZh signal is applied to the other input. The AMZh represents that the microprocessor 30 has written to the address $0025.

The flip-flops 804, 806, 808, 810, 812 and 814 are reset by the microprocessor 30. More specifically, a RESb signal is applied to the reset inputs of these flip-flops.

AUTO-ZERO STATE MACHINE

An auto-zero state machine generates the sequencing required to zero the voltage and current amplifiers 80 and 90 by adjusting the internal bias currents. During an autozero sequence, the amplifier's inputs and outputs are isolated from associated circuitry and the inputs are grounded. The autozero state machine differentially varies the bias currents in discrete steps by way of current divider (FIG. 64) until the amplifier's output changes states. The autozeroable amplifier is illustrated in FIG. 65. The number of steps corresponding to the change in state represents the offset correction value. This correction value stored in the ADZ and AMZ registers as discussed above.

The auto-zero state machine is illustrated in FIG. 67.

The state machine includes three state register flip-flops 836, 838 and 840 as well as NAND gates 842, 844, 846, 848, 850, 852, 854, 856, 858, 860, 862, 864 and 866 and as shown in FIG. 48. There are also various inputs and outputs from the state machine as discussed below. The state register flip-flops produce state variables R0h, R0b, R1h, R1b, R2h and R2b. These variables, along with the variables R0d, R1d and R2d, available at the outputs of the NAND gates 848, 856 and 866 are used in the development of the state equations for the state machine.

Each of the state register flip-flops is clocked by the SMCLKh signal discussed above. The reset signal RESETb, available at the output of an inverter 892 is applied to the reset inputs R of these flip-flops.

The outputs of the state register flip-flops 836, 838 and 840 define the auto-zero state assignments for the auto-zero state machine. Eight permissible states S0–S7 are defined as follows:

S0—Idle. The state machine is in the idle state waiting for a start auto-zero signal STAZh to become active. The state machine also stays idle as long as the auto-range state machine is busy. This interlock between the two state machines is implemented by an auto-range busy signal ARBSYh. When the STAZh signal is active, the ARBSYh signal is inactive to allow the state machine to transfer to state S1.

S1—Five microsecond delay. States S1 and S2 form a loop which is repeated until either the voltage amplifier output changes state or a counter 868 reaches a final count. During state S1, a time request signal TIMREQh is active and a time out signal TIMOUTh is monitored.

The act of the time request signal going active, which happens in state S1, triggers a five microsecond timer (FIG. 47). When the timer has timed five microseconds, the time out signal TIMOUTh becomes active. This causes the state machine to transfer to either state S2 or state S3. The state machine proceeds to state S2 if the amplifier output VAMPh signal is still high indicating that the bias current is not yet high enough and the counter 868 has not yet reached the final count as indicated by a FULLb flag. The state machine transfers to state S3 if either the amplifier output signal goes low or the counter 868 reaches the final count. The five microsecond delay permits the amplifier 80 to settle and reach a stable output.

S2—clock counter. State S2 is entered when the counter 868 does not yet contain a full count and the count is not enough to generate a suitable bias current for zeroing the amplifier 80. The clock counter signal is active in state S2 incrementing the count value by one. The state machine always transfers to state S1 on the next clock pulse.

S3—Latch ADZ value. State S3 is reached when either the voltage amplifier output has switched states or the counter 868 has reached the final count. The present count in the counter is latched into the ADZ register by activating the VZCLKh signal for one state time. The state machine always transfers to state S4.

S4—Clear Counter. State S4 sets up the state machine for auto-zeroing the current amplifier 90. The counter is cleared via a ZERRESb signal and the MUXes 774, 776, 778, 780, 782 and 784 on the output of the counter switch to direct the count value to the AMZ register and the current amplifier 90. The state machine always transfers to state S5.

S5—Five microsecond delay. State S5 and S6 are analogous to state S1 and S2 except the counter is applied to the current amplifier 90 and the output of the current amplifier CAMPh is examined to transfer from S5 to S7.

S6—Clock Counter. This state is identical to state S2. The state machine always transfers to state S5.

S7—Latch AMZ value. This state is analogous to state S3. Current contents of the counter 868 are latched in the AMZ register. Additionally the end of auto-zero signal EOAZh is active to indicate that the auto-zero operation has been complete.

AUTO-ZERO INPUTS

There are various input and on signals to the auto-zero machine identified as follows:

ARBSYh—Auto-Range Busy. This signal is active high when the auto-range state machine is not idle. This signal is applied to the state machine by way of an inverter 870. This signal is discussed in connection with the auto-range state machine.

STAZh—Start Auto-Zero. This signal is active high when the initiate auto-zero bit of a command register has been written. This signal is available at the output of the AND gate 528 (FIG. 41).

VAMPb—Voltage Amp Output. This signal is active low when the voltage amplifier 80 has been auto-zeroed. The VAMPh signal is the output signal of the voltage amplifier 80 and is applied to a flip-flop 889.

CAMPb—Current Amp Output. This signal is low when the current amplifier 90 has been auto-zeroed. The CAMPh signal is available at the output of the current amplifier 90. This signal is applied to a flip-flop 891.

TIMOUTh—Time Out. This signal is active high when a five microsecond time delay has expired. The TIMOUTh signal is available at the output of a NAND gate 870 (FIG. 47). The NAND gate 870 is a two input NAND gate. One input is active during the test mode. The other input is from a five microsecond timer comprised of flip-flops 872, 874, 876 and 878 and a NAND gate 880. The Q outputs of these flip-flops are tied to the inputs of the NAND gate 880. The flip-flops 842 and 846 are configured such that their $\overline{Q}$ outputs are connected to their D inputs. The $\overline{Q}$ outputs of the flip-flops 872, 874 and 876 are applied to clock inputs CK of the flip-flops 874, 876 and 878, respectively. A TIMOUTb signal, available at the output of an inverter 871 (FIG. 48), is also applied to the autozero state machine. The TIMOUTb signal is applied to the NAND gate 860. The SMCLKh signal is applied to an inverter 882, whose output is connected to the clock input CK of the flip-flop 872. The reset inputs $\overline{R}$ of the flip-flops 872, 874, 876 and 878 are controlled by an OR gate 884. The OR gate 884 is a two input OR gate. Signals AZTIMh and ARTIMh are applied to the inputs.

FULLb—Counter Full. This signal is active low when the counter 868, used to set a bias current, is at 111111 count. This is a maximum bias count value. The counter 868 includes the flip-flops 872, 874, 876, 878, 880 and 882 and a NAND gate 884 connected as shown in FIG. 48. The Q outputs of the flip-flops 872, 874, 876, 878, 880 and 882 are connected to the NAND gate 884, which is FULLb flag and the internal ZERO[5 . . . 0] bus. The FULLb flag is applied to the inputs of the NAND gates 842 and 854. It is also applied to an OR gate 886 by way of an inverter 888. The other input to the OR gate 886 is from a flip-flop 889. The input to the flip-flop 889 is a signal VAMPh, which is the output of the voltage amplifier 80. This flip-flop is clocked by the complement of the SMCLKh signal, available at an inverter 890. The flip-flop 889 is reset by a RESETb signal available at the output of an inverter 892. The output of the OR gate 886 is applied to the NAND gate 858.

RESETh—Reset. This signal is active high to reset the state register flip-flops 836, 838 and 840 during system reset. This signal is available at the output of the inverter 892.

AUTO-ZERO OUTPUTS

ZERRESb—Zero Counter Reset. This signal is active low to reset the counter 868 used to generate the bias counter and is active in states S0 and S4. This signal is available at an output of a NAND gate 894.

ZERCLKh—Zero Counter Clock. This signal is active high to increment the bias current counter 868. This signal is active in states S2 and S6 and is available at an output of a NAND gate 896.

TIMREQh—Time Request. This signal is active high to request a five microsecond delay period and is active in states S1 and S5. This signal is available at an output of a two input OR gate 898. Outputs from AND gates 900 and 902 are applied to inputs of the OR gate 898. Inputs to these AND gates are from the state machine.

AZBSYh—Auto-Zero Busy. This signal is active high to indicate when an auto-zero operation is active. This signal is used to interlock the auto-zero and auto-range state machines. The AZBSYh signal also inhibits the microprocessor 30 from writing to the auto-zero registers by disabling NAND gates which decode the register select signals AMZh and ADZh and the write clock signal WRCLKh. This signal is active in states S1, S2, S3, S4, S5, S6 and S7. This signal is available at an inverting output of a NAND gate 904. The output of the NAND gate 904 is also the ZERSELh signal.

EOAZh—End of Auto-Zero. This signal is in active high signal which sets the flip-flop 492 (FIG. 41) in the ADCR status register to indicate an auto-zero process has finished. It also clears a flip-flop which generates the STAZh signal and is active in S7. This signal is available at an output of an AND gate 906.

CAZh—Current Auto-Zero. This signal is active high to indicate when the current amplifier 90 is being auto-zeroed. This signal is active in states S4, S5 and S6. This signal is available at an inverting output of a two input NOR gate 908. Inputs to the NOR gate 908 are from AND gates 910 and 912 which is connected to the state machine.

VAZh—Voltage Auto-Zero. This signal is active high to indicate when the voltage amplifier 80 is being auto-zeroed and is active in state S1 and S2. This signal is available at a non-inverting output of a NAND gate 914.

CZCLKh—Current Zero Register Clock. This signal is active low to clock the AMZ register for the current amplifier bias count. When the state machine is idle, this signal is generated by decoding the register select signal AMZh and the write clock signal WRCLKh. When the state machine is active, S7 is decoded to generate a clock pulse to the register. This signal is active in S7. This signal is available at an output of a two input AND gate 916. One input to the AND gate 916 is an inverting output from the NOR gate 908. The other input is from a three input NAND gate 918. One input to the NAND gate 918 is a non-inverting output of the NAND gate 904. The other inputs are the AMZh and WRCLKh signals.

VZCLKh—Voltage Zero Register Clock. This signal is active low to clock the ADZ register for the voltage amplifier bias count. When the state machine is idle, this signal is generated by decoding the register select signal ADZh and the write clock signal WRCLKh. When the state machine is active, S3 is decoded to generate a clock pulse to the register. This signal is active in S3. This signal is available at an output of two input AND gate 920. An inverting output of the NAND gate 914 is applied to one input. The other input is from a three input NAND gate 922. The ADZh and WRCLKh signals are applied to two inputs. A non-inverting output from the NAND gate 904 is applied to the other input.

AZST bus—Auto-Zero States. This three bit wide bus contains the auto-zero state machine flip-flops 836, 838 and 840. This bus is used to permit reading of these flip-flops during a test condition.

AUTO-ZERO STATE MACHINE OPERATION

The auto-zero state machine auto-zeros the voltage 80 and current amplifier 90. The auto-zero function is initiated by the software setting a bit in the command register which includes the flip-flops 522, 524 and 526. More specifically, referring to FIG. 41 when the command bit ADCR[2] is written to the NAND gate 520 this, in turn, controls the flip-flops 522, 524 and 526 to generate the start auto-zero signal STAZh at the output of the AND gate 528.

The voltage 80 and current 90 amplifiers are auto-zeroed in the following manner. After the generation of the start auto-zero signal STAZh. First, the six bit counter 868 is cleared. This counter 868 is cleared by the ZERRESb signal in states S0 and S4. After the six bit counter 868 is cleared the voltage amplifier 80 is placed in the auto-zero state by shorting its noninverting input to ground by way of the MUXes 66 and 86. This is accomplished by the VAZh signal which is active in states S1 and S2. This signal generates an AGNDh signal at the output of an OR gate 924, which shorts the noninverting input of the voltage amplifier 80 to ground by way of the MUX 80. MUX 88 removes the internal compensation from the voltage amplifier 80. Next the output of the counter 868 is gated onto a ZERO[5 . . . 0] bus for the amplifier being auto-zeroed. Subsequently, a five microsecond delay is timed. This is accomplished by the circuitry in FIG. 47 previously discussed. At the end of the five microsecond delay, a TIMOUTh signal is generated at the output of the NAND gate 870. At the end of the delay, the output signal VAMPh, which is the output signal of the voltage amplifier 80, is examined. Also, the counter 868 full counter count signal FULLb is examined. If either of these signals is active, the count is latched into the ADZ register by the state machine. Otherwise, the counter 868 is incremented and the five microsecond delay is timed again. After the count is latched the sequence is repeated with the current amplifier 90.

AVSF AND ACSF AUTO-RANGE REGISTERS

The voltage scale register AVSF (FIG. 49) is a read-write register that is used to control operation of the voltage input ranging circuitry (FIGS. 18 and 61). The value written into this register determines the voltage amplifier 80 auto-ranging mode. If a zero is written to this register, the voltage amplifier 80 is placed in an auto-ranging mode. A nonzero value inhibits the auto-ranging and sets the voltage amplifier 80 in a fixed gain mode. The register is not a true read-write register. The value read from it will not necessarily be the value that was written into it. Writing a zero into the AVSF register enables auto-ranging. However, a zero cannot be read from this register. The possible values are provided in Table 8. The value read from this register is one of the scale factors to properly scale the 8 bit A-D output. Five values are possible: x1, x2, x4, x8 and x16.

The AVSF register includes six flip-flops 944, 946, 948, 950, 952 and 954. The D inputs of these flip-flops are connected to the data bus DATA[5 . . . 0] for write operations during ranging. Any non-zero value written to the AVSF register is detected by a NAND gate 998 which disables autoranging. The $\overline{D}$ inputs of the flip-flops 944, 946, 948, 950, 952 and 954 are tied to the output of a buffer amplifier 955. The input to the buffer amplifier 955 is the signal VRCLKb. This signal will be defined in connection with the auto-range state machine and is used to control read and write operations of the AVSF register. The Q outputs of the flip-flops 944, 946, 948, 950 and 952 are tied to the B inputs of MUXes 956, 958, 960, 962 and 964, respectively. The D output of the flip-flop 954 is the signal VGAIN32h. This signal VGAIN32h along with GAIN[4] from autoranging circuitry which includes counter 1170 (FIG. 50) are applied to ranging circuitry 84 and MUXes 86 of the voltage amplifier 80 (FIGS. 18 and 61) to control the voltage gain. The counter 1170 as will be discussed below includes the ranged value as a result of autoranging of the voltage amplifier 80 and the current amplifier 90. More specifically, the MUXes 956, 958, 960, 962 and 964 allow the Q outputs of the flip-flops 944, 946, 948, 950, 952 and 954 to be connected to either to a gain bu GAIN[4 . . . 0] or to A inputs of MUXes 966, 968, 970, 972 and 974. The B inputs of the MUXes 966, 968, 970, 972 and 974 are connected to ground which allows the output signals of the flip-flops 944, 946, 948, 950, 952 and 954 to either be grounded or connected to the data bus DATA[5 . . . 0] by way of tristate devices 976, 978, 980, 982 and 984 for read operations. The tristate devices 976, 978, 980, 982 and 984 are under the control of a signal VRRDb (FIG. 50) which read operations of the AVSF register.

The output of the MUXes 966, 968, 970, 972 and 974 are also tied t one input of a plurality of AND gates 986, 988, 990, 992 and 994. The other input to the AND gates 986, 988, 990, 992 and 994 is from an inverter 996. The input to the inverter 996 is the VAZh signal (FIG. 48), the voltage auto-zero signal which indicates the voltage amplifier 80 autoranging is active. The output of the AND gates 986, 988, 990, 992 and 994 are connected to the VGAIN[4 . . . 0] bus which controls the autoranging MUXes 86 (FIG. 61).

The MUXes 956, 958, 960, 962 and 964 are under the control of a NAND gate 998 which generates a signal VRZEROh. This signal indicates that the microprocessor 30 wrote a zero to the AVSF register to initiate voltage auto-ranging. The signal VRZEROh is active high and determines whether the voltage amplifier 80 is placed in an auto-ranging mode or a fixed gain mode. The input to the NAND gate 998 are the Q outputs of the flip-flops 944, 946, 948, 950 and 952. A zero written to the AVSF register will cause the Q outputs of the flip-flops 944, 946, 948, 950 and 952 to be high or true. This will, in turn, cause the signal VRZEROh to be active which, in turn, will cause the MUXes 956, 958, 960, 962 and 964 to connect the Q output signals from the flip-flops 944, 946, 948, 950, 952 and 954 to the VGAIN[4 . . . 0] bus for auto-ranging. Non-zero values written to the register AVSF, detected by the NAND gate 998, will place the circuitry in a fixed gain mode. This will cause the MUXes 956, 958, 960, 962 and 964 to connect the Q output signals from the flip-flops 944, 946, 948, 950, 952 and 954 to the MUXes 966, 968, 970, 972 and 974. The MUXes 966, 968, 970, 972 and 974 either ground the Q outputs of the flip-flops 944, 946, 948, 950, 952 and 954 or allow them to be tied to the AND gates 986, 988, 990, 992 and 994 which, in turn, are connected to the VGAIN[4 . . . 0] bus. The MUXes 966, 968, 970, 972 and 974 are under the control of an AND gate 1000 which inhibits autoranging of the voltage amplifier 80 when the current mode has selected and is being auto-ranged. The AND gate 1000 is a three input AND gate 1000. The VRZEROh, indicating voltage amplifier autoranging signal, is applied to one input. The AZBSYb signal, which represents that the auto-zero signal is busy, is applied to another input. The output of an AND gate 1002 is a signal CURRENTh, which represents that the current mode has been selected. The CURRENTh signal is applied to the third input of the AND gate 1000. The AZBSYb signal, used to inhibit the auto-range state machine when the auto-zero machine is active. The AND gate 1002 inhibits auto-ranging when the current subsystem is selected.

A REGRESb signal is applied to the reset inputs R of the flip-flops 944, 946, 948, 950, 952 and 954. The REGRESb signal is available at the output of an inverter 1004 (FIG. 50). The input to the inverter 1004 is the signal RESETh from the CPCTL[3 . . . 0] bus.

The current scale factor register ACSF is a read-write register used to control the operation of the current input auto-ranging circuitry. The value written to this register determines the current subsystem autoranging operating mode. When zero is written the current subsystem is placed in an auto-ranging mode. A non-zero value inhibits the auto-ranging mode and sets the current mirror into a fixed scale value. The register is not a true read-write register. In other words, the value read from it is not necessarily the value that was written into it. Although writing a zero into the ACSF register enables the auto-ranging mode, a zero will never be read from it.

The ACFR register (FIG. 49) includes the flip-flops 1006, 1008, 1010, 1012, 1014. The data bus DATA[4 . . . 0] is applied to the D inputs of these flip-flops for write operations in a fixed gain mode. A NAND gate 1048 detects nonzero values Written to this register to enable a fixed gain mode. The $\overline{D}$ inputs of the flip-flops 1006, 1008, 1010, 1012 and 1014 are tied to a buffer amplifier 1016. The input to the buffer amplifier 1016 is a signal CRCLKb, which will be discussed in connection with the auto-range state machine. The CRCLKb signal latches the gain value in this register at the completion of the autoranging sequence. The signal REGESSb is applied to the reset inputs R. The MUXes 1018, 1020, 1022 and 1024 allow the Q outputs of the flip-flops 1006, 1008, 1010 and 1012 to be connected to the GAIN[4 . . . 0] bus, indicating that the auto-range function has been selected, or to MUXes 1026, 1028, 1030 and 1032. The CGAIN[3 . . . 0] bus is applied to the current mirror 92 (FIG. 63) to control the divider ratio of the current mirror 92. The MUXes 1026, 1028, 1030 and 1032 either allow the output signals Q from the flip-flops 1006, 1008, 1010 and 1012 to either be grounded or applied to the gain bus CGAIN[3 . . . 0] or tied to tristate devices 1034, 1036, 1038 and 1040 to allow the them to be read at the data bus DATA[3 . . . 0]. More specifically, the Q output of the flip-flop 1006 is applied to a B input of the MUX 1018. An A input of the MUX 1018 is applied to the gain bus bit GAIN[3]. The Q output of the flip-flop 1006 is also applied to inputs of OR gates 1042, 1044 and 1046. The Q output of the flip-flop 1008 is also applied to other inputs of the OR gates 1042, 1044 and 1046. Also, the Q output of the flip-flop 1010 is applied to the OR gates 1044 and 1046. Lastly, the Q output of the flip-flop 1012 is also applied to an input of the OR gate 1046.

The outputs of the OR gates 1042, 1044 and 1046 are applied to the B inputs of the MUXes 1020, 1022 and 1024. The fixed gain bus bits GAIN[3 . . . 0] are applied to the A inputs of the MUXes 1018, 1020, 1022 and 1024. The MUXes 1018, 1020, 1022 and 1024 are under the control of a NAND gate 1048. The NAND gate 1048 generates a CRZEROh signal which indicates that the microprocessor 30 has written a zero to the ACSF register to initiate current auto-ranging. A non-zero value written to this register which places the current mirror 92 into a fixed scale value. The Q outputs of the flip-flops 1006, 1008, 1010, 1012 and 1014 are applied as inputs to the NAND gate 1048. If a zero is written into the ACSF register the MUXes 1018, 1020, 1022 and 1024 connect the Q output of the flip-flop 1006 and the Q outputs of the flip-flops 1008, 1010 and 1012 to the gain bus GAIN[4 . . . 0]. Non-zero values written into the ACSF register causes the MUXes 1018, 1020, 1022 and 1024 to be connected to the A inputs of the MUXes 1026, 1028, 1030 and 1032. The B inputs of the MUXes 1026, 1028, 1030 and 1032 are grounded. The MUXes 1026, 1028, 1030 and 1032 are under the control of an AND gate 1049 which disables the auto-ranging of the current amplifier 70 when the system is in a voltage mode. In this condition, the output signals from the flip-flops 1006, 1008, 1010 and 1012 are grounded. There are two inputs to the AND gate 1049. One input to the AND gate 1049 is from the NAND gate 1048. The output of a NAND gate 1048 indicates that auto-ranging has not been selected. The $\overline{Q}$ outputs of the flip-flops 1006, 1008, 1010, 1012 and 1014 are applied as inputs to the NAND gate 1048. The other input to the AND gate 1049 is an inverter 1050. The output of the inverter is a VOLTAGEh signal which indicates that the MUX 66 is in a voltage mode. The input to the inverter 1050 is the output of the AND gate 1002 which indicates that the MUX 66 is in a current mode. The inputs to the AND gate 1002 is a MXOSELh signal (FIG. 45) which indicates that a current mode has been selected. The outputs of the MUXes 1026, 1028, 1030 and 1032 are connected to a pair of serially coupled inverter amplifiers 1052, 1054, 1056, 1058, 1060, 1062, 1064 and 1066. The outputs of the inverters 1054, 1058, 1062 and 1066 are applied to the gain bus CGAIN[3 . . . 0] as well as to the tristate devices 1034, 1036, 1038, 1040 either directly or by way of AND gates, 1068, 1070 and 1072. More specifically, the output of the inverter amplifier 1054 is applied to the tristate device 1034. The output of the inverter amplifier 1058 is applied to an AND gate 1068 along with the output of the inverter amplifier 1052. The output of the inverter amplifier 1062 is applied to the AND gate 1070 along with the output of the inverter amplifier 1056. The output of the inverter amplifier 1066 is applied to the input of the AND gate 1072 along with the inverter amplifier 1060.

These tristate devices 1034, 1036, 1038 and 1040 are also applied to the data bus DATA[3 . . . 0] to allow the ACSF register to be read. The output of the inverter amplifier 1064 is applied to a tristate device 1068. This tristate device 1068 is applied to the DATA[4] bit. The tristate devices 1034, 1036, 1038, 1040 and 1068 are controlled by a signal CRRDb. This signal will be identified in connection with the auto-range state machine.

A signal AZST[2 . . . 0], representative of the states of the auto-zero state machine, is applied to AND gates 1070, 1072 and 1074. This signal represents the Q output signals of the auto-zero state register flip-flops 836, 838 and 840 (FIG. 48). Also applied to the AND gates 1070, 1072 and 1074 are test signals. The TEST signals are also applied to the reset input R of the flip-flop 954. The outputs of the AND gates 1070, 1072 and 1074 are applied to tristate devices 1076, 1078 and 1080. The outputs of the tristate devices 1076, 1078 and 1080 are applied to the data bus DATA[7 . . . 5] to allow these signals to be read by the microprocessor 30. The tristate devices 1076, 1078 and 1080 are under the control of a signal CRRDb.

The states of the auto-range state machine ARST[2 . . . 0] are applied to the inputs of AND gates 1082, 1084 and 1086. Test signals are also applied to the inputs of the AND gates 1082, 1084 and 1086. The ARST[2 . . . 0] signal represents the states of the auto-ranging state register flip-flops and will be discussed in connection with the auto-ranging state machine. The outputs of the AND gates 1082, 1084 and 1086 are applied to tristate devices 1088, 1090 and 1092. The outputs of these tristate devices are applied to the data bus DATA[7 . . . 5]. The tristate devices 1088, 1090 and 1092 are under the control of a VRRDb signal. This signal controls the reading of the auto-range state register flip-flops states by the microprocessor 30 and will be discussed in connection with the auto-range state machine.

AUTO-RANGE STATE MACHINE

The auto-range state machine is illustrated in FIG. 50.

This state machine auto-ranges the voltage 80 and current 90 amplifier gains before initiating an analog to digital conversion. During voltage autoranging, the output signals of the voltage amplifier 80 is compared with a predetermined value by the comparator 74 (FIG. 61) to determine if the amplifier output is either too large or out of range of the A/D. At the start of the autoranging a gain shift register 1170 (FIG. 50) is initialized and incremented during a predetermined time period (TIMOUTh). When either the comparator 74 switches state or the time period expires, the value of the gain shift register will represent the gain. This gain value is stored in the AVSF register and is used to control the ranging circuitry 84.

During current autoranging, ranged currents are directed out of the MXO pin and applied to an external resister. The voltage across the external resister is then applied to a voltage input. Ranging is then accomplished in a similar manner as the voltage autoranging. Gain values in this mode are stored in the ACSF register.

The auto-range state machine includes three state register flip-flops 1128, 1130 and 1132; NAND gates 1134, 1136, 1138, 1140, 1142, 1144, 1146; AND gates 1148, 1150, 1152, 1154, 1156, 1158, 1160 and 1162; OR gate 1164 and various output gates connected as shown in FIG. 50.

The Q outputs of the state flip-flops 1128, 1130 and 1132 indicate the state variables ROh, R1h and R2h. The $\overline{Q}$ output of the state register flip-flops 1128, 1130 and 1132 generate the state variables ROb, R1b and R2b. The state variable ROd is generated at the output of the NAND gate 1138. The state variable R1d is generated at the output of the NAND gate 1146. The state variable R2d is generated at the output of the OR gate 1164.

Each of the state register flip-flops 1128, 1130 and 1132 is clocked by the SMCLKh signal. The reset signal REGRESb, available at the output of the inverter 1004, is applied to the reset inputs R of these state register flip-flops.

The outputs of the state register flip-flops 1128, 1130 and 1132 define permissible output states for the auto-range state machine. The state register flip-flops 1128, 1130 and 1132 allow for eight states. However, only seven are necessary and are defined as follows:

S0—Idle. The state machine is in the idle state waiting for a start auto-range signal (STADCh) to be active. The state machine also stays in the idle state as long as the auto-zero state machine is busy. This interlock between the two independent state machines is implemented by the auto-range busy signal (ARBSYh). When the state start auto-range signal is active and the auto-range busy signal is inactive the auto-zero state machine moves to state S1.

S1—Reset shift register. State S1 initializes a shift register 1170 for the type of conversion. For a voltage conversion the shift register 1170 is initialized to the binary value 0001 where the least significant set bit is set. This corresponds to a voltage gain of 1. For a current conversion the shift register 1170 is set to the binary value 00000. This corresponds to a current gain of 1. Only the four least significant bits are used for setting the current gain. The least significant bit is set or cleared by the GRESh signal by additional decoding of the VOLTAGEh and CURRENTh signals.

S2—Five microsecond delay. State S2 and S3 form a loop that is repeated until either the comparator 74 (FIG. 18) output switches or the shift register 1170 reaches the final gain. During S2, the time request signal (TIMREQh) is active in the time-out (TIMOUTh) signal is monitored. When the time request signal goes active the state machine enters the state S1, this triggers the five microsecond time delay. When the time delay has timed out, the time-out signal becomes active. This causes the state machine to transfer either to state S3 or S4. State S3 is entered if the RANGEh signal is inactive indicating that either the gain setting is not high enough yet or the shift register 1170 has not yet reached the final gain setting. The final gain setting is detected by decoding the VOLTh and CURRh signals with the fourth and fifth bits of the shift register 1170. For a current channel, indicated by an active CURRh signal, a fourth bit indicates that a maximum gain has been reached. Maximum gain for a voltage channel is decoded by a fifth bit of the shift register 1170 and an active VOLTh signal.

The state machine transfers to state S4 when the RANGEh signal is active, if the auto-range function is active. If the auto-range function is disabled indicated by an inactive ATORNGh signal, the state machine transfers to state S4 after the five microsecond time delay. This five microsecond time delay permits the amplifier 80, 90 to settle and reach a stable output value.

S3—Clock shift register. State S3 is entered when the shift register 1170 does not yet contain a maximum gain and the gain is not enough to generate a sufficiently high input signal. The clock signal is active in state S3 causing the shift register 1170 to shift one bit. For voltage channel signals a zero is shifted into the least significant bit of the shift register 1170. This causes the shift register to shift a one across the register generating the following sequence of values: 00001, 00010, 00100, 01000, 10000.

For current channels a 1 is shifted into the least significant bit which results in the following sequence of values: 00000, 00001, 00011, 00111, 01111. Only the four bits of the gain are used in setting the current amplifier 90. The state machine always transfers to the state S2 on the next clock pulse.

S4—General SOC pulse. State S4 is used to generate a start of conversion pulse to the analog digital converter. The state machine stays in state S4 until the SOC3b signal becomes active at which time the state machine moves to state S5. The SOC3b signal is active when the start of conversion pulse has been active for three state machine clock periods.

S5—Wait for conversion. The state machine is waiting for the analog end of conversion signal while in state S5. When the analog end of conversion goes high indicating that the conversion has finished, the state machine transfers to state S6.

S6—EOC pulse. End of Conversion EOAZh is active in state S6. This indicates to the commands/status register section that the conversion process has been completed.

AUTO-RANGE INPUTS

The inputs to the auto-range state machine are as follows:

AZBSYh—Auto-Zero Busy. This signal is active high when the auto-zero state machine is not idle. This signal is applied to the state machine by way of an inverter 1171.

ATORNGH—Auto-range Active. The auto-range active signal ATORNG represents that the auto-ranging has been activated when the microprocessor 30 writes a zero into a shift register 1170. More specifically, the ATORNGh signal is available at the output of an inverter 1164 (FIG. 49) while the ATORNGb signal is available at the output of a dual input NOR gate 1166 (FIG. 49). The NOR gate 1166 is controlled by two AND gates 1168 and 1002. The VOLTAGEh signal is applied to one input of the AND gate 1116. The signal VRZEROh is applied to the other input. The output of the AND gate 1002 in applied to the other input of the NOR gate 1166. The output of the AND gate 1002 indicates that the current mode has been selected and that the microprocessor has a zero to the ASCF register to initiate auto-ranging.

The ATORNGb and ATORNGh signals are applied to the state machine by way of circuitry which includes an AND gate 1172, an inverter 1173, an OR gate 1174 and an AND gate 1176. The OR gate 1174 is a two-input OR gate. One input is from the AND gate 1172. The AND gate 1172 is a three-input AND gate. The ATORNGb, TIMOUTh and RANGEh signals are applied to the AND gate 1172. The other input to the OR gate 1174 is from a two input AND gate 1176. One input to the AND gate 1176 is the ATORNGb signal. The other input is the TIMOUTh signal.

RANGEh—In Range Signal. This signal is active high to indicate that either the comparator 74 output signal COMPb has gone low or that the gain shift register 1170 has reached the maximum gain setting for the operating mode selected. The auto-ranging sequencing circuitry 76 includes the gain register 1170, an OR gate 1178, AND gates 1180 and 1182 and a flip-flop 1184. The RANGEh signal is available at the output of the NOR gate 1178.

The gain shift register 1170 is comprised of the flip-flops 1188, 1190, 1192, 1194 and 1196. The Q outputs of these flip-flops are tied to the D input of the next flip-flop in succession. The Q outputs are also tied to the gain bus GAIN[4 . . . 0]. A GCLKh signal is applied to the clock CK inputs of each of these flip-flops. The GCLKh signal is available at the output of an AND gate 1198. The inputs to the AND gate 1198 are the state register signals R0b, R1h and R2b which indicate the autorange state machine is in S3. Also applied to the AND gate 1194 is the signal SMCLKb.

The GCLKh signal is used to shift a zero into the flip-flop 1188 when a voltage channel has been selected and to shift a 1 into the flip-flop 1188 when a current channel has been selected. More specifically, OR gates 1200, 1202, AND gate 1204 and a NAND gate 1206 control this function. A CURRENTh signal which is active high is applied to the input of the OR gate 1200. The other input to the OR gate 1200 is a signal GRESb available at the output of the AND gate 1204. The output of the OR gate 1200 is applied to the preset input of the flip-flop 1188 to shift a 1 into this flip-flop. This value is shifted across the shift register by the GCLKh signal.

Similarly, a VOLTAGEh signal is applied to one input of the OR gate 1202. The other input to the OR gate 1202 is a GRESb signal. The output of the OR gate 1202 is applied to the reset input R of the flip-flop 1188 to shift a zero into this flip-flop when the voltage channel is selected.

The comparator 74 output signal COMPb is monitored by the flip-flop 1184. The SMCLKb signal is applied to the clock CK input of this flip-flop. The REGRESb signal is applied to the reset input R. The output of this flip-flop indicates that the comparator 74 output signal has not yet switched which means that the comparator 74 output signal is less than, for example, 1.25 Vdc to indicate that one-half the maximum has not been reached. This signal is applied to one input of the OR gate 1178. The other inputs to the OR gate 1206 are from the outputs of the AND gates 1180 and 1182. These AND gates indicate that the shift register 1170 has reached the maximum gain setting for the operation modes specified. More specifically, the AND gate 1180 relates to the current mode. The CURRENTh signal is applied to one input of the AND gate 1188. The other input is from the output of the shift register flip-flop 1194 which when active indicates the highest gain setting when the current mode is selected.

Similarly, the VOLTAGEh signal is applied to an input of the AND gate 1182. The other input to the AND gate 1182 is the output of the shift register flip-flop 1196 which represents the highest gain setting when the voltage mode is selected.

The outputs of the AND gates 1180 and 1182 are applied to the inputs of the OR gate 1178 along with the Q output of the flip-flop 1184 to generate the RANGEh signal. The RANGEh signal indicates that either the comparator 74 output signal COMPb has gone low or that the gain shift register 1170 has reached the maximum gain setting for the operating mode selected.

TIMOUTh—Time Out. This signal is active high when the five microsecond time delay has expired. This signal is available at the output of the NAND gate 870 (FIG. 47).

SOC3b—Start of Conversion Three. This signal is active low when the start of conversion pulse has been active for three clock periods.

ANAEOCh—Analog End Of Conversion. This signal is active high when the A/D 78 has finished the conversion. This signal is applied to the AND gate 1140 and to the AND gate 1162 by way of an inverter 1208.

RESETh—Reset. This signal is active high to reset the state register flip-flops during system reset.

STADCh—Start Conversion. This signal is active high when the AMUX register is written. This signal is discussed below.

AUTO-RANGE OUTPUTS

The output signals of the auto-range state machine are as follows:

GRESh—Gain Shift Register Reset. This signal is active high to reset the shift register 1170 used to generate the gain. This signal is active in state S1.

GCLKh—Gain Shift Register Clock. This signal is active high to shift the shift register and is active in state S3.

TIMREQh—Time Request. This signal is active high to request a five microsecond delay period. This signal is active in state S2. The TIMREQh signal is generated at the output of an AND gate 1210. The signals R0b, R1h and R2h are applied to the input of the AND gate 1210 to generate the TIMREQh signal when the auto-range state machine is in state S2.

ARBSYh—Auto-Range Busy. This signal is active high to indicate when a conversion operation is active. This signal is also used to interlock the auto-zero and auto-range state machines. The ARBSYh also inhibits the microprocessor 30 from writing to the gain registers by disabling the NAND gates which decode the register select signals (AVSFh, ACSFh) and the write clock WRCLKh signal. This signal is active in states S1, S2, S3, S4, S5 and S6 and is available at an inverting output of a NAND gate 1212. The state variables R0b, R1B, R2b are applied to the inputs to the NAND gate 1212 to generate the ARBSYh signal in states S1, S2, S3, S4, S5 and S6.

The signal ARBSYb is used to control write and read operations to the ASCF and AVSF registers. More specifically, ARBSYb signals inhibits the microprocessor 30 from reading or writing to the ASCF or AVSF registers when the auto-range state machine is active. The signal ARBSYb is generated at a non-inverting output of the NAND gate 1212. A non-inverting output of this NAND gate is applied to inputs of NAND gates 1214 and 1216. The AVSFh signal, which is generated when the microprocessor 30 places the address $0026 on the address bus ADDR[5 . . . 0], is applied to the NAND gate 1214 and an AND gate 1218. An ACSFh signal is applied to the inputs of the NAND gate 1216 and a NAND gate 1220. This ACSFh signal is generated any time the microprocessor 30 places the address $0027 on the address bus ADDR[5 . . . 0]. The RDCLKh signal is applied to the inputs of the NAND gates 1218 and 1220. The WRCLKh signal is applied to the inputs of the NAND gates 1214 and 1216. The outputs of the NAND gates 1214 and 1218 are the VRRDb and VRCLKb signals, which are used to control read and write operations to the AVSF register. The outputs of the NAND gates 1216 and 1220 are the CRRDb and CRCLKb signals which are used to control read and write operations to the ACFS register.

EOCh—End of Conversion. This signal is active high which sets a flip-flop in the status register to indicate that the conversion process has finished. It also clears the flip-flop 1246 (FIG. 41) which generates the STADCh signal and is active in state S6. This signal is available at an output of an AND gate 1222. The signals R0h, R1b and R2b are applied to the inputs of this AND gate to generate the ECCh signal only when the state machine is in state S6.

ANASOCh—Analog Start of Conversion. This signal is active high to initiate an analog to digital conversion and is active for three clock cycles. This signal is active in state S4. The analog of start of conversion signal ANSOCh is generated by circuitry which includes flip-flops 1224, 1226 and 1228, buffer amplifiers 1230, 1232 and 1234 and an AND gate 1236. This signal is active high for three clock cycles and is active in state S4. A signal representing that the auto-range state machine is in state S4 is available at the AND gate 1156 and applied to the D input of the flip-flop 1224. The state machine clock signal SMCLKh is applied to the clock input of the flip-flop 1224. The Q output of the flip-flop 1170 is applied to the D input of the flip-flop 1226. The Q output of the flip-flop 1226 is applied to the input of a buffer amplifier 1230. The output of the buffer amplifier 1230 is applied to the D input of the flip-flop 1228. The Q output of the flip-flop 1228 is applied to the buffer amplifier 1232 and represents the analog start of conversion ANASOCh. The AND gate 1236 controls resetting the flip-flops 1224 and 1226 after the flip-flop 1228 is reset. More specifically, the REGRESb signal is applied to one input of the AND gate 1226 as well as to the reset input of the flip-flop 1228. The $\overline{Q}$ output of flip-flop 1228 is applied to the other input of the AND gate 1236. The output of the AND gate 1180 is applied to the R reset inputs of the flip-flops 1224 and 1226.

The clock inputs of the flip-flops 1226 and 1228 are controlled by the microprocessor 30 interrupt signal INTEh. More specifically, the interrupt signal INTEh, which is active high is applied to the input of an inverter 1234. The output of inverter 1234 is applied to the clock CK inputs of the flip-flops 1226 and 1228.

AUTO-RANGE STATE MACHINE OPERATION

The auto-range function is initiated by the software writing to the AMUX register. More specifically, a STADCH signal (FIG. 41) is active high whenever the register AMUX is written to by the microprocessor 30. This signal STADCH is available at the output of an AND gate 1238. One input to the AND gate 1238 is a test circuit. The other input to the AND gate 1238 is from circuitry which includes buffer amplifiers 1240, 1242, 1244; flip-flops 1246, 1248, 1250; a NAND gate 1252 and AND gates 1254 and 1256. The WRCLKh signal is applied to one input of the AND gate 1254. This signal indicates that the microprocessor 30 is writing to one of the registers. An AMUXh signal is applied to the other input of the AND gate 1254. The AMUXh signal represents that the microprocessor 30 has written to the AMUX register by writing the address $0021 on the ADDR[5 . . . 0] bus. The output of the AND gate 1254 is a begin conversion signal BEGCONh which indicates that the AMUX register has been written to. This BEGCONh signal is applied to the input of the NAND gate 1252. The other input to the NAND gate 1252 is from the TEST[4 . . . 0] bus. The output of the NAND gate 1254 is applied to the D input of the flip-flop 1250 by way of the NAND gate 1252. The other input to the NAND gate 1252 is from test circuitry. The output of the flip-flop 1250 is applied to the input of a flip-flop 1248. The R input of the flip-flop 1250 is connected to the output of the AND gate 1256. The AND gate 1256 is a two input AND gate. The RESETb signal available at the output of the inverter amplifier 516 is applied to one input. An ARBSYh signal is applied to the other input by way of the inverter amplifier 1244. The AND gate 1256 resets the flip-flop 1250 when the autorange state machine is busy. A Q output of the flip-flop 1250 is applied to a D input of the flip-flop 1248. The output of the flip-flop 1248 is applied to the input of the buffer amplifier 1242. The output of the buffer amplifier 1242 is applied to the input of the flip-flop 1246. The clock inputs of the flip-flops 1246 and 1248 are tied to the output of the inverter 527. The SMCLKb is applied to the input of the inverter 527. The reset inputs R of both of the flip-flops 1246 and 1248 are controlled by the RESETb signal. The output of the flip-flop 1246 is applied to the input of a buffer amplifier 1240. The output of the buffer amplifier 1240 is applied to the other input of the AND gate 1236 to generate the STADCh signal to indicate that the microprocessor 30 has written to the AMUX register.

When the AMUX register has been written to, the control circuitry requests that the auto-range operation be performed followed by an analog digital conversion. More specifically, the auto-range state machine performs the following functions. First, the shift register 1170 is initialized. The output of the shift register 1170 is tied to a GAIN[4 . . . 0] bus which sets the gain for the amplifier. The initial state of the shift register 1170 depends on whether the voltage or current channel has been selected for conversion. If a voltage channel has been selected, the initial value is a binary 00001. If a current channel has been selected the initial value of the shift register 1170 will be a binary 0000. Next a five microsecond setting delay is timed. The TIMOUTh signal will be active high at the output of the five microsecond delay. When the TIMOUTh signal is active, the output of a comparator 74 is checked. If the comparator 74 has switched or if the maximum gain setting has been reached, a start of conversion signal is generated. Otherwise the gain is increased and the delay is timed again.

After the conversion has been initiated, the auto-range state machine waits for an end of conversion signal ANAEOCh to inform the microprocessor 30 to generate a processor interrupt.

A/D CONTROL LOGIC

The A/D converter 78 is an eight bit successive approximation A/D converter. The ranging circuitry for the voltage 80 and current amplifier 90 provides an additional four bits of dynamic range. The A/D converter 78 is described in detail in Section 7 of *MC68HC11A8 HCMOS SINGLE-CHIP MICROCOMPUTER* by Motorola, copyright 1987, hereby incorporated by reference.

ANALOG CONTROL LOGIC

The function block diagram for the analog control logic is shown in FIG. 18. This figure, in connection with the block diagram shown in FIG. 51 will be used to explain the analog control logic.

These figures illustrate the control logic for the current and voltage channel MUXes 66 and 68, zeroing of the voltage amplifier 80 and the current amplifier 90 and ranging of the voltage amplifier 80 and the current mirror 92. Also illustrated is an analog power supply subsystem 48 which consists of a band gap regulator subsystem 1400, a shunt regulator 1402 and the power monitor portion of subsystem 46. Biasing circuitry 1404 is illustrated for the quadcomparator subsystem 58 (FIG. 53), the band gap regulator 1400, the B+ comparator subsystem 50, the power monitor subsystem 46, the voltage amplifier 80 and the current amplifier 90. Lastly, temperature monitoring circuitry 1406 is illustrated which allows the microprocessor 30 to read the ambient temperature.

MUX CONTROL

The MUXes 66 and 68 are illustrated in FIG. 52. The input channels MUX0, MUX1, MUX2 and MUX3 can be used for either voltage inputs or current inputs. The input channels MUX4 and MUX5 can only be used for voltage channels. The channel MUX8 is for temperature sensing while the MUX 66K is tied to analog ground. More specifically, the input channels are configured by MUXes 66*a*–66*g*. The MUXes 68*a*–68*d* allow the input channels MUX0, MUX1, MUX2 and MUX3 to be tied to the current channel IMUX. The MUXes 68*e*–68*h* allow the input channels to be tied to digital ground VSS.

Sample and hold MUXes 108, 110 and 112 are connected between the channels MUX0 and MUX1, MUX2 and MUX3, and MUX4 and MUX5, respectively. A sample and hold switch, shown connected between channels MUX6 and MUX7, is reserved.

ANALOG POWER SUPPLY

The analog supply pins AVDD and AVSS are used to provide power to the analog portion of the IC 10. The analog supply pin AVDD is designed to be connected to a current source. The IC 10 contains an internal shunt regulator (FIG. 55) to regulate the voltage on the AVDD pin to approximately 5.0 Vdc. More specifically, the analog power supply consists of a 2.5 Vdc reference and a shunt regulator subsystem 1402. The 2.50 Vdc reference contains a +1.25 Vdc band gap regulator reference circuit 1406 (FIG. 54) and a buffer amplifier 1412 to generate a +2.50 Vdc reference: VREF. An adjustment pin VADJ is provided to allow the voltage to be trimmed to exactly +2.5 Vdc ±0.5 Vdc. In order to trim the reference, a two resistor voltage divider 1410 which includes resistors 1414 and 1416 is connected between the VREF and AVSS pins with the mid-point connected to VADJ. The buffer amplifier 1412 has a source follower output such that it can only source current. This will permit multiple devices to be paralleled. Also, the regulator of the IC 10 can be slaved to another by connecting its VADJ pin to the VREF pin.

The band gap regulator subsystem 1406 is illustrated in FIG. 54. A band gap reference is a precision voltage reference. In general, the band gap reference circuit utilizes as a reference the base-to-emitter voltage of a parasitic transistor which has a negative temperature coefficient (−TC) connected in series with a resistor which has a voltage developed across a resistor having a a positive temperature coefficient (+TC). The voltage developed across the resistor is a function of a predetermined current supplied to the resistor from circuitry internal to the band gap regulated reference. The difference in temperature coefficients between the base-to-emitter voltage of the parasitic transistor and the voltage cross the series connected resistor provides a voltage reference signal having an essentially zero temperature coefficient. As the base-to-emitter voltages of the parasitic transistors decreases with an increase in temperature, the voltage across the current-fed series connected resistor increases generally proportionally to provide an output reference voltage which remains relatively constant. This reference voltage is then applied to a non-inverting input of an amplifier and the inverting input of the amplifier is connected to an externally resistive divided portion of the output of the amplifier. The output of the amplifier is a voltage proportional to the reference voltage, relatively independent of temperature.

More specifically, the output of the band gap regulator reference circuit 1406 is nominally 1.25 Vdc. This output voltage is doubled by a buffer comparator 1412 and the external resistors 1414 and 1416 to produce a +2.5 Vdc reference at the external pin VREF. The external resistors 1414 and 1416 are connected in series between the output of the buffer comparator 1412 and an analog ground pin AVSS. The midpoint of these resistors 1414 and 1416 is connected to the inverting input of the buffer comparator 1412 to allow the reference voltage VREF to be adjusted. The band gap regulator circuit includes diode connected parasitic transistors 1426 and 1428, a transistor 1418, resistors 1420, 1422 and 1424 and a comparator 1441. Start-up circuitry 1432 is provided for the condition when power is first applied to the IC 10. The start-up circuitry 1432 includes the transistors 1434, 1436 and 1438. During this condition, voltages begin to rise from a zero level to a level that will ultimately be regulated by the band gap reference circuit 1406. Initially there is no current in any of the devices. In this condition, the transistor 1438 is biased on by a PBIAS circuit 1440 which will be discussed below. This, in turn, turns on the transistor 1434 to generate a current that flows into a diode connected parasitic transistor 1428. This produces a voltage at the transistor 1428 which is applied to a non-inverting input of the comparator 1441. That generates a positive signal at the output of the comparator 1441 which, in turn, turns on the transistor 1418 and produces currents in the transistors 1426 and 1428. Consequently, the band gap reference approaches a stable regulating point based upon the voltages across the diode connected transistors 1426 and 1428. When these voltages reach a steady state value, the transistor 1436 is turned on which turns off the transistor 1434, in which case all of the current is generated by the transistor 1418.

During regulation, the current applied to the emitters of the transistors 1426 and 1428 is essentially equal. This is because the resistors 1420 and 1424 are the same value and are relatively large compared to the other voltage drops. The base emitter voltage across transistors 1426 and 1428 is dependent upon the current density through these transistors. The current density is the total current divided by the area of the transistors. The current densities of the transistors 1426 and 1428 are different by a factor of 11 to 1, thus, their base emitter voltages will be different. The difference in base emitter voltages appears across the resistor 1422. Since the temperature coefficient is a function of the voltage across the device, as the base emitter voltage across the transistors 1426 and 1428 goes down, their negative temperature coefficient increases. Due to the relative current density in the transistor 1426 relative to the current density in the transistor 1428, the series combination of the resistor 1422 and transistor 1426 will have a positive temperature coefficient (+TC) and is applied to an inverting terminal of comparator 1441. The base emitter voltage of the transistor 1428, which has a negative temperature coefficient (−TC), is applied to a non-inverting terminal of the comparator 1441. As the temperature changes voltage across the base emitter junctions of the transistors 1426 and 1428, the voltage across the resistor 1422 will change by a proportional amount, thus yielding an output signal from the comparator 1440 that is relatively temperature independent.

SHUNT REGULATOR

The shunt regulator 1400 (FIG. 55) provides a nominal +5.0 Vdc at the AVDD pin based on the reference voltage at VREF. The shunt regulator 1400 includes an amplifier 1443 and resistors 1444 and 1446. More specifically, the output VREF from the buffer comparator 1412 is applied to a non-inverting input of a amplifier 1443. The AVDD bus is the regulated 5.0 Vdc supply. The inverting terminal of the amplifier 1443 is connected to the AVDD bus by way of the resistor 1444. The inverting terminal of the amplifier 1443 is also connected to the AVSS bus by way of the resistor 1446. The resistors 1444 and 1446 have equal value which causes the output of the amplifier 1443 to be twice VREF. Since VREF is nominally 2.5 volts, the regulated supply bus AVDD will nominally be 5.0 volts. A shunt element transistor 1447 is connected between AVDD and AVSS. The gate of the shunt element is controlled by output of the amplifier 1443. When the regulated supply AVDD becomes a little too high, the negative terminal of the amplifier 1443 will be a little higher than VREF. This will drive the output of the amplifier 1443 negative. This, in turn, will cause a shunt transistor 1447 to turn on a little bit more. This draws current away from the supply bus AVDD and brings the voltage down until the two inputs to the amplifier 1443 are essentially identical.

The circuitry which includes the transistors 1448, 1450 and 1452 is part of the start-up circuitry. Transistors 1448, 1450 and 1452 turn off the shunt transistor 1447 during start-up to avoid sinking a lot of current away from AVDD.

An important aspect of the invention relates to the fact that the IC 10 is current driven. This provides immunity to voltage spikes typical in applications in the automotive industry. More specifically, the IC 10 is driven by an input current, developed by an external resistor 1453 and an external voltage identified as VEXT applied to the AVDD bus.

POWER MONITOR SUBSYSTEM

The circuitry which consists of the transistors 1454, 1456, 1458 and 1460 and the comparator 1462 (FIG. 55) performs the power on reset and loss of +5.0 Vdc function. Power on reset is a delay of 8128 oscillator cycles plus an additional 1 ms from the time the reset is removed by clearing the external pin RESN.

The series connected transistors 1454, 1456, 1458 and 1460 form a voltage divider circuit. The drain of the transistor 1454 is applied to a non-inverting input of the comparator 1462. The output of the amplifier 1443 is applied to an inverting input of the comparator 1462. The output of the comparator 1462 is a signal SHUNT, an output pin which may be applied to the RESN pin of microprocessor 30 for the power monitor function to reset the microprocessor 30 upon detection of an under-voltage.

The comparator 1462 monitors the conductive state or gate voltage of the shunt transistor 1447. Whenever the shunt transistor 1447 is determined to be off, as indicated by the amplifier 1442 output being at a more positive voltage than the divided voltage at the drain of the transistor 1454, the comparator 1462 output signal shunt will be driven negative indicating insufficient current available to maintain the AVDD bus regulated at 5.0 volts.

B+ COMPARATOR SUBSYSTEM 50

The B+ comparator subsystem (FIG. 55) is used for power supply generation and includes the following circuitry, resistors 1462, 1464, a comparator 1466 and a transistor 1468. VREF is applied to an inverting input of the comparator 1466 providing a +2.5 Vdc reference. The output of the comparator 1466 is an external pin BDRIVE. Inputs to the comparator 1466 are applied to a non-inverting terminal of the comparator 1466 by way of an external pin BSENSE. The resistors 1464 and the transistor 1468 are exemplary of the hysteresis mask option, available for all comparators. The register 1464 and the transistor 1468 are connected in series to provide feedback from the output of the comparator 1466 to the inverting terminal.

FIGS. 56 and 57 illustrate exemplary circuitry for power supply generation and power supply regulation for the IC 10. FIG. 56 also illustrates the conditioning circuitry 19.

Referring first to FIG. 56, the IC 10 is used to monitor the condition of the circuit breaker 12 (FIG. 16) by way of the current transformers (CT) 14, 16 and 18. These CT's may be of the donut type which consist of a secondary winding disposed about the A, B and C phase conductors of the circuit breaker 12. During certain loading conditions, the output from the CT's may be of the order of 100 milliamps (ma). In order to reduce this output current to a level suitable for the IC 10, for example, 20 microamps, the signal conditioning circuitry 19 is provided. Various conditioning circuitry may be utilized. It should be understood that the conditioning circuitry illustrated in FIG. 56 is merely exemplary.

The CT's 14, 16 and 18 may be connected to the diode bridge 1467 in various ways. For example, the CT's 14, 16 and 18 may be connected in series with the output connected to the terminals 1469 and 1471. A single CT, for example, the B phase CT 16, may be tied to the bridge 1467. Also, the CT's 14, 16 and 18 may be connected in parallel.

The conditioning circuitry 19 includes a full wave diode bridge 1467 defining a pair of alternating current terminals 1469 and 1471 and a pair of rectified terminals with the positive terminal identified as 1473 and the negative terminal identified as 1475. The conditioning circuitry 19 also includes a resistor 1477 and a resistor 1479. Exemplary values for the resistors 1477 and 1479 are 10 ohms and 50 kilo-ohms, respectively.

The resistor 1477 is connected between the negative terminal 1475 on the bridge 1467 and ground. One side of the resistor 1479 is also tied to the negative terminal 1475. The other side of the resistor 1479 is then connected to one of the MUX inputs MUX0, MUX1, MUX3 or MUX3.

In operation, the current from the current transformers 14, 16 and 18 will flow through the resistor 1477 from ground to the negative terminal 1475 of the bridge 1469 to produce a negative voltage across the resistor 1477. If the value of the resistor 1477 is, for example, 10 ohms, a −1.0 volts will be produced across the resistor 1477 for a CT current of about 10 mA. This will, in turn, cause a −1.0 volt drop across the resistor 1479. If the resistor 1479 has a value of, for example, 50 kilo-ohms, this will, in turn, produce a current of 20 microamps to be applied to one of the current inputs 62 (e.g., MUX0, MUX1, MUX2 or MUX3) to the IC 10 as discussed below.

The exemplary circuitry illustrated in FIG. 56, identified within the dashed box 1481, in conjunction with the B+ comparator system 50 (FIG. 55) is used for power supply generation. More specifically, the power supply circuitry 1481 includes a transistor 1483, connected between the positive terminal 1473 of the bridge 1469 and ground with its gate terminal connected to BDRIVE (FIG. 55). Also connected to the positive terminal 1473 is the anode of a diode 1485. The cathode of the diode 1485 is connected to a terminal, identified in FIG. 56 as B+. A power supply capacitor 1487 is connected between the B+ terminal and ground. A pair of series connected resistors 1489 and 1491 are connected between the B+ terminal and ground with the junction between the resistors 1489 and 1491 identified as BSENSE.

In operation, the comparator 1466 (FIG. 55) is used to monitor the voltage at the BSENSE junction, a fraction of the voltage at the B+ junction, for example, 2.5 volts, and compare it with the voltage available at the VREF terminal. When the BSENSE voltage is greater than the VREF voltage, the output of the comparator 1466 goes high and turns on the transistor 1483 to shunt excess current to ground. When the voltage at the BSENSE junction drops below VREF, the comparator 1466 goes low which allows the transistor 1483 to be turned off to allow the capacitor 1487 to be charged up the desired value, for example, 30 volts.

FIG. 57 illustrates exemplary circuitry for regulating the voltages at the VDD and AVDD pins and does not form a portion of the present invention.

BIASING CIRCUITRY FOR OPERATIONAL AMPLIFIER OFFSET CORRECTION

Biasing signal PBIAS 1440 for the comparators 1412, 1440 (FIG. 54) and 1442 (FIG. 55) is illustrated in FIG. 58. Biasing signals PBIAS and NBIAS for the quad-comparator 200, 202, 204 and 206 (FIG. 53), the B+ comparator 1466 (FIG. 55), the power monitor comparator 1462 (FIG. 55), the voltage amplifier 80 (FIG. 61) and the current amplifier 90 (FIG. 62) are illustrated in FIG. 59. The PBIAS and NBIAS signals from such circuitry are reference voltages that are used to set the operating current of the particular operational amplifier to which they are applied. The above-mentioned biasing circuitry is in addition to the auto-zeroing circuitry for the voltage amplifier 80 and the current amplifier 90 are illustrated in FIG. 64 and identified as IOUT.

The circuitry illustrated in FIG. 58 is identified by the function block 1440. The PBIAS circuit 1440 includes a transistor 1470 and a resistor 1493, connected in series between AVDD and AVSS, forming a voltage divider. The voltage divider produces a gate to source voltage across the transistor 1470, identified as PBIAS.

The circuitry illustrated in FIG. 59 is used to generate the signals PBIAS and NBIAS for the quadcomparators 200, 202, 204 (FIG. 53), the voltage amplifier 80 and the current amplifier 90. This circuitry includes its own band gap regulator reference circuit which includes diode connected parasitic transistors 1472, 1474, resistors 1476, 1478, a comparator 1480 and capacitors 1482 and 1484. These signals are identified as PBIAS/I and NBIAS/I to indicate that the signals are temperature independent since the circuitry includes the band gap reference. This band gap reference operates in a manner similar to the band gap reference 1406 described above with the exception of the additional capacitors 1482 and 1484 are used to control the biasing time of the circuitry. The output of the comparator 1480 is applied to the gates of transistors 1486, 1488 and 1490, forming current mirrors. The current mirrors 1486 and 1488 are used to source the band gap regulator portion of the circuitry. The output current mirror 1490 is the NBIAS/I signal. The current mirror 1490 turns on transistors 1492 and 1494 which develop a gate to source voltage across a transistor 1496 which is the PBIAS/I reference. The transistors 1498, 1500 and 1502 form start-up circuitry for the band gap regulator portion of the circuit.

TEMPERATURE SENSING

The circuitry illustrated in FIG. 59 allows the microprocessor 30 to sense the ambient temperature in which the IC 10 is located. This circuitry includes a transistor 1504 and a diode connected parasitic transistor 1506. The voltage of the parasitic transistors is temperature dependent as previously discussed. The resulting TEMP signal is applied to a MUX 66j and converted to a digital value and read by the microprocessor 30.

VOLTAGE AMPLIFIER RANGING

The voltage amplifier 80 and ranging circuitry is illustrated in FIG. 61. This circuitry includes the voltage amplifier 80, gain circuitry 84 and a plurality of MUXes 86 to produce a voltage signal for A/D conversion that is at least half scale. The voltage ranging may be controlled either automatically or manually to provide gains of 1, 2, 4, 8 or 16 of the input voltage signal VMUX applied to a non-inverting input of the voltage amplifier 80. The gain circuitry includes resistors **84*a*–84*h* and MUXes 86*a*–86*f*. The gain circuitry is controlled by the VGAIN[4 . . . 0] bus and the gain signal VGAIN32h as previously discussed. The resistor 84*i* and 1512** form test circuitry.

If the gain is one, the voltage signal is applied directly to the A/D converter 78 by way of a MUX **88*a*. In this condition the MUXes 86*e* and 88*b* disconnect the voltage amplifier 80 from the A/D circuitry 78 and the signal is connected directly to the A/D 78 by the MUX 88*a*. During ranging, the MUXes 86*a*–86*f* connect the gain circuitry 84 to an inverting terminal of the voltage amplifier 80. For gains other than one, the MUX 88*b* connects the output of the voltage amplifier 80 to the A/D 78. The MUXes 88*a* and 88*b*** are selected by the AVSF register.

The comparator 74 is used for auto-ranging. This comparator is referenced to a fixed voltage, for example +1.25 Vdc, developed by a pair of serially coupled resistors 1508 and 1510, connected between VREF and AVSS. The midpoint of these resistors 1508 and 1510 is applied to a non-inverting terminal of the comparator 74. The output of the comparator 74 is a CAMPH signal, which is monitored by the flip-flop 1184 FIG. 50 and forms a portion of the auto-range logic as discussed above. The MUX **86*f* is used for auto-zeroing. This MUX 86*f* shorts the inverting and non-inverting terminals of the voltage amplifier 80 together to determine the offset correction value. During this condition, the offset value of the voltage amplifier 80 is loaded into the flip-flop 888 (FIG. 48). The MUX 86*f* is controlled by the VNULL signal available at the output of the buffer amplifier 756 (FIG. 45**).

CURRENT AMPLIFIER RANGING

Current amplifier 90 ranging is accomplished by the current mirror 92 (FIG. 62) as previously discussed. Current inputs are applied to the current channel IMUX (FIG. 52). This channel IMUX is tied to the current mirror 92 and to an inverting input of the current amplifier 90. A non-inverting terminal of the amplifier 90 is tied to analog ground to maintain the current input channels MUX0, MUX1, MUX2 and MUX3 at virtual ground. Negative currents (e.g., currents flowing out of the MXO pin) to be ranged are generated, for example, by connecting an external resistor (not shown) between the MUX0 pin and a negative voltage source. This causes ranged currents to flow out of the MUX0, MUX1, MUX2 or MUX 3 pins since these pins are maintained at virtual ground.

The MUXes **96*a* and 96*b* connect the output signal IOUT/I from the current mirror 92 either to the output pin MX0 or to the analog ground bus AVSS. More specifically, the MUX 96*a* is used to connect the output signal IOUT/I of the current mirror 92 to the MX0 pin under the control of a signal IOUTONh; available at the output of a NAND gate 759 (FIG. 50). The signal IOUTONh indicates that the integrator is not in a reset mode. An INTRESh signal as well as test signals are applied to the NAND gate 759. The MUX 96***b* is used to connect the current mirror 92 output signal IOUT/I to the analog ground bus AVSS under the control of a signal DISCHh, available at the output of a buffer 757. The input to the buffer 757 is an integrator reset signal INTRESh, available at the output of the AND gate 534 (FIG. 46).

The MUX 111*a* is used for auto-zeroing the current amplifier 90. Specifically, the MUX 111*a* connects both the inverting and non-inverting inputs of the current amplifier 90 to the analog ground bus AVSS under the control of a signal CSHRTh, available at the output of an inverter 581 (FIG. 49). The inverter 581 is serially connected to the output of the inverter 580. The input to the inverter 580 is the signal CAZh, which indicates the current amplifier 90 is being auto-zeroed.

The MUX 111*b* is used to connect the inverting input of the amplifier 90 to the IMUX output of the MUXes 68 (FIG. 59) whenever the amplifier 90 is not being auto-zeroed.

The ranged current from the current mirror 92 may then be dropped across an external resistor (not shown) to convert the signal to a voltage and converted by the A/D converter 78 as discussed above.

The current mirror 92 is illustrated in FIG. 63. The current mirror 92 includes current divider transistors 1512, 1514, 1516, 1518 and 1520, shunt transistors 1522, 1524, 1526 and 1528 and current mirrors 1530, 1532, 1534 and 1536. MUXes 1538, 1540, 1542 and 1544 control current shunting while MUXes 1546, 1548, 1550 and 1552 control the gain of the circuitry. These MUXes are controlled by the CGAIN[3 . . . 0] bus discussed above.

Negative currents are directed into the current mirror 92 at IIN/I. This input current is divided into five parts by the current divider transistors 1512, 1514, 1516, 1518 and 1520 which are all connected in parallel. More specifically, the sizes of the transistors 1512 and 1514 are maintained equal at a value, for example, A. The sizes of transistors 1516, 1518 and 1520 are 2A, 4A and 8A, respectively. Since the transistors 1512, 1514, 1516, 1518 and 1520 are connected as current mirrors, the current through each of the transistors will be a function of the size of the transistor. Thus, the output of transistors 1512 and 1514 each will be 1/16 of IIN/I. The output of transistor 1516 will be $\frac{1}{8}$ IIN/I. The output of transistor 1518 will be $\frac{1}{4}$ IIN/I. The output of the transistor 1520 will be $\frac{1}{2}$ IIN/I. These fractions of the input current IIN/I are either summed together to produce the desired gain which is controlled by the MUXes 1546, 1548, 1550 and 1552 and directed to the output by way of the current mirrors 1530, 1532, 1534 and 1536 or shunted around the mirrors 1530, 1532, 1534 and 1536 by way of the transistors 1522, 1524, 1526 and 1528 and the MUXes 1538, 1540, 1542 and 1544.

This is an important aspect of the invention. Specifically, in known bipolar current ranging circuitry (for example, as disclosed in U.S. Pat. No. 4,626,831), the current dividers are cascaded. However, cascading of the current dividers is not viable for the IC 10 because of the relatively small operating voltage (e.g., +5.0 Vdc).

CURRENT AND VOLTAGE AMPLIFIER ZEROING

Representative circuitry for the voltage and current amplifier 80 and 90 is illustrated in FIG. 65. These amplifiers are differential input amplifiers defining an internal bias current ITRIM/I. The differential inputs are identified as PLUS/I and MINUS/I. This internal bias current flows through resistors 1546 and 1548 which controls the offset voltage that appears at the amplifier 80 and 90 output. Known techniques have attempted to control the offset voltage by externally adjusting the resistor values of resistors 1546 and 1548, which requires precision variable resistors, such as digital-to-analog converter (DAC). Such DACs are relatively expensive. The auto-zeroing circuitry in accordance with the present invention, obviates the need for DACs and instead controls the bias current ITRIM/I to control the voltage across the resistors 1546 and 1548 to control the offset voltage. The bias current is ranged by a current dividing circuitry illustrated in FIG. 64. The ranged bias current is then applied to the amplifier 80 or 90 to control the bias current and the offset voltage.

The bias current ranging circuitry includes the MUXes 1600, 1602, 1604, 1606, 1608 and 1610, the current mirrors 1612, 1614, 1616, 1618, 1620, 1622 and 1624 and the transistors 1626 and 1628. The MUXes 1600, 1602, 1604, 1606, 1608 and 1610 are controlled by the VZERO[5 . . . 0] bus for the voltage amplifier 80 and the CZERO[5 . . . 0] bus for the current amplifier 90, as discussed below. These current mirrors are connected in parallel to allow the bias current to be divided into composite values and allow selected portions to be added together to generate the ranged current and operate in a similar manner as the current mirror 92.

GENERAL

The IC 10 is a semi-custom CMOS integrated circuit. This integrated circuit is packaged in a 44-pin Plastic Leaded Chip Carrier (PLCC) J-lead, surface mount package. The IC 10 is illustrated in FIG. 66. Signal definitions are provided below. A pin summary is provided in Table 15.

SIGNAL DEFINITIONS

PA7 . . . PA0. These eight bidirectional port pins can be individually programmed to be inputs or outputs by the software.

PB7/SCK, PB6, SDI, PB5/SDO. These three bidirectional port pins can be individually programmed to be inputs or outputs by the software. They are shared with the Synchronous Serial I/O Port (SSIOP) and their functionality may be changed when that system is in use.

PC7 . . . PC0. These eight bidirectional port pins can be individually programmed to be inputs or outputs by the software. The low-order four pins can also be configured to be the logical OR of the outputs of the four comparators.

PD7/TCAP. This input only pin is the most-significant bit of port D. Its function is shared with timer 0 and is the input capture pin of the timer.

SHUNT. This output pin is high when the power supply is shunting current to AVDD.

MUX3 . . . MUX0. These four analog input pins are two thirds of the A/D subsystem inputs. They can be individually programmed to operate in either the voltage or current modes. In the voltage mode, they are high impedance inputs.

In the current mode, an active current source maintains a virtual ground level for currents out of the device pin. When unselected in the current mode, each pin is connected to digital ground.

MUX4 . . . MUX5. These two analog input pins are the other third of the A/D subsystem inputs. They can operate only in the voltage input mode. They are always high impedance inputs.

MXO. This analog output is used by the A/D subsystem in the current mode of operation. An external resistor or capacitor between this pin and analog ground converts the mirrored and ratioed current from the selected input into a voltage for A/D conversion. If an external capacitor is used, the internal amplifier is configured as an integrator and current auto-ranging must be disabled.

CP3 . . . CP0. These four high-impedance analog inputs are the inverting inputs of four comparators.

These pins are also used during testing to select various test modes.

IRQN. This low-true CMOS input is the asynchronous external input to the microcontroller. A mask programmable option permits selection of two triggering methods: 1) negative edge-sensitive triggering, or 2) both negative edge-sensitive and low level-sensitive triggering. In the latter case, either type of input to the IRQN pin will produce an interrupt. The interrupt request must be present at least 125 ns in edge-triggered mode.

If the level-sensitive mask option is selected, the IRQN pin requires an external resistor to VDD for wire-OR operation.

The IRQN pin also puts the IC 10 in a test mode when placed at +9 V during reset. This mode is for test only and should not be used during normal operation.

BSENSE. This analog input is the non-inverting input to the B+ comparator.

BDRIVE. This analog output is the output of the B+ comparator.

VADJ. This analog input is used to adjust the analog reference voltage: VREF.

VREF. This analog output is the internal +2.5 V reference. It is the output of the reference buffer amplifier and must be connected to the external reference trim resistor network.

AVDD. This pin is the +5 V analog supply voltage. An external resistor is used to create a current source for the shunt-regulated power supply. AVDD will be regulated to approximately 2 * VREF.

AVSS. This pin is the analog ground reference.

RESN. This low-true input provides an external method of initializing the IC 10. When using the external reset, RESN must stay low for a minimum of 1.5 processor phase 2 cycles. RESN is received by a Schmitt receiver.

OSC1. This is the input of the oscillator circuit.

OSC2. This is the output of the crystal oscillator circuit. It is the inversion of the OSC1 input.

VDD. This pin is the digital +5 V supply.

VSS. This is the digital negative supply. It should be connected externally to the AVSS pin.

TABLE 15

PIN-SIGNAL SUMMARY
SIGNAL DEFINITIONS

| SIGNAL | PIN | DIRECTION | TYPE |
|---|---|---|---|
| PA7 . . . PA0 | 6–13 | Bidirectional | CMOS |
| PB7 . . . PB5 | 14–16 | Bidirectional | CMOS |
| PC7 . . . PC0 | 17–24 | Bidirectional | CMOS |
| SHUNT | 42 | Output | CMOS |
| PD7/TCAP | 43 | Input | CMOS |
| MUX5 . . . MUX0 | 31, 32, 35–38 | Input | Analog |
| MXO | 39 | Output | Analog |
| CP3 . . . CP0 | 14–18 | Input | Analog |
| RESN | 4 | Input | Schmitt |
| OSC2 | 2 | Output | Analog |
| OSC1 | 3 | Input | Analog |
| IRQN | 5 | Input | CMOS |
| BDRIVE | 29 | Output | Analog |
| BSENSE | 30 | Input | Analog |
| VADJ | 41 | Input | Analog |
| VREF | 40 | Output | Analog Reference |
| AVDD | 33 | Supply | Analog + Supply |
| AVSS | 34 | Supply | Analog − Supply |
| VSS | 44 | Supply | Digital − Supply |
| VDD | 1 | Supply | Digital + Supply |

What is claimed is:

1. A process for calculating a digital calibration factor for an electrical device of the type that acts in the presence of a predetermined value of an input electrical variable at an input of said electrical device to perform a function, where said calibration factor is digitally stored in a calibration factor memory region of said electrical device and where any input electrical value within a range of input electrical values provides a corresponding derived electrical value in said device, comprising the steps of:

supplying a first value of said input electrical variable to said input;

sensing said supplied input electrical variable and producing a corresponding first derived value related thereto;

communicating said first derived value to an external computing means which also has said first value of input electrical variable available thereto;

calculating a calibration factor within said external computing means according to the relationship:

said calibration factor is related to said first value of input electrical variable and said first derived value; and communicating said calibration factor to said calibration factor memory region for digital placement therein and subsequent use by said electrical device in performing said function.

2. The process as claimed in claim 1 wherein said input electrical variable is electrical current.

3. The process as claimed in claim 1 wherein said input electrical variable is electrical voltage.

4. The process as claimed in claim 1 wherein said input electrical input variable is frequency.

5. The process as claimed in claim 1 wherein said input electrical variable is electrical power.

6. The process as claimed in claim 1 wherein said corresponding derived electrical value multiplied by said calibration factor equals said predetermined value.

7. The process as claimed in claim 1 wherein said calibration factor algebraically added to said corresponding derived electrical value equals said predetermined value.

8. The process as claimed in claim 1 wherein said external computing means is a digital computer.

9. The process as claimed in claim 8 wherein said digital computer is a personal computer.

10. The process as claimed in claim 1 wherein said calibration factor is a gain factor.

11. The process as claimed in claim 1 wherein said input electrical variable is an analog value.

12. The process as claimed in claim 1 wherein said calibration factor memory region is part of a microprocessor.

13. The process as claimed in claim 1 wherein said calibration factor memory region is an EEPROM.

14. The process as claimed in claim 1 wherein said electrical device is a motor control device.

15. The process as claimed in claim 1 wherein said electrical device is a circuit breaker.

16. The process as claimed in claim 1 wherein said electrical device is a monitor.

17. The process as claimed in claim 1 wherein said function is performed using said corresponding derived value to which said calibration factor is applied to produce said predetermined value of said input electrical value.

18. In combination, an electrical device of the type that acts in the presence of a predetermined value of an input electrical variable at an input thereof to perform a function, where a calibration factor is digitally stored in a calibration factor memory region of said electrical device and where any input electrical value within a range of input electrical values provides a corresponding derived electrical value in said device;

supply means for supplying a first value of said input electrical variable to said input, said electrical device sensing said supplied input electrical variable and producing a corresponding first derived value related thereto;

external computing means having said first value of said input electrical variable available thereto;

first communication means for communicating said first derived value to said external computing means, said external computing means calibrating a calibration factor according to the relationship;

said calibration factor equals said first value of said input electrical variable divided by said first derived value; and second communication means for communicating said calibration factor to said calibration factor memory region for digital placement therein and subsequent use by said electrical device in performing said function.

19. The combination as claimed in claim 18 wherein said input electrical variable is electrical current.

20. The combination as claimed in claim 18 wherein said input electrical variable is electrical voltage.

21. The combination as claimed in claim 18 wherein said input electrical variable is frequency.

22. The combination as claimed in claim 18 wherein said input electrical variable is electrical power.

23. The combination as claimed in claim 18 wherein said corresponding derived electrical value multiplied by said calibration factor equals said predetermined value.

24. The combination as claimed in claim 18 wherein said calibration factor algebraically added to said corresponding derived value equals said predetermined value.

25. The combination as claimed in claim 18 wherein said external computing means is a digital computer.

26. The combination as claimed in claim 25 wherein said digital computer is a personal computer.

27. The combination as claimed in claim 18 wherein said calibration factor is a gain factor.

28. The combination as claimed in claim 18 wherein said input electrical variable is an analog value.

29. The combination as claimed in claim 18 wherein said calibration factor memory region is part of a microprocessor.

30. The combination as claimed in claim 18 wherein said calibration factor memory region is an EEPROM.

31. The combination as claimed in claim 18 wherein said electrical device is a motor control device.

32. The combination as claimed in claim 18 wherein said electrical device is a circuit breaker.

33. The combination as claimed in claim 18 wherein said electrical device is a monitor.

34. The combination as claimed in claim 18 wherein said electrical device includes means performing said function using said corresponding derived value to which said calibration factor is applied as said predetermined value.

35. In combination, an electrical device of the type that acts in the presence of a predetermined value of an input electrical variable at an input thereof to perform a function, where a calibration factor is digitally stored in a calibration factor memory region of said electrical device and where any input electrical value within a range of input electrical values provides a corresponding derived electrical value in said device;

supply means for supplying a first value of said input electrical variable to said input, said electrical device sensing said supplied input electrical variable and producing a corresponding first derived value related thereto;

external computing means having said first value of input electrical variable available thereto;

first communication means for communicating said first derived value to said external computing means, said external computing means calculating a calibration factor according to the relationship;

said calibration factor is related to said first value of input electrical variable and said first derived value; and second communication means for communicating said calibration factor to said calibration factor memory region for digital placement therein and subsequent use by said electrical device in performing said function.

36. In combination, a monitor of the type that acts in the presence of a predetermined value of an input electrical variable at an input thereof to perform a function, where a calibration factor is digitally stored in a calibration factor memory region of said electrical device and where any input electrical value within a range of input electrical values provides a corresponding derived electrical value in said device;

supply means for supplying a first value of said input electrical variable to said input, said monitor sensing said supplied input electrical variable and producing a corresponding first derived value related thereto;

external computing means having said first value of input electrical variable available thereto;

first communication means for communicating said first derived value to said external computing means, said external computing means calculating a calibration factor according to the relationship:

said calibration factor is related to said first value of input electrical variable and said first derived value; and second communication means for communicating said calibration factor to said calibration factor memory region for digital placement therein and subsequent use by said monitor in performing said function.

37. In combination, a circuit breaker of the type that acts in the presence of a predetermined value of an input electrical variable at an input thereof to perform a function, where a calibration factor is digitally stored in a calibration factor memory region of said electrical device and where any input electrical value within a range of input electrical values provides a corresponding derived electrical value in said device;

supply means for supplying a first value of said input electrical variable to said input; said circuit breaker sensing said supplied input electrical variable and producing a corresponding first derived value related thereto;

external computing means having said first value of input electrical variable available thereto;

first communication means for communicating said first derived value to said external computing means, said external computing means calculating a calibration factor according to the relationship:

said calibration factor is related to said first value of input electrical variable and said first derived value; and second communication means for communicating said calibration factor to said calibration factor memory region for digital placement therein and subsequent use by said circuit breaker in performing said function.

38. In combination, a motor controller of the type that acts in the presence of a predetermined value of an input electrical variable at an input thereof to perform a function, where a calibration factor is digitally stored in a calibration factor memory region of said electrical device and where any input electrical value within a range of input electrical values provides a corresponding derived electrical value in said device;

supply means for supplying a first value of said input electrical variable to said input, said motor controller sensing said supplied input electrical variable and producing a corresponding first derived value related thereto;

external computing means having said first value of input electrical variable available thereto;

first communication means for communicating said first derived value to said external computing means, said external computing means calculating a calibration factor according to the relationship;

said calibration factor is related to said first value of input electrical variable and said first derived value; and said communication means for communicating said calibration factor to said calibration factor memory region for digital placement therein and subsequent use by said motor controller in performing said function.

39. A process for calculating a digital calibration factor for an electrical device of the type that acts in the presence of a predetermined value of an input electrical signal at an input of said electrical device which electrical signal is related to a variable to perform a function related to said variable, where said calibration factor is digitally stored in a calibration factor memory region of said electrical device and where any input electrical value within a range of input electrical values provides a corresponding derived electrical value in said device, comprising the steps of:

supplying a first value of said input electrical signal to said input;

sensing said supplied input electrical signal and producing a corresponding first derived value related thereto;

communicating said first derived value to an external computing means which also has said first value of input electrical signal available thereto;

calculating a calibration factor within said external computing means according to the relationship:

said calibration factor is related to said first value of input electrical signal and said first derived value; and communicating said calibration factor to said calibration factor memory region for digital placement therein and subsequent use by said electrical device in performing said function.

40. In combination, an electrical device of the type that acts in the presence of a predetermined value of an input electrical signal at an input thereof which electrical signal is related to a variable to perform a function related to said variable, where a calibration factor is digitally stored in a calibration factor memory region of said electrical device and where any input electrical value within a range of input electrical values provides a corresponding derived electrical value in said device;

supply means for supplying a first value of said input electrical signal to said input; said electrical device sensing said supplied input electrical signal and producing a corresponding first derived value related thereto;

external computing means having said first value of input electrical signal available thereto;

first communication means for communicating said first derived value to said external computing means, said external computing means calculating a calibration factor according to the relationship:

said calibration factor equals said first value of input electrical signal divided by said first derived value; and second communication means for communicating said calibration factor to said calibration factor memory region for digital placement therein and subsequent use by said electrical device in performing said function.

* * * * *